United States Patent
Tsikos et al.

(10) Patent No.: US 7,621,455 B2
(45) Date of Patent: *Nov. 24, 2009

(54) HAND-SUPPORTABLE CODE SYMBOL READER EMPLOYING COPLANAR LASER ILLUMINATION AND LINEAR IMAGING

(75) Inventors: Constantine J. Tsikos, Voorhees, NJ (US); Michael D. Schnee, Aston, PA (US); Xiaoxun Zhu, Marlton, NJ (US); Thomas Amundsen, Turnersville, NJ (US); Charles A. Naylor, Sewell, NJ (US); Russell Joseph Dobbs, Cherry Hill, NJ (US); Carl Harry Knowles, Moorestown, NJ (US)

(73) Assignee: Metrologic Instruments, Inc., Blackwood, NJ (US)

( * ) Notice: Subject to any disclaimer, the term of this patent is extended or adjusted under 35 U.S.C. 154(b) by 3 days.

This patent is subject to a terminal disclaimer.

(21) Appl. No.: 11/974,183

(22) Filed: Oct. 11, 2007

(65) Prior Publication Data

US 2008/0110993 A1 May 15, 2008

Related U.S. Application Data

(63) Continuation of application No. 11/490,544, filed on Jul. 20, 2006, now Pat. No. 7,523,863, which is a continuation of application No. 11/484,369, filed on Jul. 11, 2006, now Pat. No. 7,533,821, which is a continuation of application No. 10/066,545, filed on Feb. 1, 2002, now Pat. No. 7,073,718, which is a continuation of application No. 09/721,885, filed on Nov. 24, 2000, now Pat. No. 6,631,842, which is a continuation-in-part of application No. PCT/US00/15624, filed on Jun. 7, 2000, and a continuation-in-part of application No. 09/327,756, filed on Jun. 7, 1999, now abandoned.

(51) Int. Cl.
*G06K 7/10* (2006.01)

(52) U.S. Cl. .............................. 235/462.42; 235/472.01

(58) Field of Classification Search ................................
235/462.01–462.45, 472.01, 472.02, 472.03
See application file for complete search history.

(56) References Cited

U.S. PATENT DOCUMENTS 3,901,597 A    8/1975   White (Continued)

FOREIGN PATENT DOCUMENTS

WO         WO 99/21252       4/1999

(Continued)

OTHER PUBLICATIONS

U.S. Appl. No. 60/190,273, filed May 29, 2001, Thomas J. Brobst.
Product brochure for the LMC555 CMOS Timer by National Semiconductor Corporation, Mar. 2002, pp. 1-10.

(Continued)

*Primary Examiner*—Thien M Le
(74) *Attorney, Agent, or Firm*—Thomas J. Perkowski, Esq., P.C.

(57) ABSTRACT

A hand-supportable coplanar laser illumination and imaging (PLIIM) based code symbol reader includes: a hand-supportable housing having light transmission aperture; a linear image formation and detection module having a linear image detection array; and a planar laser illumination beam (PLIB) producing a coplanar laser illumination and imaging based device having at least one visible laser diode (VLD) for producing a planar light illumination beam (PLIB). The code symbol reader further includes an image grabber for grabbing digital linear images formed and detected by the image formation and detection module, an image data buffer for buffering the digital linear images grabbed by the image grabber, and an image processing computer for processing the buffered digital linear images so as to read code symbols graphically represented in the digital linear images. During object illumination and imaging operations, a controller automatically controls the linear image formation and detection module, the PLIB producing device, the image frame grabber, and the image data buffer.

10 Claims, 84 Drawing Sheets

U.S. PATENT DOCUMENTS

| | | | |
|---|---|---|---|
| 4,471,228 A | 9/1984 | Nishizawa et al. |
| 4,538,060 A | 8/1985 | Sakai et al. |
| 4,687,325 A | 8/1987 | Corby |
| 4,734,910 A | 3/1988 | Izadpanah |
| 4,766,300 A | 8/1988 | Chadima, Jr. et al. |
| 4,805,026 A | 2/1989 | Oda |
| 4,816,916 A | 3/1989 | Akiyama |
| 4,818,847 A | 4/1989 | Hara et al. |
| 4,826,299 A | 5/1989 | Powell |
| 4,835,615 A | 5/1989 | Taniguchi et al. |
| 4,894,523 A | 1/1990 | Chadima, Jr. et al. |
| 4,900,907 A | 2/1990 | Matusima et al. |
| 4,952,966 A | 8/1990 | Ishida et al. |
| 4,961,195 A | 10/1990 | Skupsky et al. |
| 4,979,815 A | 12/1990 | Tsikos |
| 4,996,413 A | 2/1991 | McDaniel et al. |
| 5,025,319 A | 6/1991 | Mutoh et al. |
| 5,034,619 A | 7/1991 | Hammond, Jr. |
| 5,038,024 A | 8/1991 | Chadima, Jr. et al. |
| 5,063,462 A | 11/1991 | Nakagawa et al. |
| 5,111,263 A | 5/1992 | Stevens |
| 5,124,537 A | 6/1992 | Chandler et al. |
| 5,144,119 A | 9/1992 | Chadima, Jr. et al. |
| 5,192,856 A | 3/1993 | Schaham |
| 5,212,390 A | 5/1993 | LeBeau et al. |
| 5,231,293 A | 7/1993 | Longacre, Jr. |
| 5,233,169 A | 8/1993 | Longacre, Jr. |
| 5,253,198 A | 8/1993 | Stevens et al. |
| 5,258,605 A | 11/1993 | Metlitsky et al. |
| 5,262,871 A | 11/1993 | Wilder et al. |
| 5,272,538 A | 12/1993 | Homma et al. |
| 5,286,960 A | 2/1994 | Longacre, Jr. et al. |
| 5,288,985 A | 2/1994 | Chadima, Jr. et al. |
| 5,291,008 A | 3/1994 | Havens et al. |
| 5,291,009 A | 3/1994 | Roustaei |
| 5,294,783 A | 3/1994 | Hammond, Jr. et al. |
| 5,296,690 A | 3/1994 | Chandler et al. |
| 5,304,786 A | 4/1994 | Pavlidis et al. |
| 5,304,787 A | 4/1994 | Wang |
| 5,308,962 A | 5/1994 | Havens et al. |
| 5,309,243 A | 5/1994 | Tsai |
| 5,319,181 A | 6/1994 | Shellhammer et al. |
| 5,319,182 A | 6/1994 | Havens et al. |
| 5,319,185 A | 6/1994 | Obata |
| 5,331,118 A | 7/1994 | Jensen |
| 5,345,266 A | 9/1994 | Denyer |
| 5,349,172 A | 9/1994 | Roustaei |
| 5,354,977 A | 10/1994 | Roustaei |
| 5,378,883 A | 1/1995 | Batterman et al. |
| 5,396,054 A | 3/1995 | Krichever et al. |
| 5,399,846 A | 3/1995 | Pavlidis et al. |
| 5,410,141 A | 4/1995 | Kkoenck et al. |
| 5,418,357 A | 5/1995 | Inoue et al. |
| 5,420,409 A | 5/1995 | Longacre, Jr. et al. |
| 5,430,286 A | 7/1995 | Hammond, Jr. et al. |
| 5,457,309 A | 10/1995 | Pelton |
| 5,463,214 A | 10/1995 | Longacre, Jr. et al. |
| 5,479,515 A | 12/1995 | Longacre, Jr. |
| RE35,148 E | 1/1996 | Lizzi et al. |
| 5,484,994 A | 1/1996 | Roustaei |
| 5,489,771 A | 2/1996 | Beach et al. |
| 5,491,330 A | 2/1996 | Sato et al. |
| 5,521,366 A | 5/1996 | Wang et al. |
| 5,532,467 A | 7/1996 | Roustaei |
| 5,545,886 A | 8/1996 | Metlitsky et al. |
| 5,550,366 A | 8/1996 | Rousatei |
| 5,572,006 A | 11/1996 | Wang et al. |
| 5,576,529 A | 11/1996 | Koenck et al. |
| 5,591,952 A | 1/1997 | Krichever et al. |
| 5,615,003 A | 3/1997 | Hermary et al. |
| 5,621,203 A | 4/1997 | Swartz et al. |
| 5,634,697 A | 6/1997 | Shellhammer et al. |
| 5,637,851 A | 6/1997 | Swartz et al. |
| 5,646,390 A | 7/1997 | Wang et al. |
| 5,659,167 A | 8/1997 | Wang et al. |
| 5,672,858 A | 9/1997 | Li et al. |
| 5,702,059 A | 12/1997 | Chu et al. |
| 5,710,417 A | 1/1998 | Joseph et al. |
| 5,717,195 A | 2/1998 | Feng et al. |
| 5,717,221 A | 2/1998 | Li et al. |
| 5,719,384 A | 2/1998 | Ju et al. |
| 5,723,853 A | 3/1998 | Longacre, Jr. et al. |
| 5,723,868 A | 3/1998 | Hammond, Jr. et al. |
| 5,736,724 A | 4/1998 | Ju et al. |
| 5,739,518 A | 4/1998 | Wang |
| 5,756,981 A | 5/1998 | Roustaei et al. |
| 5,773,806 A | 6/1998 | Longacre, Jr. et al. |
| 5,773,810 A | 6/1998 | Hussey et al. |
| 5,777,314 A | 7/1998 | Roustaei |
| 5,780,834 A | 7/1998 | Havens et al. |
| 5,783,811 A | 7/1998 | Feng et al. |
| 5,784,102 A | 7/1998 | Hussey et al. |
| 5,786,582 A | 7/1998 | Roustaei et al. |
| 5,786,586 A | 7/1998 | Pidhirny et al. |
| 5,793,033 A | 8/1998 | Feng et al. |
| 5,808,286 A | 9/1998 | Nukui et al. |
| 5,811,774 A | 9/1998 | Ju et al. |
| 5,811,784 A | 9/1998 | Tausch et al. |
| 5,815,200 A | 9/1998 | Ju et al. |
| 5,821,518 A | 10/1998 | Sussmeier et al. |
| 5,825,006 A | 10/1998 | Longacre, Jr. et al. |
| 5,825,803 A | 10/1998 | Labranche et al. |
| 5,831,254 A | 11/1998 | Karpen et al. |
| 5,831,674 A | 11/1998 | Ju et al. |
| 5,834,749 A | 11/1998 | Durbin |
| 5,834,754 A | 11/1998 | Feng et al. |
| 5,837,985 A | 11/1998 | Karpen |
| 5,838,495 A | 11/1998 | Hennick |
| 5,841,121 A | 11/1998 | Koenck |
| 5,841,889 A | 11/1998 | Seyed-Bolorforosh |
| 5,867,594 A | 2/1999 | Cymbalski |
| 5,883,375 A | 3/1999 | Knowles et al. |
| 5,914,476 A | 6/1999 | Gerst, III et al. |
| 5,920,061 A | 7/1999 | Feng |
| 5,929,418 A | 7/1999 | Ehrhart et al. |
| 5,932,862 A | 8/1999 | Hussey et al. |
| 5,942,741 A | 8/1999 | Longacre, Jr. et al. |
| 5,949,052 A | 9/1999 | Longacre, Jr. et al. |
| 5,949,057 A | 9/1999 | Feng |
| 5,979,763 A | 11/1999 | Wang et al. |
| 5,986,705 A | 11/1999 | Shiboya et al. |
| 5,986,745 A | 11/1999 | Hermary et al. |
| 5,988,506 A | 11/1999 | Schabam et al. |
| 5,992,744 A | 11/1999 | Smith et al. |
| 5,992,750 A | 11/1999 | Chadima, Jr. et al. |
| 6,000,612 A | 12/1999 | Xu |
| RE36,528 E | 1/2000 | Roustaei |
| 6,015,088 A | 1/2000 | Parker et al. |
| 6,016,135 A | 1/2000 | Biss et al. |
| 6,019,286 A | 2/2000 | Li et al. |
| 6,053,408 A | 4/2000 | Stoner |
| 6,060,722 A | 5/2000 | Havens et al. |
| 6,062,475 A | 5/2000 | Feng |
| 6,064,763 A | 5/2000 | Maltsev |
| 6,081,381 A | 6/2000 | Shalapenok et al. |
| 6,097,839 A | 8/2000 | Liu |
| 6,098,887 A | 8/2000 | Figarella et al. |
| 6,123,261 A | 9/2000 | Roustaei |
| 6,123,263 A | 9/2000 | Feng |
| 6,123,264 A | 9/2000 | Li et al. |
| 6,128,049 A | 10/2000 | Butterworth |
| 6,128,414 A | 10/2000 | Liu |
| 6,138,915 A | 10/2000 | Danielson et al. |
| 6,141,046 A | 10/2000 | Roth et al. |

| | | |
|---|---|---|
| 6,152,371 A | 11/2000 | Schwartz et al. |
| 6,158,661 A | 12/2000 | Chadima, Jr. et al. |
| 6,159,153 A | 12/2000 | Dubberstein et al. |
| 6,164,544 A | 12/2000 | Schwartz et al. |
| 6,166,770 A | 12/2000 | Yasuda |
| 6,173,893 B1 | 1/2001 | Maltsev et al. |
| 6,179,208 B1 | 1/2001 | Feng |
| 6,184,981 B1 | 2/2001 | Hasson et al. |
| 6,191,887 B1 | 2/2001 | Michaloski et al. |
| 6,209,789 B1 | 4/2001 | Amundsen et al. |
| 6,223,988 B1 | 5/2001 | Batterman et al. |
| 6,230,975 B1 | 5/2001 | Colley et al. |
| 6,234,395 B1 | 5/2001 | Chadima et al. |
| 6,244,512 B1 | 6/2001 | Koenck et al. |
| 6,250,551 B1 | 6/2001 | He et al. |
| 6,254,003 B1 | 7/2001 | Pettinelli et al. |
| 6,264,105 B1 | 7/2001 | Longacre, Jr. et al. |
| 6,266,685 B1 | 7/2001 | Danielson et al. |
| 6,275,388 B1 | 8/2001 | Hennick et al. |
| 6,296,187 B1 | 10/2001 | Shearer |
| 6,298,175 B1 | 10/2001 | Longacre, Jr. et al. |
| 6,298,176 B2 | 10/2001 | Longacre, Jr. et al. |
| 6,318,637 B1 | 11/2001 | Stoner |
| 6,330,974 B1 | 12/2001 | Ackley |
| 6,336,587 B1 | 1/2002 | He et al. |
| 6,340,114 B1 | 1/2002 | Correa et al. |
| 6,345,765 B1 | 2/2002 | Wiklof |
| 6,347,163 B2 | 2/2002 | Roustaei |
| 6,357,659 B1 | 3/2002 | Kelly et al. |
| 6,367,699 B2 | 4/2002 | Ackley |
| 6,371,374 B1 | 4/2002 | Schwartz et al. |
| D456,808 S | 5/2002 | Fitch et al. |
| 6,385,352 B1 | 5/2002 | Roustaei |
| 6,398,112 B1 | 6/2002 | Li et al. |
| 6,427,917 B2 | 8/2002 | Knowles et al. |
| 6,431,452 B2 | 8/2002 | Feng |
| 6,435,411 B1 | 8/2002 | Massieu et al. |
| 6,469,289 B1 | 11/2002 | Scott-Thomas et al. |
| 6,489,798 B1 | 12/2002 | Scott-Thomas et al. |
| 6,491,223 B1 | 12/2002 | Longacre, Jr. et al. |
| 6,499,664 B2 | 12/2002 | Knowles et al. |
| 6,527,182 B1 | 3/2003 | Chiba et al. |
| 6,550,679 B2 | 4/2003 | Hennick et al. |
| 6,561,428 B2 | 5/2003 | Meier et al. |
| 6,565,003 B1 | 5/2003 | Ma et al. |
| 6,575,367 B1 | 6/2003 | Longacre et al. |
| 6,575,369 B1 | 6/2003 | Knowles et al. |
| 6,578,766 B1 | 6/2003 | Parker et al. |
| 6,585,159 B1 | 7/2003 | Meier et al. |
| 6,601,768 B2 | 8/2003 | McCall et al. |
| 6,607,128 B1 | 8/2003 | Schwartz et al. |
| 6,616,046 B1 | 9/2003 | Barkan et al. |
| 6,619,547 B2 | 9/2003 | Crowther et al. |
| 6,628,445 B2 | 9/2003 | Chaleff et al. |
| 6,637,655 B1 | 10/2003 | Hudrick et al. |
| 6,637,658 B2 | 10/2003 | Barber et al. |
| 6,655,595 B1 | 12/2003 | Longacre, Jr. et al. |
| 6,659,350 B2 | 12/2003 | Schwartz et al. |
| 6,681,994 B1 | 1/2004 | Koenck |
| 6,685,095 B2 | 2/2004 | Roustaei et al. |
| 6,689,998 B1 | 2/2004 | Bremer |
| 6,698,656 B2 | 3/2004 | Parker et al. |
| 6,708,883 B2 | 3/2004 | Krichever |
| 6,722,569 B2 | 4/2004 | Ehrhart et al. |
| 6,736,320 B1 | 5/2004 | Crowther et al. |
| 6,749,110 B2 | 6/2004 | Hecht |
| 6,814,290 B2 | 11/2004 | Longacre |
| 6,832,725 B2 | 12/2004 | Gardiner et al. |
| 6,834,807 B2 | 12/2004 | Ehrhart et al. |
| 6,856,440 B2 | 2/2005 | Chaleff et al. |
| 6,863,217 B2 | 3/2005 | Hudrick et al. |
| D505,423 S | 5/2005 | Ahearn et al. |
| 6,912,076 B2 | 6/2005 | Chaleff et al. |
| 6,913,202 B2 * | 7/2005 | Tsikos et al. ............ 235/472.01 |
| 6,947,612 B2 | 9/2005 | Helms et al. |
| 7,055,747 B2 | 6/2006 | Havens et al. |
| 7,059,525 B2 | 6/2006 | Longacre, Jr. et al. |
| 7,077,317 B2 | 7/2006 | Longacre, Jr. et al. |
| 7,077,321 B2 | 7/2006 | Longacre, Jr. et al. |
| 7,077,327 B1 | 7/2006 | Knowles et al. |
| 7,080,786 B2 | 7/2006 | Longacre, Jr. et al. |
| 7,086,596 B2 | 8/2006 | Meier et al. |
| 7,148,923 B2 | 12/2006 | Harper et al. |
| 7,261,238 B1 | 8/2007 | Carlson et al. |
| 2002/0096566 A1 | 7/2002 | Schwartz et al. |
| 2002/0139853 A1 * | 10/2002 | Tsikos et al. ............ 235/462.01 |
| 2002/0145042 A1 * | 10/2002 | Knowles et al. ........ 235/462.01 |
| 2003/0213847 A1 | 11/2003 | McCall et al. |
| 2004/0094627 A1 | 5/2004 | Parker et al. |
| 2004/0195328 A1 | 10/2004 | Barber et al. |
| 2006/0180670 A1 | 8/2006 | Acosta et al. |
| 2008/0116279 A1 * | 5/2008 | Tsikos et al. ............ 235/462.42 |
| 2008/0128506 A1 * | 6/2008 | Tsikos et al. ............ 235/462.42 |
| 2008/0135621 A1 * | 6/2008 | Tsikos et al. ............ 235/462.42 |

FOREIGN PATENT DOCUMENTS

| | | |
|---|---|---|
| WO | WO 99/31531 | 6/1999 |
| WO | WO 99/49787 | 10/1999 |
| WO | WO 99/60443 | 11/1999 |
| WO | WO 99/64916 | 12/1999 |
| WO | WO 99/64980 | 12/1999 |
| WO | WO 00/43822 | 7/2000 |
| WO | WO 00/62114 | 10/2000 |
| WO | WO 00/65401 | 11/2000 |
| WO | WO 01/71419 A2 | 9/2001 |
| WO | WO 01/72028 A1 | 9/2001 |

OTHER PUBLICATIONS

Code Reader 2.0 (CR2)—promotional pp. Apr. 20-21, 2004 from www.codecorp.com.

Code Corporation's New Imager Offers Revolutionary Performance and Bluetooth Radio, Feb. 19, 2003, by Benjamin M. Miller, Codex Corporation, 11814 South Election Road, Suite 200, Draper UT 84020.

National Semiconductor's brochure entitled "LLM9638 Monochrome CMOS Image Sensor SXGA 18 FPS", 2000, www.national.com.

Product Manual for 4600r Retail 2D Imager by HHP, 2006, pp. 102.

Omniplanar Incorporated product manual entitled "The Customer's Guide to SwiftDecoder Automatic Gain Control", 1999,pp. 1-14.

Web-based Product Brochure on Model 120 LIVAAR Short Wave IR Gated Camera Specification, by Intevac Corporation, Santa Clara CA, Sep. 2001, pp. 1-7.

Web-based presentation entitled "New Livar Imagery" by Intevac Corporation, Santa Clara CA, http://www.intevac.com/livar_imagery/livar_imagery.html. 2001, pp. 1-9.

Product Brochure for the Lasiris™ SNF Laser by StockerYale, Salem NH, 2001, pp. 1-4.

Product Brochure for the AV3700 High Speed CCD Bar Code Reader by Accu-Sort Corporation, 2001, pp. 1-2.

Product brochure for DALSA IT-PA Image Sensors, by Dalsa, Inc., 2001 pp. 1-14.

Product Specification for "KAF-4202 Series Full-Frame CCD Image Sensor Performance Specification" by Eastman Kodak Company, Rochester NY, Jun. 29, 2000, pp. 1-15.

User Manual for the Piranha CT-P4, CL-P4 High Speed Line Scan Camera by Dalsa, Inc., 2000, pp. 1-30.

Product brochure for Sony ICX085AL 2/3-inch Progressive Scan CCD Image Sensor with Square Pixel for B/W Cameras, by Sony Corporation, 2000, pp. 1-20.

Product brochure for "ML1XX6 Series for Optical Information Systems" by Mitsubishi Electric, Dec. 1999, pp. 1-4.

Web-based brochure for Intevac Photonics Division Products- Laser Illuminated Viewing and Ranging (LIVAR) System, Intevac, Inc., http://www.intevac.com/photonics/products.html,2001, pp. 1-5.

Web-based publication entitled "Planar Etalon Theory" by TecOptics, www.tecoptics.com/etalons/theory.htm, 2001, pp. 1-2.

Web-based publication entitled "Introduction: Etalons" by TecOptics, http://www.tecoptics.com/etalons/index.htm, 2001, 1 page.

Web-based publication entitled "Types of Planar Etalons" by TecOptics, http://www.tecoptics.com/etalons/types.htm, 2001, pp. 1-3.

Web-based brochure entitled "High-Speed, Repetitively Pulsed Ruby Laser Light Source" by Physical Sciences Inc., http://www.psicvorp.com/html/prod/lasillum.htm, 2001, pp. 1-4.

Web-based brochure entitled "Collimated Laser Diode Arrays" by INO, Inc., http://www.ino.qe.ca/en/syst_et_compo/clda.asp, 2001, pp. 1-2.

Academic publication entitled "Nonlinear Electro-Optic Effect and Kerr Shutter" by Jagat Shakya and Mim lal Nakarmi, Dept. of Physics, Kansas State Univ., Apr. 2001, pp. 1-14.

Chapter 4 entitled "Speckle Reduction" by T.S. McKechnie, Topics in Applied Physics vol. 9—Laser Speckle and Related Phenomena, Editor J.C. Dainty, Springer-Verlag, 1984, pp. 123-170.

Web-based brochure for the Optical Shutter by Optron Systems, Inc., http://members.bellatlantic.net/-optron3/shutter.htm#TypicalApplications, 2001, pp. 1-4.

Scientific publication entitled "Speckle Reduction in Laser Projections with Ultrasonic Waves" by Wang et al., Opt. Eng. 39(6) 1659-1664 Jun. 2000, vol. 39, No. 6.

Scientific publication entitled "Principles of Parametric Temporal Imaging—Part I: System Configurations" by Bennett et al., IEEE Journal of Quantum Electronics, vol. 36, No. 4, Apr. 2000, vol. 36, No. 4, pp. 430-437.

Web-based slide show entitled "Speckle Noise and Laser Scanning Systems" by Kresic-Juric et al., www.ima.umn.edu/industrial/99-2000/kresic/sld001.htm, 2000, pp. 1-25.

NEC Press Release entitled "NEC Develops Highly Stable, Ultra-short Pulse Seimconductor Laser for Ultra-high Capacity Optical Communications" NEC Corporation, Jan. 11, 1999, pp. 1-3.

Scientific publication entitled "High-speed visualization, a powerful diagnostic tool for microactuators—retrospect and prospect" by Krehl et al., Microsystem Technologie 5, Springer-Verlag 1999, pp.113-132.

Web-based publication entitled "3-D Sensing" by Papadoupoulos, http://perso.club-internet.fr/dpo/numeerisation 3d, 1995, pp. 1-12.

Scientific publication entitled "Laser triangulation: fundamental uncertainty in distance measurement" by Dorsch et al., Applied Optics, vol. 33(7), Mar. 1994, pp. 442-450.

Scientific publication entitled "The Use of Diode Laser Collimators for Targeting 3-D Objects" by Clarke et al., Dept. Engineering/City Univ./London, 1994, pp. 47-54.

Scientific publication entitled "Speckle Reduction by Virtual Spatial Coherence" by Freischlad et al., SPIE vol. 1755 Interferometry: Techniques and Analysis (1992), pp. 38-43.

Search Report for Int'l Application No. PCT/US01/44011, 2002.

* cited by examiner

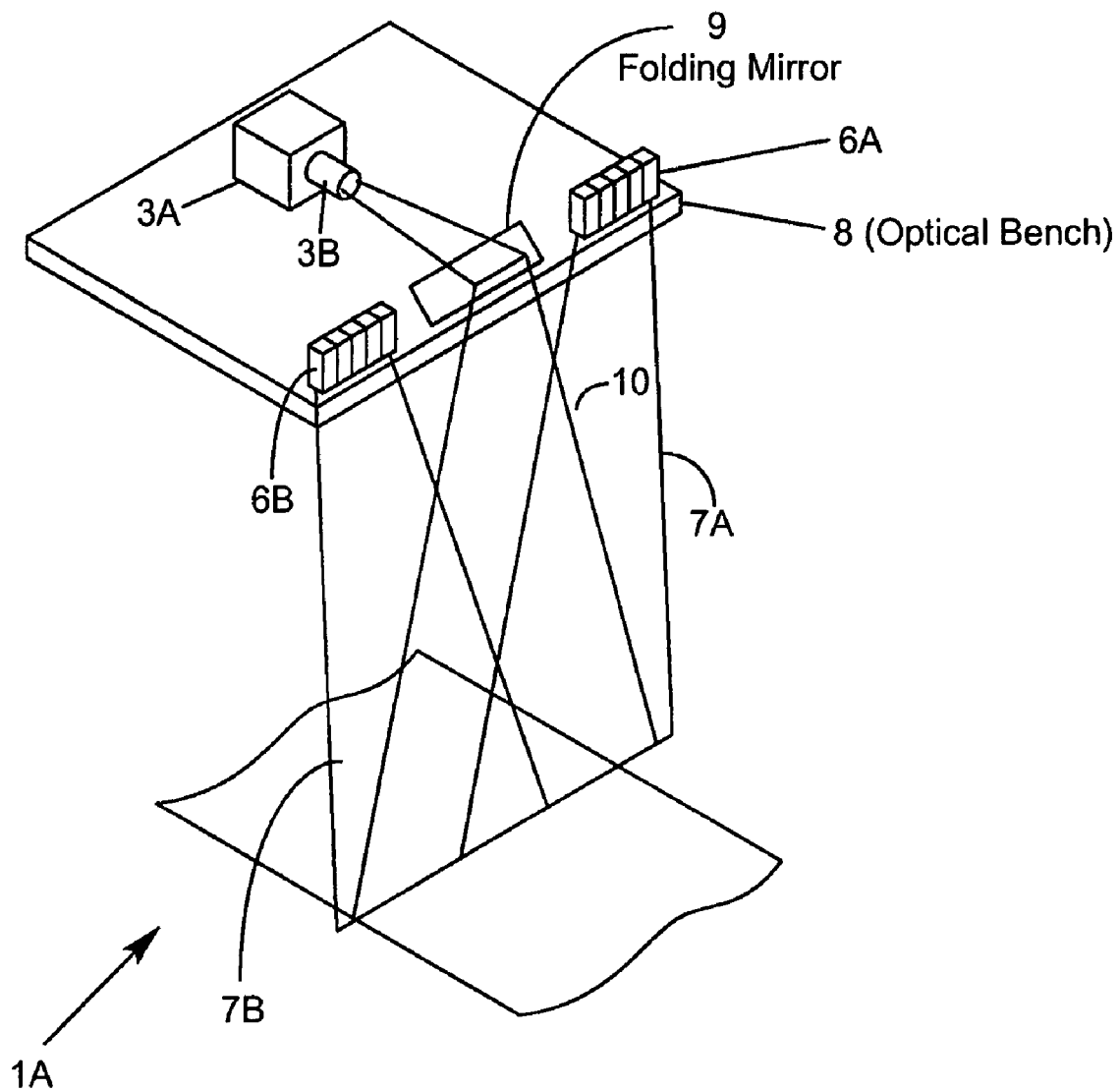
FIG. 1B1

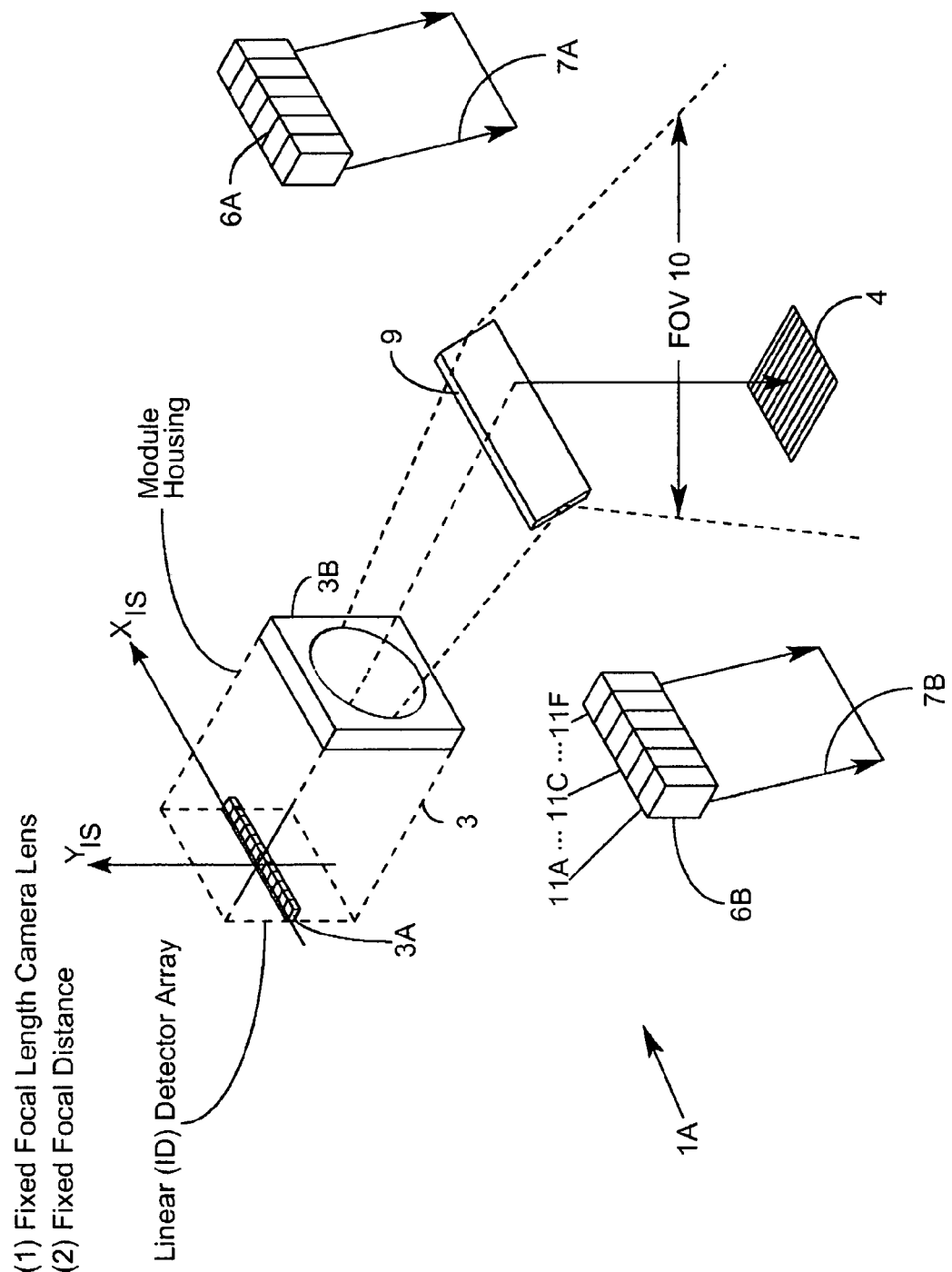
FIG. 1B2

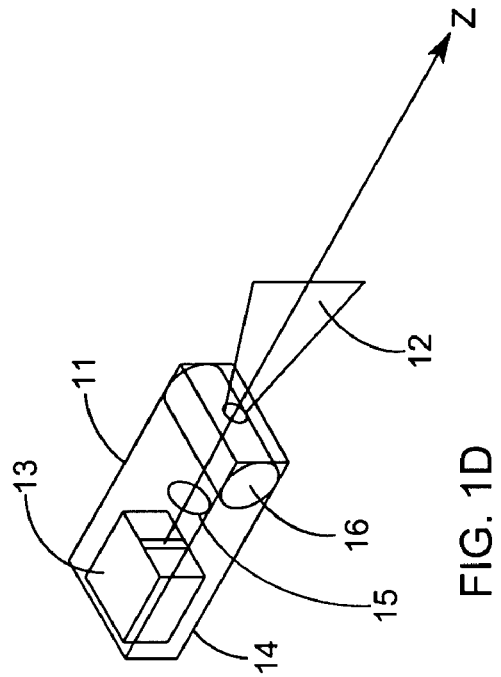
FIG. 1C
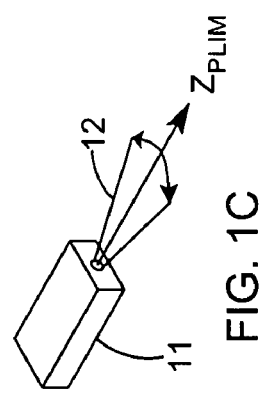
FIG. 1D
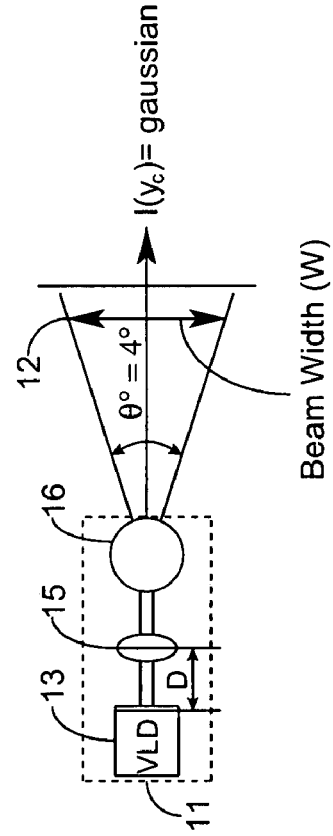
FIG. 1E1
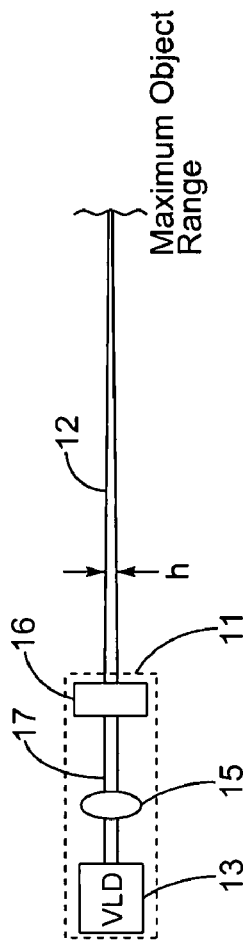
FIG. 1E2

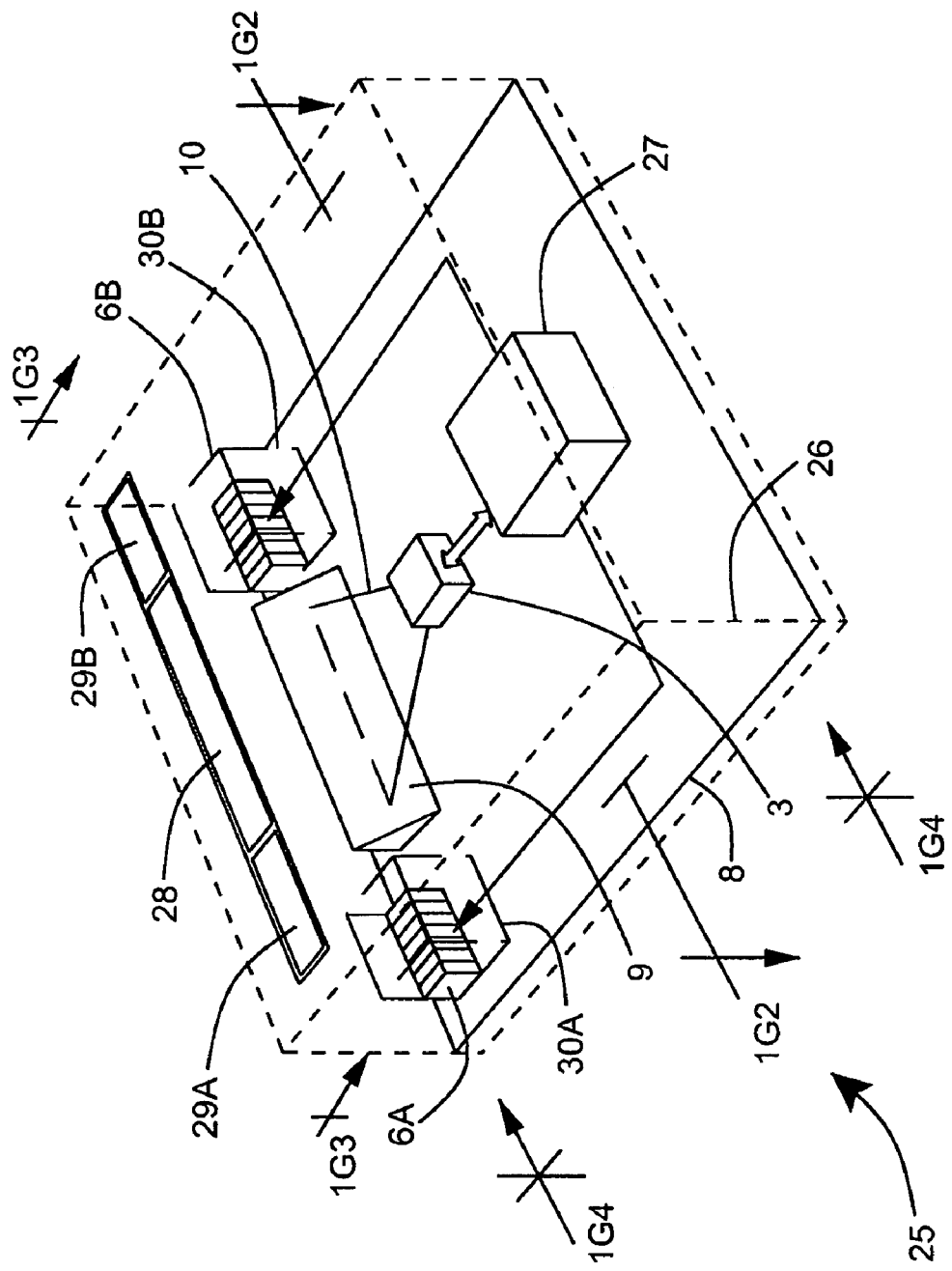
FIG. 1G1

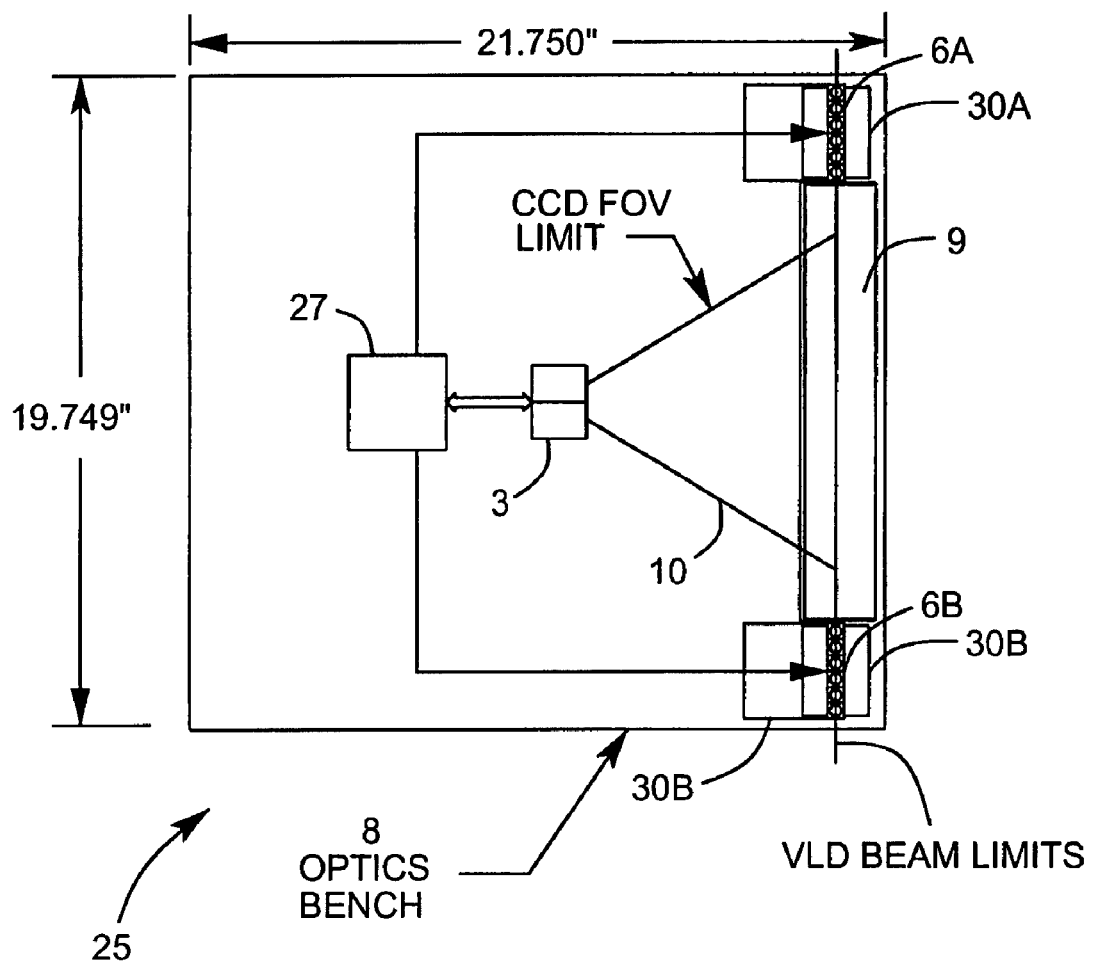
FIG. 1G2

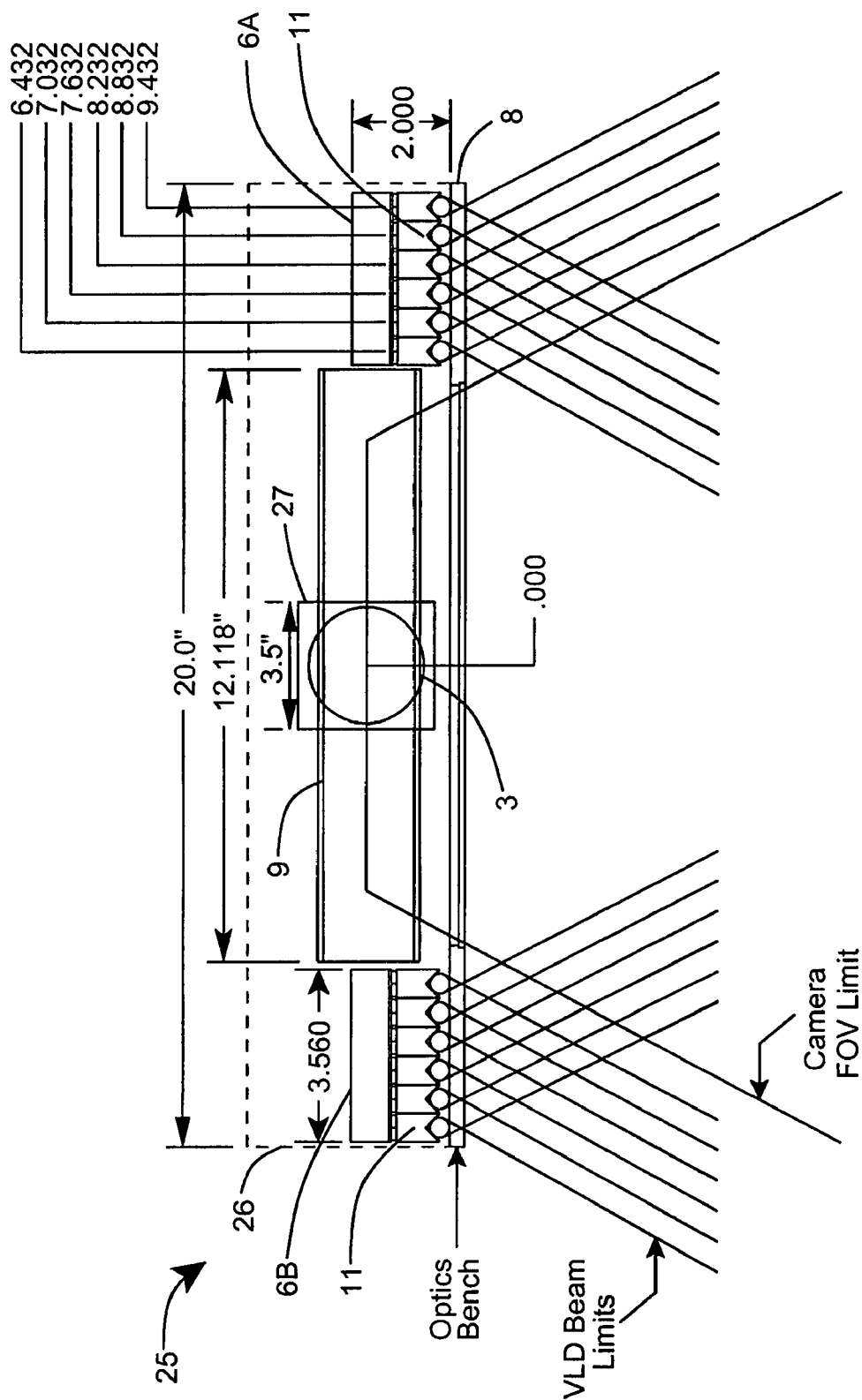
FIG. 1G3

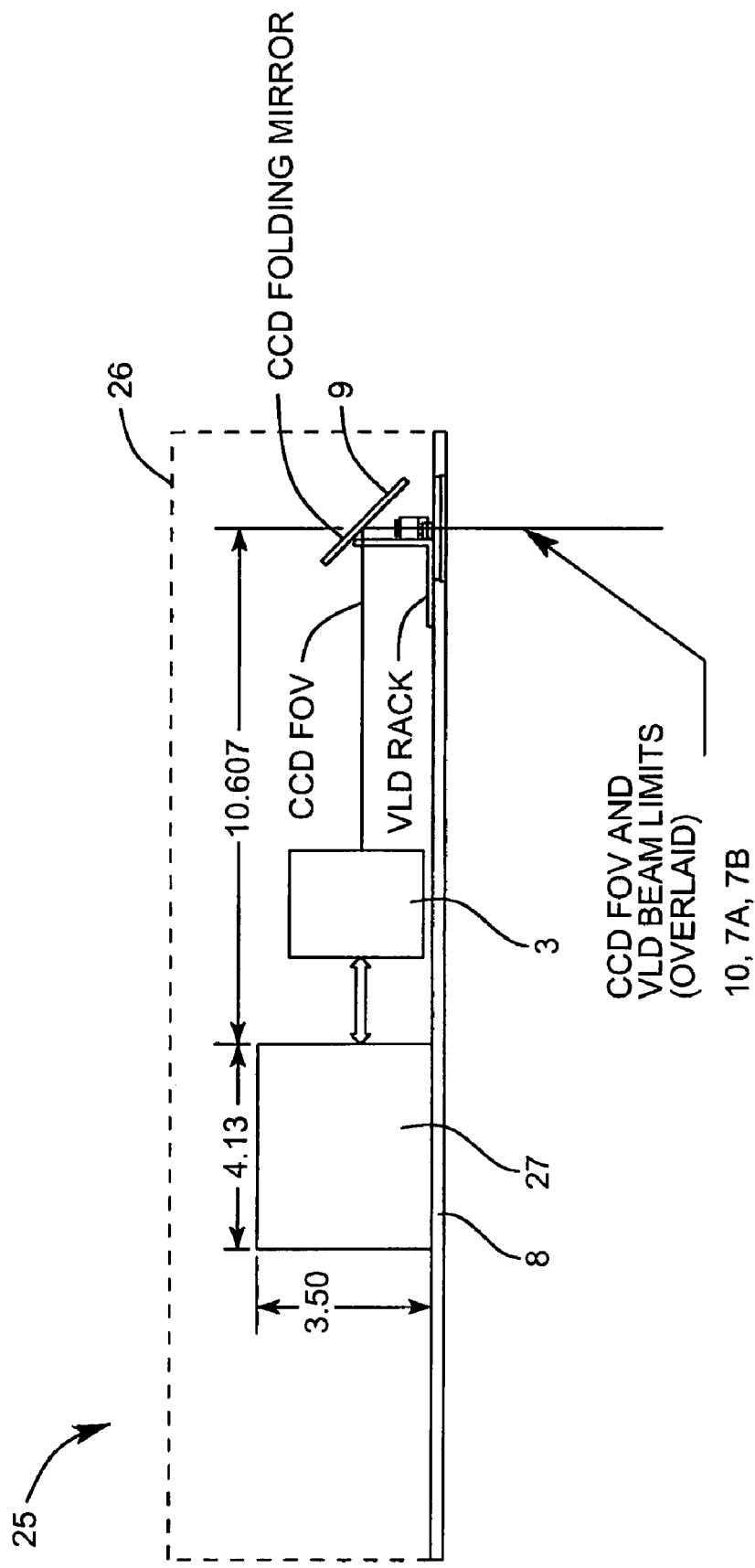
FIG. 1G4

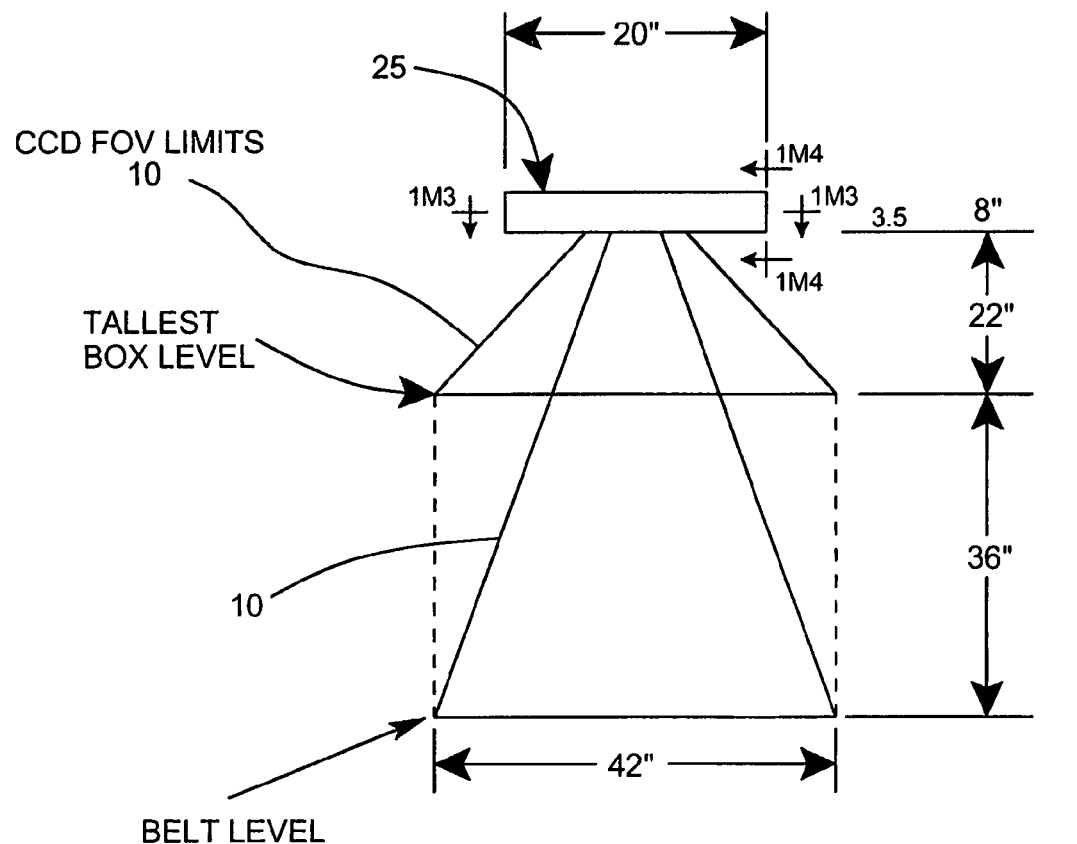
FIG. 1G5

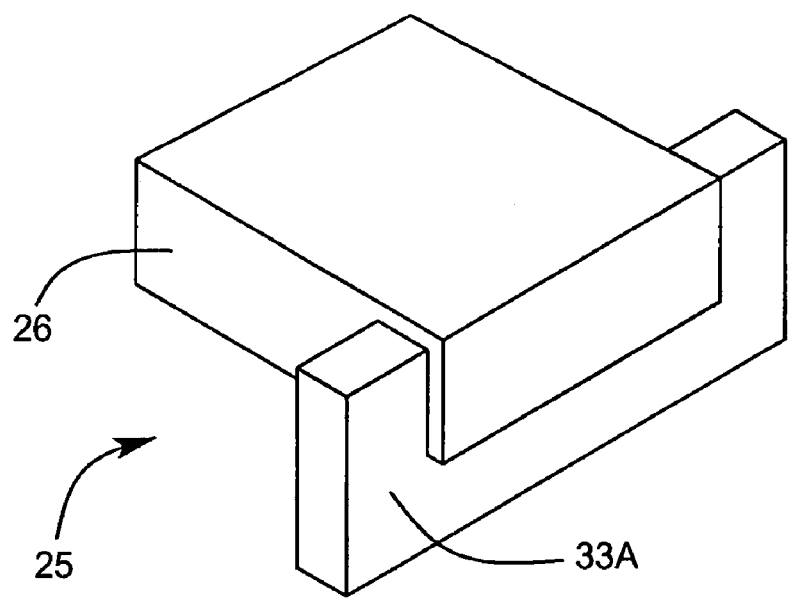
FIG. 1G6
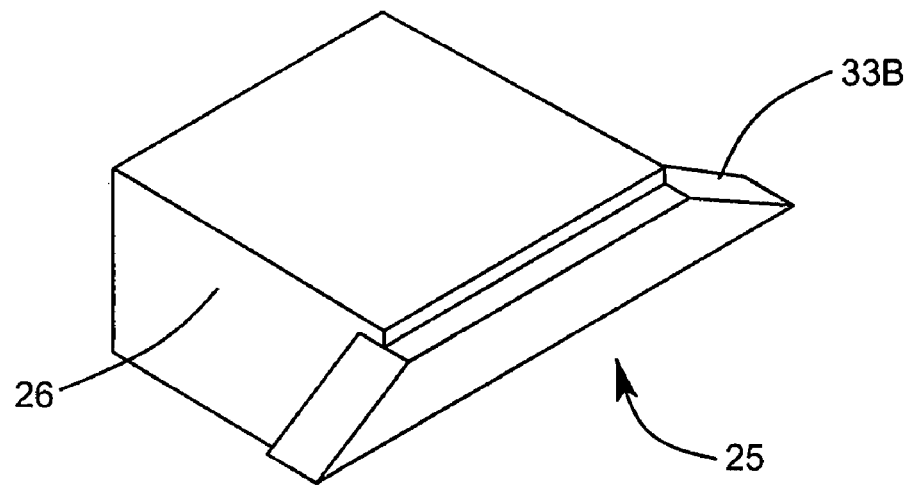
FIG. 1G7

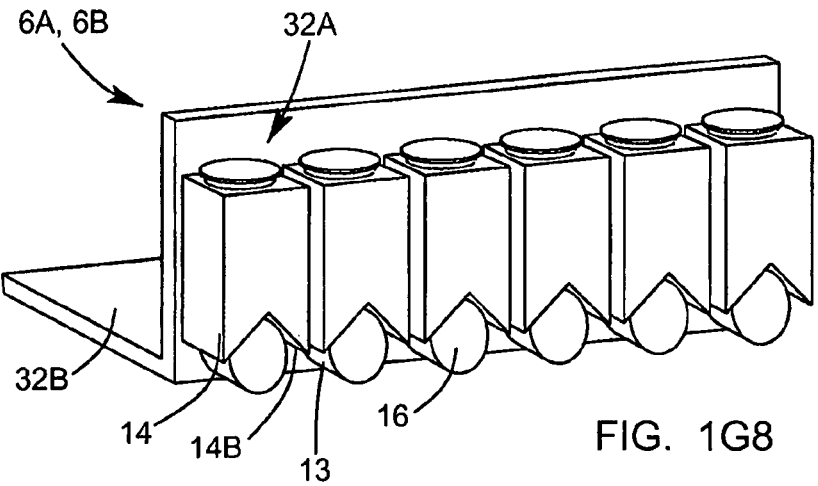
FIG. 1G8
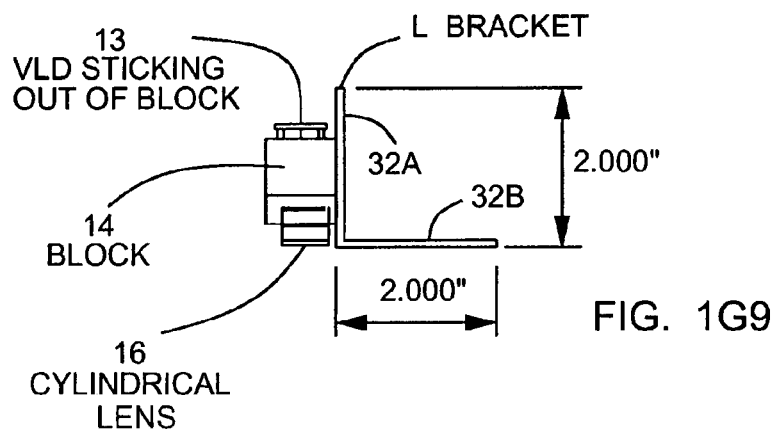
FIG. 1G9
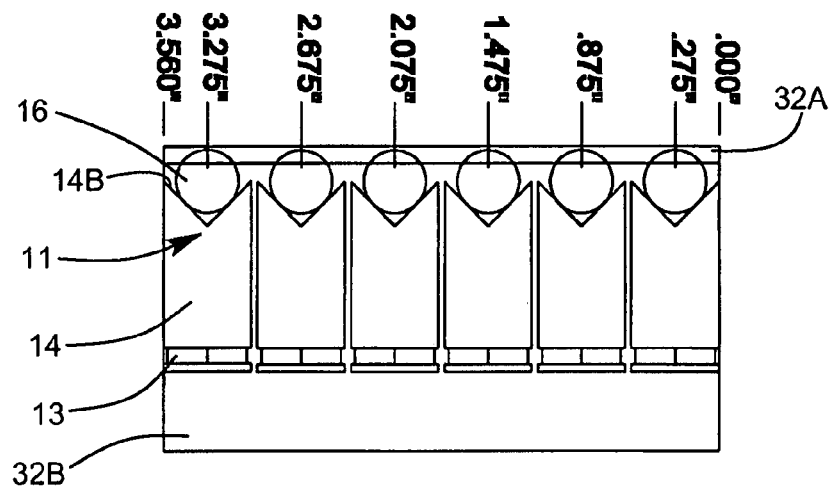
FIG. 1G10

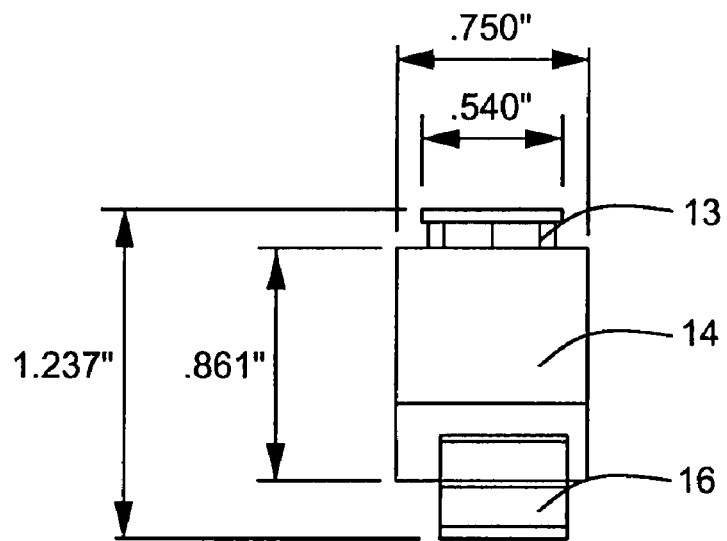
FIG. 1G11
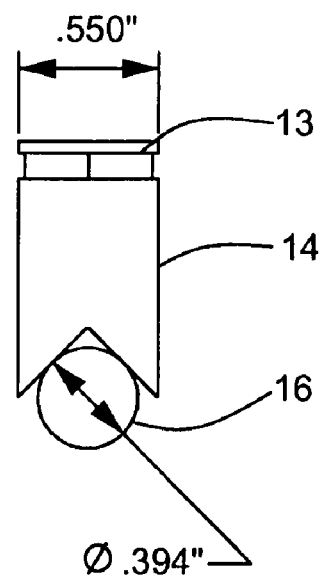
FIG. 1G12

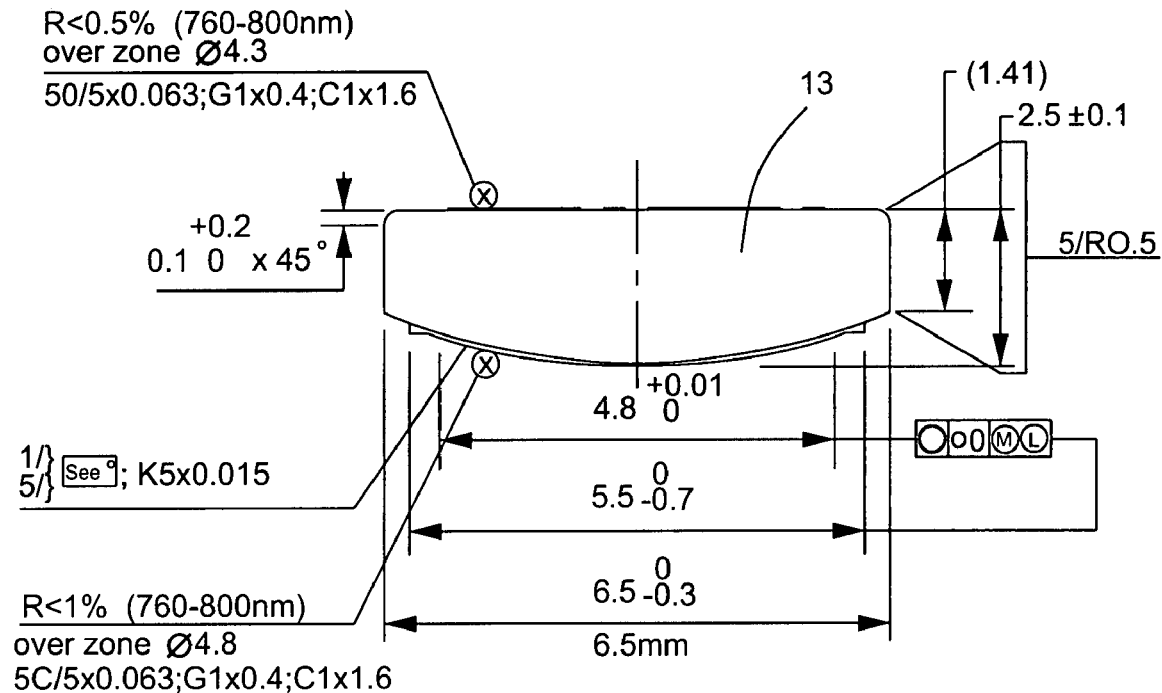
FIG. 1H1
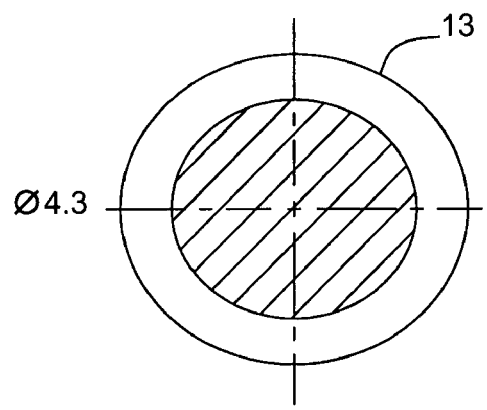
FIG. 1H2

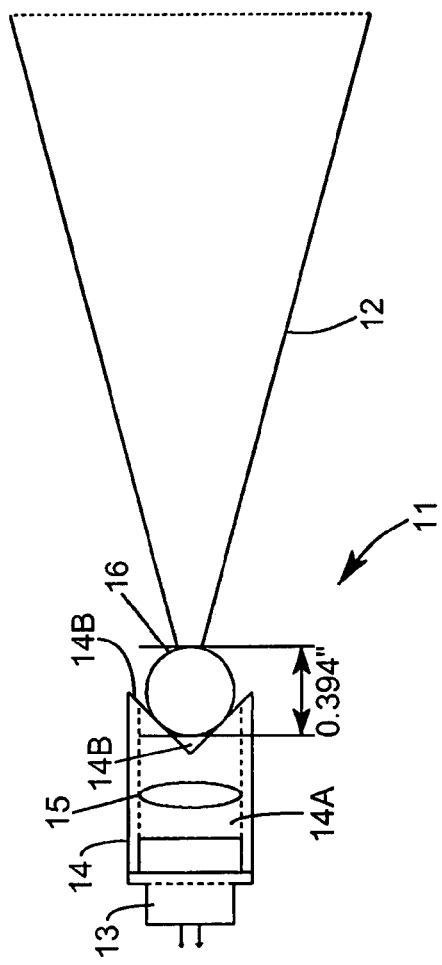
FIG. 1I1
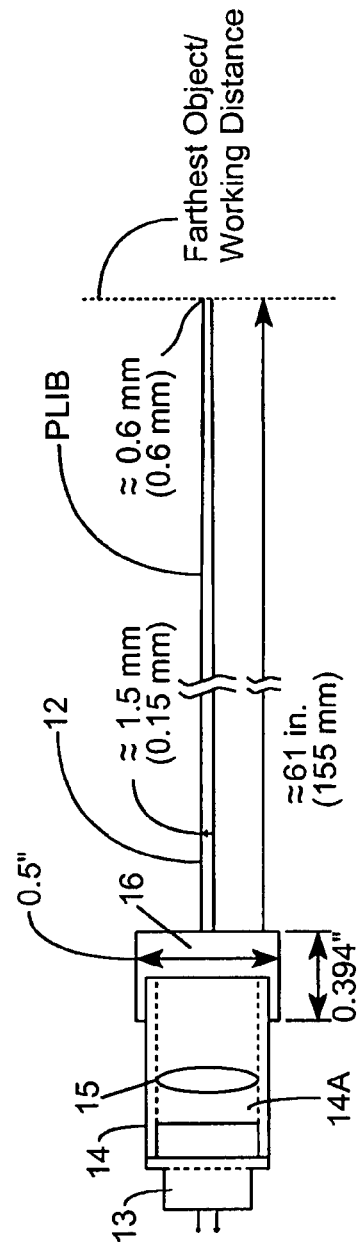
FIG. 1I2

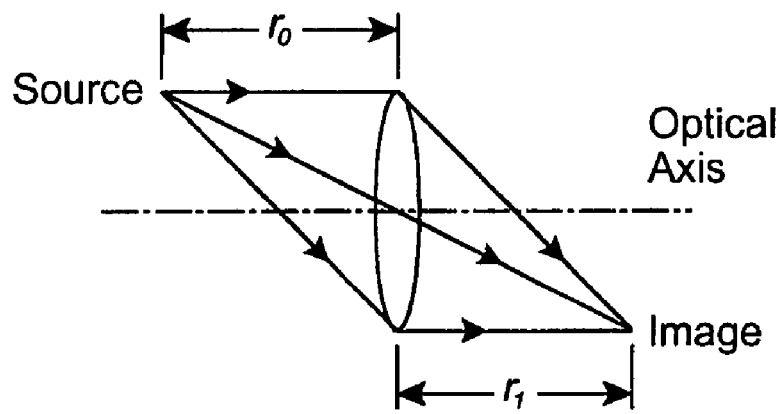
FIG. 1J1
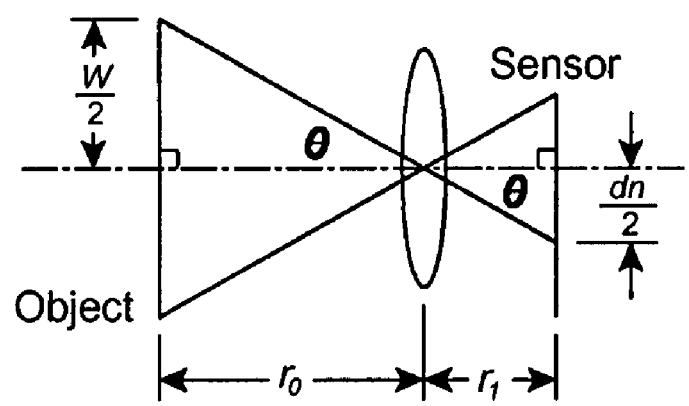
FIG. 1J2

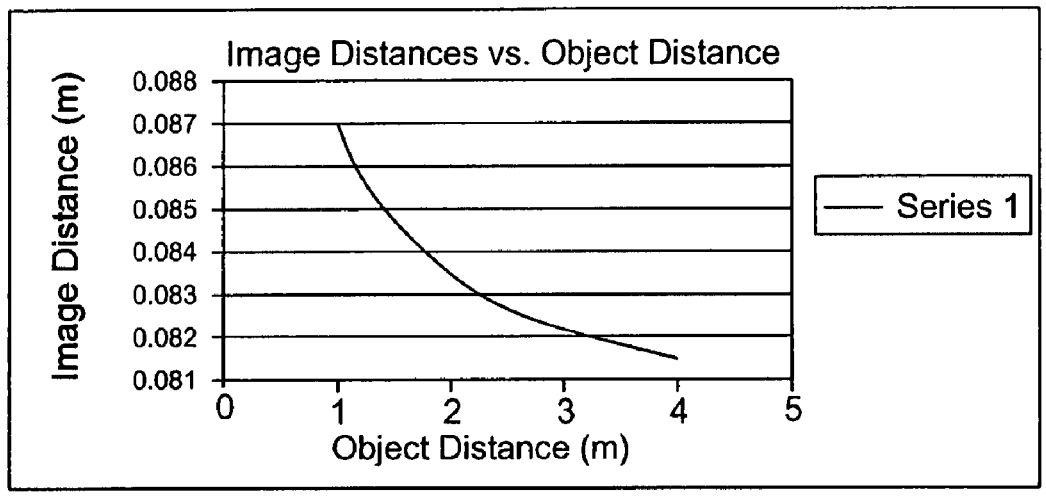
FIG. 1J3
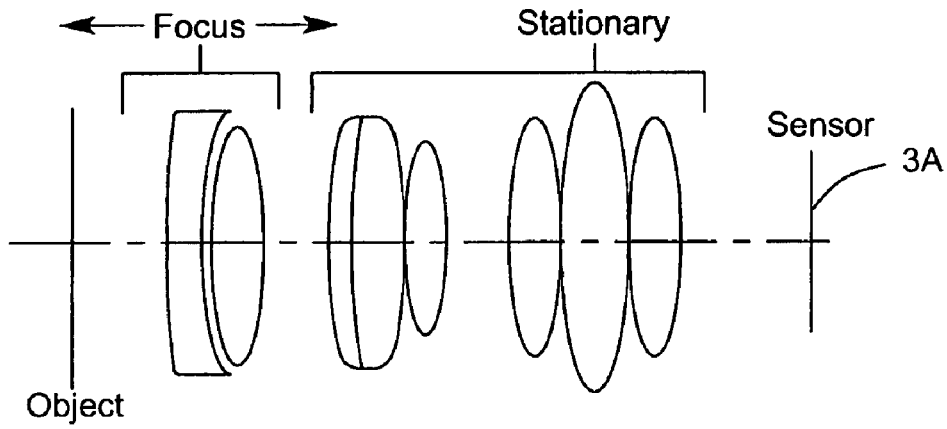
FIG. 1J4
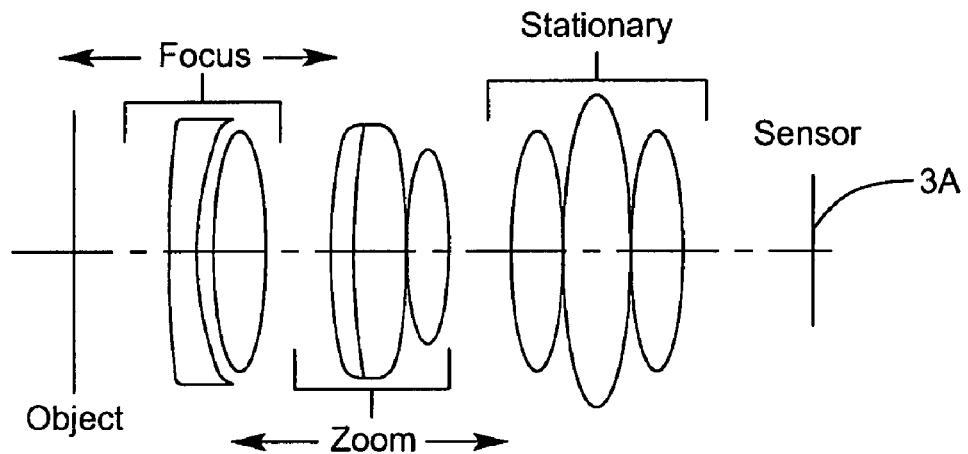
FIG. 1J5

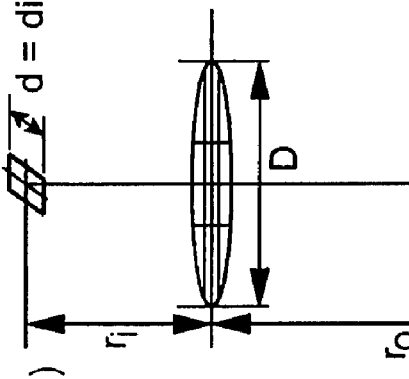
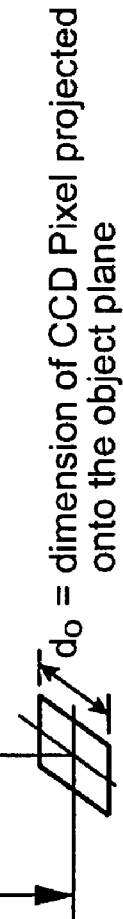

Assumptions:
1) Objects are Lambertian Scatterers
2) Object Reflectance = 100%
3) Optical Transmittance = 100%
4) Square CCD pixels d = dimension of CCD Pixel
$d_o$ = dimension of CCD Pixel projected onto the object plane $E_{ccd}$ = CCD irradiance (in Watts / meter squared)

f = Lens Focal Length
F = Lens f-stop
$r_i$ = Image Distance
$r_o$ = Working Distance
m = Lens Magnification $E_{obj.}$ = Evenly distributed irradiance (in Watts / meter squared)

CCD-Based Scanner

FIG. 1J6

Fixed Focal Length
Lens Cases
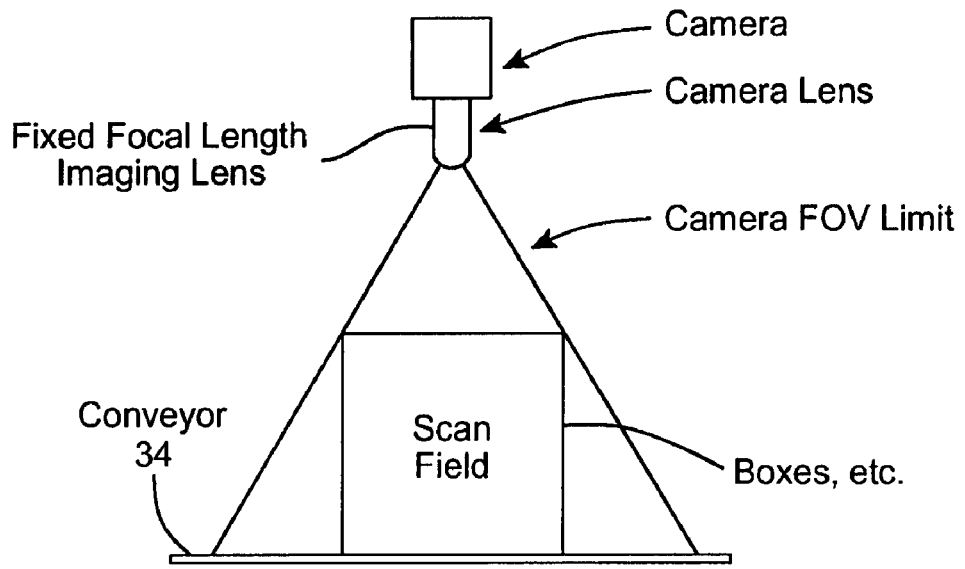
FIG. 1K1
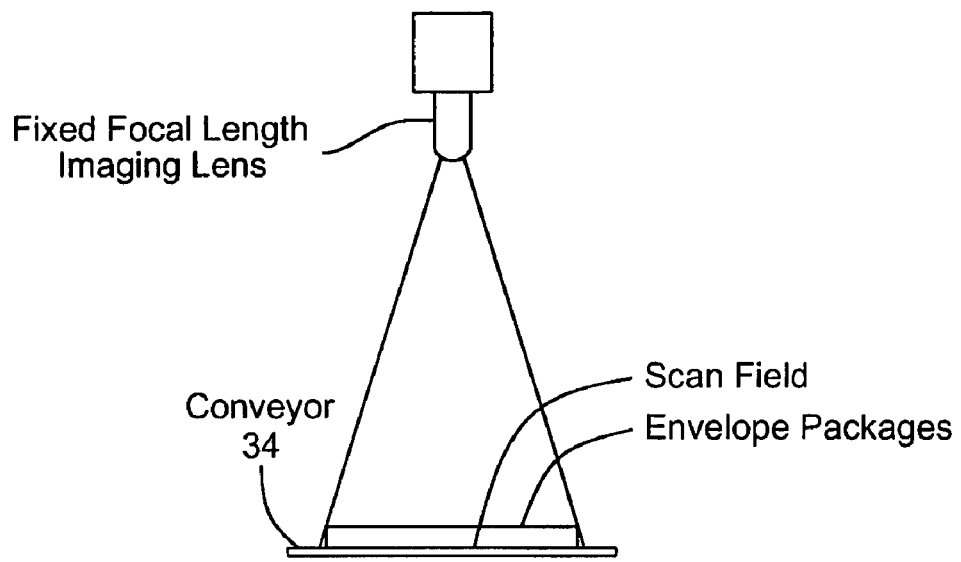
FIG. 1K2

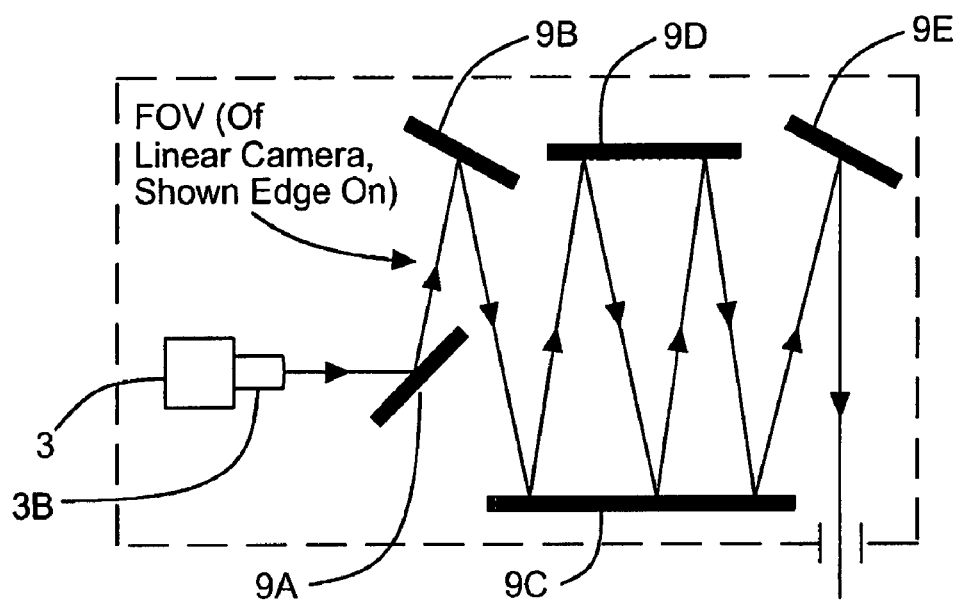
FIG. 1L1
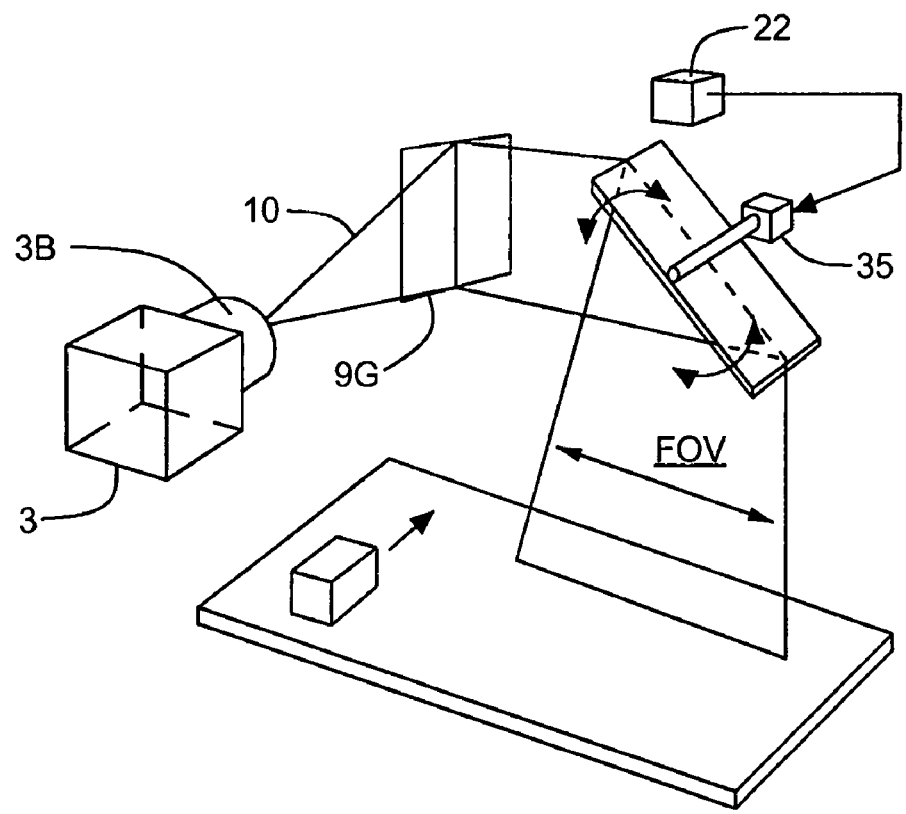
FIG. 1L2

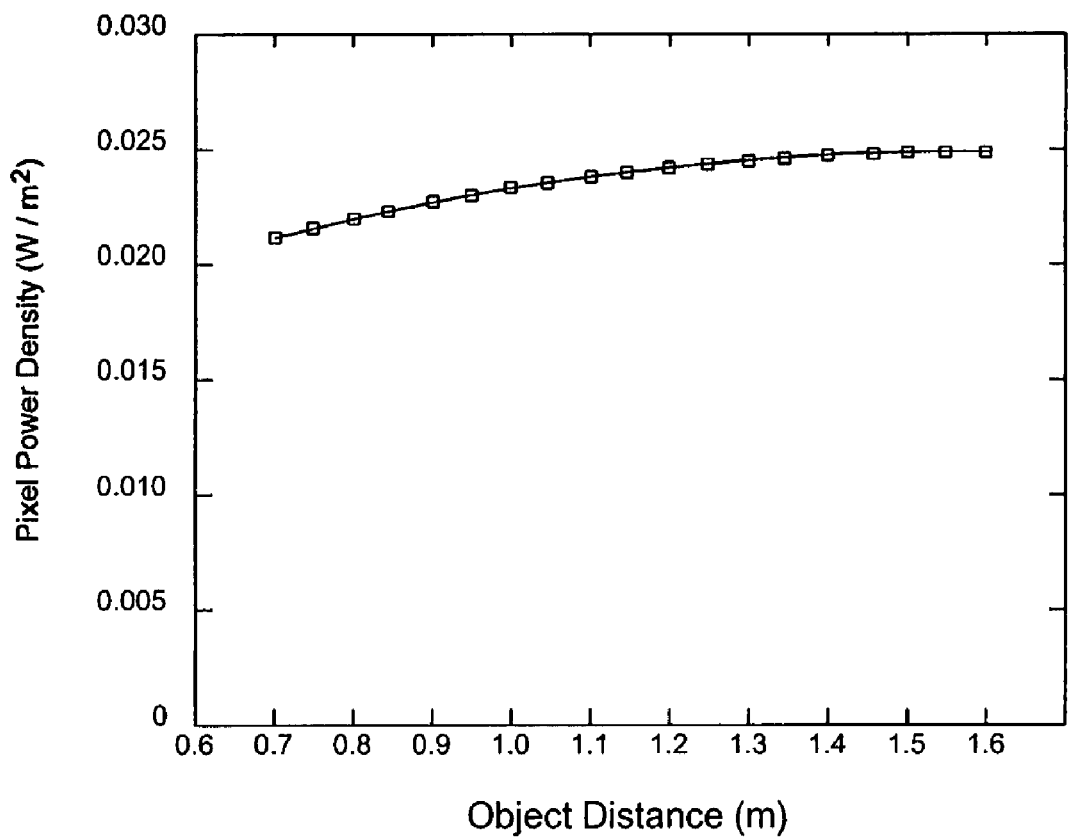
FIG. 1M1

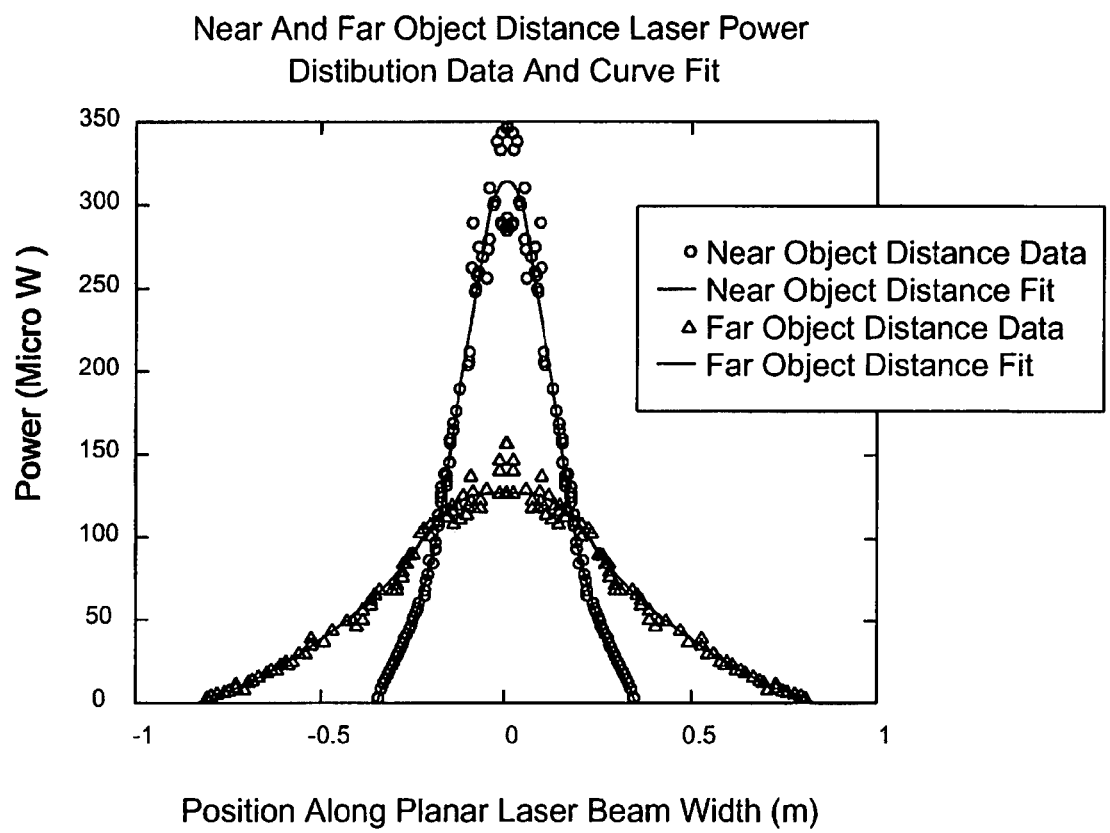
FIG. 1M2

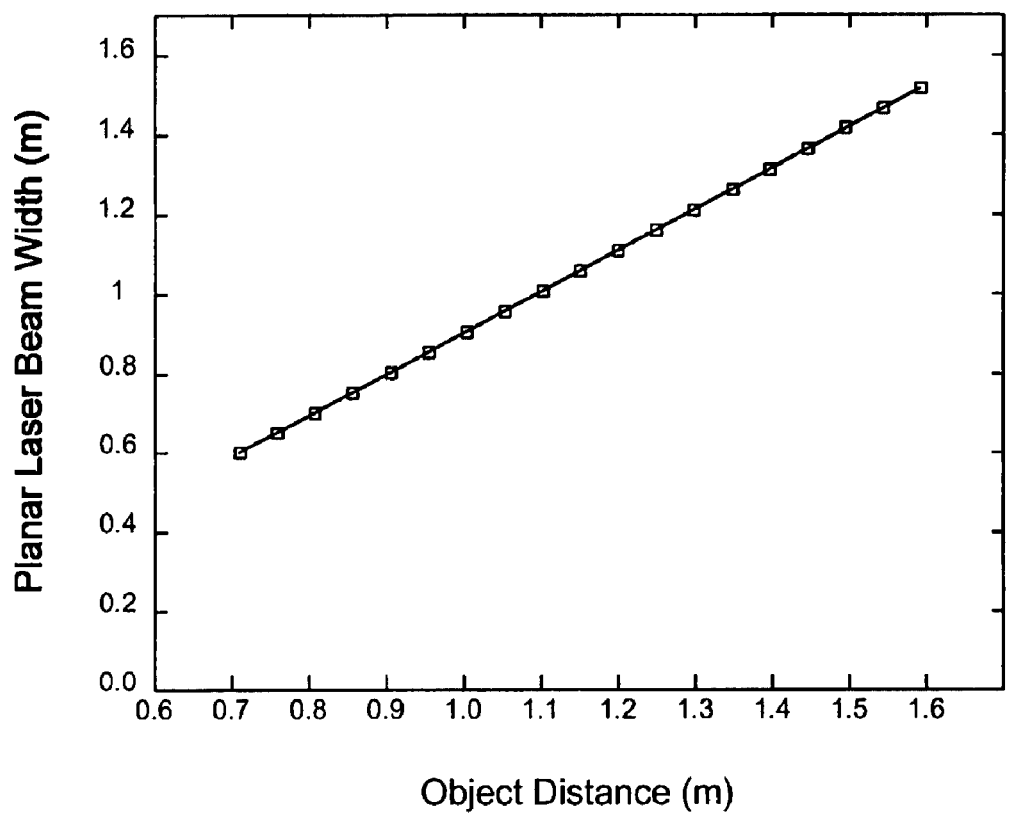
FIG. 1M3

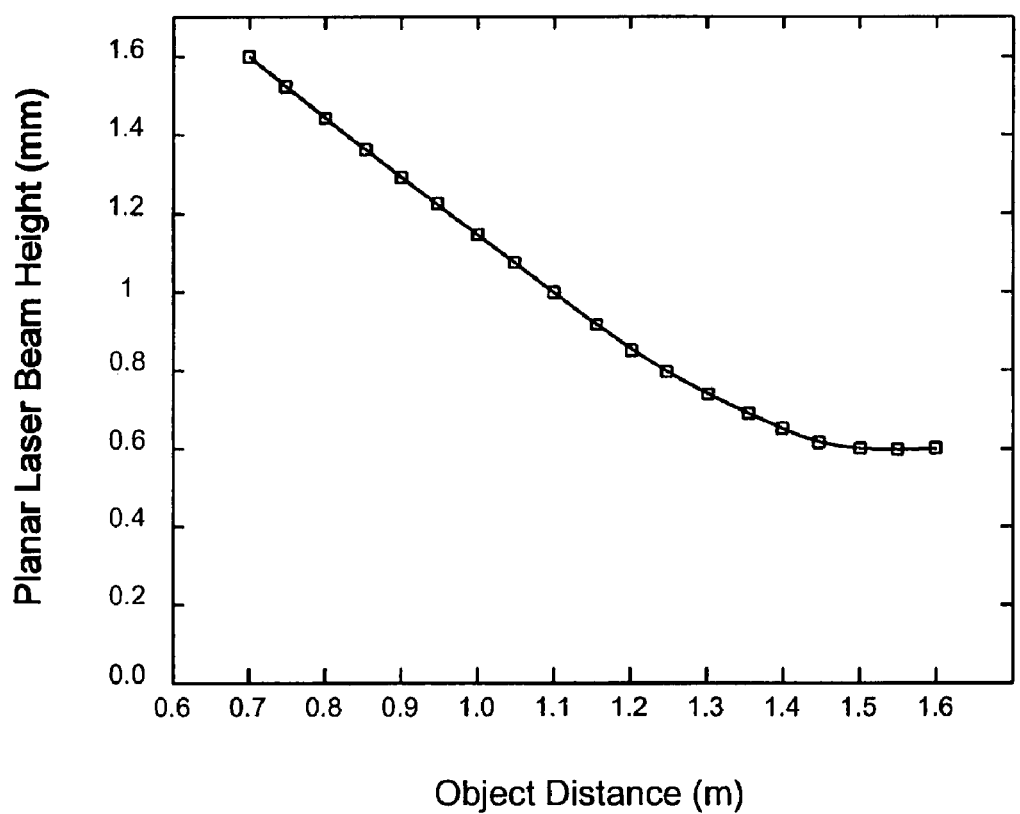
FIG. 1M4

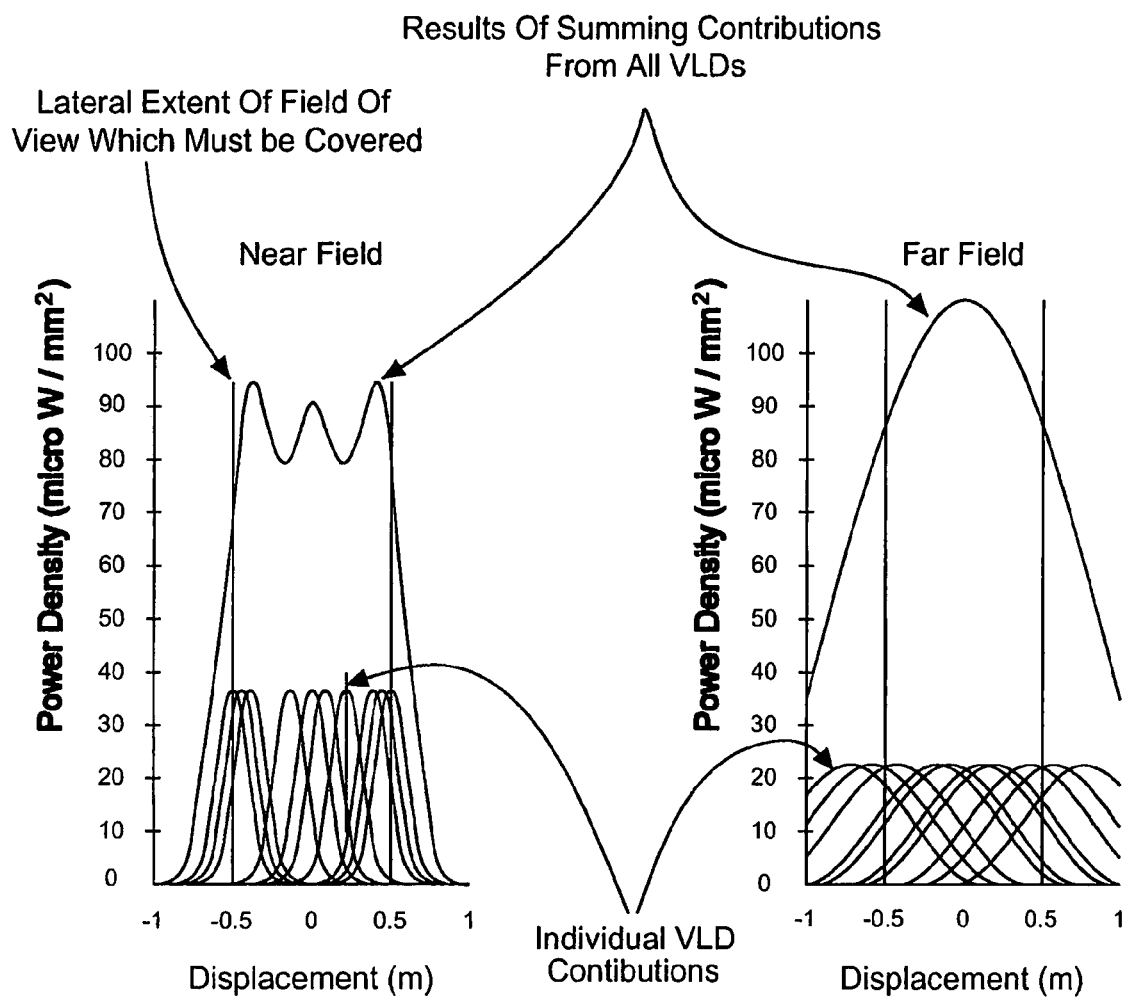
FIG. 1P1            FIG. 1P2

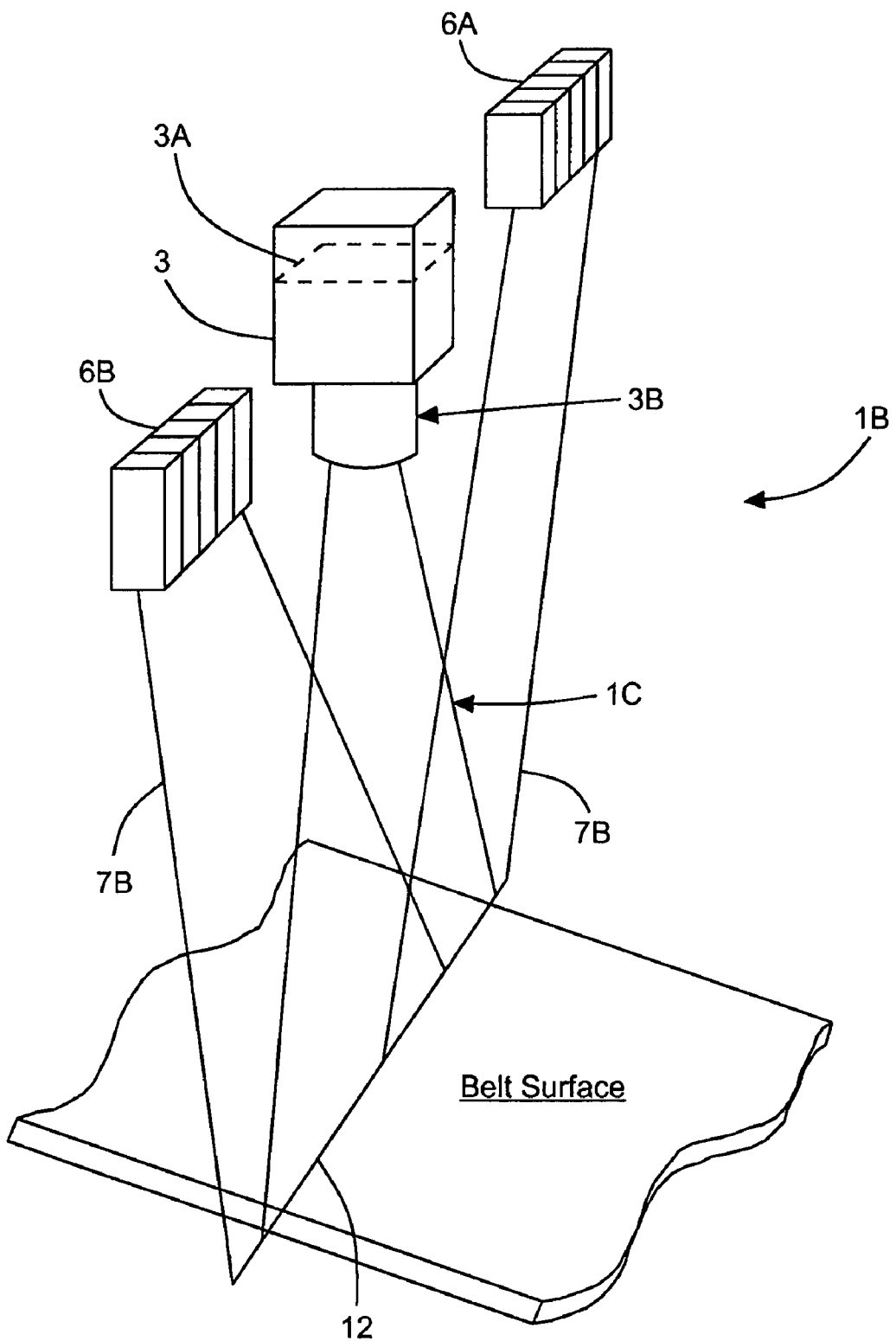
FIG. 1Q1

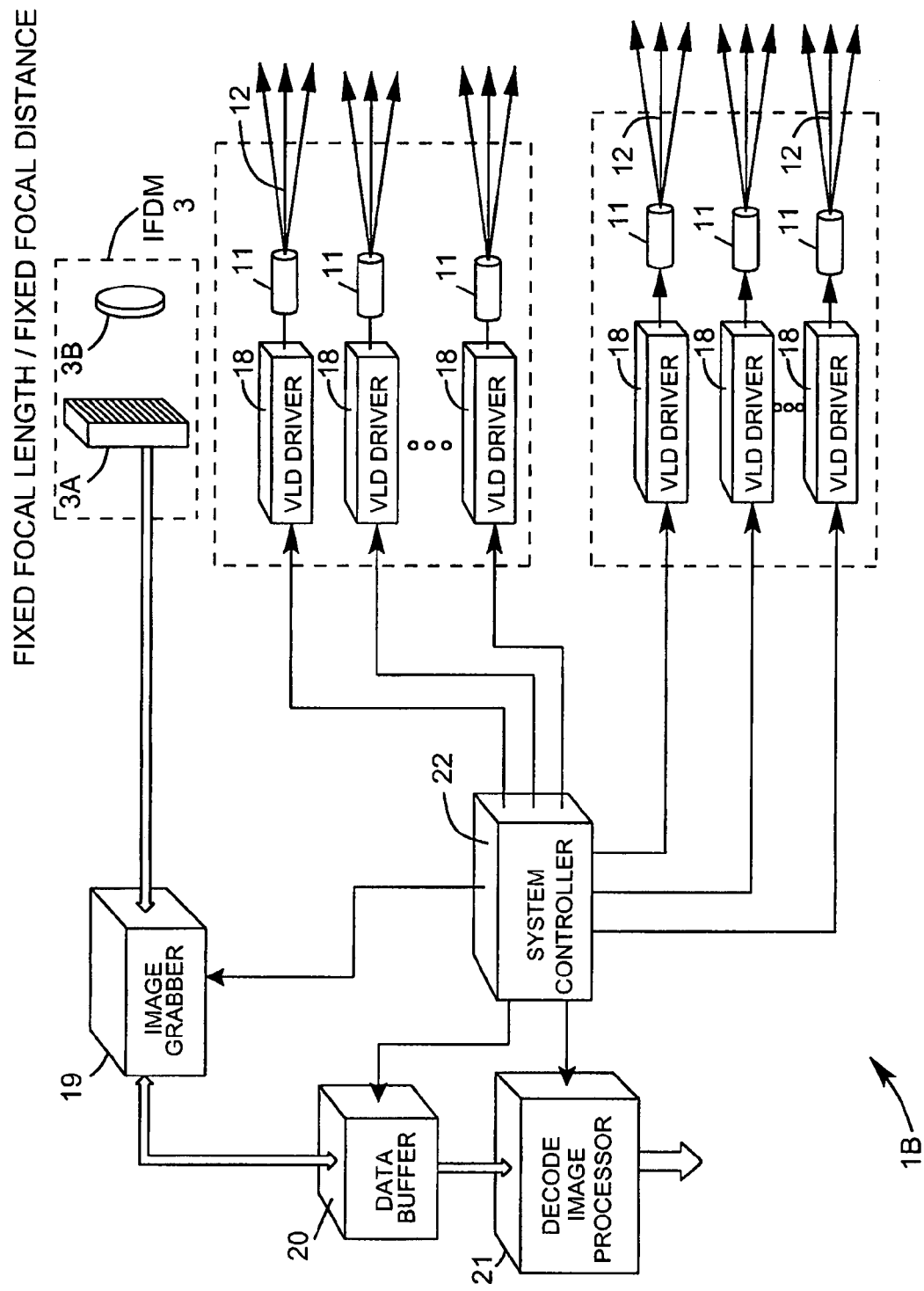
FIG. 1Q2

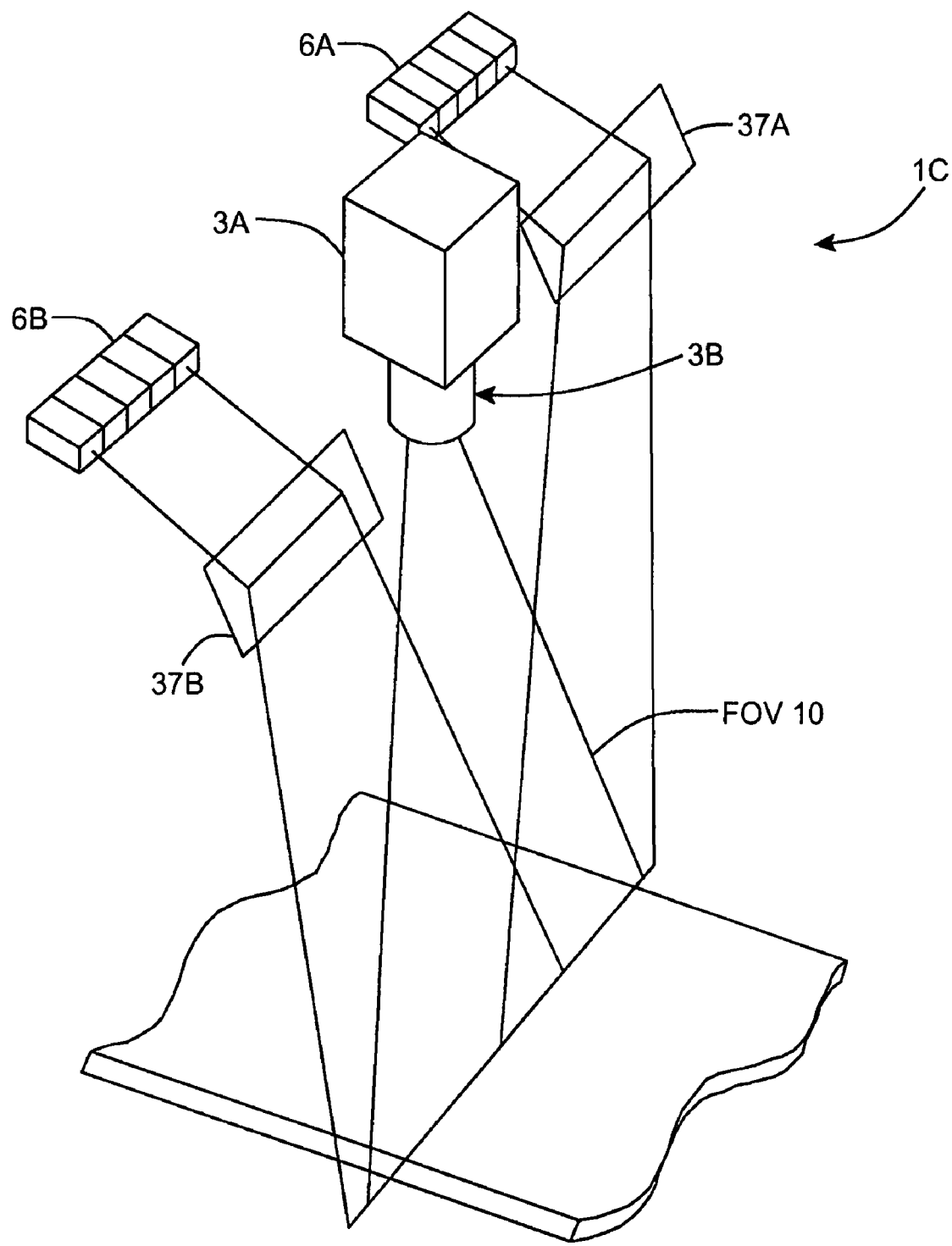
FIG. 1R1

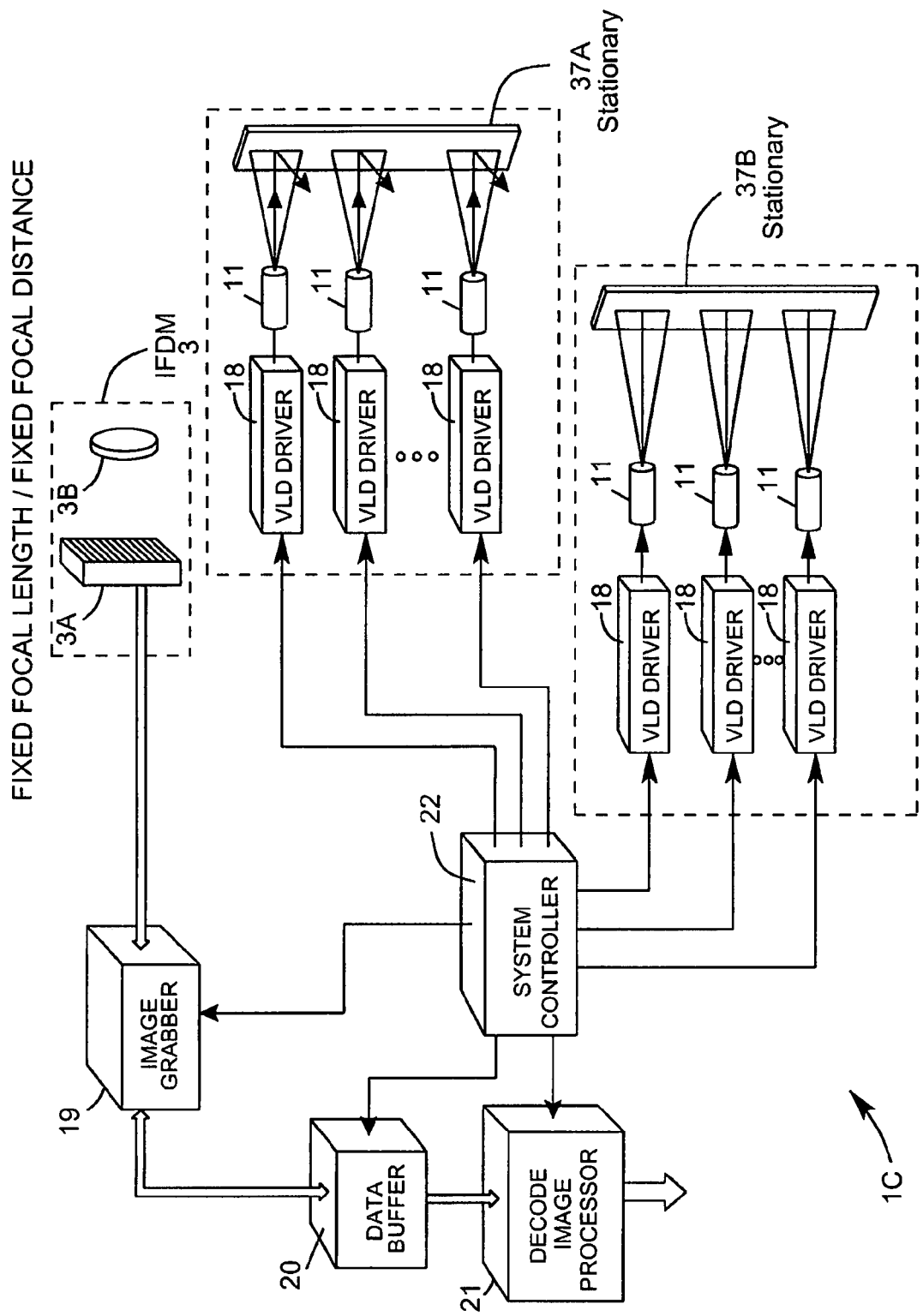
FIG. 1R2

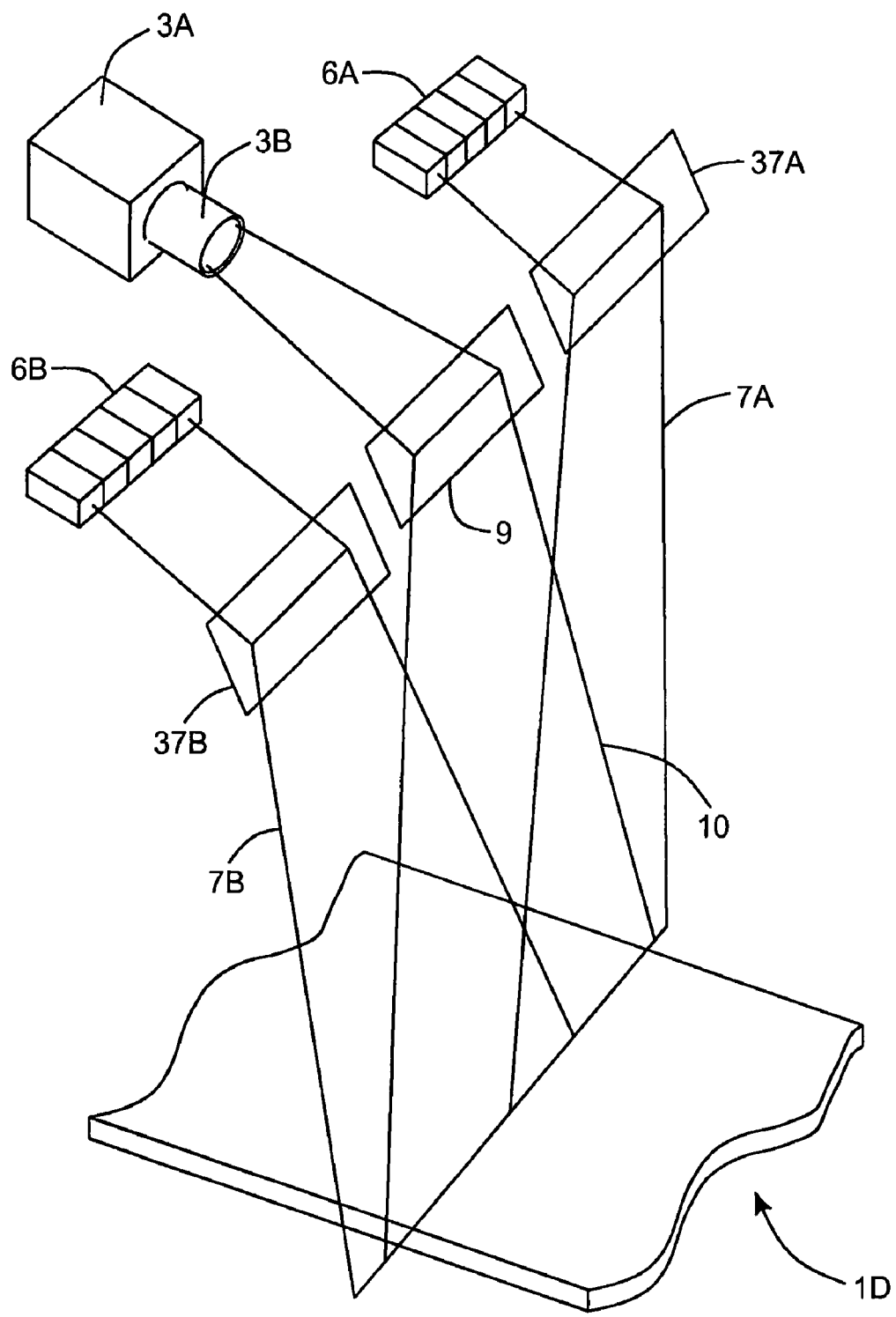
FIG. 1S1

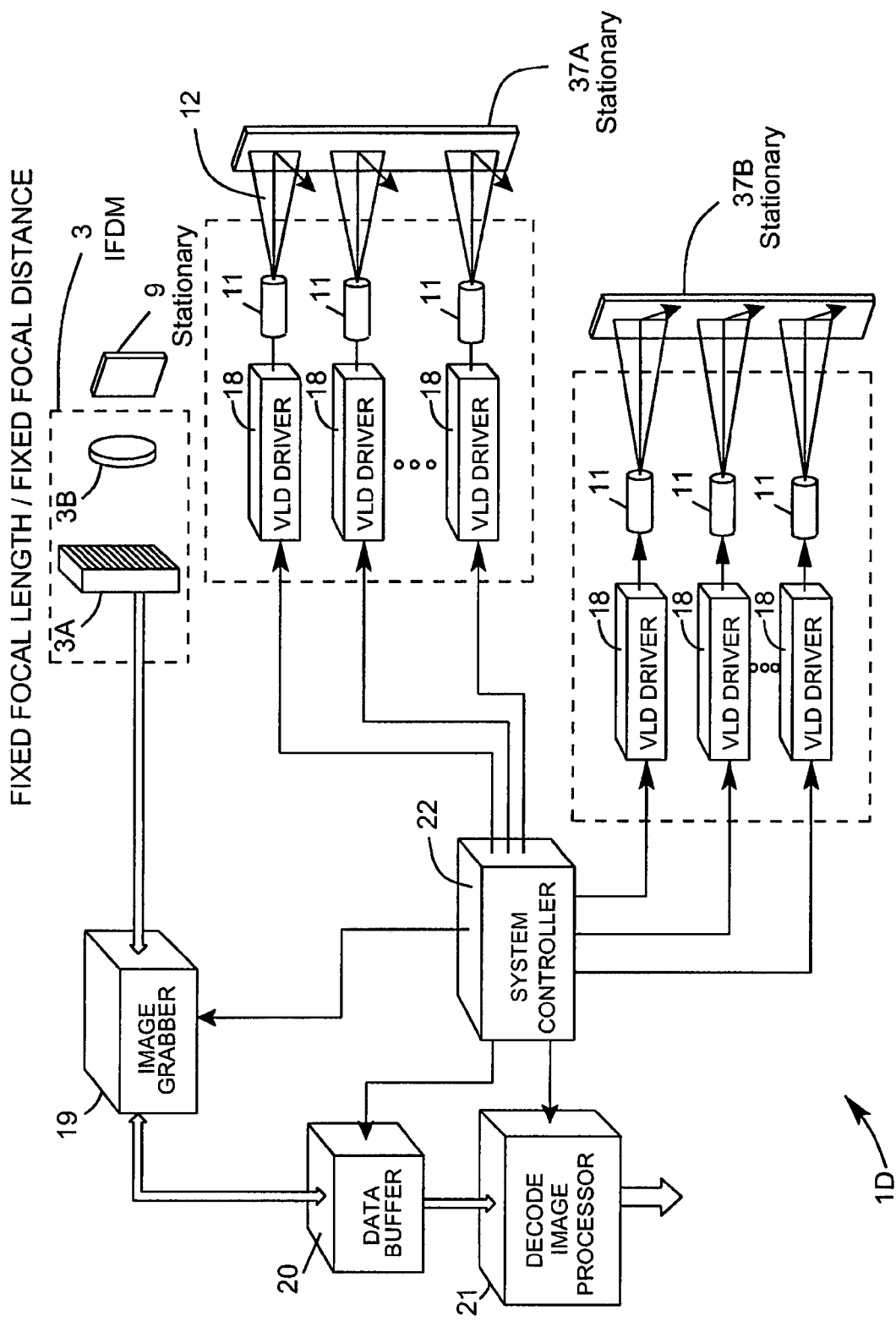
FIG. 1S2

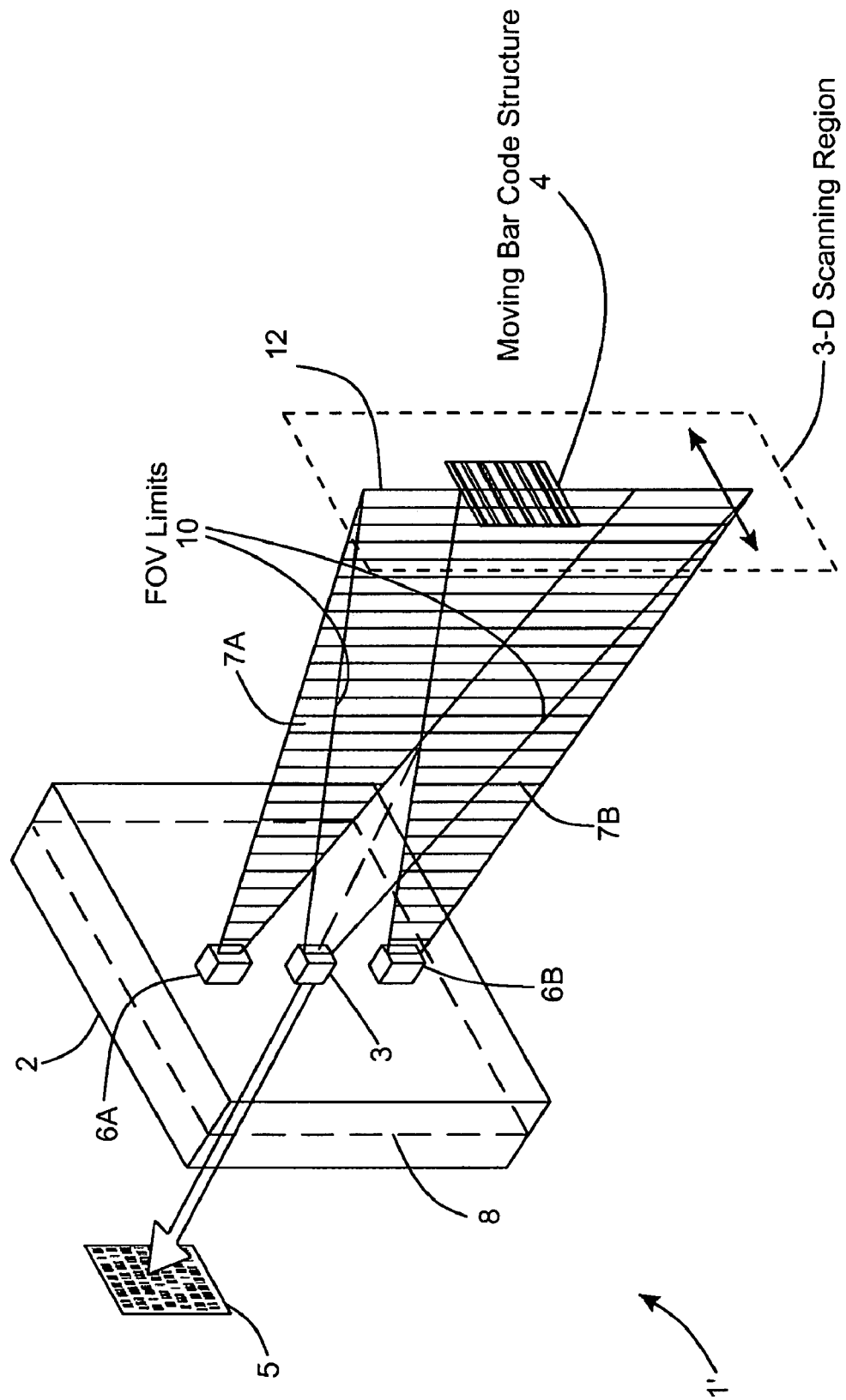
FIG. 1V1

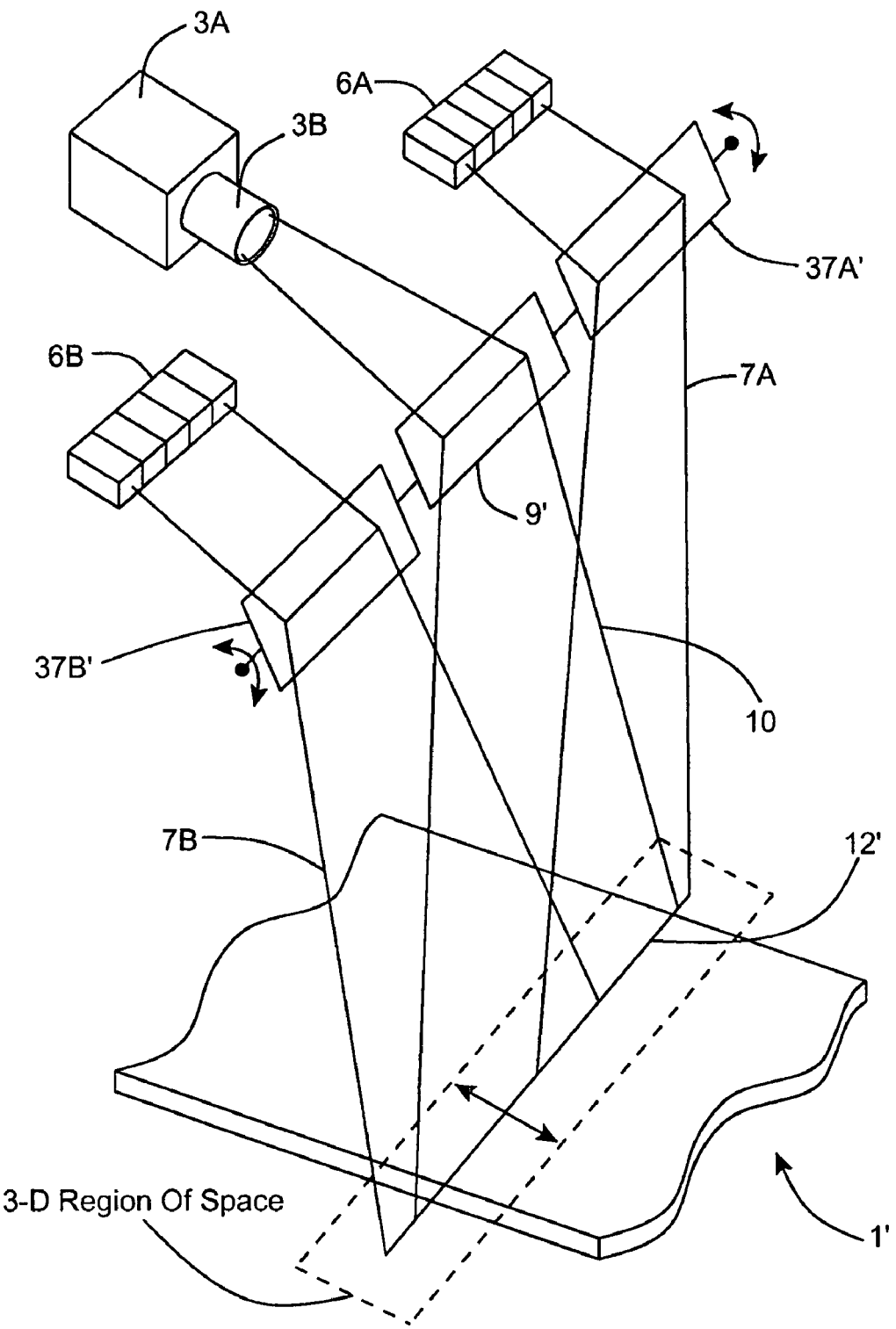
FIG. 1V2

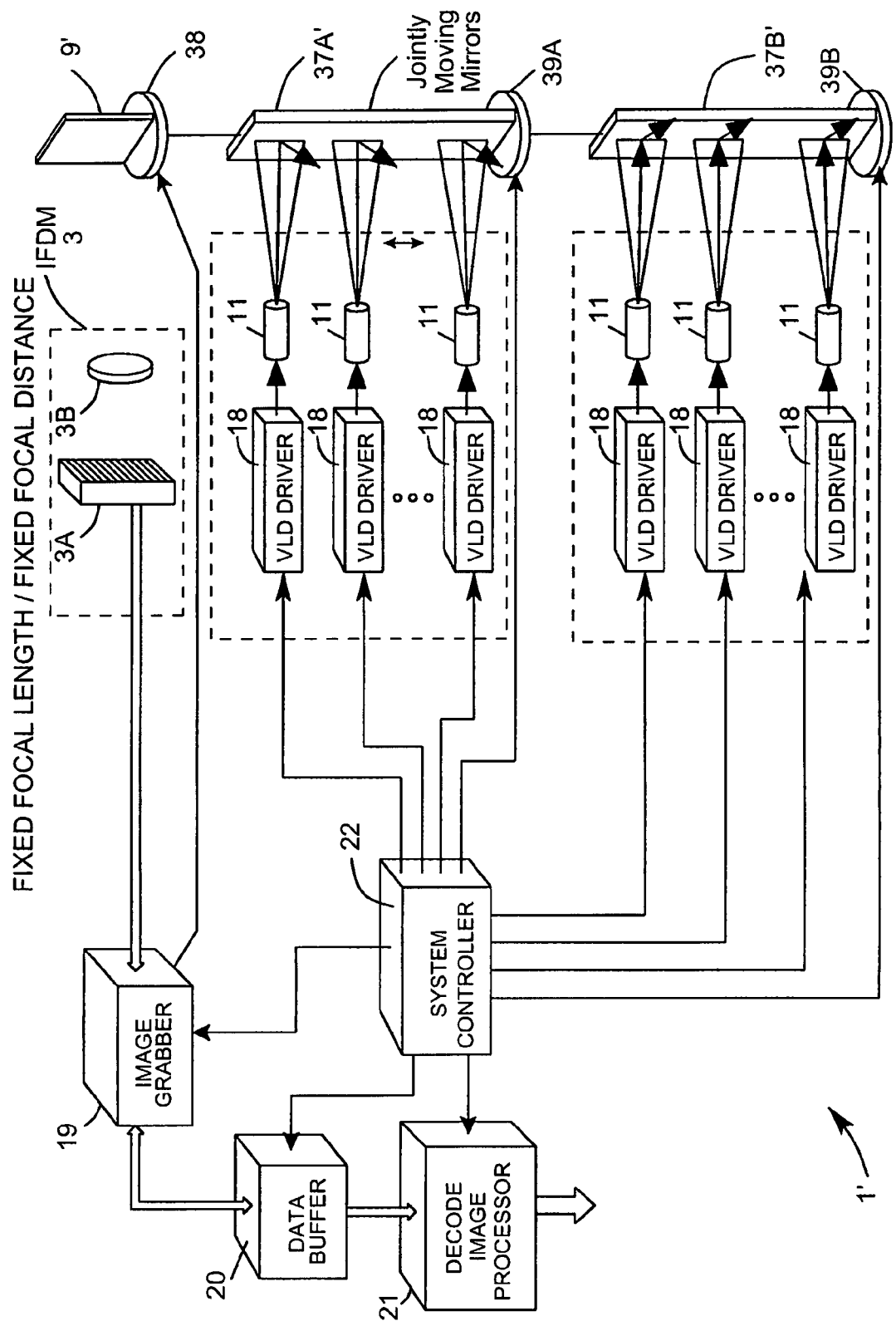
FIG. 1V3

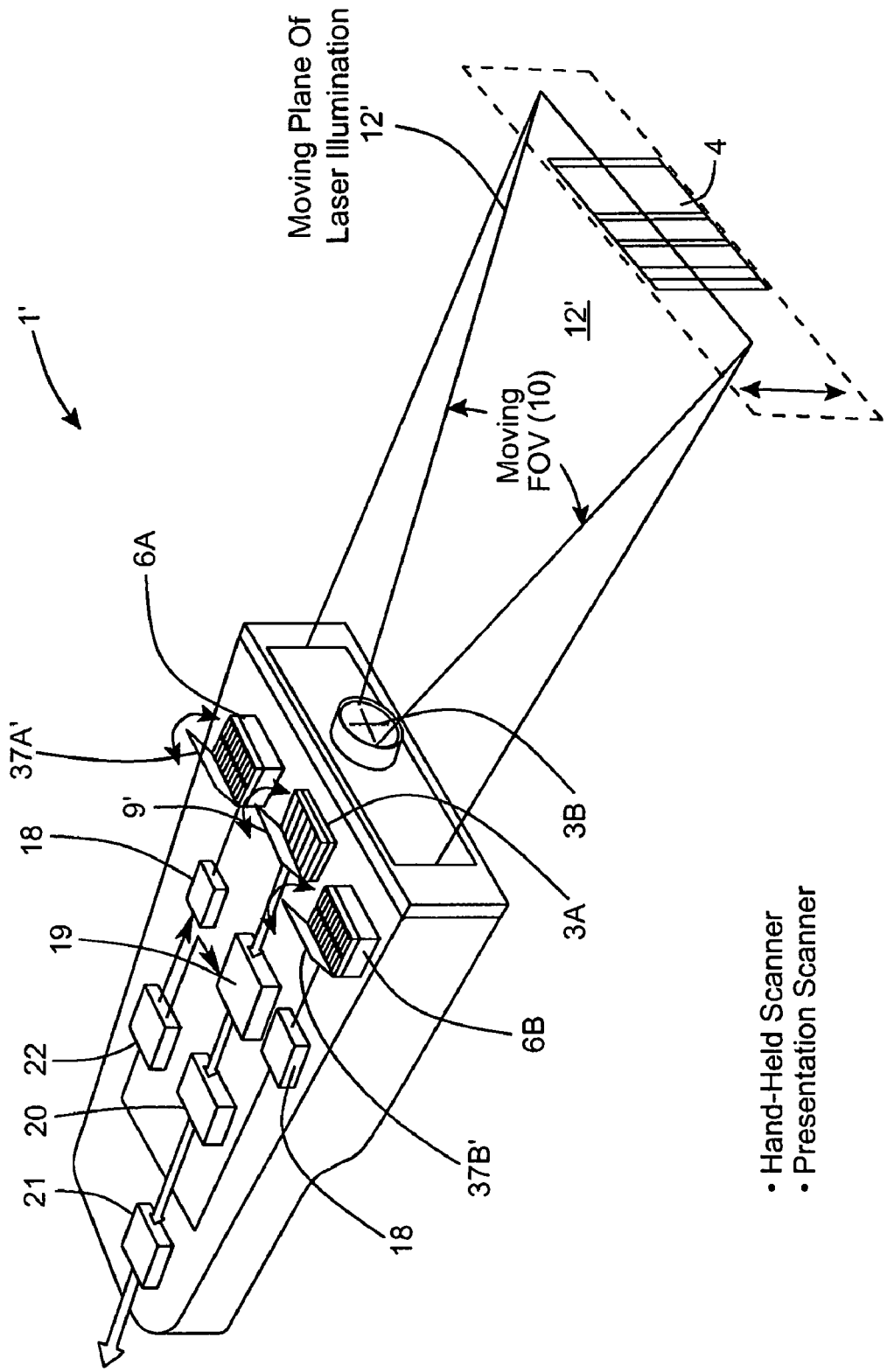
FIG. 1V4
- Hand-Held Scanner
- Presentation Scanner

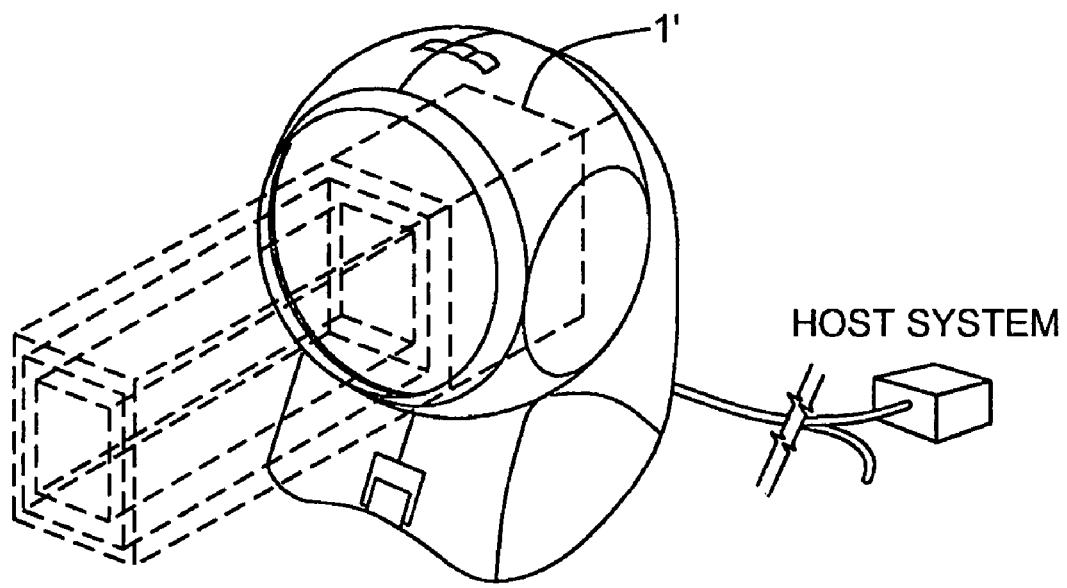
PRESENTATION TYPE SCANNER
FIG. 1V5

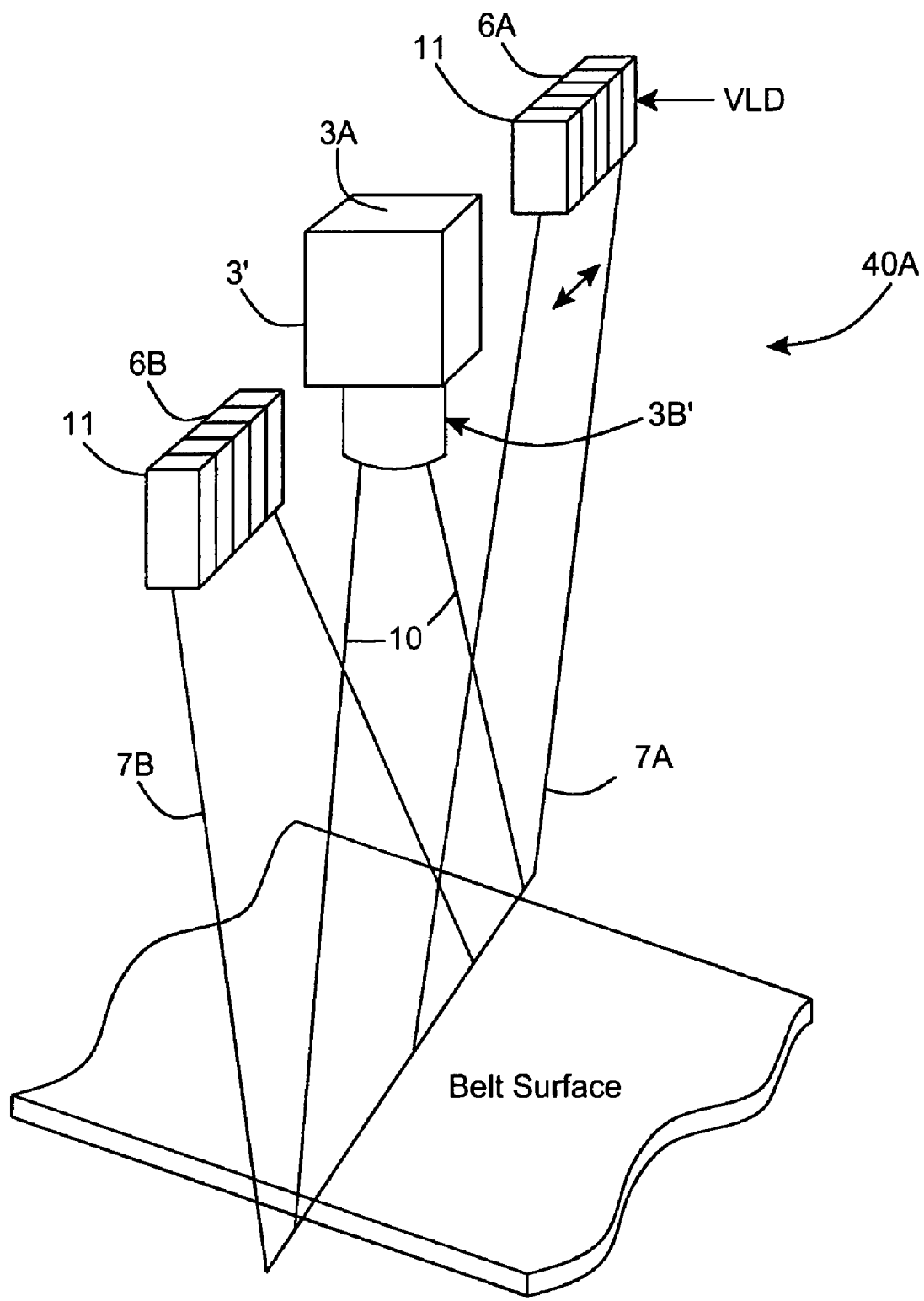
FIG. 2B1

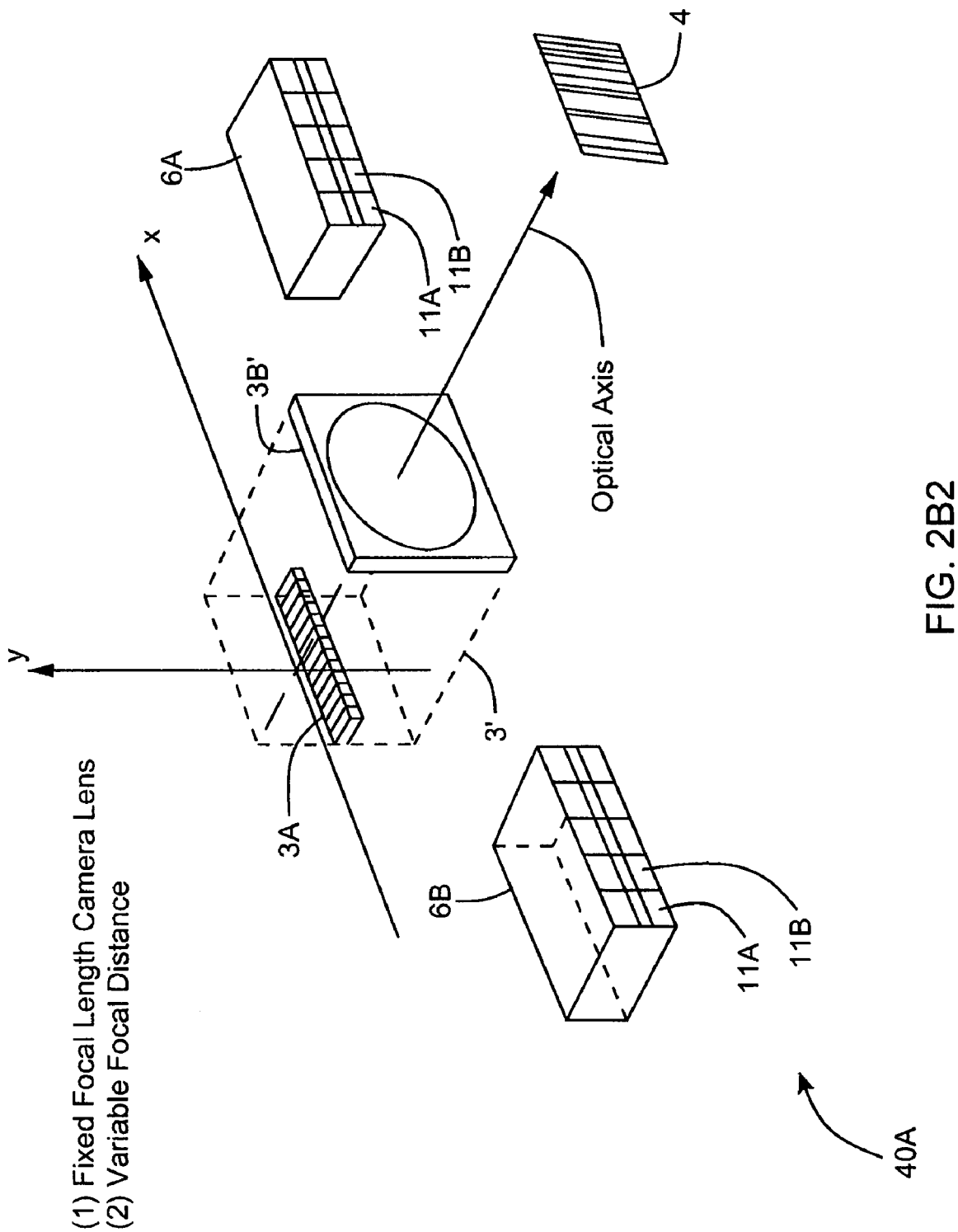
FIG. 2B2

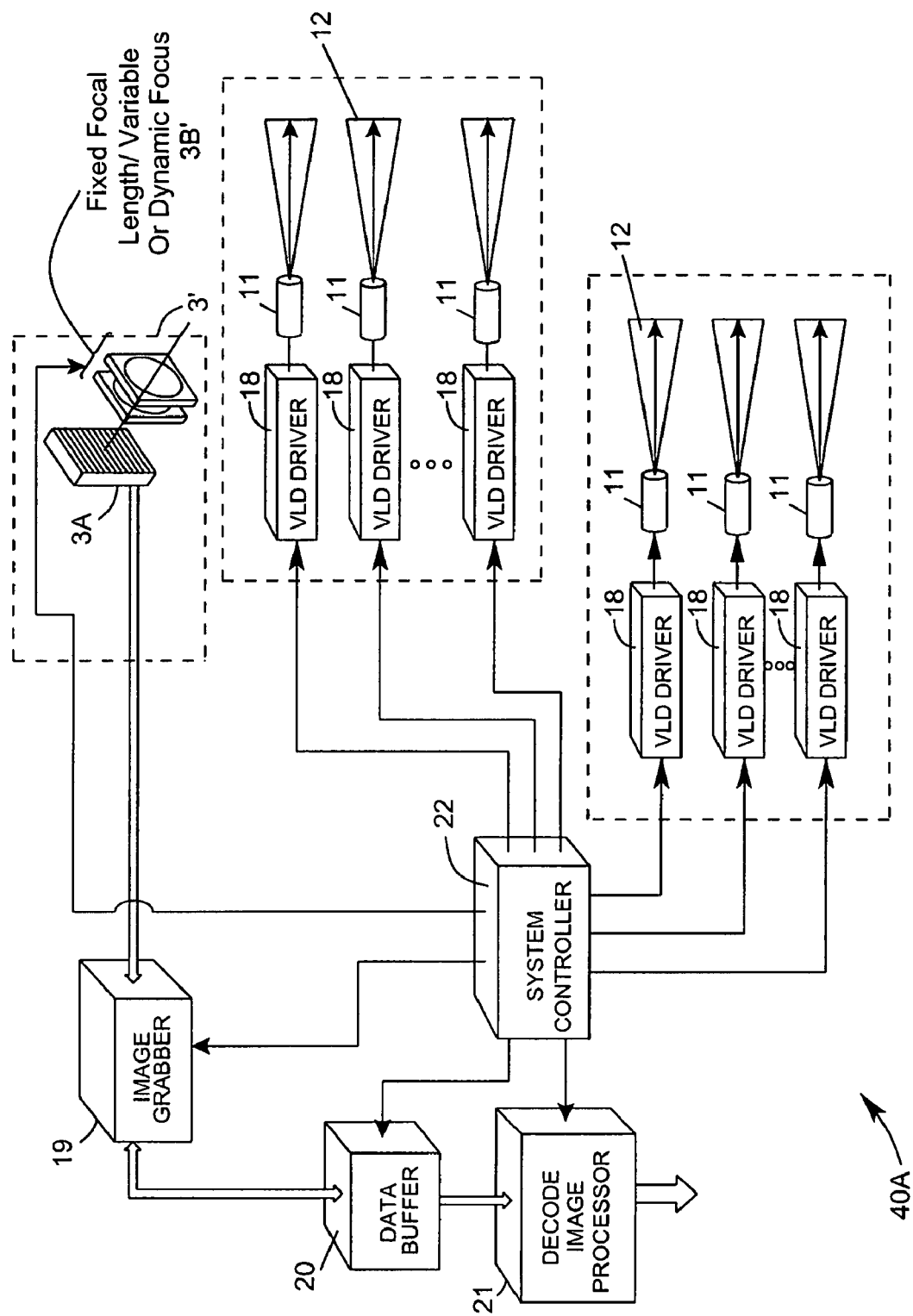
FIG. 2C1

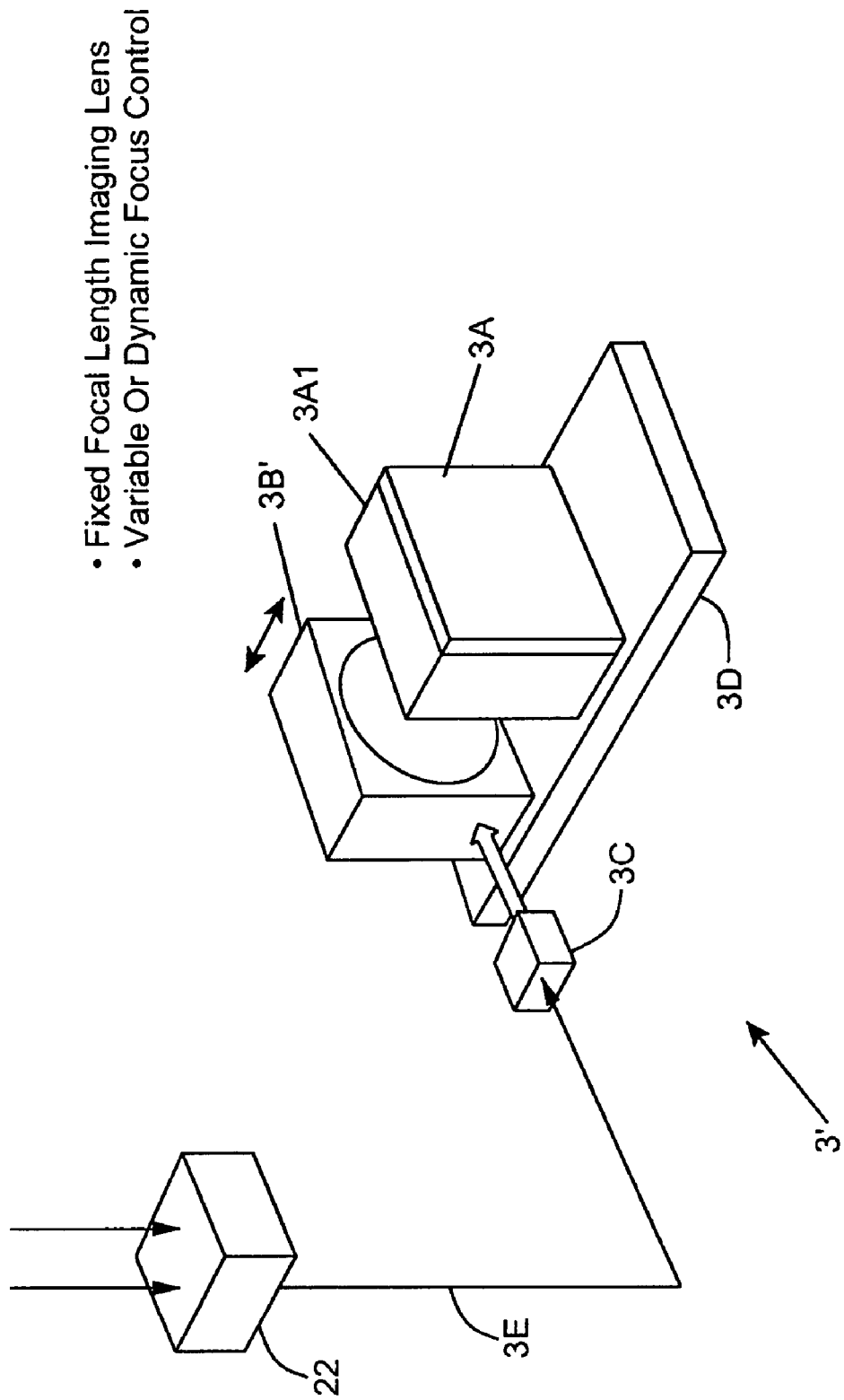
FIG. 2C2

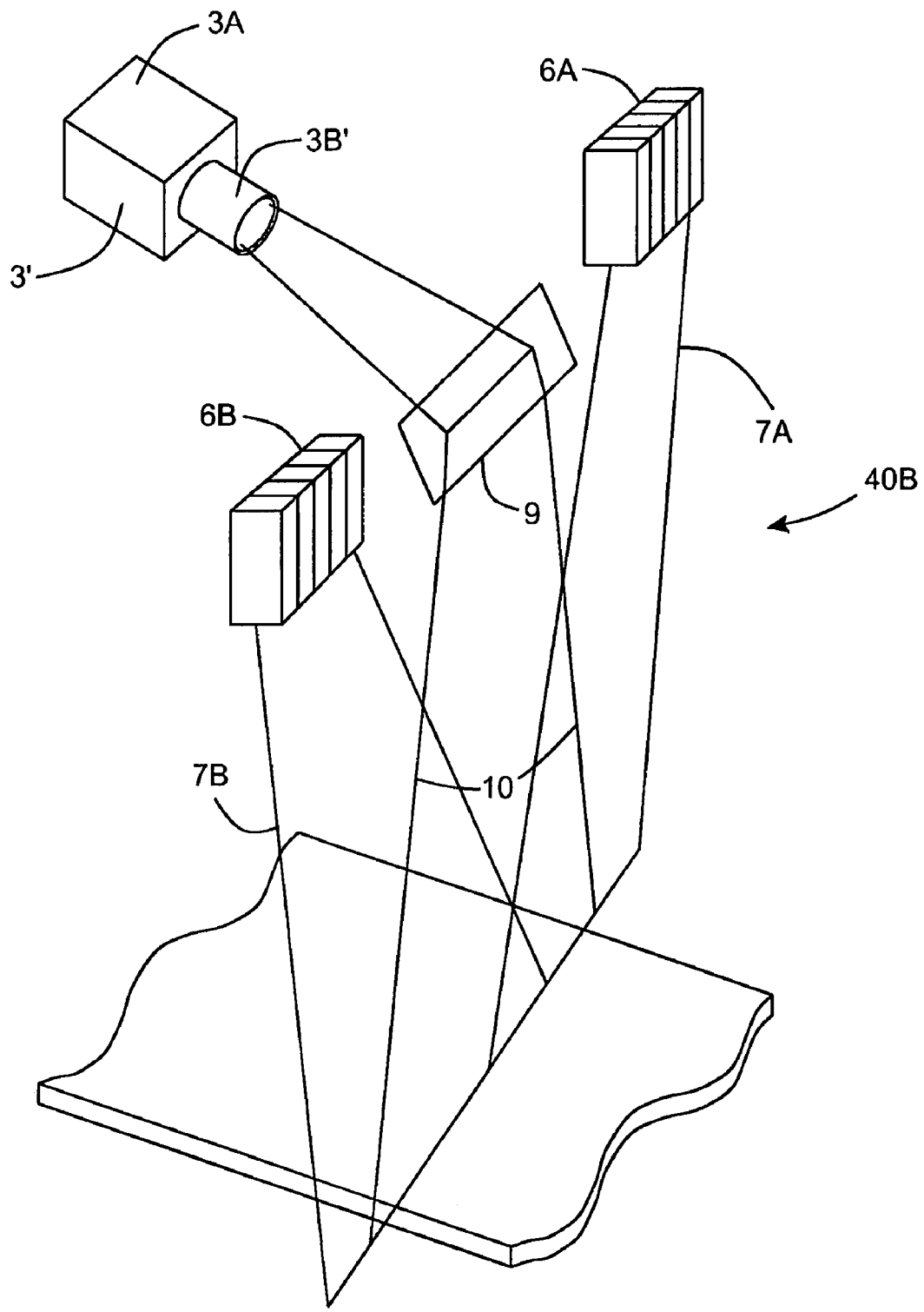
FIG. 2D1

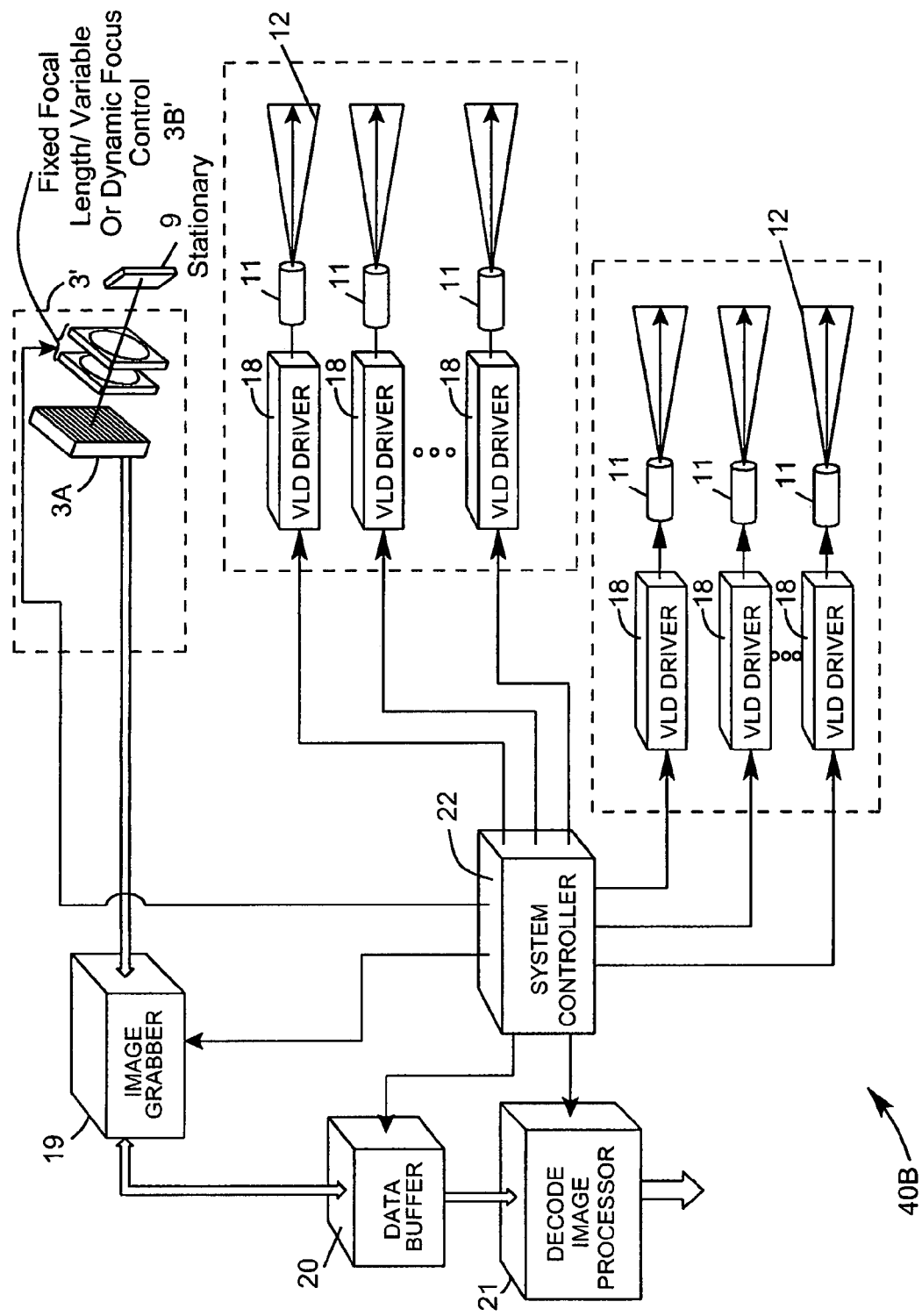
FIG. 2D2

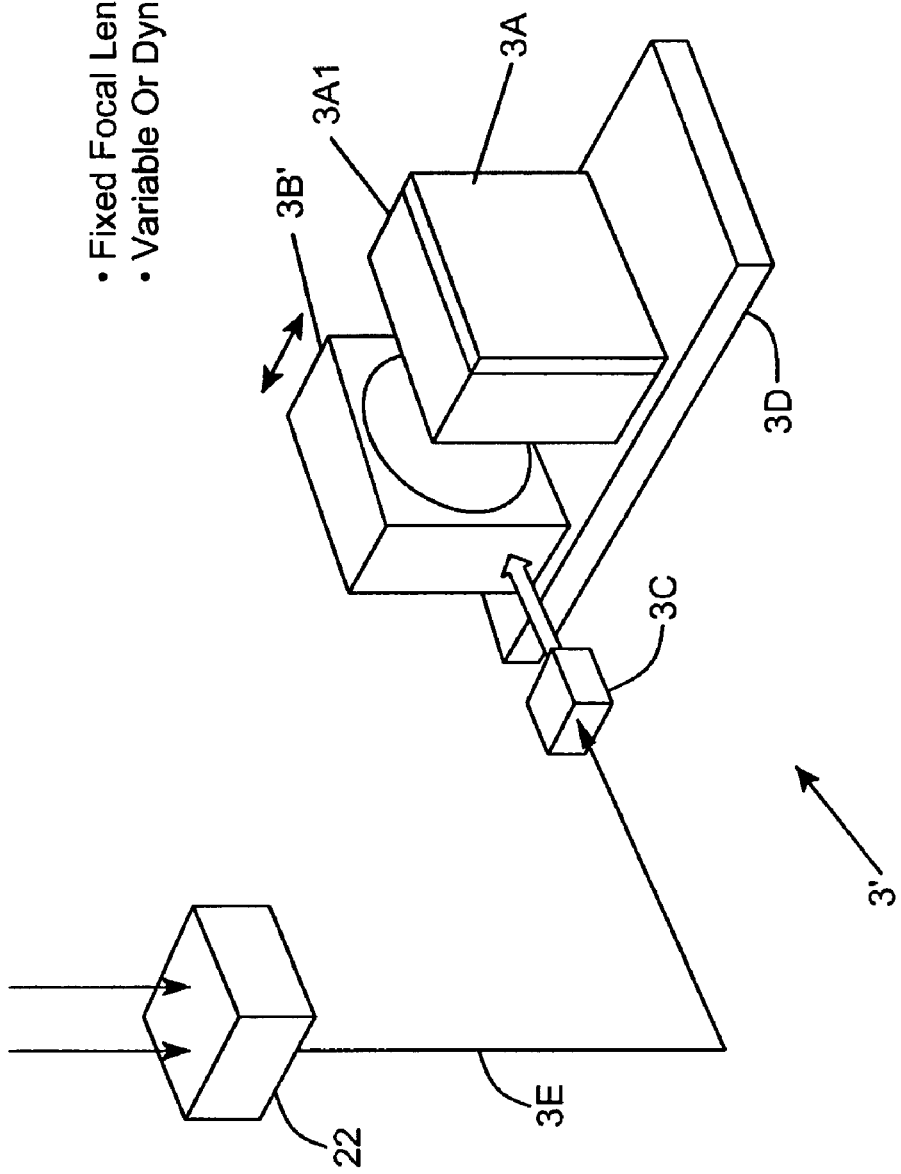
FIG. 2D3

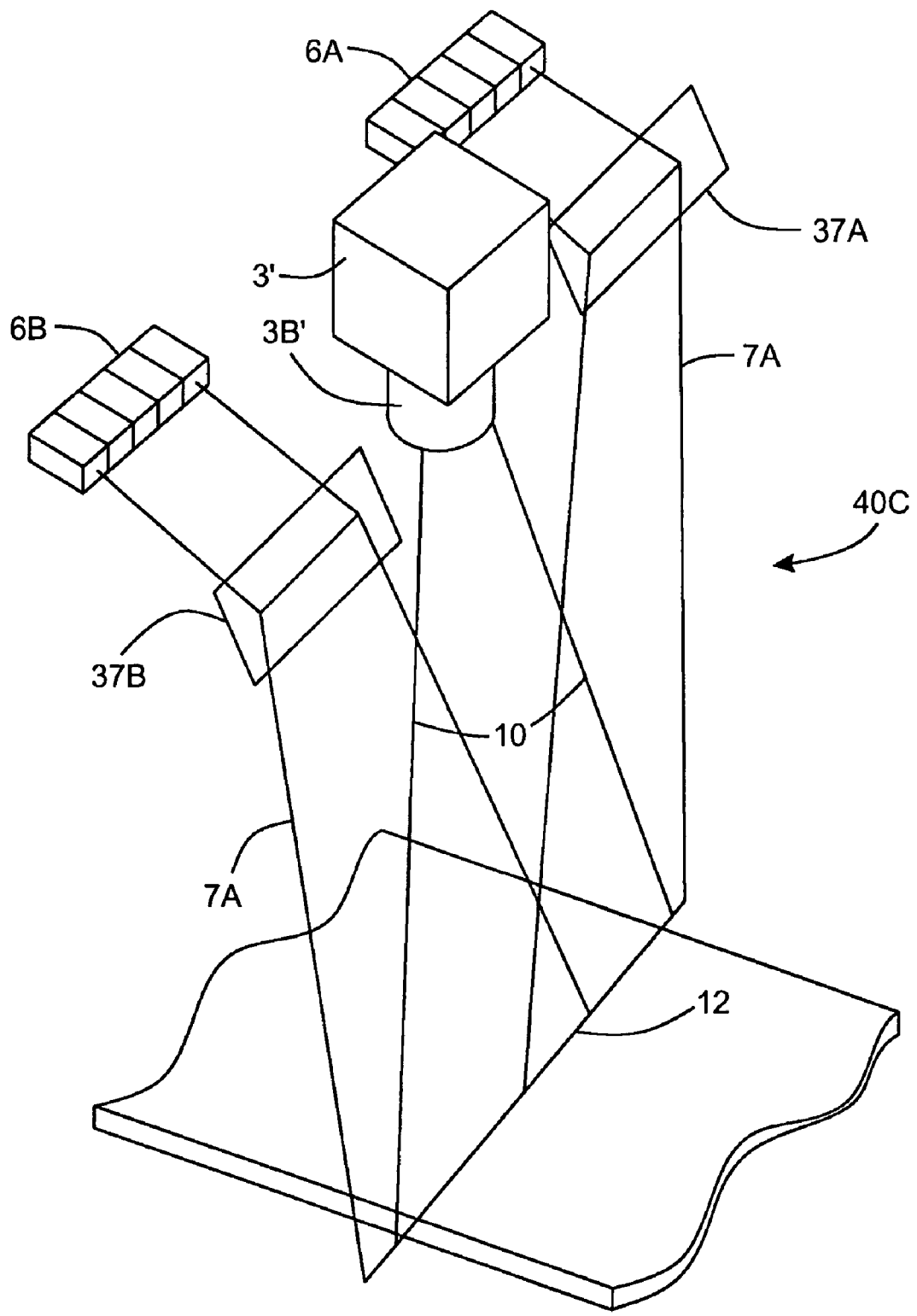
FIG. 2E1

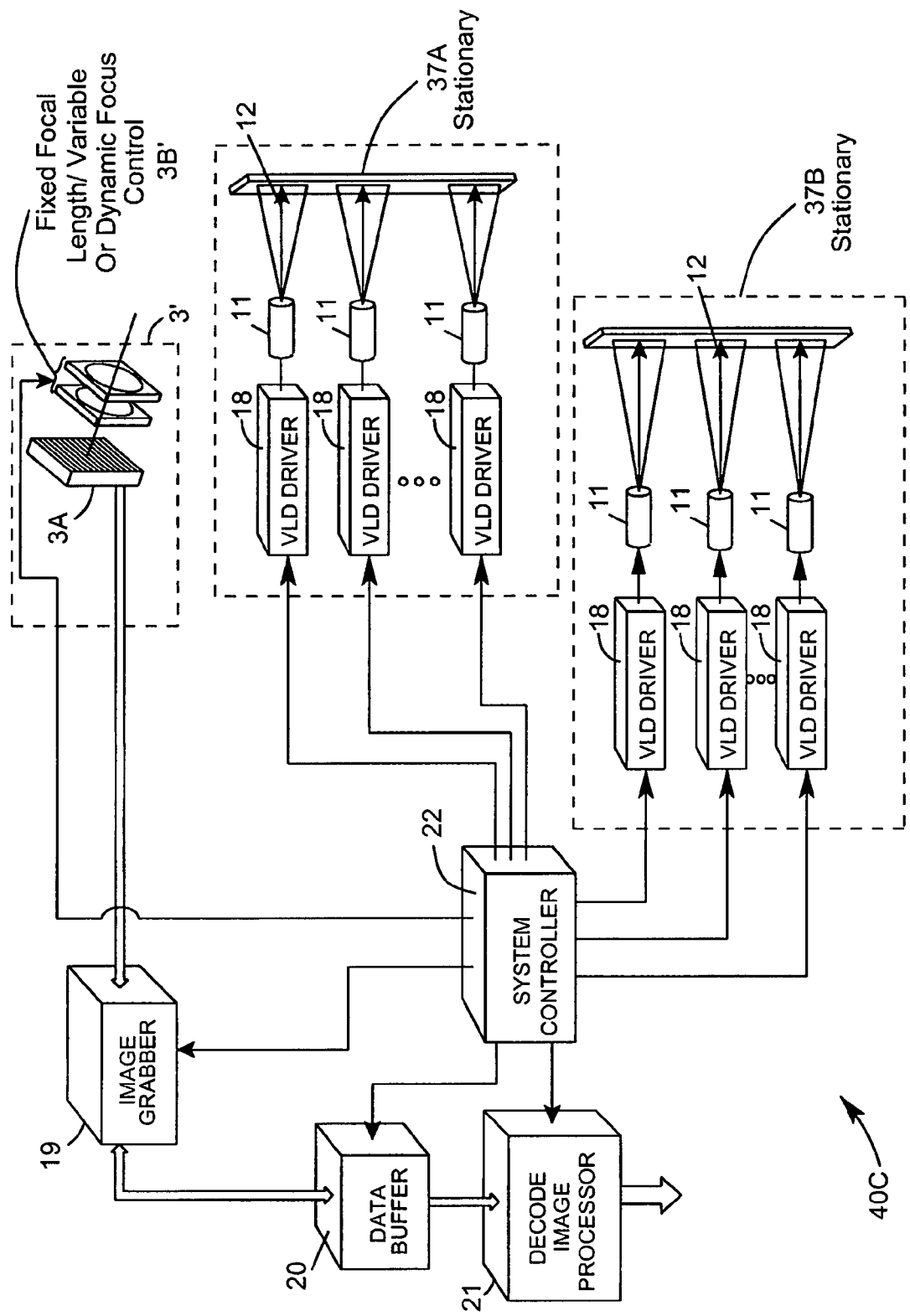
FIG. 2E2

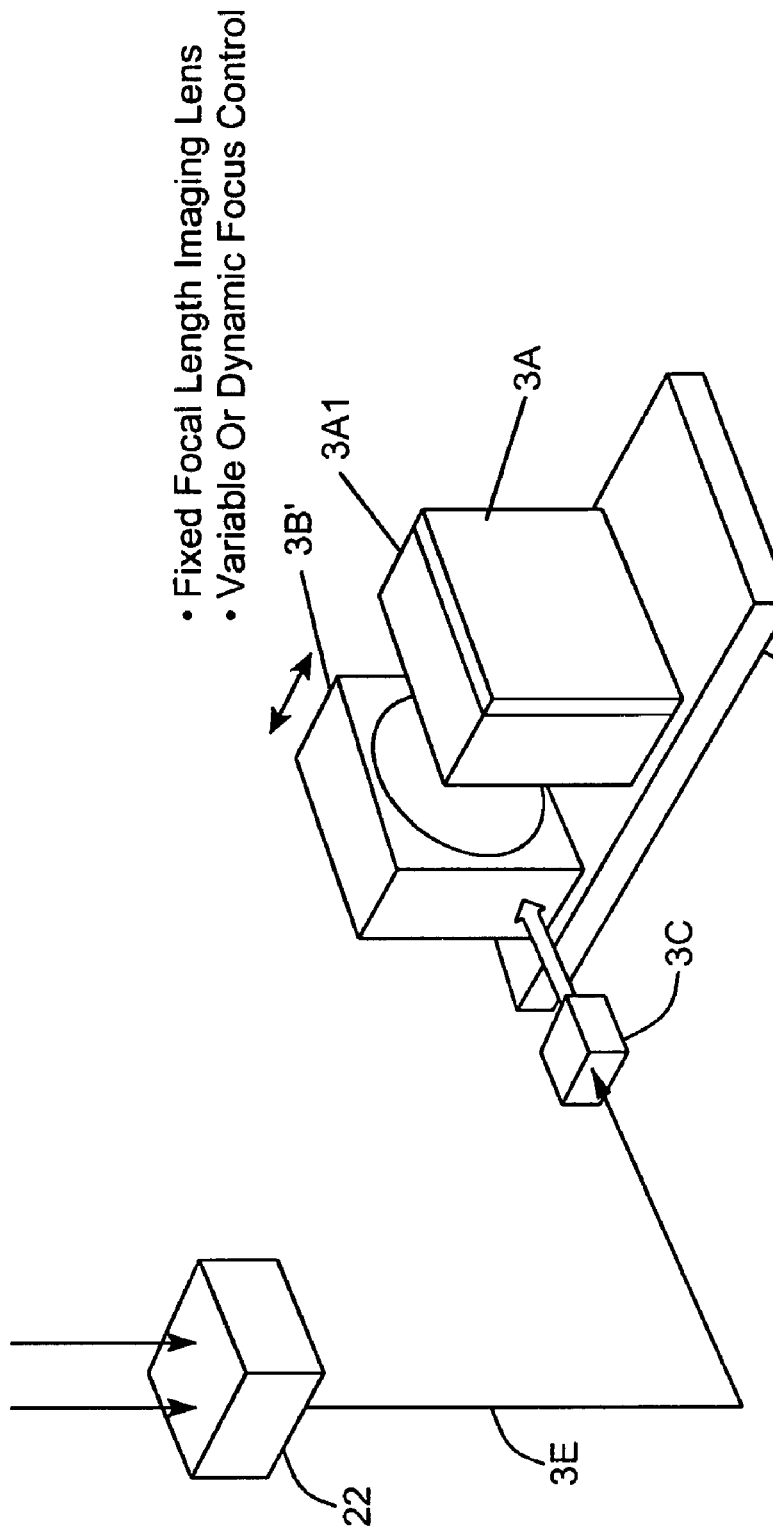

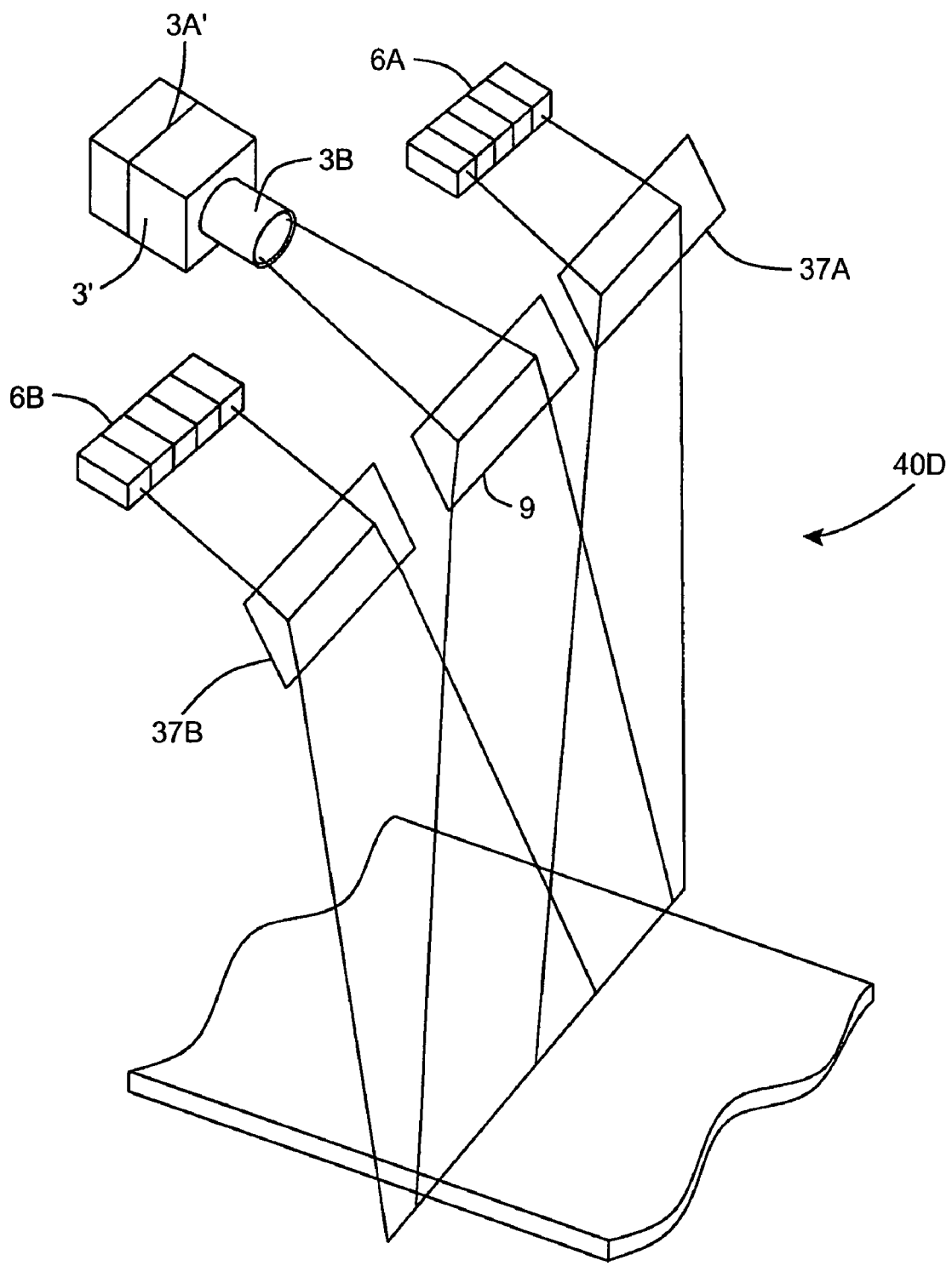
FIG. 2F1

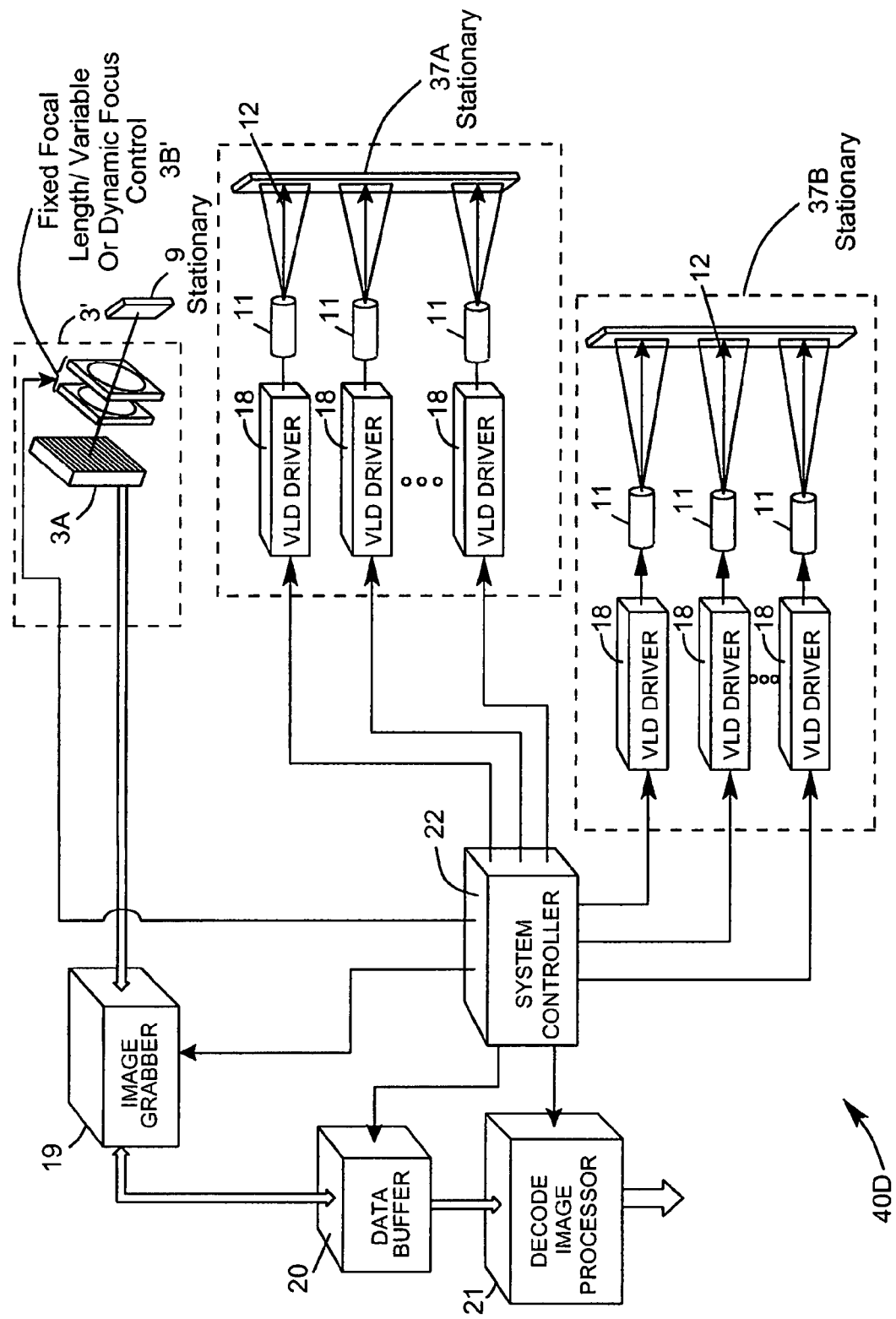
FIG. 2F2

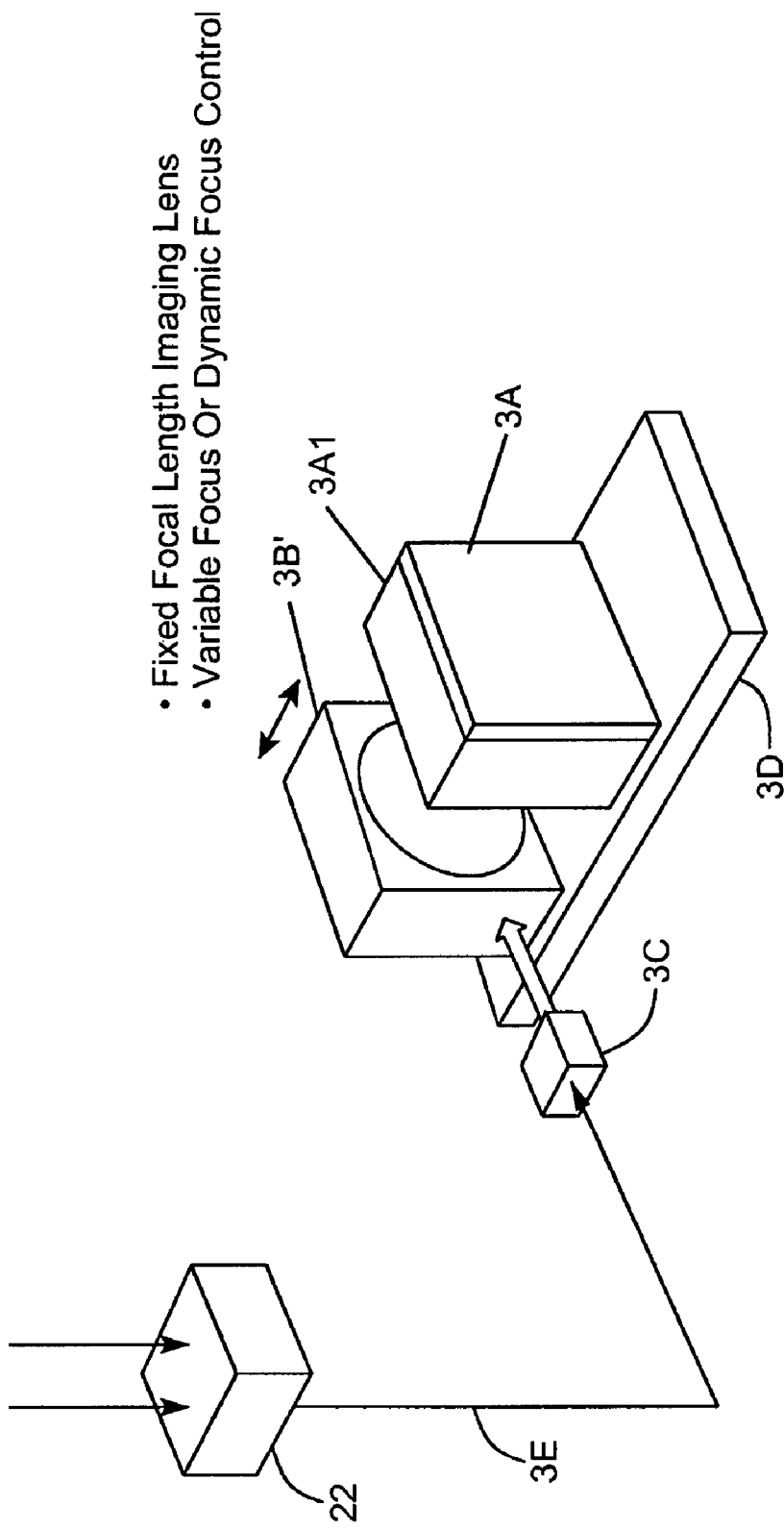
FIG. 2F3

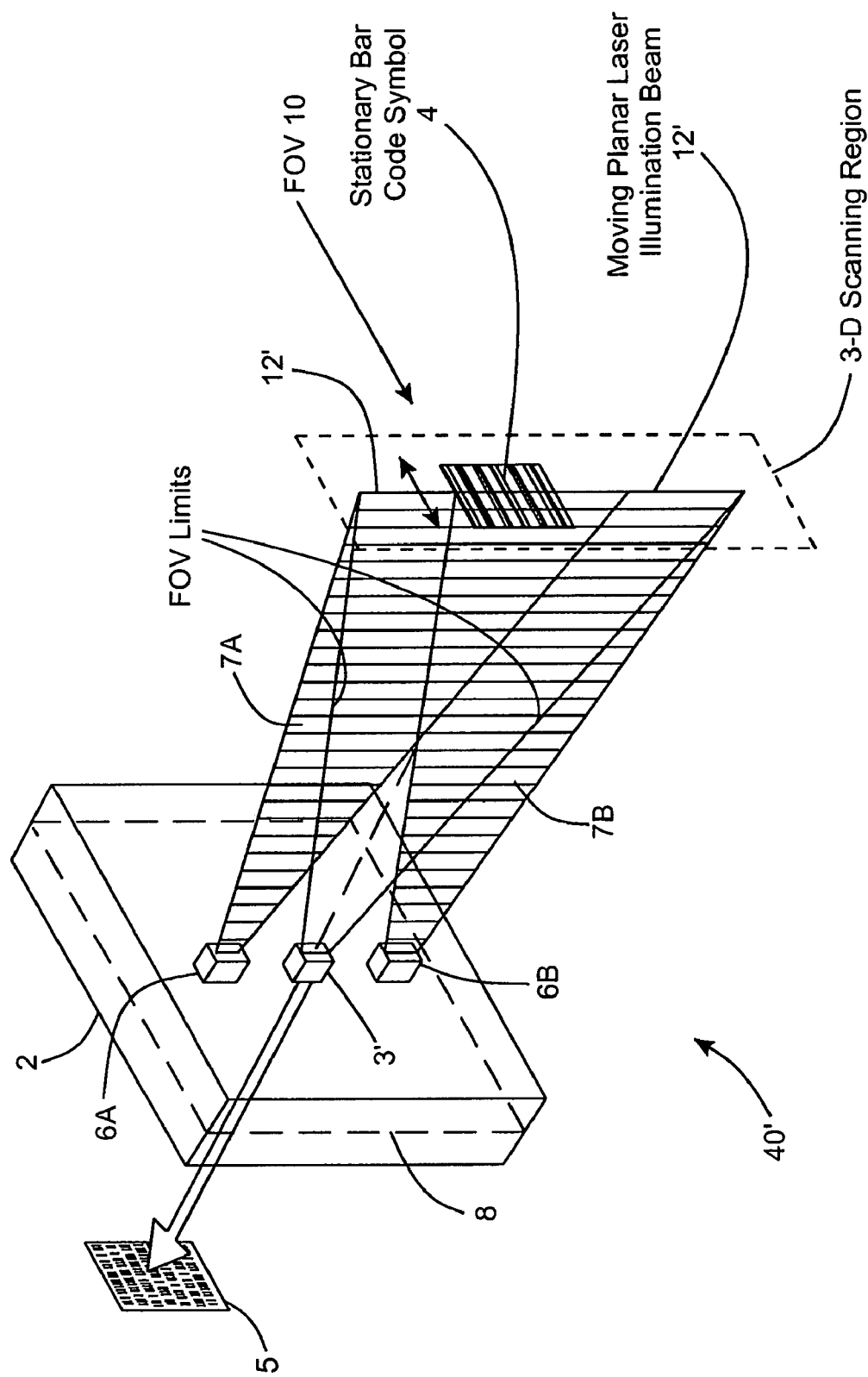
FIG. 2I1

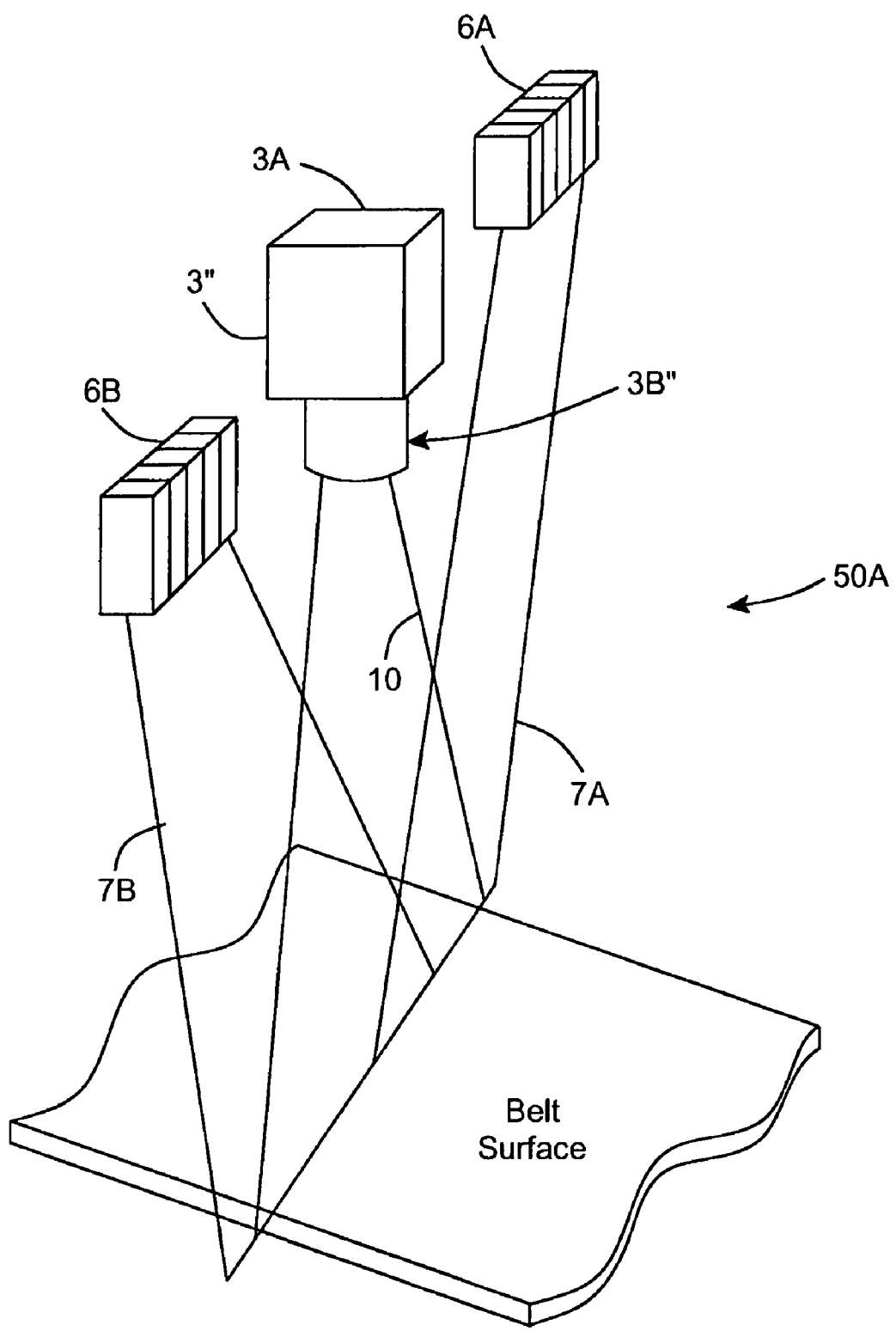
FIG. 3B1

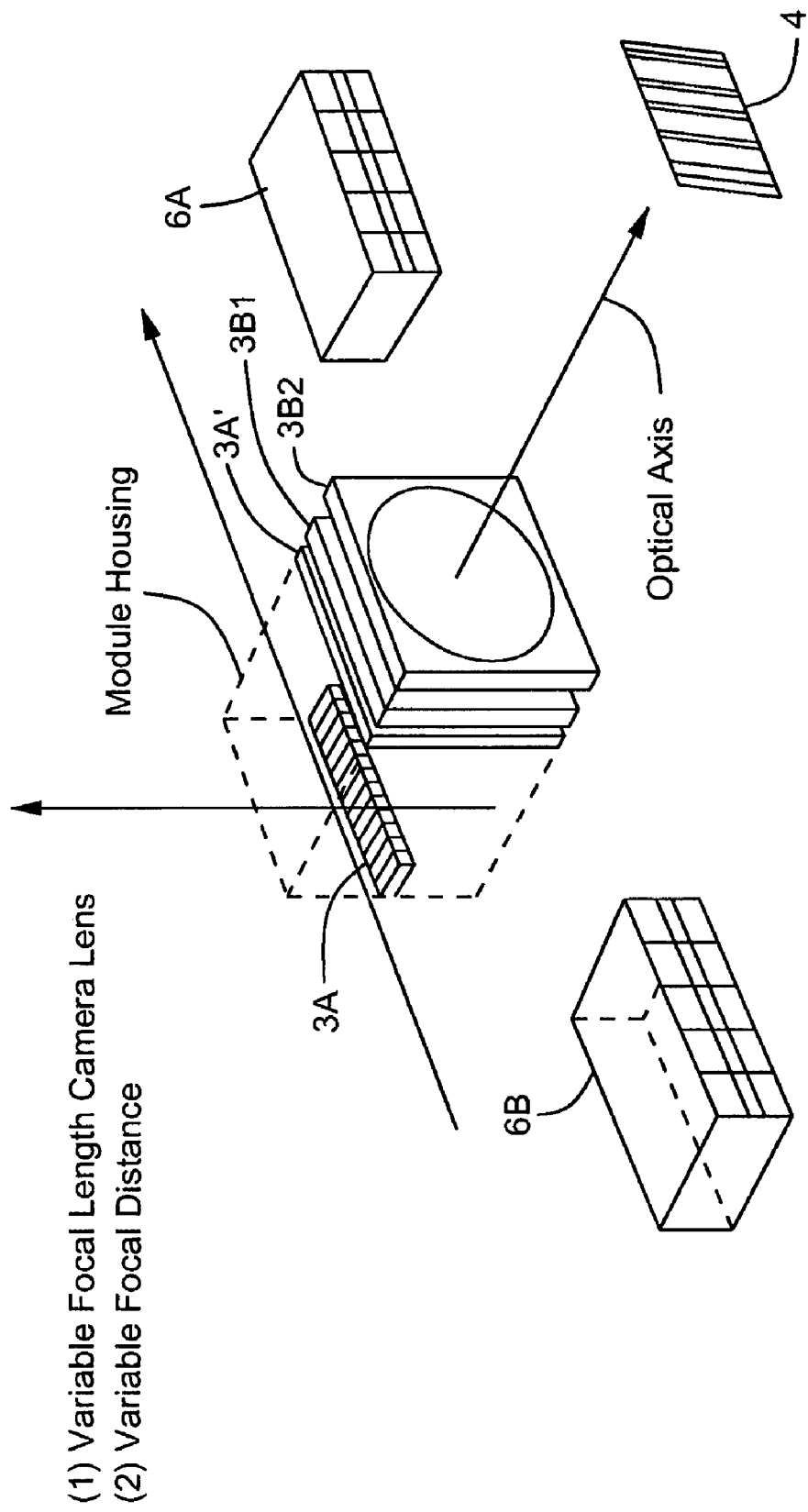
FIG. 3B2

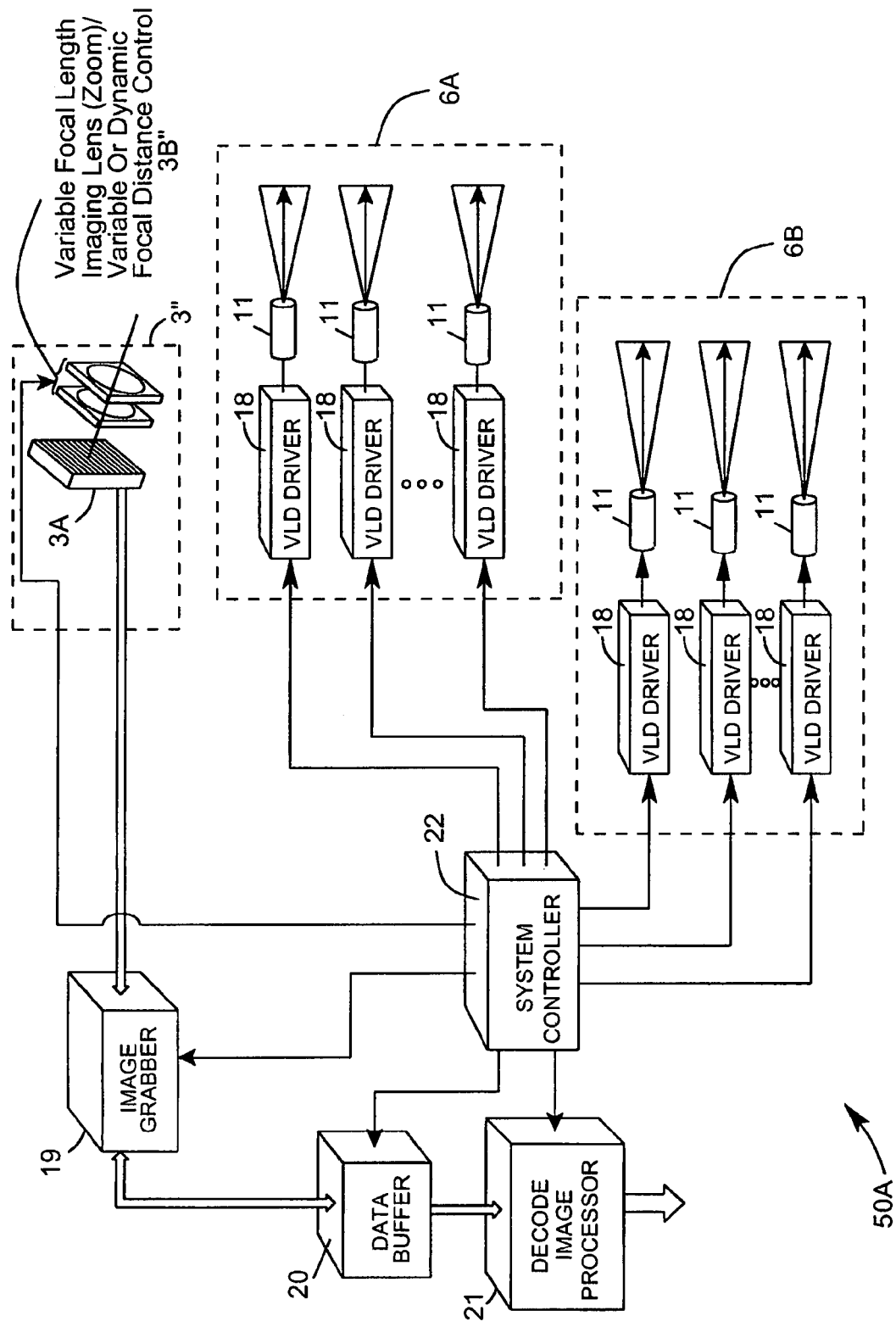
FIG. 3C1

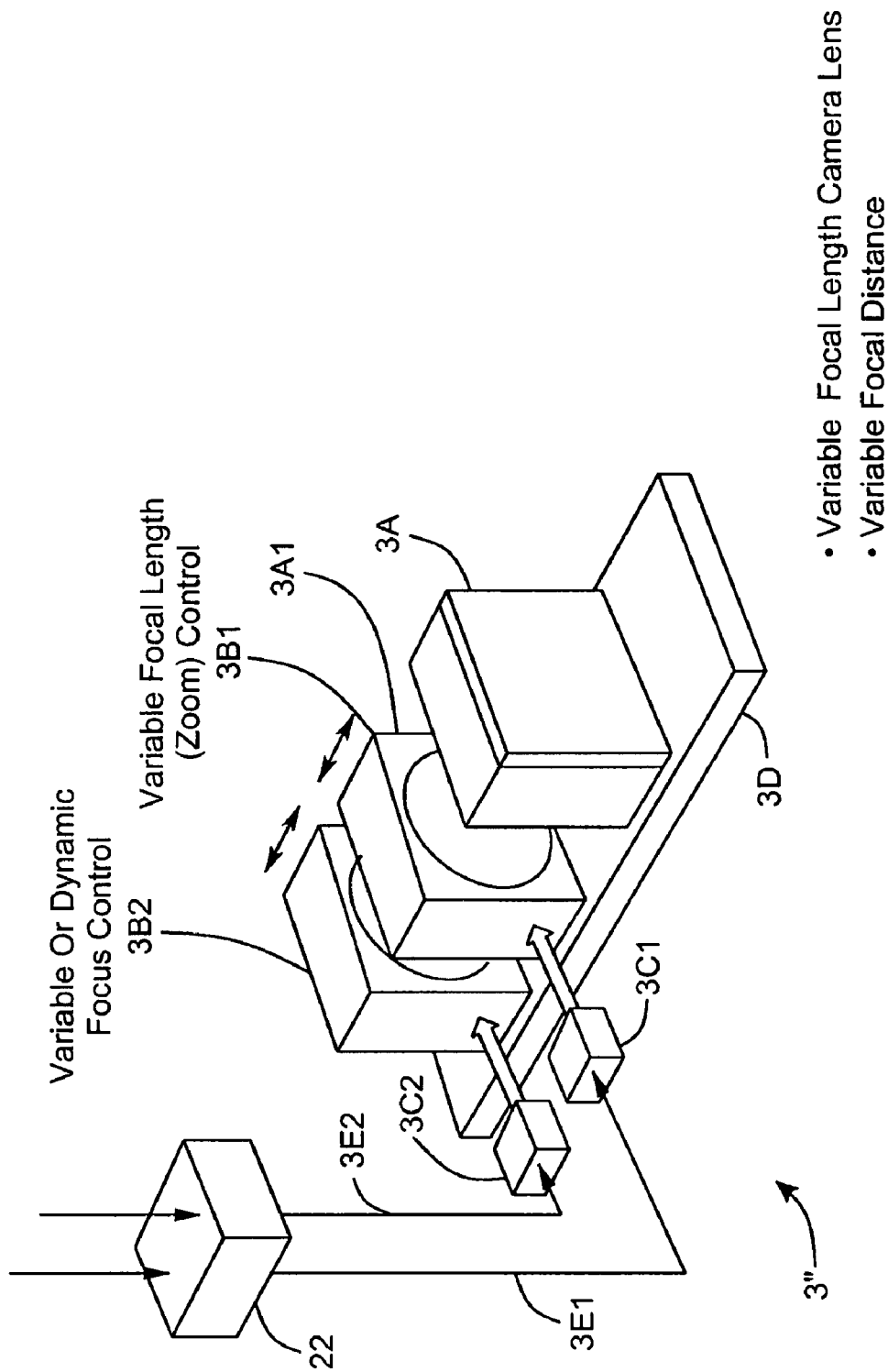
FIG. 3C2

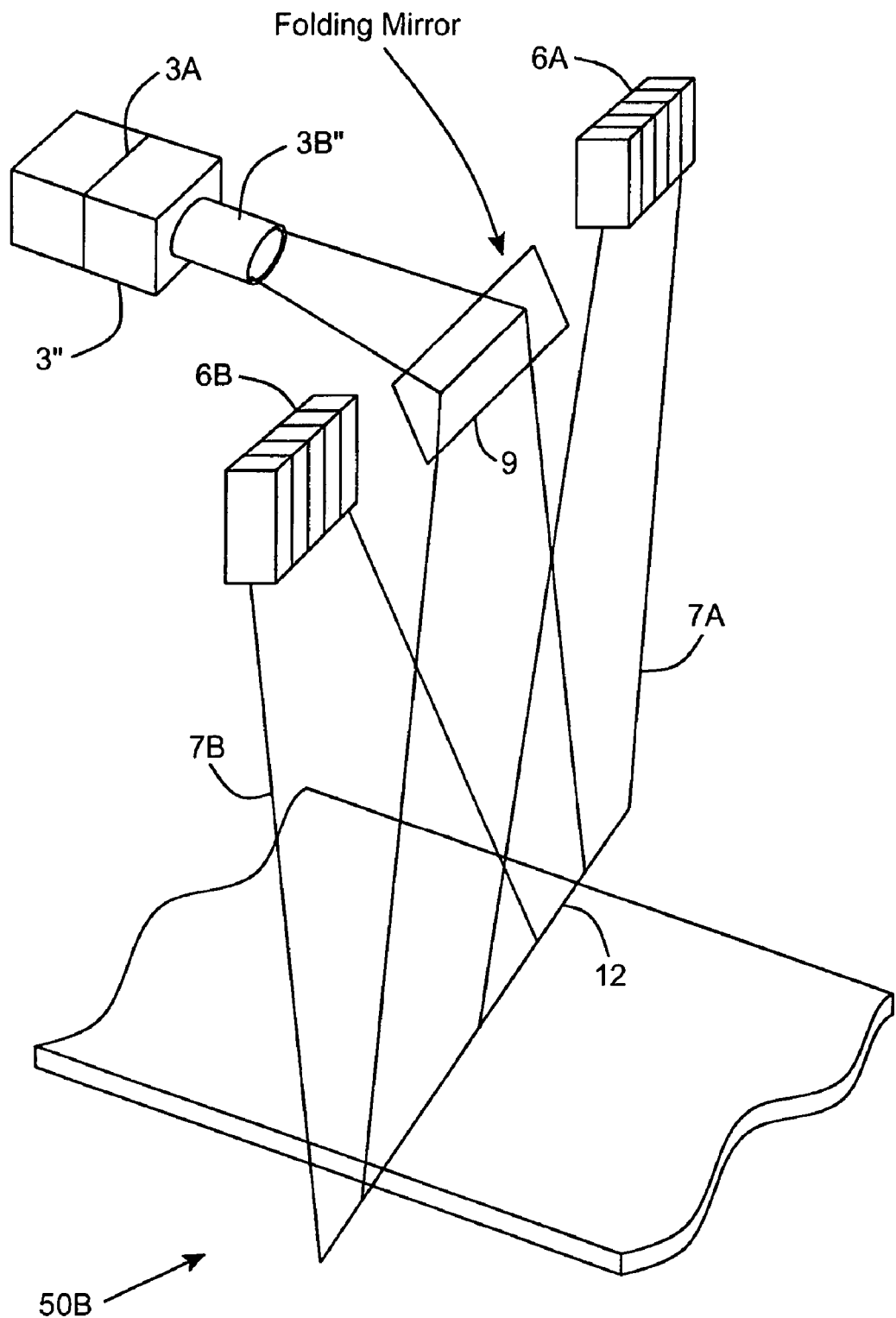
FIG. 3E1

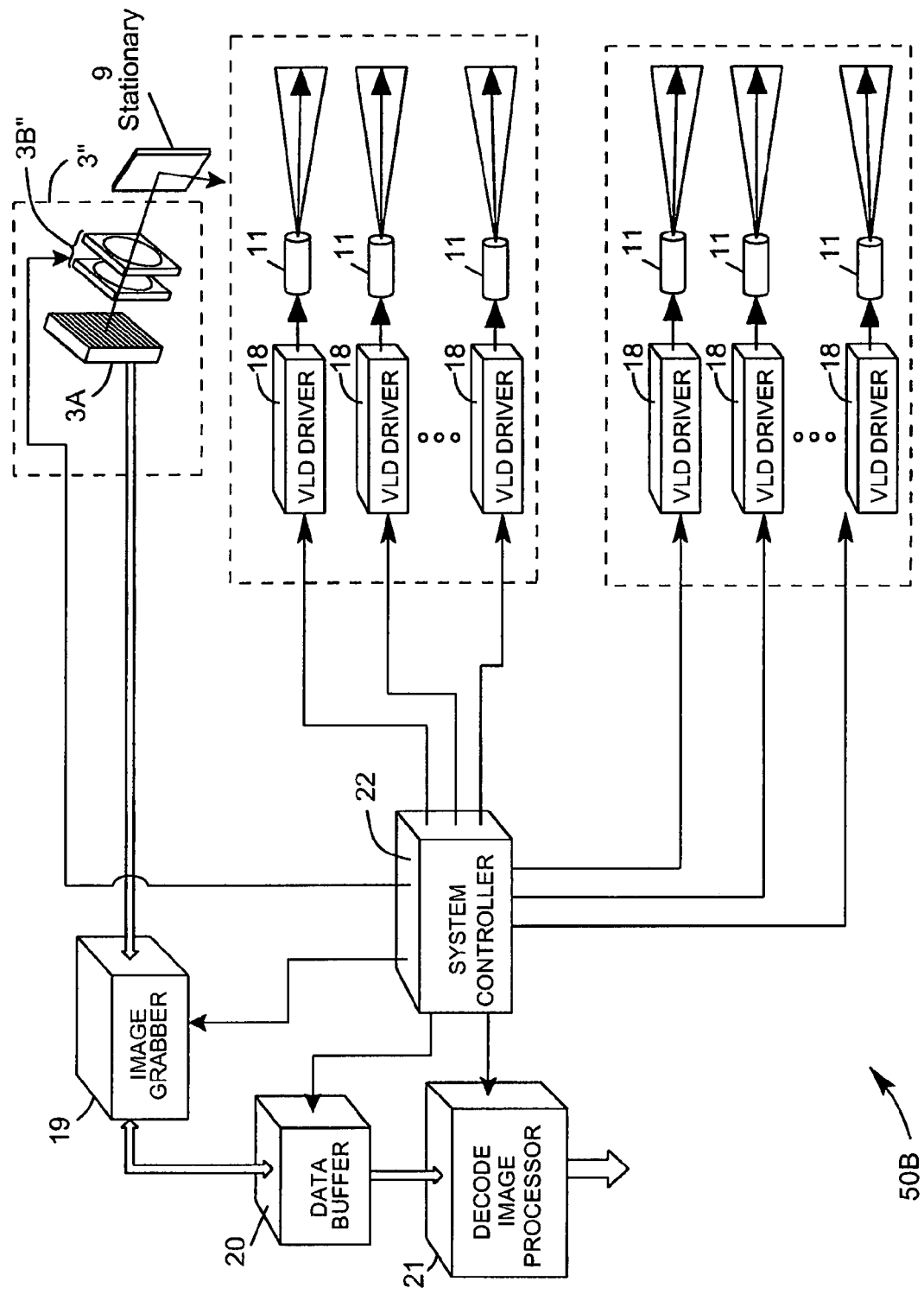
FIG. 3E2

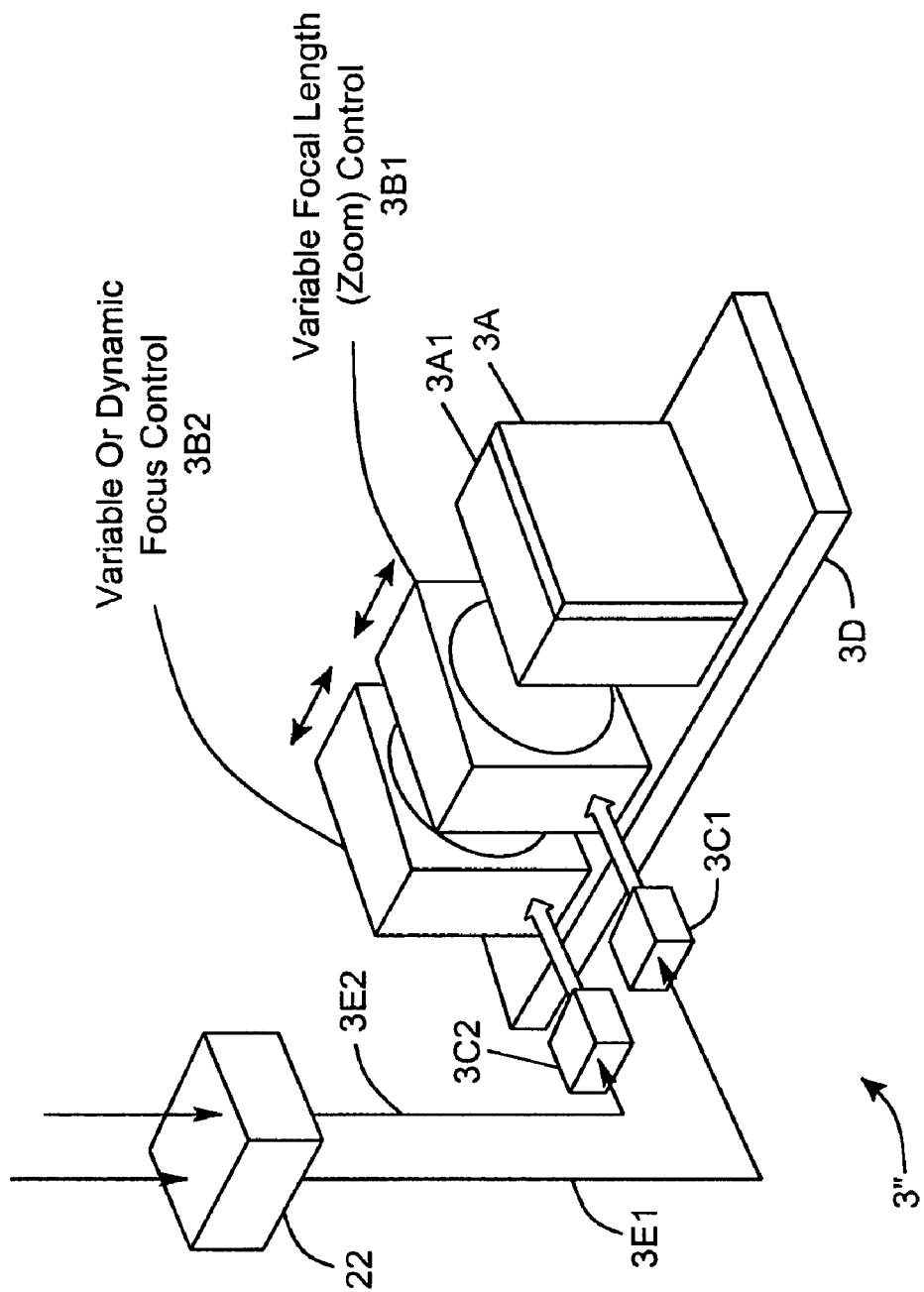
FIG. 3E3

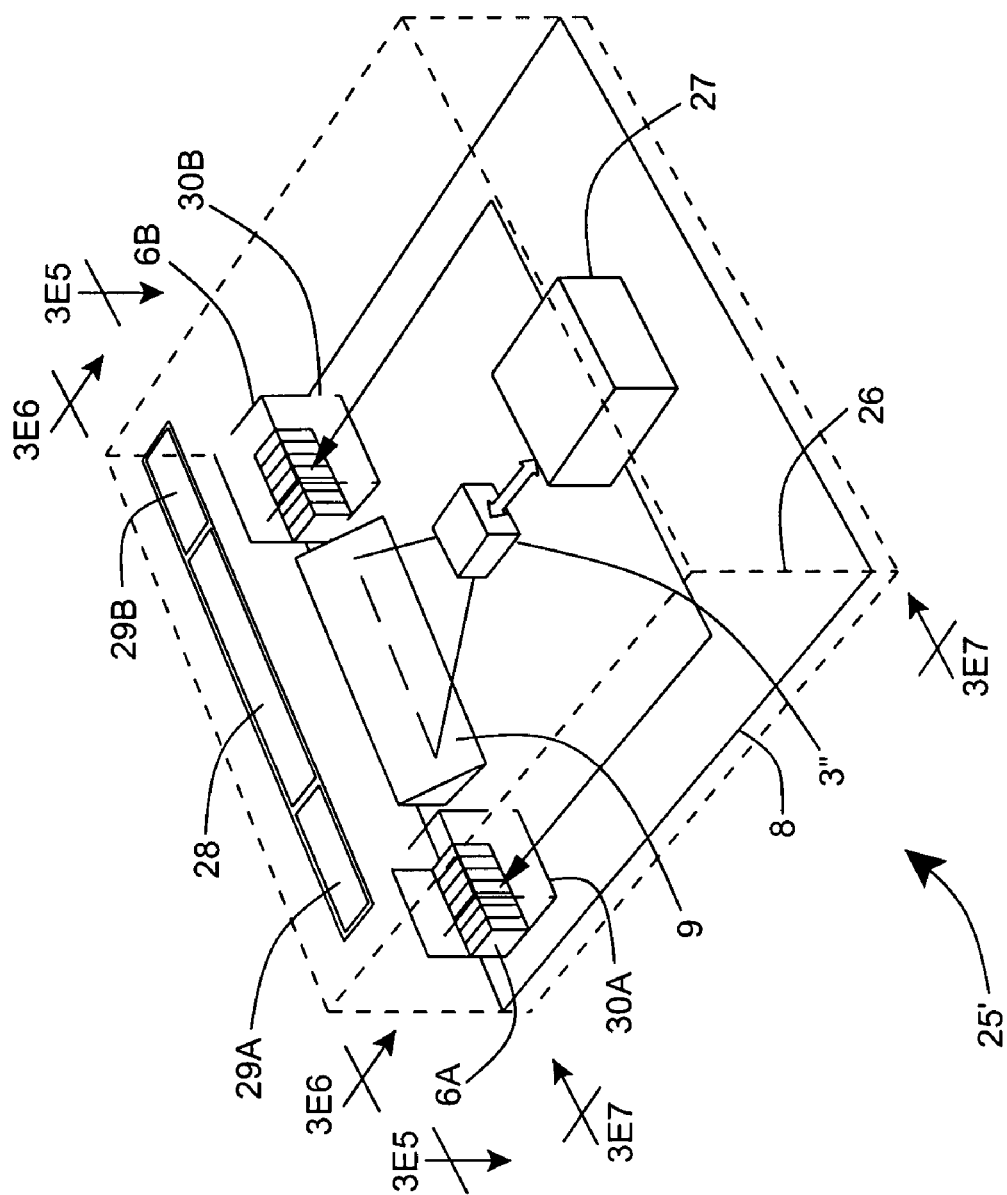
FIG. 3E4

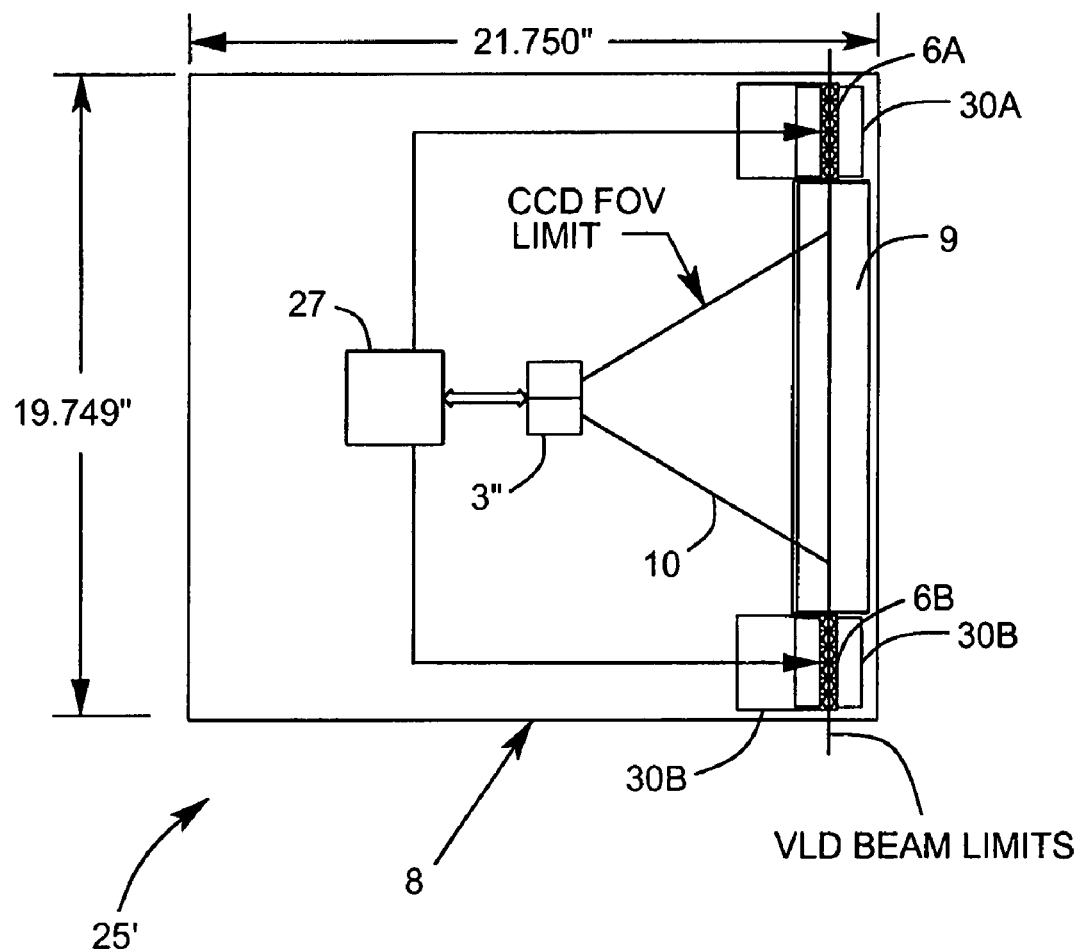
FIG. 3E5

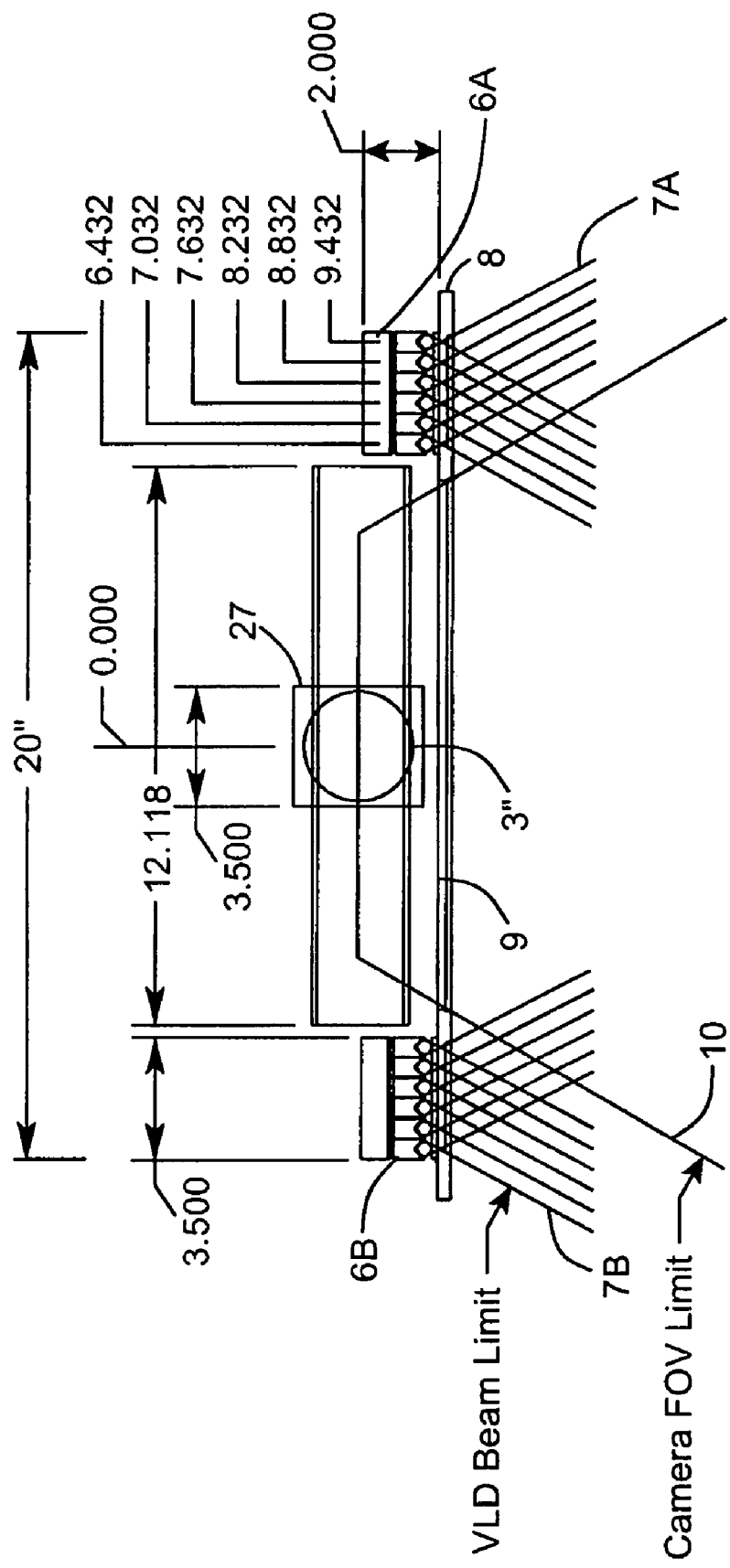
FIG. 3E6

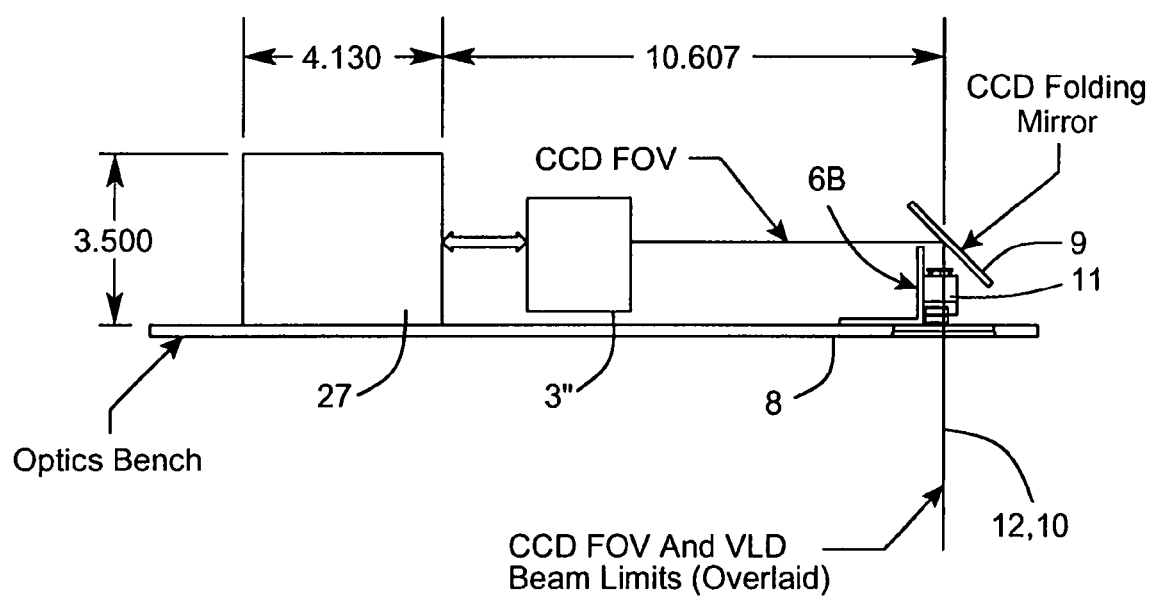
FIG. 3E7

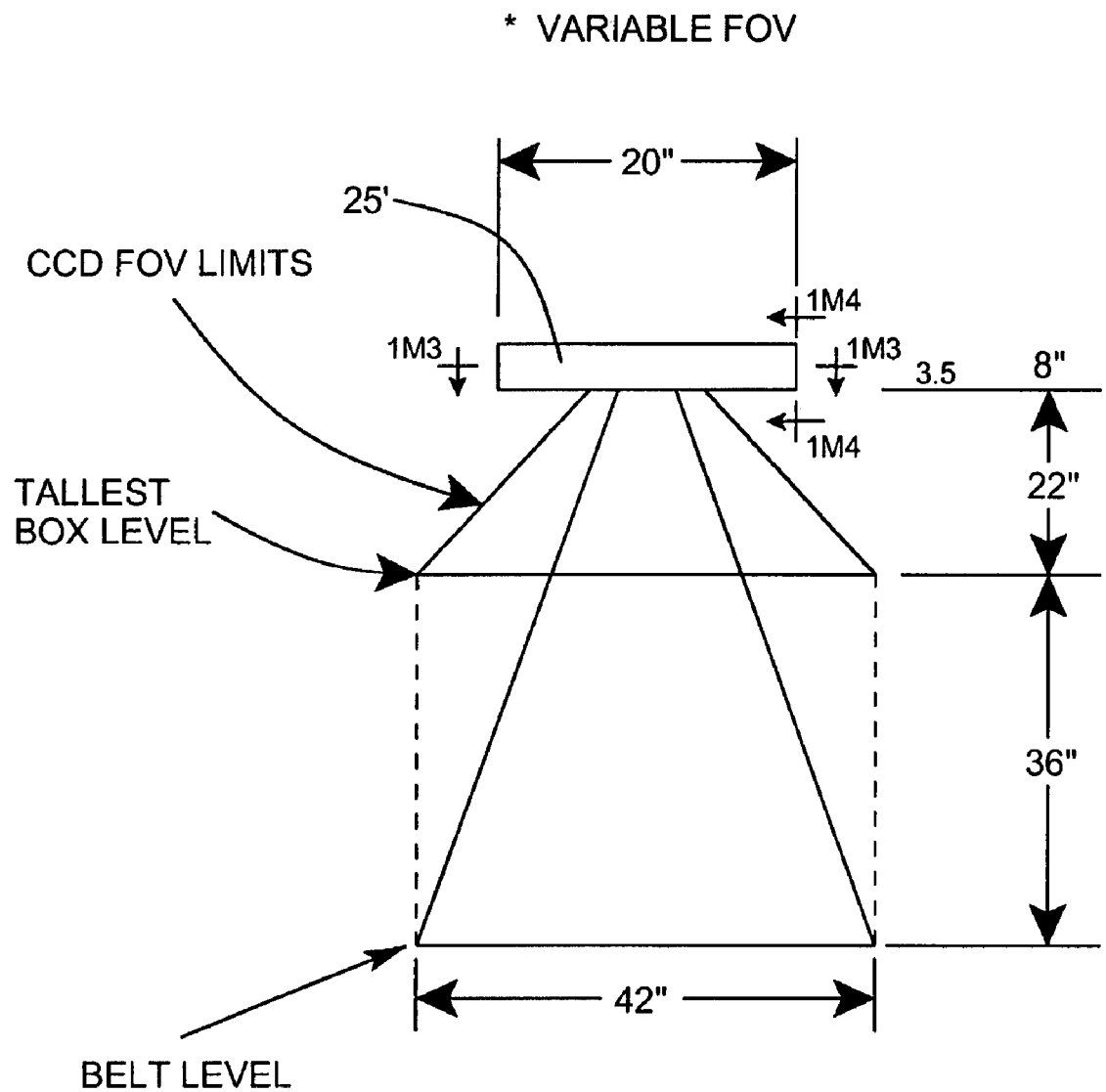
FIG. 3E8

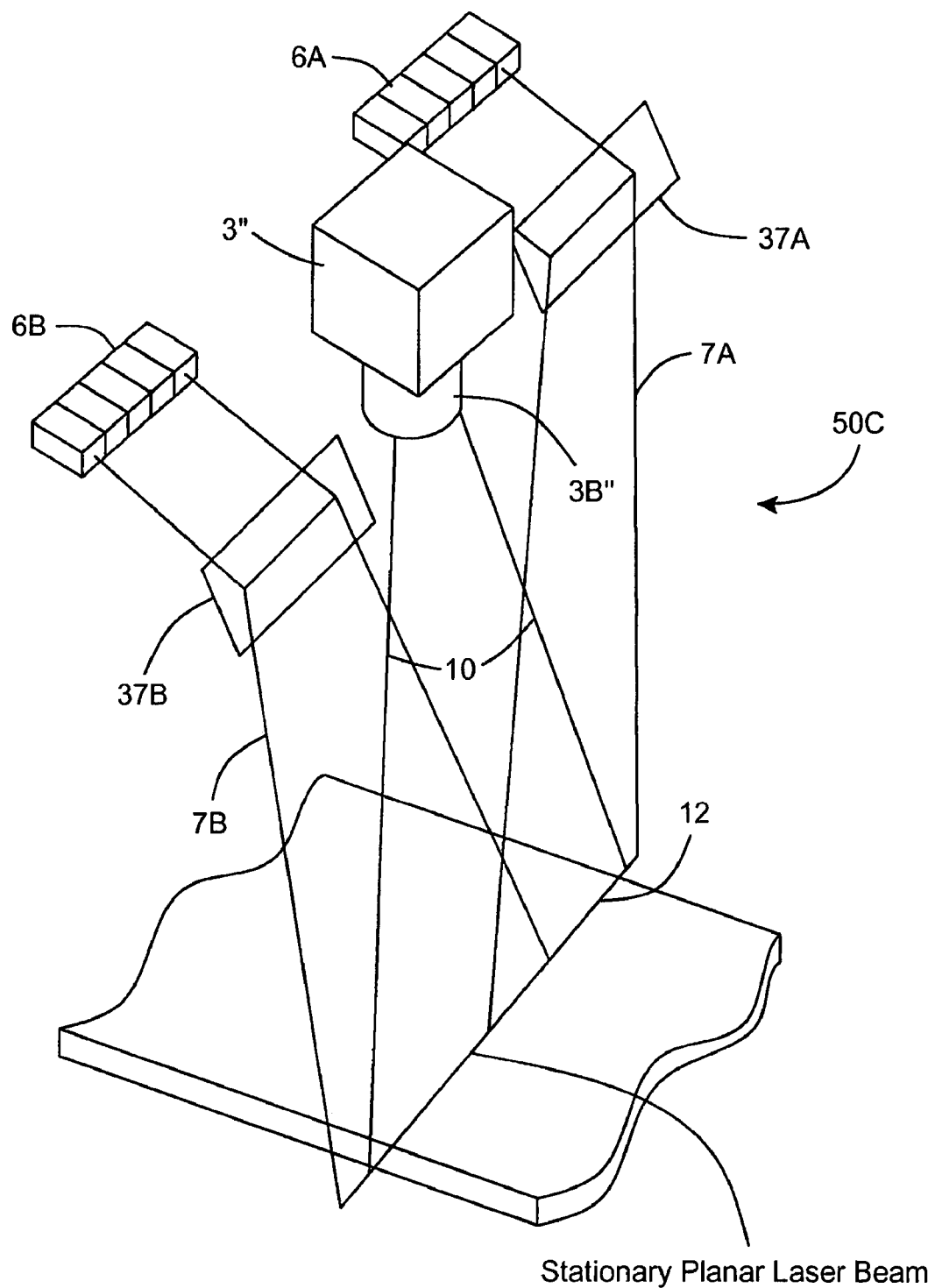
FIG. 3F1

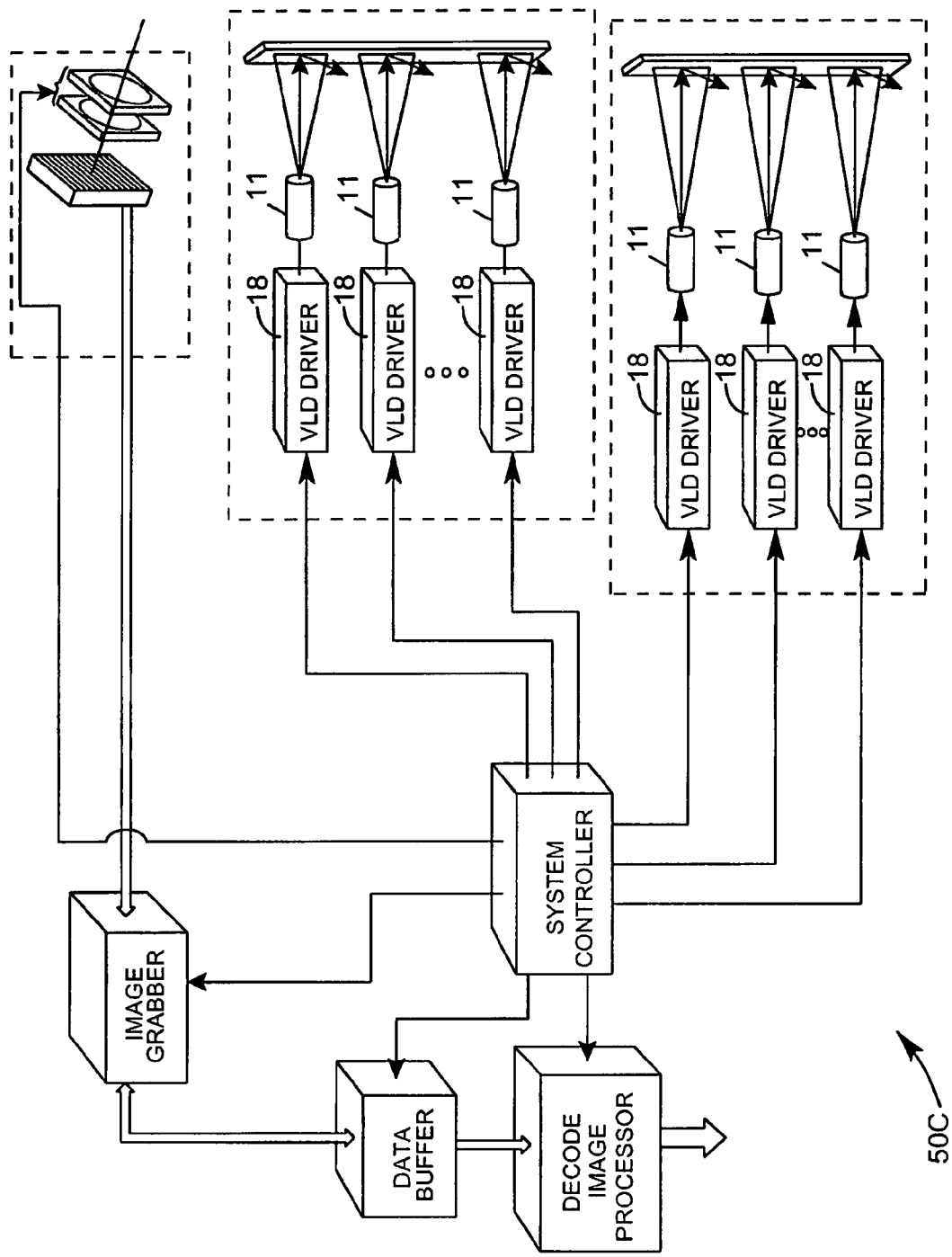
FIG. 3F2

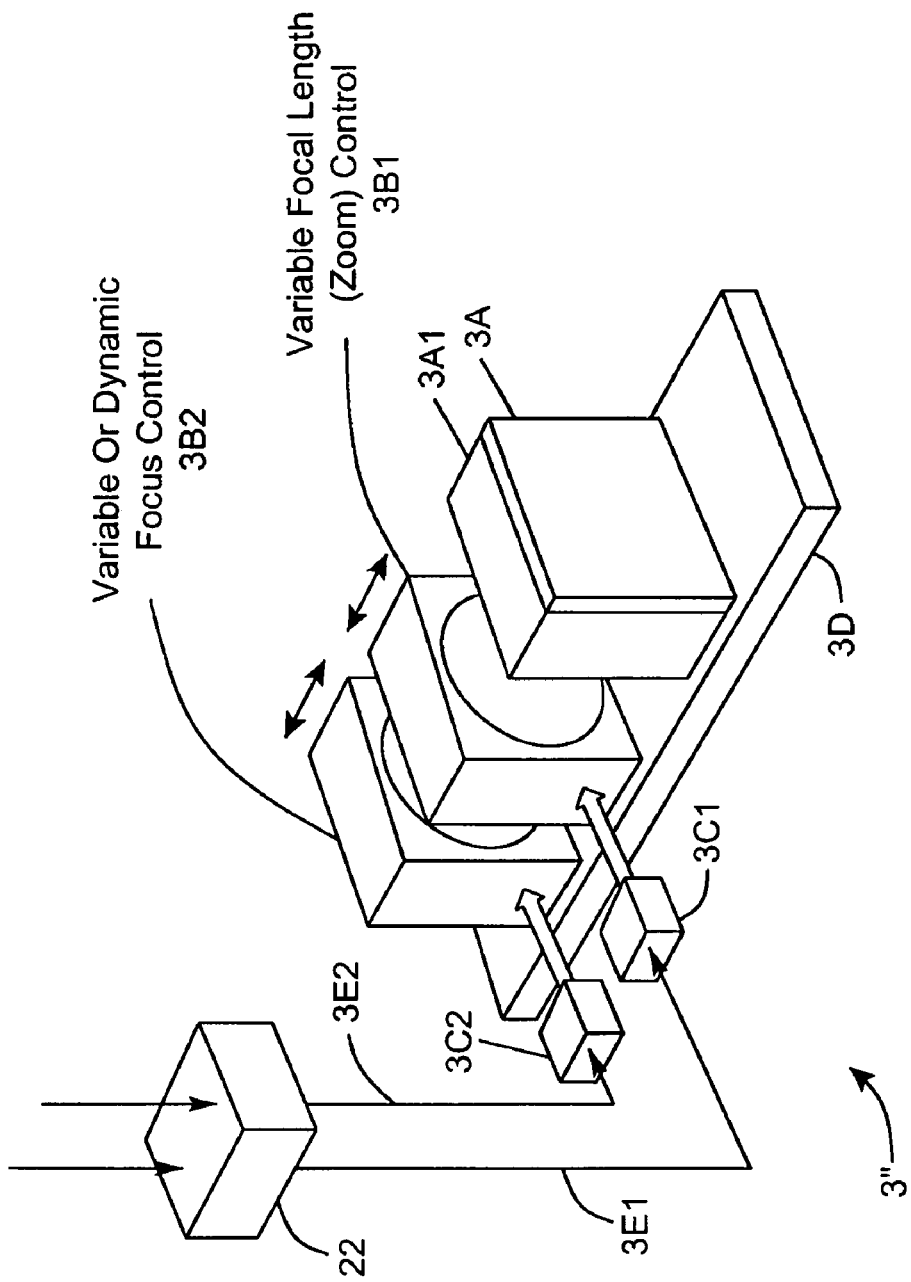
FIG. 3F3

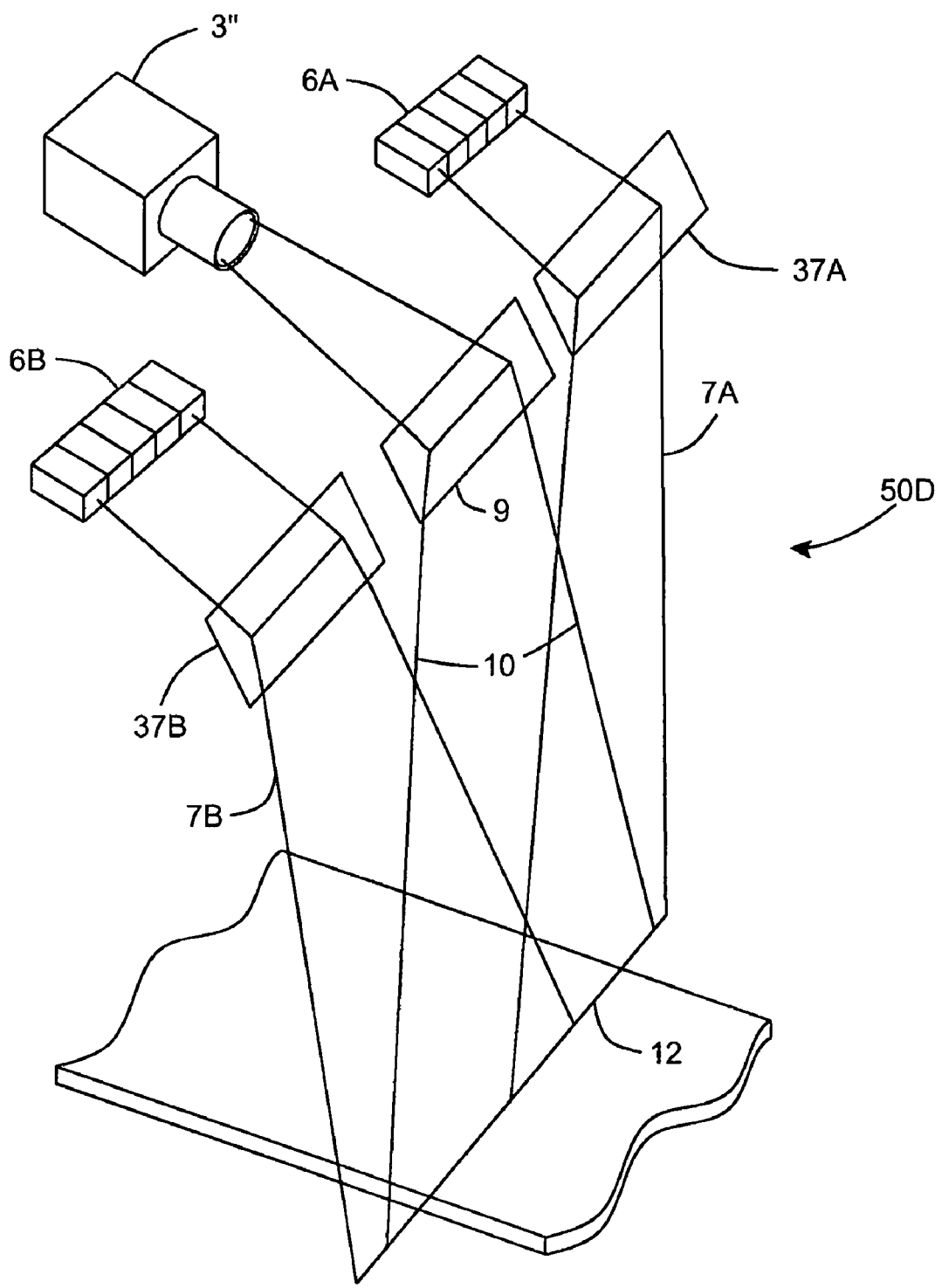
FIG. 3G1

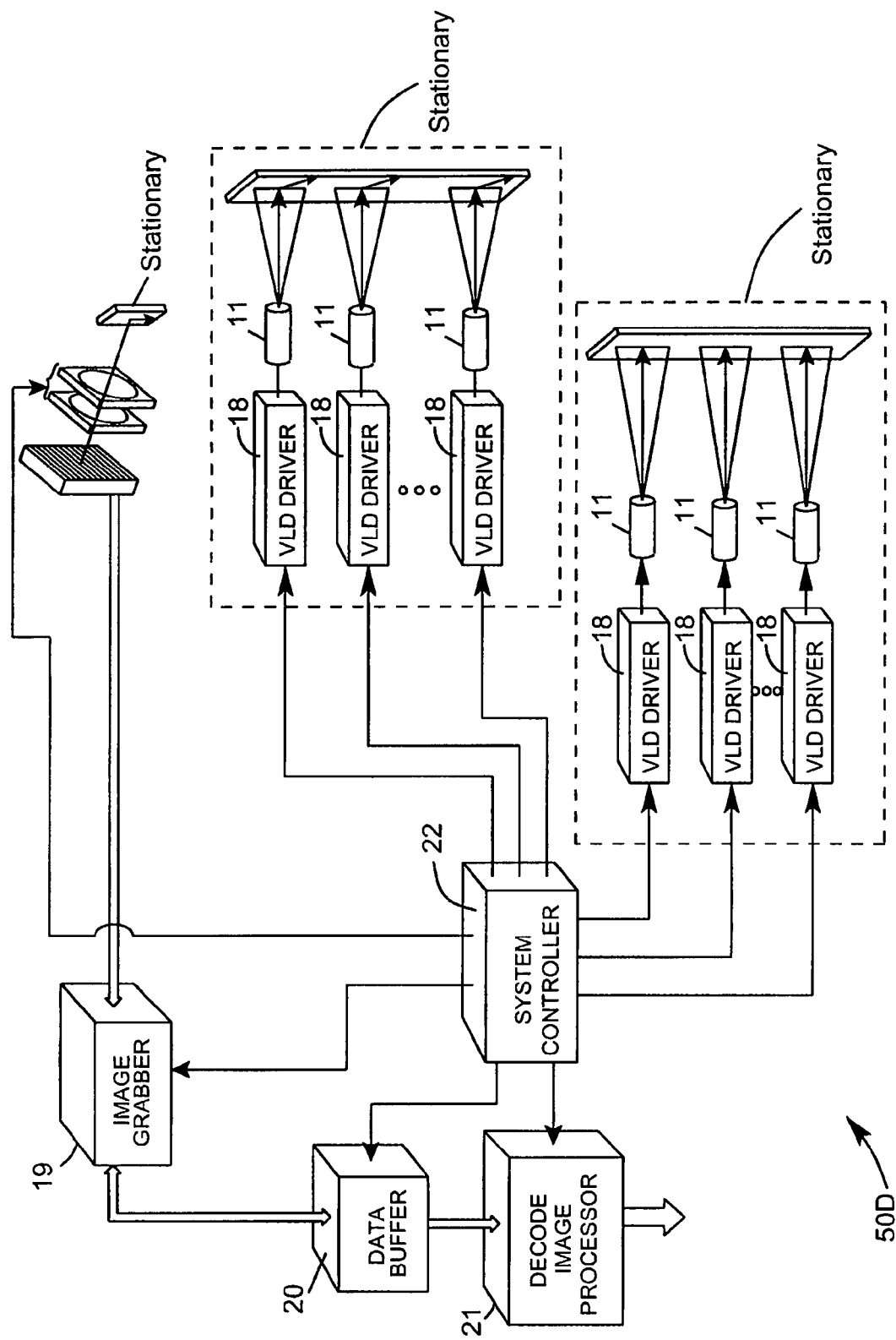
FIG. 3G2

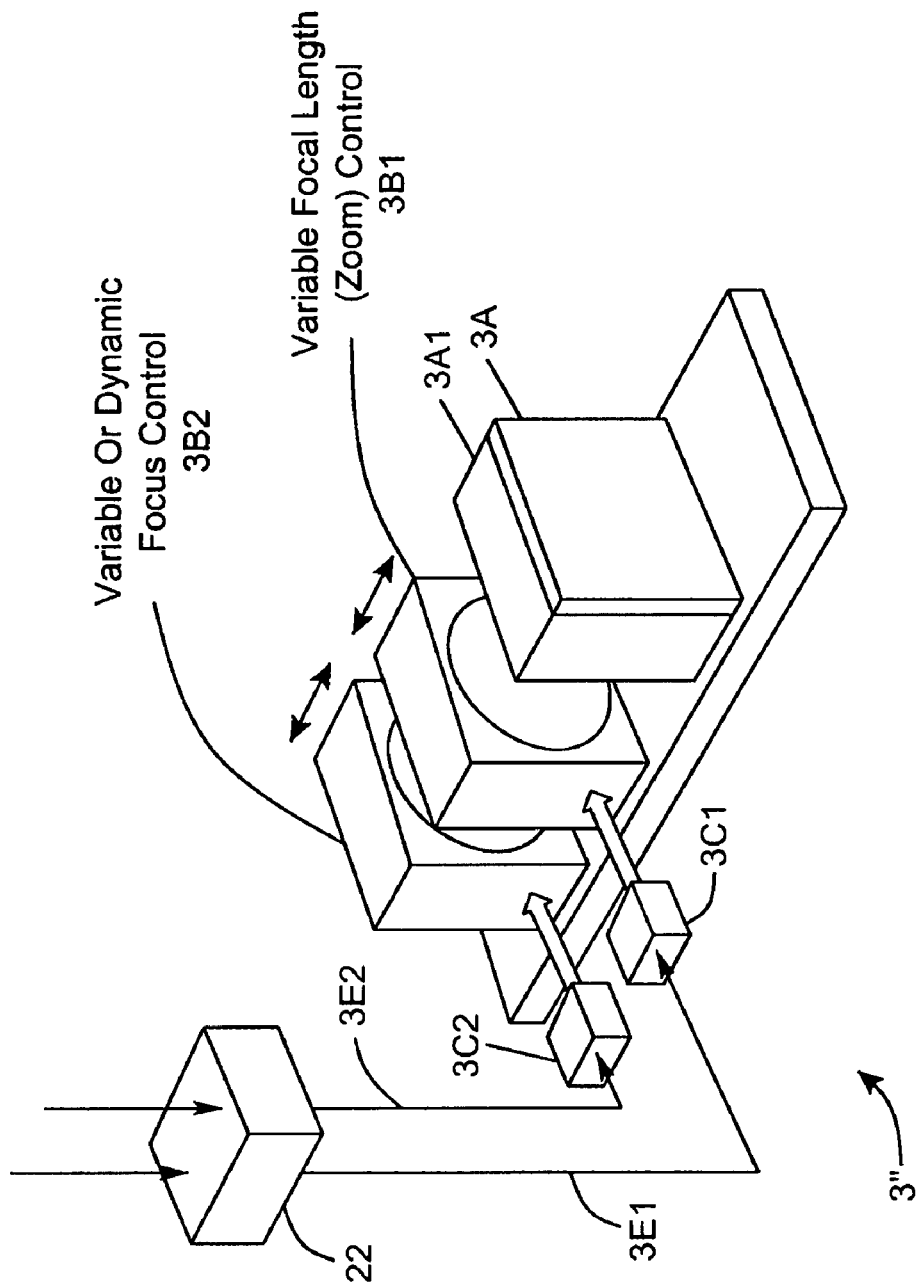
FIG. 3G3

HAND-SUPPORTABLE CODE SYMBOL READER EMPLOYING COPLANAR LASER ILLUMINATION AND LINEAR IMAGING

CROSS-REFERENCE TO RELATED U.S. APPLICATIONS

This is a Continuation of U.S. application Ser. No. 11/490,544 filed Jul. 20, 2006 now U.S. Pat. No. 7,523,863; which is a Continuation of U.S. application Ser. No. 11/484,369 filed Jul. 11, 2006 now U.S. Pat. No. 7,533,821; which is a Continuation of U.S. application Ser. No. 10/066,545 filed Feb. 1, 2002, now U.S. Pat. No. 7,073,718 B2; which is a Continuation of U.S. application Ser. No. 09/721,885 filed Nov. 24, 2000, now U.S. Pat. No. 6,631,842; which is a Continuation-in-Part of copending application Ser. No. 09/327,756 filed Jun. 7, 1999, now abandoned; and PCT/US00/15624 filed Jun. 7, 2000, published as WO 00/75856 A1; each said application being commonly owned by Assignee, Metrologic Instruments, Inc., of Blackwood, N.J., and incorporated herein by reference as if fully set forth herein.

BACKGROUND OF THE INVENTION

1. Technical Field

The present invention relates generally to an improved method of and system for illuminating the surface of objects during image formation and detection operations, and also to an improved method of and system for producing digital images using such improved methods of object illumination.

2. Brief Description of the Prior Art

The use of image-based bar code symbol readers and scanners is well known in the field of auto-identification. Examples of image-based bar code symbol reading/scanning systems include, for example, hand-hand scanners, point-of-sale (POS) scanners, and industrial-type conveyor scanning systems.

Presently, most commercial image-based bar code symbol readers are constructed using charge-coupled device (CCD) image sensing/detecting technology. Unlike laser-based scanning technology, CCD imaging technology has particular illumination requirements which differ from application to application.

Most prior art CCD-based image scanners, employed in conveyor-type package identification systems, require high-pressure sodium, metal halide or halogen lamps and large, heavy and expensive parabolic or elliptical reflectors to produce sufficient light intensities to illuminate the large depth of field scanning fields supported by such industrial scanning systems. Even when the light from such lamps is collimated or focused using such reflectors, light strikes the target object other than where the imaging optics of the CCD-based camera are viewing. Since only a small fraction of the lamps output power is used to illuminate the CCD camera's field of view, the total output power of the lamps must be very high to obtain the illumination levels required along the field of view of the CCD camera. The balance of the output illumination power is simply wasted in the form of heat.

Most prior art CCD-based hand-held image scanners use an array of light emitting diodes (LEDs) to flood the field of view of the imaging optics in such scanning systems. A large percentage of the output illumination from these LED sources is dispersed to regions other than the field of view of the scanning system. Consequently, only a small percentage of the illumination is actually collected by the imaging optics of the system, Examples of prior art CCD hand-held image scanners employing LED illumination arrangements are disclosed in U.S. Pat. Nos. Re. 36,528, 5,777,314, 5,756,981, 5,627,358, 5,484,994, 5,786,582, and 6,123,261 to Roustaei, each assigned to Symbol Technologies, Inc. and incorporated herein by reference in its entirety. In such prior art CCD-based hand-held image scanners, an array of LEDs are mounted in a scanning head in front of a CCD-based image sensor that is provided with a cylindrical lens assembly. The LEDs are arranged at an angular orientation relative to a central axis passing through the scanning head so that a fan of light is emitted through the light transmission aperture thereof that expands with increasing distance away from the LEDs. The intended purpose of this LED illumination arrangement is to increase the "angular distance" and "depth of field" of CCD-based bar code symbol readers. However, even with such improvements in LED illumination techniques, the working distance of such hand-held CCD scanners can only be extended by using more LEDs within the scanning head of such scanners to produce greater illumination output therefrom, thereby increasing the cost, size and weight of such scanning devices.

Similarly, prior art "hold-under" and "hands-free presentation" type CCD-based image scanners suffer from shortcomings and drawbacks similar to those associated with prior art CCD-based hand-held image scanners.

Thus, there is a great need in the art for an improved method of and system for illuminating the surface of objects during image formation and detection operations, and also an improved method of and system for producing digital images using such improved methods object illumination, while avoiding the shortcomings and drawbacks of prior art illumination, imaging and scanning systems and methodologies.

OBJECTS AND SUMMARY OF THE PRESENT INVENTION

Accordingly, a primary object of the present invention is to provide an improved method of and system for illuminating the surface of objects during image formation and detection operations and also improved methods of and systems for producing digital images using such improved methods object illumination, while avoiding the shortcomings and drawbacks of prior art systems and methodologies.

Another object of the present invention is to provide such an improved method of and system or device for illuminating the surface of objects using a linear array of laser light emitting devices configured together to produce a substantially planar beam of laser illumination which extends in substantially the same plane as the field of view of the linear array of electronic image detection cells of the system, along at least a portion of its optical path within its working distance, Another object of the present invention is to provide such an image producing system, wherein the linear array of electronic image detection cells are realized using charge-coupled device (CCD) technology.

Another object of the present invention is to provide such an improved method of and system for producing digital images of objects using a visible laser diode array for producing a planar laser illumination beam for illuminating the surfaces of such objects, and also an electronic image detection array for detecting laser light reflected off the illuminated objects during illumination and imaging operations.

Another object of the present invention is to provide such an improved method of and system for illuminating the surfaces of object to be imaged, using an array of planar laser illumination arrays which employ VLDs that are smaller, and cheaper, run cooler, draw less power, have longer lifetimes, and require simpler optics (because their frequency bandwidths are very small compared to the entire spectrum of visible light).

Another object of the present invention is to provide such an improved method of and system for illuminating the surfaces of objects to be imaged, wherein the VLD concentrates all of its output power into a thin laser beam illumination plane which spatially coincides exactly with the field of view of the imaging optics of the system, so very little light energy is wasted.

Another object of the present invention is to provide a planar laser illumination and imaging (PLIIM) system, wherein the working distance of the system can be easily extended by simply changing the beam focusing and imaging optics, and without increasing the output power of the visible laser diode (VLD) sources employed therein.

Another object of the present invention is to provide a planar laser illumination and imaging (PLIIM) system, wherein each planar laser illumination beam is focused so that the minimum width thereof (e.g. 0.6 mm along its non-spreading direction) occurs at a point or plane which is the farthest object distance at which the system is designed to capture images.

Another object of the present invention is to provide a planar laser illumination and imaging (PLIIM) system, wherein a fixed focal length imaging subsystem is employed, and the laser beam focusing technique of the present invention helps compensate for decreases in the power density of the incident planar illumination beam due to the fact that the width of the planar laser illumination beam for increasing distances away from the imaging subsystem.

Another object of the present invention is to provide a planar laser illumination and imaging (PLIIM) system, wherein a variable focal length (i.e. zoom) imaging subsystem is employed, and the laser beam focusing technique of the present invention helps compensate for (i) decreases in the power density of the incident illumination beam due to the fact that the width of the planar laser illumination beam (i.e. beamwidth) along the direction of the beam's planar extent increases for increasing distances away from the imaging subsystem, and (ii) any $1/r^2$ type losses that would typically occur when using the planar laser illumination beam of the present invention.

Another object of the present invention is to provide a planar laser illumination and imaging (PLIIM) system, wherein scanned objects need only be illuminated along a single plane which is coplanar with a planar section of the field of view of the image formation and detection module being used in the PLIIM system.

Another object of the present invention is to provide a planar laser illumination and imaging (PLIIM) system, wherein the planar laser illumination technique of the present invention enables high-speed modulation of the planar laser illumination beam, and use of simple (i.e. substantially monochromatic) lens designs for substantially monochromatic optical illumination and image formation and detection operations.

Another object of the present invention is to provide a planar laser illumination and imaging (PLIIM) system, wherein the planar laser illumination beam and the field of view of the image formation and detection module do not overlap on any optical surface within the PLIIM system.

Another object of the present invention is to provide a planar laser illumination and imaging (PLIIM) system, wherein the planar laser illumination beams are permitted to spatially overlap with the FOV of the imaging lens of the PLIIM only outside of the system housing, measured at a particular point beyond the light transmission window, through which the FOV is projected.

Another object of the present invention is to provide a planar laser illumination (PLIM) system for use in illuminating objects being imaged.

Another object of the present invention is to provide planar laser illumination and substantially-monochromatic imaging system, wherein the monochromatic imaging module is realized as an array of electronic image detection cells (e.g. CCD).

Another object of the present invention is to provide a planar laser illumination and substantially-monochromatic imaging system, wherein the planar laser illumination arrays (PLIAs) and the image formation and detection (IFD) module are mounted in strict optical alignment on an optical bench such that there is substantially no relative motion, caused by vibration or temperature changes, is permitted between the imaging lens within the IFD module and the VLD/cylindrical lens assemblies within the PLIAs.

Another object of the present invention is to provide a planar laser illumination and substantially-monochromatic imaging system, wherein the imaging module is realized as a photographic image recording module.

Another object of the present invention is to provide a planar laser illumination and substantially-monochromatic imaging system, wherein the imaging module is realized as an array of electronic image detection cells (e.g. CCD) having short integration time settings for high-speed image capture operations.

Another object of the present invention is to provide a planar laser illumination and substantially-monochromatic imaging system, wherein a pair of planar laser illumination arrays are mounted about an image formation and detection module having a field of view, so as to produce a substantially planar laser illumination beam which is coplanar with the field of view during object illumination and imaging operations.

Another object of the present invention is to provide a planar laser illumination and substantially-monochromatic imaging system, the principle of Gaussian summation of light intensity distributions is employed to produce a planar laser illumination beam having a power density across the width the beam which is substantially the same for both far and near fields of the system.

Another object of the present invention is to provide method of and system for illuminating the surfaces of objects during image formation and detection operations.

Another object of the present invention is to provide method of and system for producing digital images of objects using planar laser illumination beams and electronic image detection arrays.

Another object of the present invention is to provide method of and system for producing a planar laser illumination beam to illuminate the surface of objects and electronically detecting light reflected off the illuminated objects during planar laser beam illumination operations.

Another object of the present invention is to provide a hand-held coplanar laser-illuminated image detection and processing system or device for use in reading bar code symbols and other character strings.

Another object of the present invention is to provide method of and system for producing images of objects by focusing a planar laser illumination beam within the field of view of an imaging lens so that the minimum width thereof along its non-spreading direction occurs at the farthest object distance of the imaging lens.

Another object of the present invention is to provide such system in which lasers beams having multiple wavelengths are used to sense packages having a wide range of reflectivity characteristics.

Another object of the present invention is to provide improved image-based hand-held scanners, body-wearable scanners, presentation-type scanners, and hold-under scanners which embody the PLIIM subsystem of the present invention.

As will be described in greater detail in the Detailed Description of the Illustrative Embodiments set forth below, such objectives are achieved in novel methods of and systems for illuminating objects (e.g. bar coded packages, textual materials, graphical indicia, etc.) using planar laser illumination beams having substantially-planar spatial distribution characteristics that extend through the field of view (FOV) of image formation and detection modules (e.g. realized within a CCD-type digital electronic camera employed in such systems.

In each illustrative embodiment of the present invention, the substantially planar laser illumination beams are preferably produced from a planar laser illumination beam array (PLIA) comprising an plurality of planar laser illumination modules (PLIMs). Each PLIM comprises a visible laser diode (VLD, a focusing lens, and a cylindrical optical element arranged therewith. The individual planar laser illumination beam components produced from each PLIM are optically combined within the PLIA to produce a composite substantially planar laser illumination beam having substantially uniform power density characteristics over the entire spatial extend thereof and thus the working range of the system.

Preferably, each planar laser illumination beam component is focused so that the minimum beam width thereof occurs at a point or plane which is the farthest or maximum object distance at which the system is designed to acquire images. In the case of both fixed and variable focal length imaging systems, this inventive principle helps compensate for decreases in the power density of the incident planar laser illumination beam due to the fact that the width of the planar laser illumination beam increases in length for increasing object distances away from the imaging subsystem.

By virtue of the novel principles of the present invention, it is now possible to use both VLDs and high-speed CCD-type image detectors in conveyor, hand-held and hold-under type scanning applications alike, enjoying the advantages and benefits that each such technology has to offer, while avoiding the shortcomings and drawbacks hitherto associated therewith.

These and other objects of the present invention will become apparent hereinafter and in the claims to Invention.

BRIEF DESCRIPTION OF THE DRAWINGS

For a more complete understanding of the present invention, the following Detailed Description of the Illustrative Embodiment should be read in conjunction with the accompanying Drawings, wherein:

FIG. 1B1 is a schematic representation of the first illustrative embodiment of the PLIIM system of the present invention shown in FIG. 1A, wherein the field of view of the image formation and detection module is folded in the downwardly imaging direction by the field of view folding mirror so that both the folded field of view and resulting stationary planar laser illumination beams produced by the planar illumination arrays are arranged in a substantially coplanar relationship during object illumination and image detection operations;

FIG. 1B2 is a schematic representation of the PLIIM system shown in FIG. 1A, wherein the linear image formation and detection module is shown comprising a linear array of photo-electronic detectors realized using CCD technology, and each planar laser illumination array is shown comprising an array of planar laser illumination modules;

FIG. 1C is a schematic representation of a single planar laser illumination module (PLIM) used to construct each planar laser illumination array shown in FIG. 1B, wherein the planar laser illumination beam emanates substantially within a single plane along the direction of beam propagation towards an object to be optically illuminated;

FIG. 1D is a schematic diagram of the planar laser illumination module of FIG. 1C, shown comprising a visible laser diode (VLD), a light collimating lens, and a cylindrical-type lens element configured together to produce a beam of planar laser illumination;

FIG. 1E1 is a plan view of the VLD, collimating lens and cylindrical lens assembly employed in the planar laser illumination module of FIG. 1C, showing that the focused laser beam from the collimating lens is directed on the input side of the cylindrical lens, and the output beam produced therefrom is a planar laser illumination beam expanded (i.e. spread out) along the plane of propagation;

FIG. 1E2 is an elevated side view of the VLD, collimating lens and cylindrical lens assembly employed in the planar laser illumination module of FIG. 1C, showing that the laser beam is transmitted through the cylindrical lens without expansion in the direction normal to the plane of propagation, but is focused by the collimating lens at a point residing within a plane located at the farthest object distance supported by the PLIIM system;

FIG. 1G1 is a schematic representation of an exemplary realization of the PLIIM system of FIG. 1A, shown comprising a linear image formation and detection module, a pair of planar laser illumination arrays, and a field of view (FOV) folding mirror for folding the fixed field of view of the linear image formation and detection module in a direction that is coplanar with the plane of laser illumination beams produced by the planar laser illumination arrays;

FIG. 1G2 is a plan view schematic representation of the PLIIM system, taken along line 1G2-1G2 in FIG. 1G1, showing the spatial extent of the fixed field of view of the linear image formation and detection module in the illustrative embodiment of the present invention;

FIG. 1G3 is an elevated end view schematic representation of the PLIIM system, taken along line 1G3-1G3 in FIG. 1G1, showing the fixed field of view of the linear image formation and detection module being folded in the downwardly imaging direction by the field of view folding mirror, and the planar laser illumination beam produced by each planar laser illumination module being directed in the imaging direction such that both the folded field of view and planar laser illumination beams are arranged in a substantially coplanar relationship during object illumination and image detection operations;

FIG. 1G4 is an elevated side view schematic representation of the PLIIM system, taken along line 1G4-1G4 in FIG. 1G1, showing the field of view of the image formation and detection module being folded in the downwardly imaging direction by the field of view folding mirror, and the planar laser illumination beam produced by each planar laser illumination module being directed along the imaging direction such that both the folded field of view and stationary planar laser illumination beams are arranged in a substantially coplanar relationship during object illumination and image detection operations;

FIG. 1G5 is an elevated side view of the PLIIM system of FIG. 1G1, showing the spatial limits of the fixed field of view (FOV) of the image formation and detection module when set to image the tallest packages moving on a conveyor belt structure, as well as the spatial limits of the fixed FOV of the image formation and detection module when set to image objects having height values close to the surface height of the conveyor belt structure;

FIG. 1G6 is a perspective view of a first type of light shield which can be used in the PLIIM system of FIG. 1G1, to visually block portions of planar laser illumination beams that extend beyond the scanning field of the system, but which could pose a health risk to humans if viewed thereby during system operation;

FIG. 1G7 is a perspective view of a second type of light shield which can be used in the PLIIM system of FIG. 1G1, to visually block portions of planar laser illumination beams that extend beyond the scanning field of the system, but which could pose a health risk to humans if viewed thereby during system operation;

FIG. 1G8 is a perspective view of one planar laser illumination array (PLIA) employed in the PLIIM system of FIG. 1G1, showing an array of visible laser diodes (VLDs), each mounted within a VLD mounting block wherein a focusing lens is mounted and on the end of which there is a v-shaped notch or recess, within which a cylindrical lens element is mounted, and wherein each such VLD mounting block is mounted on an L-bracket for mounting within the housing of the PLIIM system;

FIG. 1G9 is an elevated end view of one planar laser illumination array (PLIA) employed in the PLIIM system of FIG. 1G1, taken along line 1G9-1G9 thereof;

FIG. 1G10 is an elevated side view of one planar laser illumination array (PLIA) employed in the PLIIM system of FIG. 1G1, taken along line 1G10-1G10 thereof, showing a visible laser diode (VLD) and a focusing lens mounted within a VLD mounting block, and a cylindrical lens element mounted at the end of the VLD mounting block, so that the central axis of the cylindrical lens element is substantially perpendicular to the optical axis of the focusing lens;

FIG. 1G11 is an elevated side view of one of the VLD mounting blocks employed in the PLIIM system of FIG. 1G1, taken along a viewing direction which is orthogonal to the central axis of the cylindrical lens element mounted to the end portion of the VLD mounting block;

FIG. 1G12 is an elevated plan view of one of VLD mounting blocks employed in the PLIIM system of FIG. 1G1, taken along a viewing direction which is parallel to the central axis of the cylindrical lens element mounted to the VLD mounting block;

FIG. 1H1 is an elevated side view of the collimating lens element installed within each VLD mounting block employed in the PLIIM system of FIG. 1G1;

FIG. 1H2 is an axial view of the collimating lens element installed within each VLD mounting block employed in the PLIIM system of FIG. 1G1;

FIG. 1I1 is an elevated plan view of one of planar laser illumination modules (PLIMs) employed in the PLIIM system of FIG. 1G1, taken along a viewing direction which is parallel to the central axis of the cylindrical lens element mounted in the VLD mounting block thereof, showing that the cylindrical lens element expands (i.e. spreads out) the laser beam along the direction of beam propagation so that a substantially planar laser illumination beam is produced, which is characterized by a plane of propagation that is coplanar with the direction of beam propagation;

FIG. 1I2 is an elevated plan view of one of the PLIMs employed in the PLIIM system of FIG. 1G1, taken along a viewing direction which is perpendicular to the central axis of the cylindrical lens element mounted within the axial bore of the VLD mounting block thereof, showing that the focusing lens planar focuses the laser beam to its minimum beam width at a point which is the farthest distance at which the system is designed to capture images, while the cylindrical lens element does not expand or spread out the laser beam in the direction normal to the plane of propagation of the planar laser illumination beam;

FIG. 1J1 is a geometrical optics model for the imaging subsystem employed in the linear-type image formation and detection module in the PLIIM system of the first generalized embodiment shown in FIG. 1A;

FIG. 1J2 is a geometrical optics model for the imaging subsystem and linear image detection array employed in linear-type image detection array employed in the image formation and detection module in the PLIIM system of the first generalized embodiment shown in FIG. 1A;

FIG. 1J3 is a graph, based on thin lens analysis, showing that the image distance at which light is focused through a thin lens is a function of the object distance at which the light originates;

FIG. 1J4 is a schematic representation of an imaging subsystem having a variable focal distance lens assembly, wherein a group of lens can be controllably moved along the optical axis of the subsystem, and having the effect of changing the image distance to compensate for a change in object distance, allowing the image detector to remain in place;

FIG. 1J5 is schematic representation of a variable focal length (zoom) imaging subsystem which is capable of changing its focal length over a given range; so that a longer focal length produces a smaller field of view at a given object distance;

FIG. 1J6 is a schematic representation of an illustrative embodiment of the image formation and detection (IFD) module employed in the PLIIM systems of the present invention, wherein various optical parameters used to model the system are defined and graphically indicated wherever possible;

FIG. 1K1 is a schematic representation illustrating how the field of view of a PLIIM system can be fixed to substantially match the scan field width thereof (measured at the top of the scan field) at a substantial distance above a conveyor belt;

FIG. 1K2 is a schematic representation illustrating how the field of view of a PLIIM system can be fixed to substantially match the scan field width of a low profile scanning field slightly above the conveyor belt surface, by fixed the focal length of the imaging subsystem during the optical design stage;

FIG. 1L1 is a schematic representation illustrating how an arrangement of FOV beam folding mirrors can be used to produce an expanded FOV that matches the geometrical characteristics of the scanning application at hand, when the FOV emerges from the system housing;

FIG. 1L2 is a schematic representation illustrating how the fixed field of view of an imaging subsystem can be expanded across a working space (e.g. conveyor belt structure) by rotating the FOV during object illumination and imaging operations;

FIG. 1M1 shows a data plot of pixel power density $E_{pix}$ vs. object distance r calculated using the arbitrary but reasonable values $E_0$=1 W/m$^2$, f=80 mm and F=4.5, demonstrating that, in a counter-intuitive manner, the power density at the pixel (and therefore the power incident on the pixel, since its area remains constant) actually increases as the object distance increases;

FIG. 1M2 is data plot of laser beam power density vs. position along the planar laser beam width showing that the total output power in the planar laser illumination beam of the present invention is distributed along the width of the beam in a roughly Gaussian distribution;

FIG. 1M3 shows a plot of beam width length L vs. object distance r calculated using a beam fan/spread angle $\theta$=50°, demonstrating that the planar laser beam width increases as a function of increasing object distance;

FIG. 1M4 is a typical data plot of planar laser beam height h vs. image distance r for a planar laser illumination beam of the present invention focused at the farthest working distance in accordance with the principles of the present invention, demonstrating that the height dimension of the planar laser beam decreases as a function of increasing object distance;

FIG. 1O is a data plot of pixel power density $E_0$ vs. object distance, obtained when using a planar laser illumination beam whose beam height decreases with increasing object distance, and also a data plot of the "reference" pixel power density plot $E_{pix}$ vs. object distance obtained when using a planar laser illumination beam whose beam height is substantially constant (e.g. 1 mm) over the entire portion of the object distance range of the PLIIM system;

FIG. 1P1 is a schematic representation of the composite power density characteristics associated with the planar laser illumination array in the PLIIM system of FIG. 1G1, taken at the "near field region" of the system, and resulting from the additive contributions of the individual visible laser diodes in the planar laser illumination arrays;

FIG. 1P2 is a schematic representation of the composite power density characteristics associated with the planar laser illumination array in the PLIIM system of FIG. 1G1, taken at the "far field region" of the system, and resulting from the additive contributions of the individual visible laser diodes in the planar laser illumination arrays;

FIG. 1Q1 is a schematic representation of second illustrative embodiment of the PLIIM system of the present invention shown in FIG. 1A, shown comprising a linear image formation and detection module, and a pair of planar laser illumination arrays arranged in relation to the image formation and detection module such that the field of view thereof is oriented in a direction that is coplanar with the plane of the stationary planar laser illumination beams produced by the planar laser illumination arrays, without using any laser beam or field of view folding mirrors;

FIG. 1Q2 is a block schematic diagram of the PLIIM system shown in FIG. 1Q1, comprising a linear image formation and detection module, a pair of planar laser illumination arrays, an image frame grabber, an image data buffer, a decode image processor, and a system controller;

FIG. 1R1 is a schematic representation of third illustrative embodiment of the PLIIM system of the present invention shown in FIG. 1A, shown comprising a linear image formation and detection module having a field of view, a pair of planar laser illumination arrays for producing first and second stationary planar laser illumination beams, and a pair of stationary planar laser beam folding mirrors arranged so as to fold the optical paths of the first and second planar laser illumination beams such that the planes of the first and second stationary planar laser illumination beams are in a direction that is coplanar with the field of view of the image formation and detection module;

FIG. 1R2 is a block schematic diagram of the PLIIM system shown in FIG. 1P1, comprising a linear image formation and detection module, a stationary field of view folding mirror, a pair of planar illumination arrays, a pair of stationary planar laser illumination beam folding mirrors, an image frame grabber, an image data buffer, a decode image processor, and a system controller;

FIG. 1S1 is a schematic representation of fourth illustrative embodiment of the PLIIM system of the present invention shown in FIG. 1A, shown comprising a linear image formation and detection module having a field of view (FOV), a stationary field of view (FOV) folding mirror for folding the field of view of the image formation and detection module, a pair of planar laser illumination arrays for producing first and second stationary planar laser illumination beams, and a pair of stationary planar laser illumination beam folding mirrors for folding the optical paths of the first and second stationary planar laser illumination beams so that planes of first and second stationary planar laser illumination beams are in a direction that is coplanar with the field of view of the image formation and detection module;

FIG. 1S2 is a block schematic diagram of the PLIIM system shown in FIG. 1S1, comprising a linear-type image formation and detection module, a stationary field of view folding mirror, a pair of planar laser illumination arrays, a pair of stationary planar laser beam folding mirrors, an image frame grabber, an image data buffer, a decode image processor, and a system controller;

FIG. 1V1 is a is a schematic representation of second generalized embodiment of the PLIIM system of the present invention, wherein a pair of planar laser illumination arrays (PLIAs) are mounted on opposite sides of a linear type image formation and detection module (IFDM) having a field of view, such that the planar laser illumination arrays produce a plane of laser beam illumination (i.e. light) which is disposed substantially coplanar with the field of view of the image formation and detection module, and that the planar laser illumination beam and the field of view of the image formation and detection module move synchronously while maintaining their coplanar relationship with each other as the planar laser illumination beam is automatically scanned over a 2-D region of space during object illumination and image detection operations;

FIG. 1V2 is a schematic representation of first illustrative embodiment of the PLIIM system of the present invention shown in FIG. 1V1, shown comprising an image formation and detection module having a field of view (FOV), a field of view (FOV) folding/sweeping mirror for folding the field of view of the image formation and detection module, a pair of planar laser illumination arrays for producing first and second planar laser illumination beams, and a pair of planar laser beam folding/sweeping mirrors, jointly or synchronously movable with the FOV folding/sweeping mirror, and arranged so as to fold and sweep the optical paths of the first and second planar laser illumination beams, so that the folded field of view of the image formation and detection module is synchronously moved with the planar laser illumination beams in a direction that is coplanar therewith as the planar laser illumination beams are scanned over a 2-D region of space under the control of the system controller;

FIG. 1V3 is a block schematic diagram of the PLIIM system shown in FIG. 1V1, comprising a pair of planar illumination arrays, a pair of planar laser beam folding/sweeping mirrors, a linear-type image formation and detection module, a field of view folding/sweeping mirror, an image frame grabber, an image data buffer, a decode image processor, and a system controller;

FIG. 1V4 is a schematic representation of an over-the-conveyor belt package identification system embodying the PLIIM system of FIG. 1V1;

FIG. 1V5 is a schematic representation of a presentation-type bar code symbol reading system embodying the PLIIM system of FIG. 1V1;

FIG. 2B1 is a schematic representation of a first illustrative embodiment of the PLIIM system shown in FIG. 2A, comprising an image formation and detection module having a field of view (FOV), and a pair of planar laser illumination arrays for producing first and second stationary planar laser illumination beams in an imaging direction that is coplanar with the field of view of the image formation and detection module;

FIG. 2B2 is a schematic representation of the PLIIM system of the present invention shown in FIG. 2B1, wherein the linear image formation and detection module is shown comprising a linear array of photo-electronic detectors realized using CCD technology, and each planar laser illumination array is shown comprising an array of planar laser illumination modules;

FIG. 2C1 is a block schematic diagram of the PLIIM system shown in FIG. 2B1, comprising a pair of planar illumination arrays, a linear-type image formation and detection module, an image frame grabber, an image data buffer, a decode image processor, and a system controller;

FIG. 2C2 is a schematic representation of the linear type image formation and detection module (IFDM) employed in the PLIIM system shown in FIG. 2B1, wherein an imaging subsystem having a fixed focal length imaging lens, a variable focal distance and a fixed field of view is arranged on an optical bench, mounted within a compact module housing, and responsive to focus control signals generated by the system controller of the PLIIM system;

FIG. 2D1 is a schematic representation of the second illustrative embodiment of the PLIIM system of the present invention shown in FIG. 2A, shown comprising a linear image formation and detection module, a stationary field of view (FOV) folding mirror for folding the field of view of the image formation and detection module, and a pair of planar laser illumination arrays arranged in relation to the image formation and detection module such that the folded field of view is oriented in an imaging direction that is coplanar with the stationary planes of laser illumination produced by the planar laser illumination arrays;

FIG. 2D2 is a block schematic diagram of the PLIIM system shown in FIG. 2D1, comprising a pair of planar laser illumination arrays (PLIAs), a linear-type image formation and detection module, a stationary field of view of folding mirror, an image frame grabber, an image data buffer, a decode image processor, and a system controller;

FIG. 2D3 is a schematic representation of the linear type image formation and detection module (IFDM) employed in the PLIIM system shown in FIG. 2D1, wherein an imaging subsystem having a fixed focal length imaging lens, a variable focal distance and a fixed field of view is arranged on an optical bench, mounted within a compact module housing, and responsive to focus control signals generated by the system controller of the PLIIM system;

FIG. 2E1 is a schematic representation of the third illustrative embodiment of the PLIIM system of the present invention shown in FIG. 1A, shown comprising an image formation and detection module having a field of view (FOV), a pair of planar laser illumination arrays for producing first and second stationary planar laser illumination beams, a pair of stationary planar laser beam folding mirrors for folding the stationary (i.e. non-swept) planes of the planar laser illumination beams produced by the pair of planar laser illumination arrays, in an imaging direction that is coplanar with the stationary plane of the field of view of the image formation and detection module during system operation;

FIG. 2E2 is a block schematic diagram of the PLIIM system shown in FIG. 2B1, comprising a pair of planar laser illumination arrays, a linear image formation and detection module, a pair of stationary planar laser illumination beam folding mirrors, an image frame grabber, an image data buffer, a decode image processor, and a system controller;

FIG. 2E3 is a schematic representation of the linear image formation and detection module (IFDM) employed in the PLIIM system shown in FIG. 2B1, wherein an imaging subsystem having fixed focal length imaging lens, a variable focal distance and a fixed field of view is arranged on an optical bench, mounted within a compact module housing, and responsive to focus control signals generated by the system controller of the PLIIM system;

FIG. 2F1 is a schematic representation of the fourth illustrative embodiment of the PLIIM system of the present invention shown in FIG. 2A, shown comprising a linear image formation and detection module having a field of view (FOV), a stationary field of view (FOV) folding mirror, a pair of planar laser illumination arrays for producing first and second stationary planar laser illumination beams, and a pair of stationary planar laser beam folding mirrors arranged so as to fold the optical paths of the first and second stationary planar laser illumination beams so that these planar laser illumination beams are oriented in an imaging direction that is coplanar with the folded field of view of the linear image formation and detection module;

FIG. 2F2 is a block schematic diagram of the PLIIM system shown in FIG. 2F1, comprising a pair of planar illumination arrays, a linear image formation and detection module, a stationary field of view (FOV) folding mirror, a pair of stationary planar laser illumination beam folding mirrors, an image frame grabber, an image data buffer, a decode image processor, and a system controller;

FIG. 2F3 is a schematic representation of the linear type image formation and detection module (IFDM) employed in the PLIIM system shown in FIG. 2F1, wherein an imaging subsystem having a fixed focal length imaging lens, a variable focal distance and a fixed field of view is arranged on an optical bench, mounted within a compact module housing, and responsive to focus control signals generated by the system controller of the PLIIM system;

FIG. 2I1 is a schematic representation of the fourth generalized embodiment of the PLIIM system of the present invention, wherein a pair of planar laser illumination arrays (PLIAs) are mounted on opposite sides of a linear image formation and detection module (IFDM) having a fixed focal length imaging lens, a variable focal distance and fixed field of view (FOV), so that the planar illumination arrays produces a plane of laser beam illumination which is disposed substantially coplanar with the field view of the image formation and detection module and synchronously moved therewith while the planar laser illumination beams are automatically scanned over a 2-D region of space during object illumination and imaging operations;

FIG. 2I2 is a schematic representation of the first illustrative embodiment of the PLIIM system of the present invention shown in FIG. 2I1, shown comprising an image formation and detection module having a field of view (FOV), a field of view (FOV) folding/sweeping mirror, a pair of planar laser illumination arrays for producing first and second planar laser illumination beams, and a pair of planar laser beam folding/sweeping mirrors, jointly movable with the FOV folding/sweeping mirror, and arranged so that the field of view of the image formation and detection module is coplanar with the folded planes of first and second planar laser illumination beams, and the coplanar FOV and planar laser illumination beams are synchronously moved together while the planar laser illumination beams and FOV are scanned over a 2-D region of space containing a stationary or moving bar code symbol or other graphical structure (e.g. text) embodying information;

FIG. 2I3 is a block schematic diagram of the PLIIM system shown in FIGS. 2I1 and 2I2, comprising a pair of planar illumination arrays, a linear image formation and detection module, a field of view (FOV) folding/sweeping mirror, a pair of planar laser illumination beam folding/sweeping mirrors jointly movable therewith, an image frame grabber, an image data buffer, a decode image processor, and a system controller;

FIG. 2I4 is a schematic representation of the linear type image formation and detection module (IFDM) employed in the PLIIM system shown in FIGS. 2I1 and 2I2, wherein an imaging subsystem having a fixed focal length imaging lens, a variable focal distance and a fixed field of view is arranged on an optical bench, mounted within a compact module housing, and responsive to focus control signals generated by the system controller of the PLIIM system;

FIG. 2I5 is a schematic representation of a hand-supportable bar code symbol reader embodying the PLIIM system of FIG. 2I1;

FIG. 2I6 is a schematic representation of a presentation-type bar code symbol reader embodying the PLIIM system of FIG. 2I1;

FIG. 3B1 is a schematic representation of the first illustrative embodiment of the PLIIM system of the present invention shown in FIG. 3A, shown comprising an image formation and detection module, and a pair of planar laser illumination arrays arranged in relation to the image formation and detection module such that the stationary field of view thereof is oriented in an imaging direction that is coplanar with the stationary plane of laser illumination produced by the planar laser illumination arrays, without using any laser beam or field of view folding mirrors.

FIG. 3B2 is a schematic representation of the first illustrative embodiment of the PLIIM system shown in FIG. 3B1, wherein the linear image formation and detection module is shown comprising a linear array of photo-electronic detectors realized using CCD technology, and each planar laser illumination array is shown comprising an array of planar laser illumination modules;

FIG. 3C1 is a block schematic diagram of the PLIIM shown in FIG. 3B1, comprising a pair of planar laser illumination arrays, a linear image formation and detection module, an image frame grabber, an image data buffer, a decode image processor, and a system controller;

FIG. 3C2 is a schematic representation of the linear type image formation and detection module (IFDM) employed in the PLIIM system shown in FIG. 3B1, wherein an imaging subsystem having a variable focal length imaging lens, a variable focal distance and a variable field of view is arranged on an optical bench, mounted within a compact module housing, and responsive to zoom and focus control signals generated by the system controller of the PLIIM system;

FIG. 3E1 is a schematic representation of the second illustrative embodiment of the PLIIM system of the present invention shown in FIG. 3A, shown comprising a linear image formation and detection module, a pair of planar laser illumination arrays, and a stationary field of view (FOV) folding mirror arranged in relation to the image formation and detection module such that the stationary field of view thereof is oriented in an imaging direction that is coplanar with the stationary plane of laser illumination produced by the planar laser illumination arrays, without using any planar laser illumination beam folding mirrors;

FIG. 3E2 is a block schematic diagram of the PLIIM system shown in FIG. 3E1, comprising a pair of planar illumination arrays, a linear image formation and detection module, a stationary field of view (FOV) folding mirror, an image frame grabber, an image data buffer, a decode image processor, and a system controller;

FIG. 3E3 is a schematic representation of the linear type image formation and detection module (IFDM) employed in the PLIIM system shown in FIG. 3E1, wherein an imaging subsystem having a variable focal length imaging lens, a variable focal distance and a variable field of view is arranged on an optical bench, mounted within a compact module housing, and responsive to zoom and focus control signals generated by the system controller of the PLIIM system;

FIG. 3E4 is a schematic representation of the PLIIM system of FIG. 3E1, shown comprising a linear-type image formation and detection module, a pair of planar laser illumination arrays, and a field of view (FOV) folding mirror for folding the field of view of the image formation and detection module in a direction that is coplanar with the plane of laser illumination produced by the planar illumination arrays;

FIG. 3E5 is a plan view schematic representation of the PLIIM system, taken along line 3E5-3E5 in FIG. 3E4, showing the spatial extent of the field of view of the image formation and detection module in the illustrative embodiment of the present invention;

FIG. 3E6 is an elevated end view schematic representation of the PLIIM system, taken along line 3E6-3E6 in FIG. 3E4, showing the field of view of the linear image formation and detection module being folded in the downwardly imaging direction by the field of view folding mirror, and the planar laser illumination beam produced by each planar laser illumination module being directed in the imaging direction such that both the folded field of view and planar laser illumination beams are arranged in a substantially coplanar relationship during object illumination and imaging operations;

FIG. 3E7 is an elevated side view schematic representation of the PLIIM system, taken along line 3E7-3E7 in FIG. 3E4, showing the field of view of the linear image formation and detection module being folded in the downwardly imaging direction by the field of view folding mirror, and the planar laser illumination beam produced by each planar laser illumination module being directed along the imaging direction such that both the folded field of view and stationary planar laser illumination beams are arranged in a substantially coplanar relationship during object illumination and image detection operations;

FIG. 3E8 is an elevated side view of the PLIIM system of FIG. 3E4, showing the spatial limits of the variable field of view (FOV) of the linear image formation and detection module when controllably adjusted to image the tallest packages moving on a conveyor belt structure, as well as the spatial limits of the variable FOV of the linear image formation and detection module when controllably adjusted to image objects having height values close to the surface height of the conveyor belt structure;

FIG. 3F1 is a schematic representation of the third illustrative embodiment of the PLIIM system of the present invention shown in FIG. 3A, shown comprising a linear image formation and detection module having a field of view (FOV), a pair of planar laser illumination arrays for producing first and second stationary planar laser illumination beams, a pair of stationary planar laser illumination beam folding mirrors arranged relative to the planar laser illumination arrays so as to fold the stationary planar laser illumination beams produced by the pair of planar illumination arrays in an imaging direction that is coplanar with stationary field of view of the image formation and detection module during illumination and imaging operations;

FIG. 3F2 is a block schematic diagram of the PLIIM system shown in FIG. 3FF1, comprising a pair of planar illumination arrays, a linear image formation and detection module, a pair of stationary planar laser illumination beam folding mirrors, an image frame grabber, an image data buffer, a decode image processor, and a system controller;

FIG. 3F3 is a schematic representation of the linear type image formation and detection module (IFDM) employed in the PLIIM system shown in FIG. 3F1, wherein an imaging subsystem having a variable focal length imaging lens, a variable focal distance and a variable field of view is arranged on an optical bench, mounted within a compact module housing, and responsive to zoom and focus control signals generated by the system controller of the PLIIM system during illumination and imaging operations;

FIG. 3G1 is a schematic representation of the fourth illustrative embodiment of the PLIIM system of the present invention shown in FIG. 3A, shown comprising a linear image formation and detection module having a field of view (FOV), a pair of planar laser illumination arrays for producing first and second stationary planar laser illumination beams, a stationary field of view (FOV) folding mirror for folding the field of view of the image formation and detection module, and a pair of stationary planar laser beam folding mirrors arranged so as to fold the optical paths of the first and second planar laser illumination beams such that stationary planes of first and second planar laser illumination beams are in an imaging direction which is coplanar with the field of view of the image formation and detection module during illumination and imaging operations;

FIG. 3G2 is a block schematic diagram of the PLIIM system shown in FIG. 3G1, comprising a pair of planar illumination arrays, a linear image formation and detection module, a stationary field of view (FOV) folding mirror, a pair of stationary planar laser illumination beam folding mirrors, an image frame grabber, an image data buffer, a decode image processor, and a system controller;

FIG. 3G3 is a schematic representation of the linear type image formation and detection module (IFDM) employed in the PLIIM system shown in FIG. 3G1, wherein an imaging subsystem having a variable focal length imaging lens, a variable focal distance and a variable field of view is arranged on an optical bench, mounted within a compact module housing, and responsive to zoom and focus control signals generated by the system controller of the PLIIM system during illumination and imaging operations;

FIG. 3I1 is a schematic representation of a hand-supportable bar code symbol reading device embodying the PLIIM system of FIG. 3A.

DETAILED DESCRIPTION OF THE ILLUSTRATIVE EMBODIMENTS OF THE PRESENT INVENTION

Figure 1A:
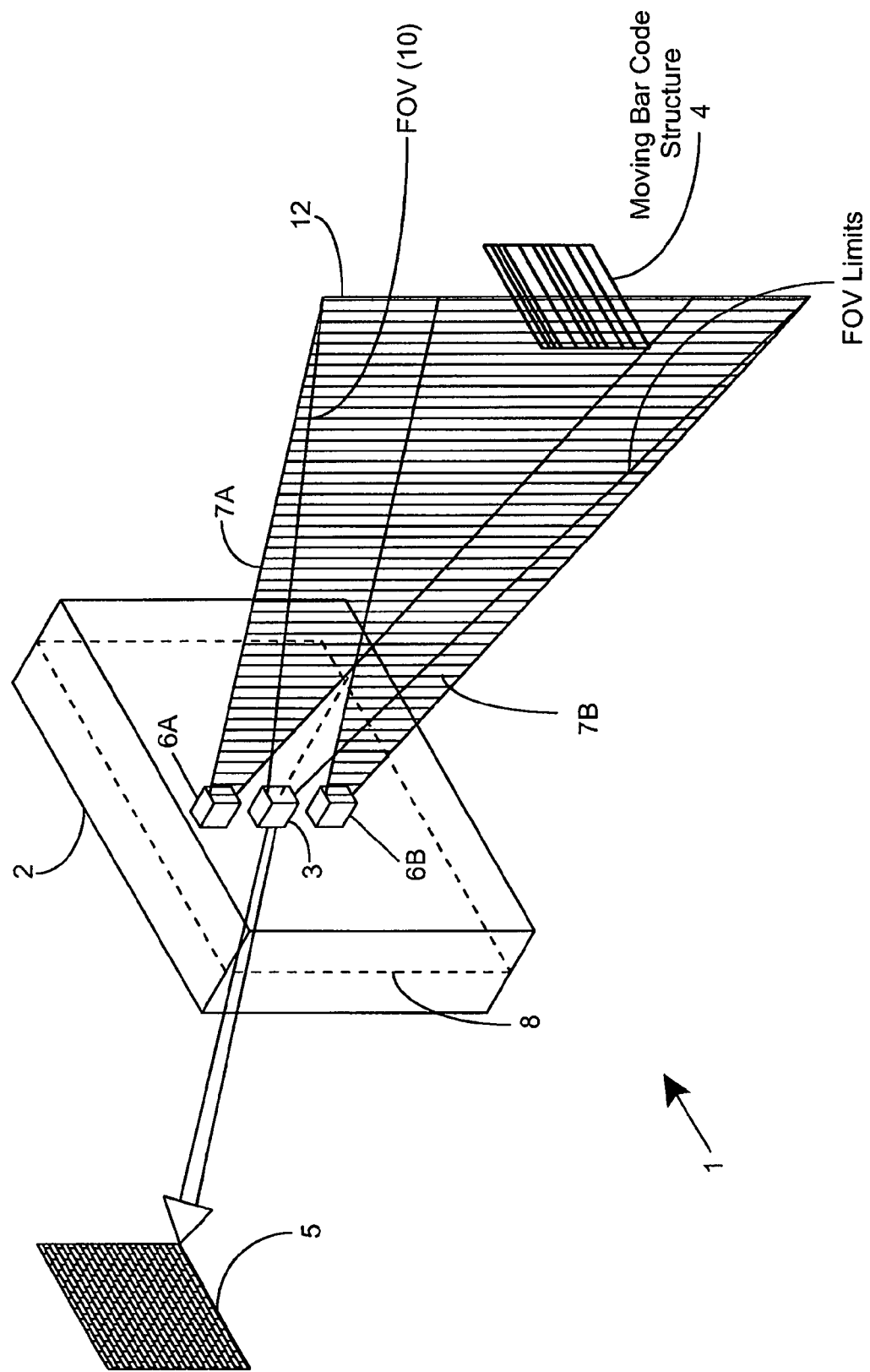
FIG. 1A is a schematic representation of a first generalized embodiment of the planar laser illumination and (electronic) imaging (PLIIM) system of the present invention, wherein a pair of planar laser illumination arrays (PLIAs) are mounted on opposite sides of a linear (i.e. I-dimensional) type image formation and detection module (IFDM) having a fixed focal length imaging lens, a fixed focal distance and fixed field of view, such that the planar illumination array produces a stationary (i.e. non-scanned) plane of laser beam illumination which is disposed substantially coplanar with the field of view of the image formation and detection module during object illumination and image detection operations carried out by the PLIIM system on a moving bar code symbol or other graphical structure.

Referring to the figures in the accompanying Drawings, the preferred embodiments of the Planar Laser Illumination and (Electronic) Imaging (PLIIM) System of the present invention will be described in great detail, wherein like elements will be indicated using like reference numerals.

Overview of the Planar Laser Illumination and Electronic Imaging (PLIIM) System of the Present Invention In accordance with the principles of the present invention, an object (e.g. a bar coded package, textual materials, graphical indicia, etc.) is illuminated by a substantially planar laser illumination beam having substantially-planar spatial distribution characteristics along a planar direction which passes through the field of view (FOV) of an image formation and detection module (e.g. realized within a CCD-type digital electronic camera, or a 35 mm optical-film photographic camera), while images of the illuminated object are formed and detected by the image formation and detection module.

This inventive principle of coplanar laser illumination and image formation is embodied in two different classes of the PLIIM, namely: (1) in PLIIM systems shown in FIGS. 1A, 1V1, 2A, 2I1, 3A, and 3J1, wherein the image formation and detection modules in these systems employ linear-type (1-D) image detection arrays; and (2) in PLIIM systems shown in FIGS. 4A, 5A and 6A, wherein the image formation and detection modules in these systems employ area-type (2-D) image detection arrays. Among these illustrative systems, those shown in FIGS. 1A, 2A and 3A each produce a planar laser illumination beam that is neither scanned nor deflected relative to the system housing during planar laser illumination and image detection operations and thus can be said to use "stationary" planar laser illumination beams to read relatively moving bar code symbol structures and other graphical indicia. Those systems shown in FIGS. 1V1, 2I1, 3J1, 4A, 5A and 6A, each produce a planar laser illumination beam that is scanned (i.e. deflected) relative to the system housing during planar laser illumination and image detection operations and thus can be said to use "moving" planar laser illumination beams to read relatively stationary bar code symbol structures and other graphical indicia.

Figure 2A:
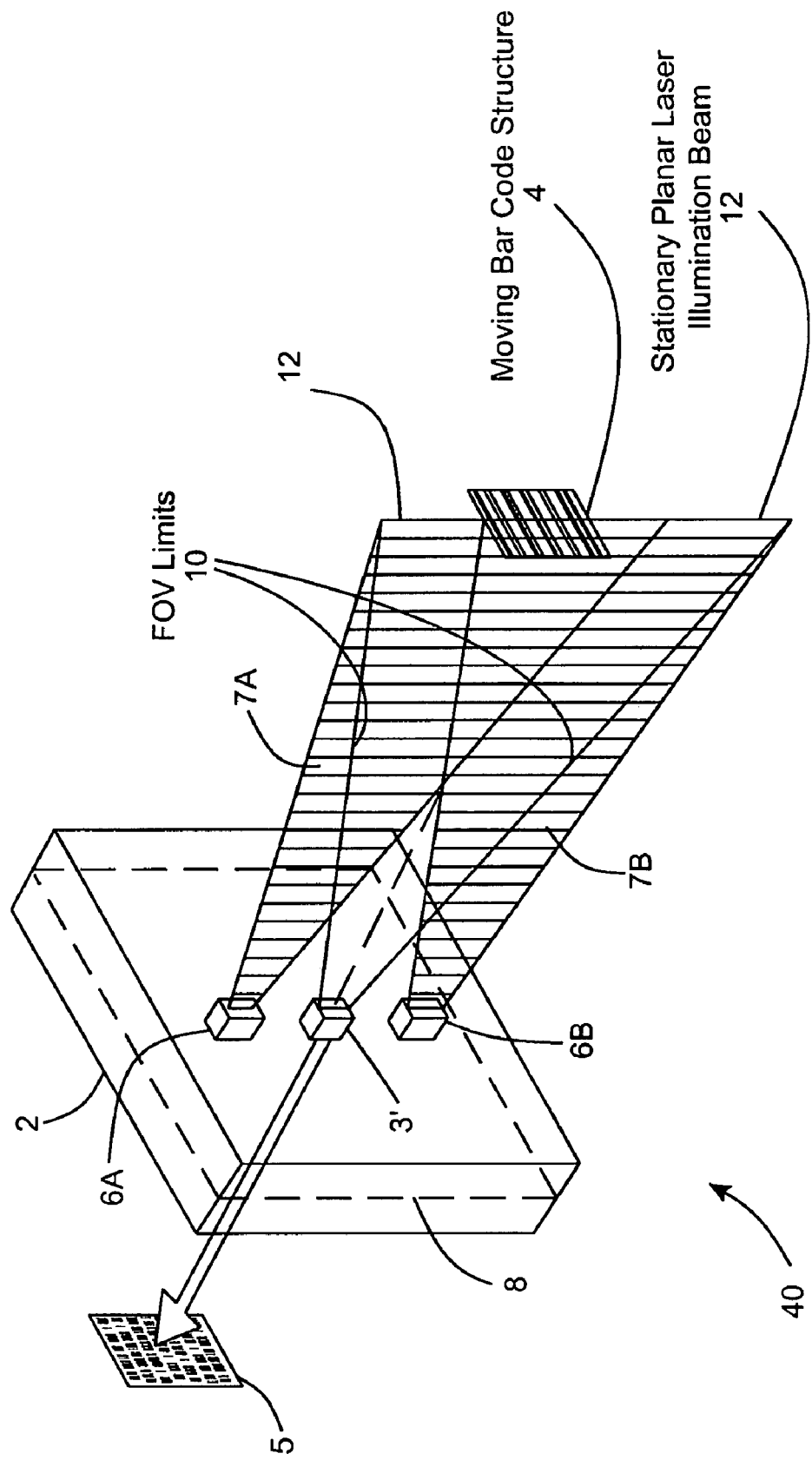
FIG. 2A is a schematic representation of a third generalized embodiment of the PLIIM system of the present invention, wherein a pair of planar laser illumination arrays (PLIAs) are mounted on opposite sides of a linear (i.e. 1-dimensional) type image formation and detection module (IFDM) having a fixed focal length imaging lens, a variable focal distance and a fixed field of view (FOV), so that the planar laser illumination arrays produce a plane of laser beam illumination which is disposed substantially coplanar with the field view of the image formation and detection module during object illumination and image detection operations carried out on bar code symbol structures and other graphical indicia which may embody information within its structure.
Figure 2G:
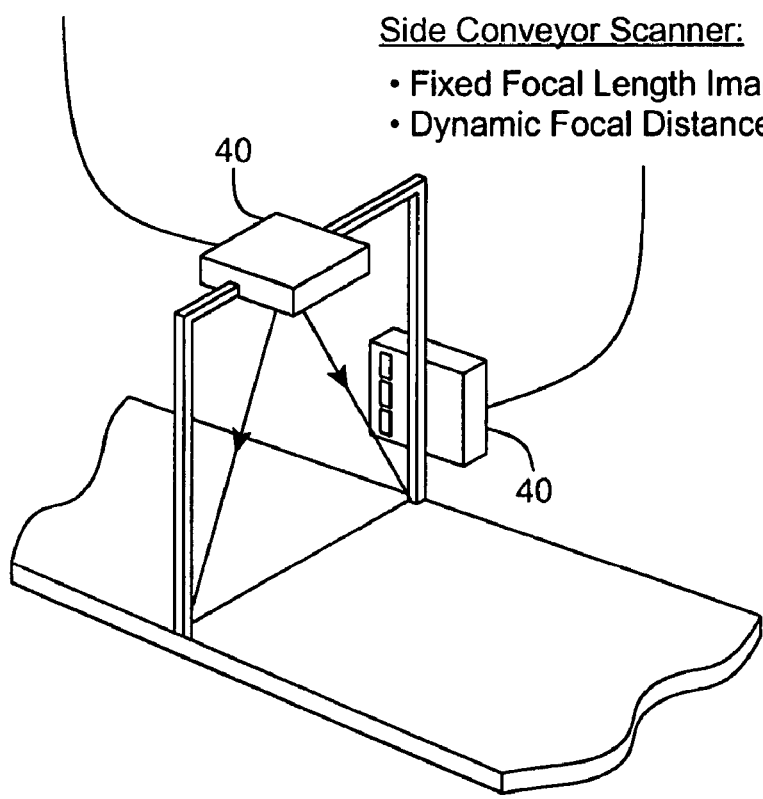
FIG. 2G is a schematic representation of an over-the-conveyor belt package identification system embodying the PLIIM system of FIG. 2A.
Figure 2H:
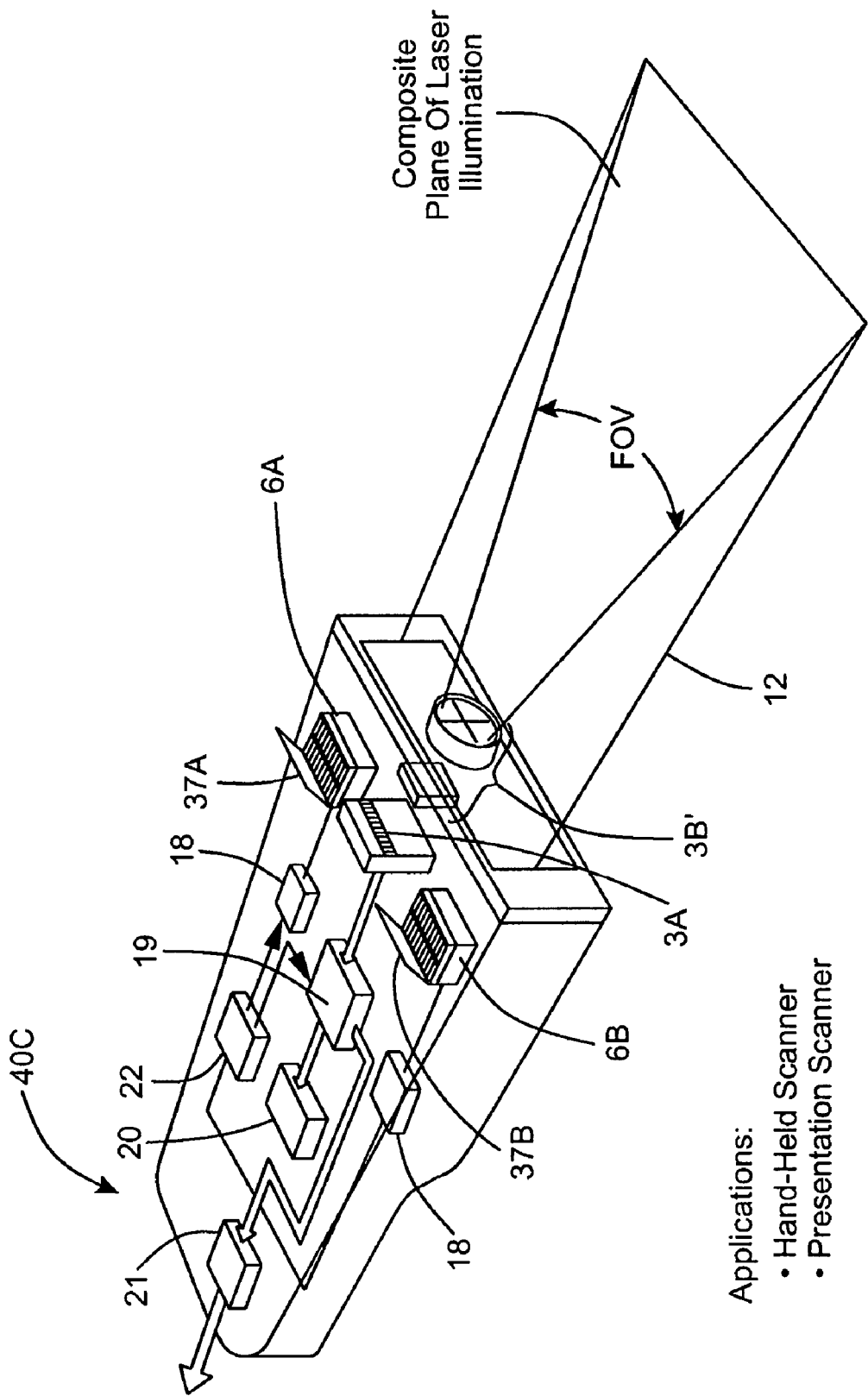
FIG. 2H is a schematic representation of a hand-supportable bar code symbol reading system embodying the PLIIM system of FIG. 2A.
Figure 212:
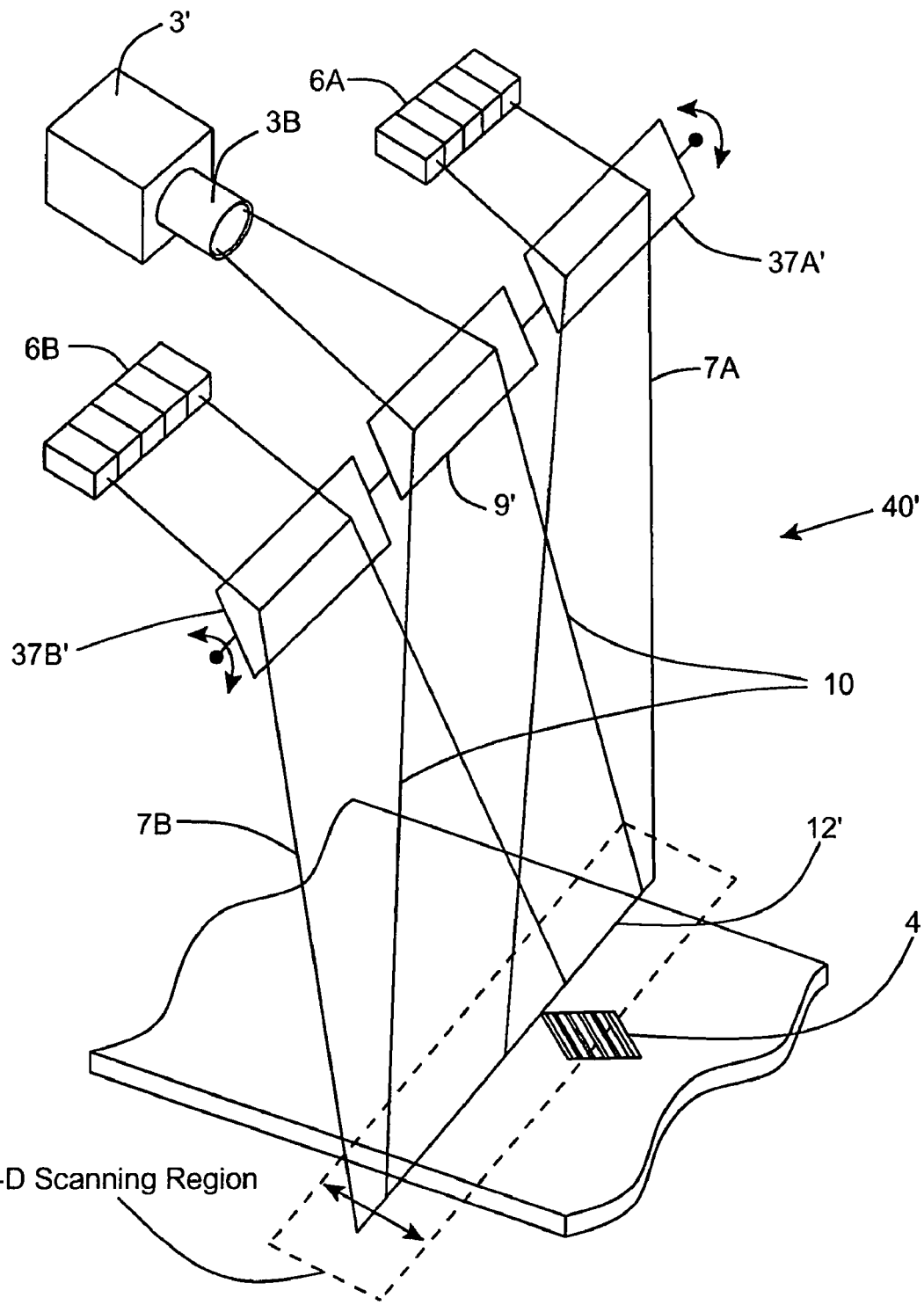
Figure 213:
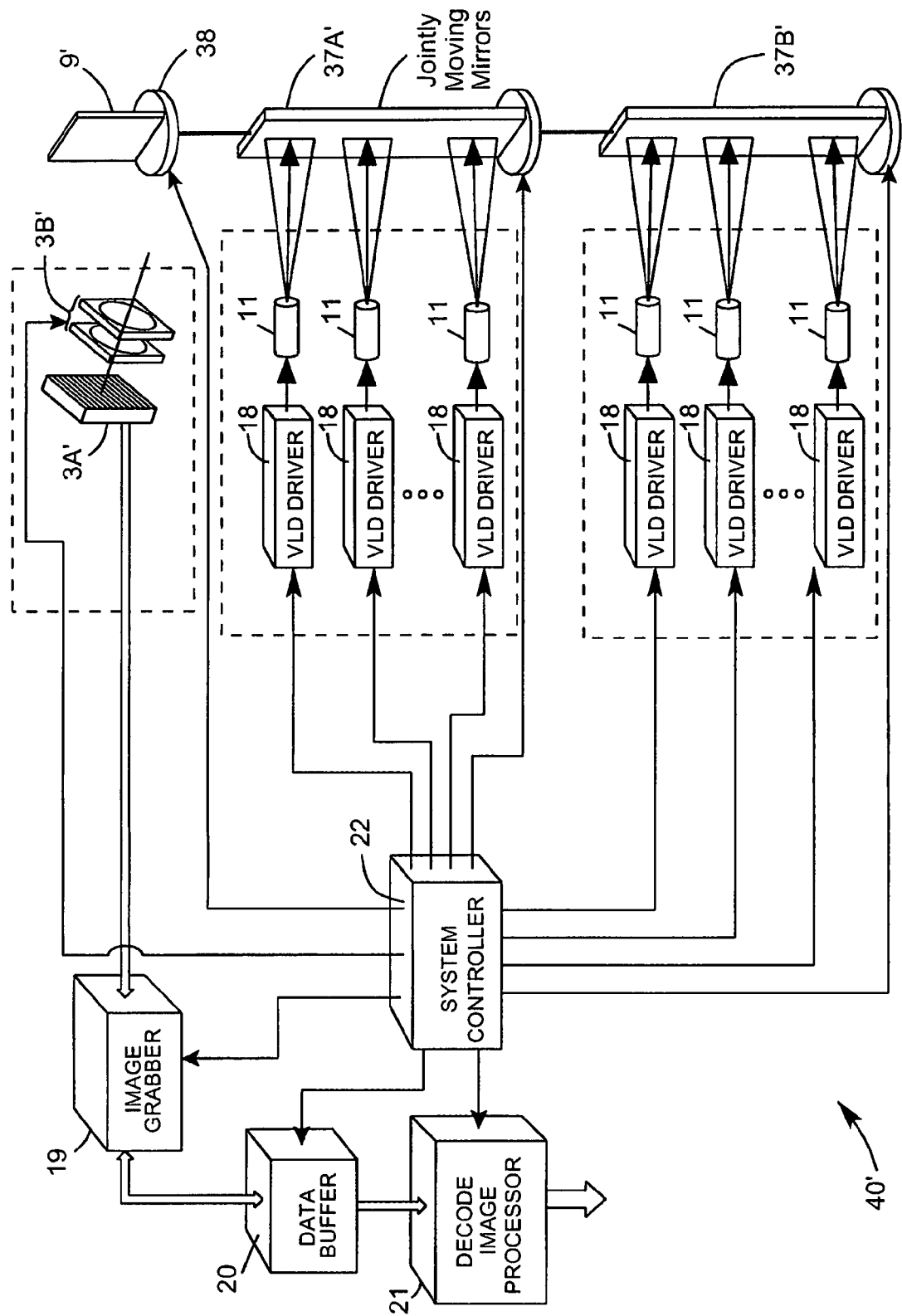
Figure 214:
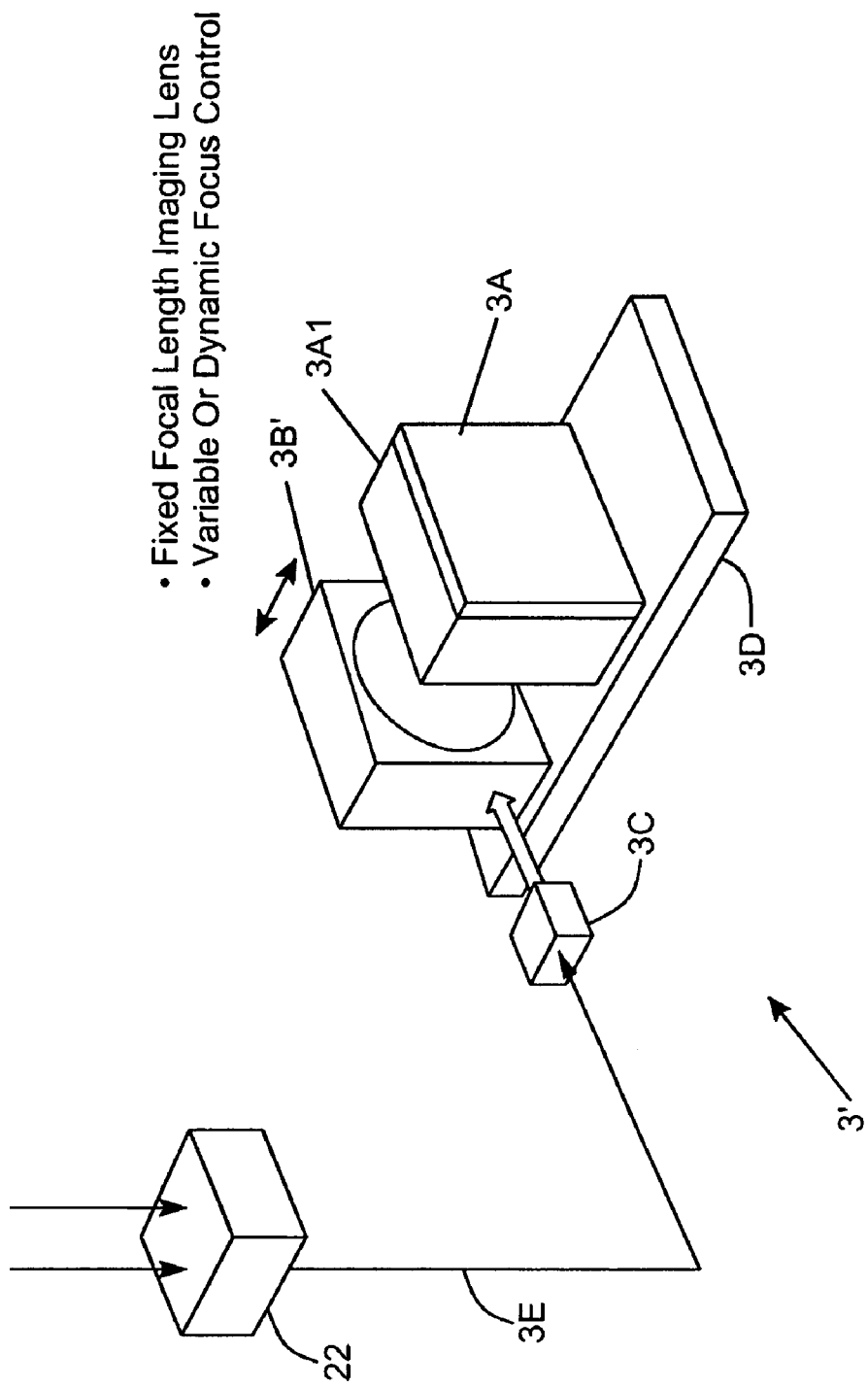
Figure 215:
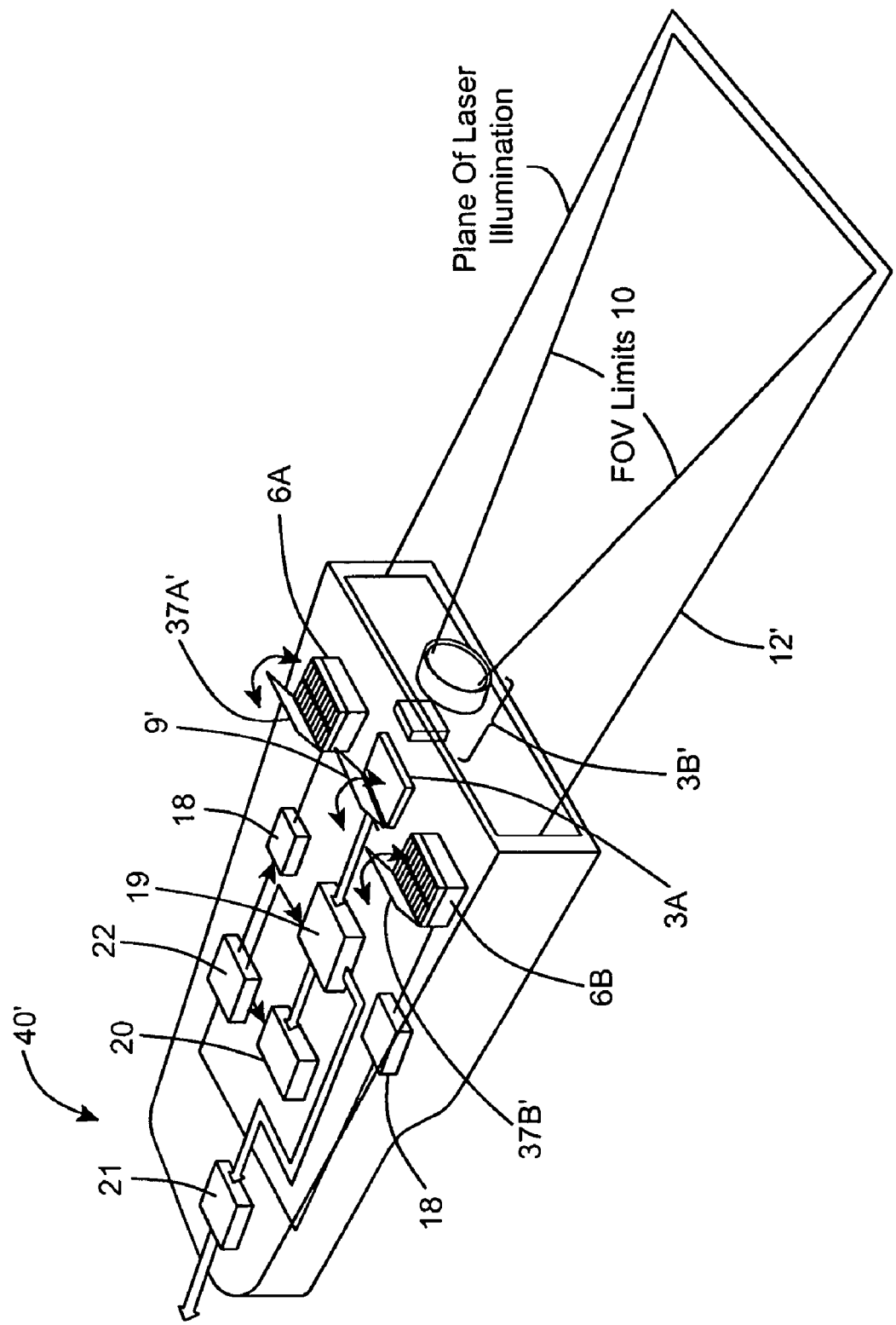
Figure 216:
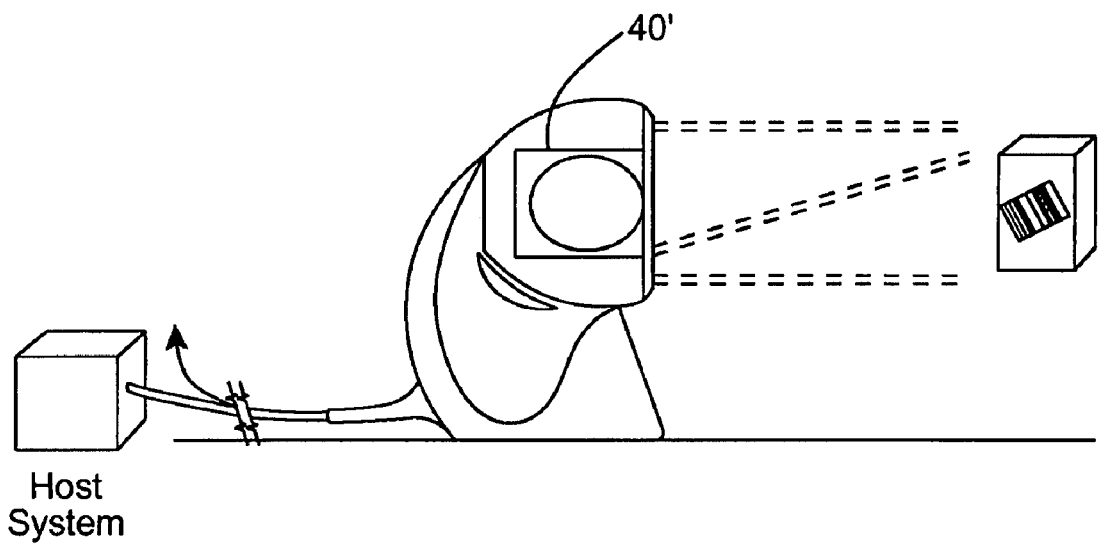

In each such system embodiment, it is preferred that each planar laser illumination beam is focused so that the minimum beam width thereof (e.g. 0.6 mm along its non-spreading direction, as shown in FIG. 1I2) occurs at a point or plane which is the farthest or maximum working (i.e. object) distance at which the system is designed to acquire images of objects, as best shown in FIG. 1I2. Hereinafter, this aspect of the present invention shall be deemed the "Focus Beam At Farthest Object Distance (FBAFOD)" principle.

In the case where a fixed focal length imaging subsystem is employed in the PLIIM system, the FBAFOD principle helps compensate for decreases in the power density of the incident planar laser illumination beam due to the fact that the width of the planar laser illumination beam increases in length for increasing object distances away from the imaging subsystem.

In the case where a variable focal length (i.e. zoom) imaging subsystem is employed in the PLIIM system, the FBAFOD principle helps compensate for (i) decreases in the power density of the incident planar illumination beam due to the fact that the width of the planar laser illumination beam increases in length for increasing object distances away from the imaging subsystem, and (ii) any $1/r^2$ type losses that would typically occur when using the planar laser planar illumination beam of the present invention.

By virtue of the present invention, scanned objects need only be illuminated along a single plane which is coplanar with a planar section of the field of view of the image formation and detection module (e.g. camera) during illumination and imaging operations carried out by the PLIIM system. This enables the use of low-power, light-weight, high-response, ultra-compact, high-efficiency solid-state illumination producing devices, such as visible laser diodes (VLDs), to selectively illuminate ultra-narrow sections of an object during image formation and detection operations, in contrast with high-power, low-response, heavy-weight, bulky, low-efficiency lighting equipment (e.g. sodium vapor lights) required by prior art illumination and image detection systems. In addition, the planar laser illumination techniques of the present invention enables high-speed modulation of the planar laser illumination beam, and use of simple (i.e. substantially-monochromatic wavelength) lens designs for substantially-monochromatic optical illumination and image formation and detection operations.

As will be illustrated in greater detail hereinafter, PLIIM systems embodying the "planar laser illumination" and "FBAFOD" principles of the present invention can be embodied within a wide variety of bar code symbol reading and scanning systems, as well as optical character, text, and image recognition systems well known in the art.

In general, bar code symbol reading systems can be grouped into at least two general scanner categories, namely: industrial scanners; and point-of-sale (POS) scanners.

An industrial scanner is a scanner that has been designed for use in a warehouse or shipping application where large numbers of packages must be scanned in rapid succession. Industrial scanners include conveyor-type scanners, and hold-under scanners. These scanner categories will be described in greater detail below Conveyor scanners are designed to scan packages as they move by on a conveyor belt. In general, a minimum of six conveyors (e.g. one overhead scanner, four side scanners, and one bottom scanner) are necessary to obtain complete coverage of the conveyor belt and ensure that any label will be scanned no matter where on a package it appears. Conveyor scanners can be further grouped into top, side, and bottom scanners which will be briefly summarized below.

Top scanners are mounted above the conveyor belt and look down at the tops of packages transported there along. It might be desirable to angle the scanner's field of view slightly in the direction from which the packages approach or that in which they recede depending on the shapes of the packages being scanned. A top scanner generally has less severe depth of field and variable focus or dynamic focus requirements compared to a side scanner as the tops of packages are usually fairly flat, at least compared to the extreme angles that a side scanner might have to encounter during scanning operations.

Side scanners are mounted beside the conveyor belt and scan the sides of packages transported There along. It might be desirable to angle the scanner's field of view slightly in the direction from which the packages approach or that in which they recede depending on the shapes of the packages being scanned and the range of angles at which the packages might be rotated.

Side scanners generally have more severe depth of field and variable focus or dynamic focus requirements compared to a top scanner because of the great range of angles at which the sides of the packages may be oriented with respect to the scanner (this assumes that the packages can have random rotational orientations; if an apparatus upstream on the on the conveyor forces the packages into consistent orientations, the difficulty of the side scanning task is lessened). Because side scanners can accommodate greater variation in object distance over the surface of a single target object, side scanners can be mounted in the usual position of a top scanner for applications in which package tops are severely angled.

Bottom scanners are mounted beneath the conveyor and scans the bottoms of packages by looking up through a break in the belt that is covered by glass to keep dirt off the scanner. Bottom scanners generally do not have to be variably or dynamically focused because its working distance is roughly constant, assuming that the packages are intended to be in contact with the conveyor belt under normal operating conditions. However, boxes tend to bounce around as they travel on the belt, and this behavior can be amplified when a package crosses the break, where one belt section ends and another begins after a gap of several inches. For this reason, bottom scanners must have a large depth of field to accommodate these random motions, to which a variable or dynamic focus system could not react quickly enough.

Hold-under scanners are designed to scan packages that are picked up and held underneath it. The package is then manually routed or otherwise handled, perhaps based on the result of the scanning operation. Hold-under scanners are generally mounted so that its viewing optics are oriented in downward direction, like a library bar code scanner. Depth of field (DOF) is an important characteristic for hold-under scanners, because the operator will not be able to hold the package perfectly still while the image is being acquired.

Point-of-sale (POS) scanners are typically designed to be used at a retail establishment to determine the price of an item being purchased. POS scanners are generally smaller than industrial scanner models, with more artistic and ergonomic case designs. Small size, low weight, resistance to damage from accident drops and user comfort are all major design factors for POS scanner. POS scanners include hand-held scanners, hands-free presentation scanners and combination-type scanners supporting both hands-on and hands-free modes of operation. These scanner categories will be described in greater detail below.

Hand-held scanners are designed to be picked up by the operator and aimed at the label to be scanned.

Hands-free presentation scanners are designed to remain stationary and have the item to be scanned picked up and passed in front of the scanning device. Presentation scanners can be mounted on counters looking horizontally, embedded flush with the counter looking vertically, or partially embedded in the counter looking vertically, but having a "tower" portion which rises out above the counter and looks horizontally to accomplish multiple-sided scanning. If necessary, presentation scanners that are mounted in a counter surface can also include a scale to measure weights of items.

Some POS scanners can be used as handheld units or mounted in stands to serve as presentation scanners, depending on which is more convenient for the operator based on the item that must be scanned.

Various generalized embodiments of the PLIIM system of the present invention will now be described in great detail, and after each generalized embodiment, various applications thereof will be described.

First Generalized Embodiment of the PLIIM System of the Present Invention

The first generalized embodiment of the PLIIM system of the present invention 1 is illustrated in FIG. 1A. As shown therein, the PLIIM system 1 comprises: a housing 2 of compact construction; a linear (i.e. 1-dimensional) type image formation and detection (IFD) 3 including a 1-D electronic image detection array 3A, and a linear (1-D) imaging subsystem (LIS) 3B having a fixed focal length, a fixed focal distance, and a fixed field of view (FOV), for forming a 1-D image of an illuminated object 4 located within the fixed focal distance and FOV thereof and projected onto the 1-D image detection array 3A, so that the 1-D image detection array 3A can electronically detect the image formed thereon and automatically produce a digital image data set 5 representative of the detected image for subsequent image processing; and a pair of planar laser illumination arrays (PLIAs) 6A and 6B, each mounted on opposite sides of the IFD module 3, such that each planar laser illumination array 6A and 6B produces a plane of laser beam illumination 7A, 7B which is disposed substantially coplanar with the field view of the image formation and detection module 3 during object illumination and image detection operations carried out by the PLIIM system.

An image formation and detection (IFD) module 3 having an imaging lens with a fixed focal length has a constant angular field of view (FOV); that is, the imaging subsystem can view more of the target object's surface as the target object is moved further away from the IFD module. A major disadvantage to this type of imaging lens is that the resolution of the image that is acquired, expressed in terms of pixels or dots per inch (dpi), varies as a function of the distance from the target object to the imaging lens. However, a fixed focal length imaging lens is easier and less expensive to design and produce than a zoom-type imaging lens which will be discussed in detail hereinbelow with reference to FIGS. 3A through 3J4.

The distance from the imaging lens 3B to the image detecting (i.e. sensing) array 3A is referred to as the image distance. The distance from the target object 4 to the imaging lens 3B is called the object distance. The relationship between the object distance (where the object resides) and the image distance (at which the image detection array is mounted) is a function of the characteristics of the imaging lens, and assuming a thin lens, is determined by the thin (imaging) lens equation (1) defined below in greater detail. Depending on the image distance, light reflected from a target object at the object distance will be brought into sharp focus on the detection array plane. If the image distance remains constant and the target object is moved to a new object distance, the imaging lens might not be able to bring the light reflected off the target object (at this new distance) into sharp focus. An image formation and detection (IFD) module having an imaging lens with fixed focal distance cannot adjust its image distance to compensate for a change in the target's object distance; all the component lens elements in the imaging subsystem remain stationary. Therefore, the depth of field (DOF) of the imaging subsystems alone must be sufficient to accommodate all possible object distances and orientations. Such basic optical terms and concepts will be discussed in more formal detail hereinafter with reference to FIGS. 1J1 and 1J6.

In accordance with the present invention, the planar laser illumination arrays 6A and 6B, the linear image formation and detection module 3, and any non-moving FOV and/or planar laser illumination beam folding mirrors employed in any particular system configuration described herein, are fixedly mounted on an optical bench 8 or chassis so as to prevent any relative motion (which might be caused by vibration or temperature changes) between: (i) the image forming optics (e.g. imaging lens) within the image formation and detection module 3 and any stationary FOV folding mirrors employed therewith; and (ii) each planar laser illumination array (i.e. VLD/cylindrical lens assembly) 6A, 6B and any planar laser illumination beam folding mirrors employed in the PLIIM system configuration. Preferably, the chassis assembly should provide for easy and secure alignment of all optical components employed in the planar laser illumination arrays 6A and 6B as well as the image formation and detection module 3, as well as be easy to manufacture, service and repair. Also, this PLIIM system 1 employs the general "planar laser illumination" and "focus beam at farthest object distance (FBAFOD)" principles described above. Various illustrative embodiments of this generalized PLIIM system will be described below.

First Illustrative Embodiment of the PLIIM System of the Present Invention Shown in FIG. 1A The first illustrative embodiment of the PLIIM system 1A of FIG. 1A is shown in FIG. 1B1. As illustrated therein, the field of view of the image formation and detection module 3 is folded in the downwardly direction by a field of view (FOV) folding mirror 9 so that both the folded field of view 10 and resulting first and second planar laser illumination beams 7A and 7B produced by the planar illumination arrays 6A and 6B, respectively, are arranged in a substantially coplanar relationship during object illumination and image detection operations. One primary advantage of this system design is that it enables a construction having an ultra-low height profile suitable, for example, in unitary package identification and dimensioning systems of the type disclosed in FIGS. 17-22, wherein the image-based bar code symbol reader needs to installed within a compartment (or cavity) of a housing having relatively low height dimensions. Also, in this system design, there is a relatively high degree of freedom provided in where the image formation and detection module 3 can be mounted on the optical bench of the system, thus enabling the field of view (FOV) folding technique disclosed in FIG. 1L1 to practiced in a relatively easy manner.

The PLIIM system 1A illustrated in FIG. 1B1 is shown in greater detail in FIG. 1B2. As shown therein, the linear image formation and detection module 3 is shown comprising an imaging subsystem 3B, and a linear array of photo-electronic detectors 3A realized using high-speed CCD technology (e.g. Dalsa IT-P4 Linear Image Sensors, from Dalsa, Inc. located on the WWW at http://www.dalsa.com). As shown, each planar laser illumination array 6A, 6B comprises a plurality of planar laser illumination modules (PLIMs) 11A through 11F, closely arranged relative to each other, in a rectilinear fashion. For purposes of clarity, each PLIM is indicated by reference numeral. As shown in FIGS. 1K1 and 1K2, the relative spacing of each PLIM is such that the spatial intensity distribution of the individual planar laser beams superimpose and additively provide a substantially uniform composite spatial intensity distribution for the entire planar laser illumination array 6A and 6B.

FIG. 1C is a schematic representation of a single planar laser illumination module (PLIM) 11 used to construct each planar laser illumination array 6A, 6B shown in FIG. 1B2. As shown in FIG. 1C, the planar laser illumination beam emanates substantially within a single plane along the direction of beam propagation towards an object to be optically illuminated.

As shown in FIG. 1D, the planar laser illumination module of FIG. 1C, comprises: a visible laser diode (VLD) 13 supported within an optical tube or block 14; a light collimating lens 15 supported within the optical tube 14; and a cylindrical-type lens element 16 configured together to produce a beam of planar laser illumination 12. As shown in FIG. 1E, a focused laser beam 17 from the focusing lens 15 is directed on the input side of the cylindrical lens element 16, and the produced output therefrom is a planar laser illumination beam 12.

Figure 1F:
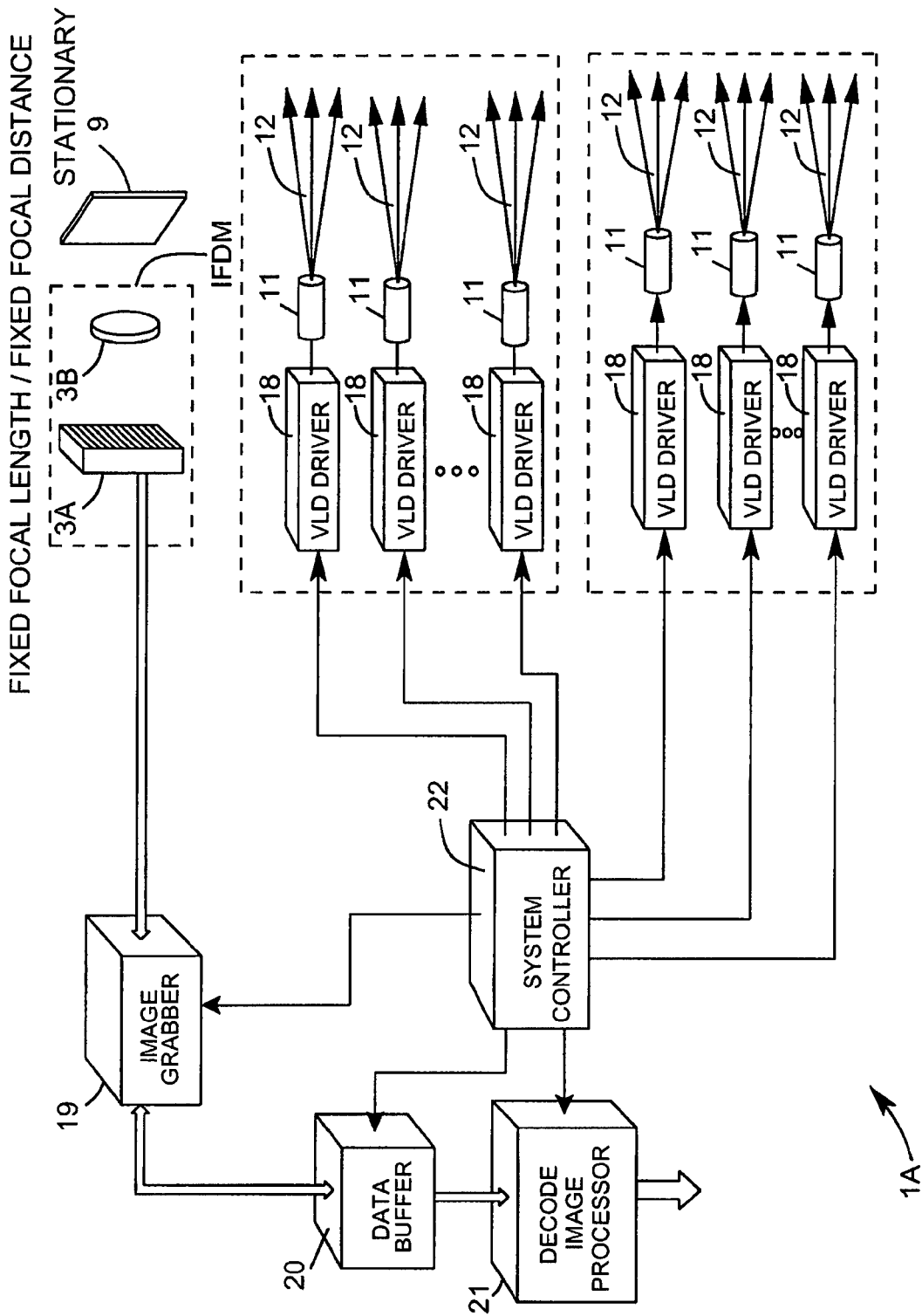
FIG. 1F is a block schematic diagram of the PLIIM system shown in FIG. 1A, comprising a pair of planar illumination arrays, a linear-type image formation and detection module, a stationary field of view folding mirror, an image frame grabber, an image data buffer, a decode image processor, and a system controller.

As shown in FIG. 1F, the PLIIM system 1A of FIG. 1A comprises: planar laser illumination arrays 6A and 6B, each having a plurality of PLMS 11A through 11F, and each PLIM being driven by a VLD driver circuit 18 well known in the art; linear-type image formation and detection module 3; field of view (FOV) folding mirror 9, arranged in spatial relation with the image formation and detection module 3; an image frame grabber 19 operably connected to the linear-type image formation and detection module 3, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer, including image-based bar code symbol decoding software such as, for example, SwiftDecode™ Bar Code Decode Software, from Omniplanar, Inc., of Princeton, N.J. (http://www.omniplanar.com); and a system controller 22 operably connected to the various components within the system for controlling the operation thereof in an orchestrated manner.

Detailed Description of an Exemplary Realization of the PLIIM System Shown in FIG. 1B1 Through 1F Referring now to FIGS. 1G1 through 1N2, an exemplary realization of the PLIIM system shown in FIGS. 1B1 through 1F will now be described in detail below.

As shown in FIGS. 1G1 and 1G2, the PLIIM system 25 of the illustrative embodiment is contained within a compact housing 26 having height, length and width dimensions 45", 21.7", and 19.7" to enable easy mounting above a conveyor belt structure or the like. As shown in FIG. 1G1, the PLIIM system comprises an image formation and detection module 3, a pair of planar laser illumination arrays 6A, 6B, and a stationary field of view (FOV) folding structure (e.g. mirror, refractive element, or diffractive element) 9, as shown in FIGS. 1B1 and 1B2. The function of the FOV folding mirror 9 is to fold the field of view (FOV) of the image formation and detection module 3 in a direction that is coplanar with the plane of laser illumination beams 7A and 7B produced by the planar illumination arrays 6A and 6B respectively. As shown, components 6A, 6B, 3 and 9 are fixedly mounted to an optical bench 8 supported within the compact housing 26 by way of metal mounting brackets that force the assembled optical components to vibrate together on the optical bench. In turn, the optical bench is shock mounted to the system housing techniques which absorb and dampen shock forces and vibration. The 1-D CCD imaging array 3A can be realized using a variety of commercially available high-speed line-scan camera systems such as, for example, the Piranha Model Nos. CT-P4, or CL-P4 High-Speed CCD Line Scan Camera, from Dalsa, Inc. USA—http:/www.dalsa.com. Notably, image frame grabber 17, image data buffer (e.g. VRAM) 20, decode image processor 21, and system controller 22 are realized on one or more printed circuit (PC) boards contained within a camera and system electronic module 27 also mounted on the optical bench, or elsewhere in the system housing 26

In general, the linear CCD image detection array (i.e. sensor) 3A has a single row of pixels, each of which measures from several μm to several tens of μm along each dimension. Square pixels are most common, and most convenient for bar code scanning applications, but different aspect ratios are available. In principle, a linear CCD detection array can see only a small slice of the target object it is imaging at any given time. For example, for a linear CCD detection array having 2000 pixels, each of which is 10 μm square, the detection array measures 2 cm long by 10 μm high. If the imaging lens 3B in front of the linear detection array 3A causes an optical magnification of 10×, then the 2 cm length of the detection array will be projected onto a 20 cm length of the target object. In the other dimension, the 10 μm height of the detection array becomes only 100 μm when projected onto the target. Since any label to be scanned will typically measure more than a hundred μm or so in each direction, capturing a single image with a linear image detection array will be inadequate. Therefore, in practice, the linear image detection array employed in each of the PLIIM systems shown in FIGS. 1A through 3J6 builds up a complete image of the target object by assembling a series of linear (1-D) images, each of which is taken of a different slice of the target object. Therefore, successful use of a linear image detection array in the PLIIM systems shown in FIGS. 1A through 3J6 requires relative movement between the target object and the PLIIM system. In general, either the target object is moving and the PLIIM system is stationary, or else the field of view of PLIIM system is swept across a relatively stationary target object, as shown in FIGS. 3J1 through 3J4. This makes the linear image detection array a natural choice for conveyor scanning applications.

As shown in FIG. 1G1, the compact housing 26 has a relatively long light transmission window 28 of elongated dimensions for projecting the FOV of the image formation and detection module 3 through the housing towards a predefined region of space outside thereof, within which objects can be illuminated and imaged by the system components on the optical bench 8. Also, the compact housing 26 has a pair of relatively short light transmission apertures 29A and 29B closely disposed on opposite ends of light transmission window 28, with minimal spacing therebetween, as shown in FIG. 1G1, so that the FOV emerging from the housing 26 can spatially overlap in a coplanar manner with the substantially planar laser illumination beams projected through transmission windows 29A and 29B, as close to transmission window 28 as desired by the system designer, as shown in FIGS. 1G3 and 1G4. Notably, in some applications, it is desired for such coplanar overlap between the FOV and planar laser illumination beams to occur very close to the light transmission windows 20, 29A and 29B (i.e. at short optical throw distances), but in other applications, for such coplanar overlap to occur at large optical throw distances.

In either event, each planar laser illumination array 6A and 6B is optically isolated from the FOV of the image formation and detection module 3. In the preferred embodiment, such optical isolation is achieved by providing a set of opaque wall structures 30A 30B about each planar laser illumination array, from the optical bench 8 to its light transmission window 29A or 29B, respectively. Such optical isolation structures prevent the image formation and detection module 3 from detecting any laser light transmitted directly from the planar laser illumination arrays 6A, 6B within the interior of the housing. Instead, the image formation and detection module 3 can only receive planar laser illumination that has been reflected off an illuminated object, and focused through the imaging subsystem of module 3.

As shown in FIG. 1G3, each planar laser illumination array 6A, 6B comprises a plurality of planar laser illumination modules 11A through 11F, each individually and adjustably mounted to an L-shaped bracket 32 which, in turn, is adjustably mounted to the optical bench. As mentioned above, each planar laser illumination module 11 must be rotatably adjustable within its L-shaped bracket so as permit easy yet secure adjustment of the position of each PLIM 11 along a common alignment plane extending within L-bracket portion 32A thereby permitting precise positioning of each PLIM relative to the optical axis of the image formation and detection module 3. Once properly adjusted in terms of position on the L-bracket portion 32A, each PLIM can be securely locked by an allen or like screw threaded into the body of the L-bracket portion 32A. Also, L-bracket portion 32B, supporting a plurality of PLIMS 11A through 11B, is adjustably mounted to the optical bench 8 and releasably locked thereto so as to permit precise lateral and/or angular positioning of the L-bracket 32B relative to the optical axis and FOV of the image formation and detection module 3. The function of such adjustment mechanisms is to enable the intensity distributions of the individual PLIMs to be additively configured together along a substantially singular plane, typically having a width or thickness dimension on the orders of the width and thickness of the spread or dispersed laser beam within each PLIM. When properly adjusted, the composite planar laser illumination beam will exhibit substantially uniform power density characteristics over the entire working range of the PLIIM system, as shown in FIGS. 1K1 and 1K2.

In FIG. 1G3, the exact position of the individual PLIMs 11A through 11F along its L-bracket 32A is indicated relative to the optical axis of the imaging lens 3B within the image formation and detection module 3. FIG. 1G3 also illustrates the geometrical limits of each substantially planar laser illumination beam produced by its corresponding PLIM, measured relative to the folded FOV 10 produced by the image formation and detection module 3. FIG. 1G4, illustrates how, during object illumination and image detection operations, the FOV of the image formation and detection module 3 is first folded by FOV folding mirror 19, and then arranged in a spatially overlapping relationship with the resulting/composite planar laser illumination beams in a coplanar manner in accordance with the principles of the present invention.

Notably, the PLIIM system of FIG. 1G1 has an image formation and detection module with an imaging subsystem having a fixed focal distance lens and a fixed focusing mechanism. Thus, such a system is best used in either hand-held scanning applications, and/or bottom scanning applications where bar code symbols and other structures can be expected to appear at a particular distance from the imaging subsystem. In FIG. 1G5, the spatial limits for the FOV of the image formation and detection module are shown for two different scanning conditions, namely: when imaging the tallest package moving on a conveyor belt structure; and when imaging objects having height values close to the surface of the conveyor belt structure. In a PLIIM system having a fixed focal distance lens and a fixed focusing mechanism, the PLIIM system would be capable of imaging objects under one of the two conditions indicated above, but not under both conditions. In a PLIIM system having a fixed focal length lens and a variable focusing mechanism, the system can adjust to image objects under either of these two conditions.

In the PLIIM system of FIG. 1G1, special measures are undertaken to ensure that (i) a minimum safe distance is maintained between the VLDs in each PLIM and the user's eyes, and (ii) the planar laser illumination beam is prevented from directly scattering into the FOV of the image formation and detection module, from within the system housing, during object illumination and imaging operations. Condition (i) above can be achieved by using a light shield 32A or 32B shown in FIGS. 1G6 and 1G7, respectively, whereas condition (ii) above can be achieved by ensuring that the planar laser illumination beam from the PLIAs and the field of view (FOV) of the imaging lens (in the IFD module) do not spatially overlap on any optical surfaces residing within the PLIIM system. Instead, the planar laser illumination beams are permitted to spatially overlap with the FOV of the imaging lens only outside of the system housing, measured at a particular point beyond the light transmission window 28, through which the FOV 10 is projected to the exterior of the system housing, to perform object imaging operations.

Detailed Description of the Planar Laser Illumination Modules (PLIMs) Employed in the Planar Laser Illumination Arrays (PLIAs) of the Illustrative Embodiments Referring now to FIGS. 1G8 through 1I2, the construction of each PLIM 14 and 15 used in the planar laser illumination arrays (PLIAs) will now be described in greater detail below.

As shown in FIG. 1G8, each planar laser illumination array (PLIA) 6A, 6B employed in the PLIIM system of FIG. 1G1, comprises an array of planar laser illumination modules (PLIMs) 11 mounted on the L-bracket structure 32, as described hereinabove. As shown in FIGS. 1G9 through 1G11, each PLIM of the illustrative embodiment disclosed herein comprises an assembly of subcomponents: a VLD mounting block 14 having a tubular geometry with a hollow central bore 14A formed entirely therethrough, and a v-shaped notch 14B formed on one end thereof; a visible laser diode (VLD) 13 (e.g. Mitsubishi ML1XX6 Series high-power 658 nm AlGaInP semiconductor laser) axially mounted at the end of the VLD mounting block, opposite the v-shaped notch 14B, so that the laser beam produced from the VLD 13 is aligned substantially along the central axis of the central bore 14A; a cylindrical lens 16, made of optical glass (e.g. borosilicate) or plastic having the optical characteristics specified, for example, in FIGS. 1G1 and 1G2, and fixedly mounted within the V-shaped notch 14B at the end of the VLD mounting block 14, using an optical cement or other lens fastening means, so that the central axis of the cylindrical lens 16 is oriented substantially perpendicular to the optical axis of the central bore 14A; and a focusing lens 15, made of central glass (e.g. borosilicate) or plastic having the optical characteristics shown, for example, in FIGS. 1H and 1H2, mounted within the central bore 14A of the VLD mounting block 14 so that the optical axis of the focusing lens 15 is substantially aligned with the central axis of the bore 14A, and located at a distance from the VLD which causes the laser beam output from the VLD 13 to be converging in the direction of the cylindrical lens 16. Notably, the function of the cylindrical lens 16 is to disperse (i.e. spread) the focused laser beam from focusing lens 15 along the plane in which the cylindrical lens 16 has curvature, as shown in FIG. 1I1 while the characteristics of the planar laser illumination beam (PLIB) in the direction transverse to the propagation plane are determined by the focal length of the focusing lens 15, as illustrated in FIGS. 1I1 and 1I2.

As will be described in greater detail hereinafter, the focal length of the focusing lens 15 within each PLIM hereof is preferably selected so that the substantially planar laser illumination beam produced from the cylindrical lens 16 is focused at the farthest object distance in the field of view of the image formation and detection module 3, as shown in FIG. 1I2, in accordance with the "FBAFOD" principle of the present invention. As shown in the exemplary embodiment of FIGS. 1I1 and 1I2, wherein each PLIM has maximum object distance of about 61 inches (i.e. 155 centimeters), and the cross-sectional dimension of the planar laser illumination beam emerging from the cylindrical lens 16, in the non-spreading (height) direction, oriented normal to the propagation plane as defined above, is about 0.15 centimeters and ultimately focused down to about 0.06 centimeters at the maximal object distance (i.e. the farthest distance at which the system is designed to capture images). The behavior of the height dimension of the planar laser illumination beam is determined by the focal length of the focusing lens 15 embodied within the PLIM. Proper selection of the focal length of the focusing lens 15 in each PLIM and the distance between the VLD 13 and the focusing lens 15B indicated by reference No. (D), can be determined using the thin lens equation (1) below and the maximum object distance required by the PLIIM system, typically specified by the end-user. As will be explained in greater detail hereinbelow, this preferred method of VLD focusing helps compensate for decreases in the power density of the incident planar laser illumination beam (on target objects) due to the fact that the width of the planar laser illumination beam increases in length for increasing distances away from the imaging subsystem (i.e. object distances).

Figure 10:
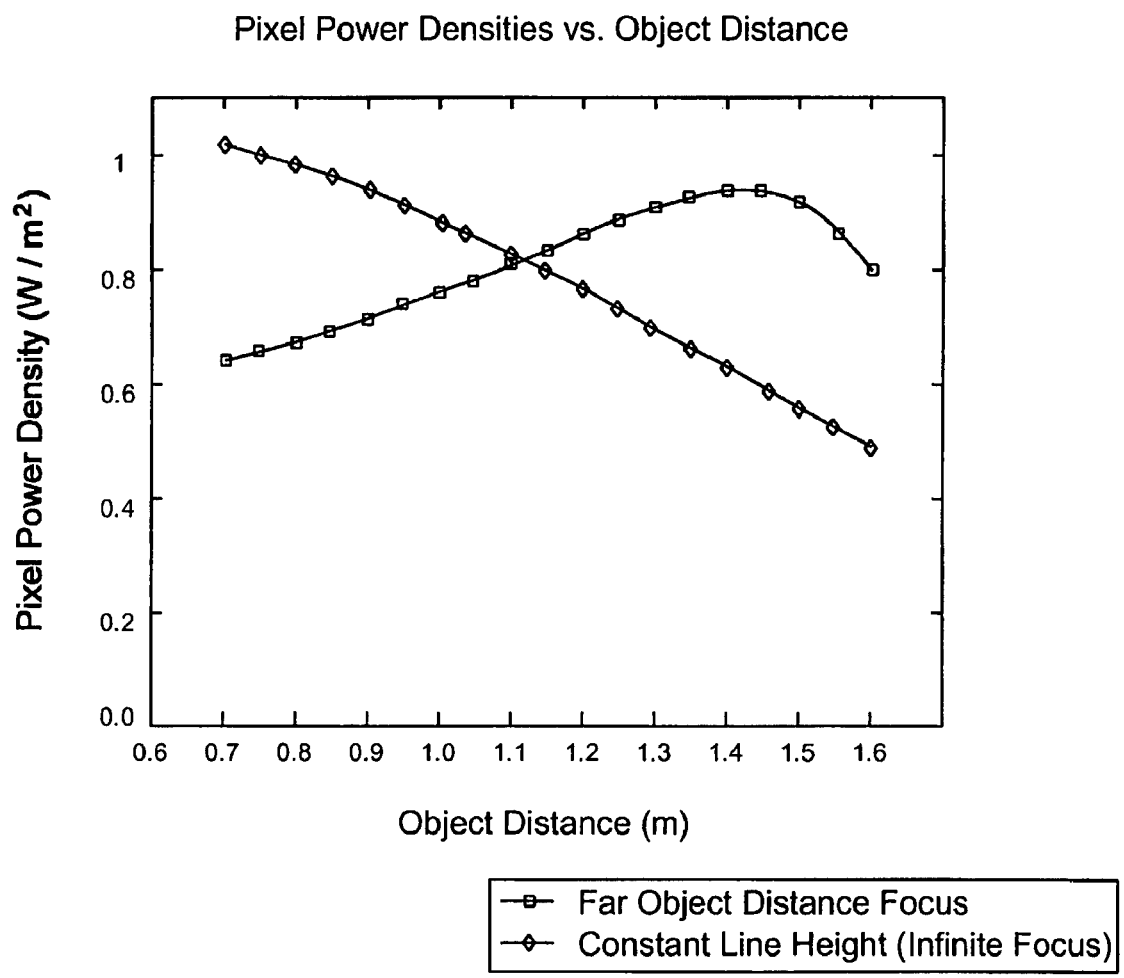

After specifying the optical components for each PLIM, and completing the assembly thereof as described above, each PLIM is adjustably mounted to the L bracket position 32A by way of a set of mounting/adjustment screws turned through fine-threaded mounting holes formed thereon. In FIG. 1G10, the plurality of PLIMs 11A through 11F are shown adjustably mounted on the L-bracket at positions and angular orientations which ensure substantially uniform power density characteristics in both the near and far field portions of the planar laser illumination field produced by planar laser illumination arrays (PLIAs) 6A and 6B cooperating together in accordance with the principles of the present invention. Notably, the relative positions of the PLIMs indicated in FIG. 1G9 were determined for a particular set of a commercial VLDs 13 used in the illustrative embodiment of the present invention, and, as the output beam characteristics will vary for each commercial VLD used in constructing each such PLIM, it is therefore understood that each such PLIM may need to be mounted at different relative positions on the L-bracket of the planar laser illumination array to obtain, from the resulting system, substantially uniform power density characteristics at both near and far regions of the planar laser illumination field produced thereby.

While a refractive-type cylindrical lens element 16 has been shown mounted at the end of each PLIM of the illustrative embodiments, it is understood each cylindrical lens element can be realized using refractive, reflective and/or diffractive technology and devices, including reflection and transmission type holographic optical elements (HOEs) well know in the art and described in detail in published International Application No. WO 99/57579 Nov. 11, 1999 [108-010PCT000], incorporated herein by reference. The only requirement of the optical element mounted at the end of each PLIM is that it has sufficient optical properties to convert a focusing laser beam transmitted therethrough, into a laser beam which expands or otherwise spreads out only along a single plane of propagation, while the laser beam is substantially unaltered (i.e. neither compressed or expanded) in the direction normal to the propagation plane. As used hereinafter and in the claims, the terms "cylindrical lens", "cylindrical lens element" and "cylindrical optical element (COE)" shall be deemed to embrace all such alternative embodiments of this aspect of the present invention.

Detailed Description of the Image Formation and Detection Module Employed in the PLIIM System of the First Generalized Embodiment of the Present Invention In FIG. 1J1, there is shown a geometrical model (based on the thin lens equation) for the simple imaging subsystem 3B employed in the image formation and detection module 3 in the PLIIM system of the first generalized embodiment shown in FIG. 1A. As shown in FIG. 11J1, this simple imaging system 3B consists of a source of illumination (e.g. laser light reflected off a target object) and an imaging lens. The illumination source is at an object distance $r_0$ measured from the center of the imaging lens. In FIG. 1J1, some representative rays of light have been traced from the source to the front lens surface. The imaging lens is considered to be of the converging type which, for ordinary operating conditions, focuses the incident rays from the illumination source to form an image which is located at an image distance $r_i$ on the opposite side of the imaging lens. In FIG. 1J1, some representative rays have also been traced from the back lens surface to the image. The imaging lens itself is characterized by a focal length f, the definition of which will be discussed in greater detail hereinbelow.

For the purpose of simplifying the mathematical analysis, the imaging lens is considered to be a thin lens, that is, idealized to a single surface with no thickness. The parameters f, $r_0$ and $r_i$, all of which have units of length, are related by the "thin lens" equation (1) set forth below:

$$\frac{1}{f} = \frac{1}{r_0} + \frac{1}{r_i} \quad (1)$$

This equation may be solved for the image distance, which yields expression (2)

$$r_i = \frac{fr_0}{r_0 - f} \quad (2)$$

If the object distance $r_0$ goes to infinity, then expression (2) reduces to $r_i = f$. Thus, the focal length of the imaging lens is the image distance at which light incident on the lens from an infinitely distant object will be focused. Once f is known, the image distance for light from any other object distance can be determined using (2).

Field of View of the Imaging Lens and Resolution of the Detected Image

The basic characteristics of an image detected by the IFD module 3 hereof may be determined using the technique of ray tracing, in which representative rays of light are drawn from the source through the imaging lens and to the image. Such ray tracing is shown in FIG. 1J2. A basic rule of ray tracing is that a ray from the illumination source that passes through the center of the imaging lens continues undeviated to the image. That is, a ray that passes through the center of the imaging lens is not refracted. Thus, the size of the field of view (FOV) of the imaging lens may be determined by tracing rays (backwards) from the edges of the image detection/sensing array through the center of the imaging lens and out to the image plane as shown in FIG. 1J2, where d is the dimension of a pixel, n is the number of pixels on the image detector array in this direction, and W is the dimension of the field of view of the imaging lens. Solving for the FOV dimension W, and substituting for $r_i$ using expression (2) above yields expression (3) as follows:

$$W = \frac{dn(r_0 - f)}{f} \quad (3)$$

Now that the size of the field of view is known, the dpi resolution of the image is determined. The dpi resolution of the image is simply the number of pixels divided by the dimension of the field of view. Assuming that all the dimensions of the system are measured in meters, the dots per inch (dpi) resolution of the image is given by the expression (4) as follows:

$$dpi = \frac{f}{39.37d(r_0 - f)} \quad (4)$$

Working Distance and Depth of Field of the Imaging Lens

Light returning to the imaging lens that emanates from object surfaces slightly closer to and farther from the imaging lens than object distance $r_0$ will also appear to be in good focus on the image. From a practical standpoint, "good focus" is decided by the decoding software 21 used when the image is too blurry to allow the code to be read (i.e. decoded), then the imaging subsystem is said to be "out of focus". If the object distance $r_0$ at which the imaging subsystem is ideally focused is known, then it can be calculated theoretically the closest and farthest "working distances" of the PLIIM system, given by parameters $r_{near}$ and $r_{far}$, respectively, at which the system will still function. These distance parameters are given by expression (5) and (6) as follows:

$$r_{near} = \frac{fr_0(f + DF)}{f^2 + DFr_0} \quad (5)$$

$$r_{far} = \frac{fr_0(f - DF)}{f^2 - DFr_0} \quad (6)$$

where D is the diameter of the largest permissible "circle of confusion" on the image detection array. A circle of confusion is essentially the blurred out light that arrives from points at image distances other than object distance $r_0$. When the circle of confusion becomes too large (when the blurred light spreads out too much) then one will lose focus. The value of parameter D for a given imaging subsystem is usually estimated from experience during system design, and then determined more precisely, if necessary, later through laboratory experiment.

Another optical parameter of interest is the total depth of field Δr, which is the difference between distances $r_{far}$ and $r_{near}$; this parameter is the total distance over which the imaging system will be able to operate when focused at object distance $r_0$. This optical parameter may be expressed by equation (7) below:

$$\Delta r = \frac{2Df^2 F r_0 (r_0 - f)}{f^4 - D^2 F^2 r_0^2} \quad (7)$$

It should be noted that the parameter Δr is generally not symmetric about $r_0$; the depth of field usually extends farther towards infinity from the ideal focal distance than it does back towards the imaging lens.

Modeling a Fixed Focal Length Imaging Subsystem Used in the Image Formation and Detection Module of the Present Invention A typical imaging (i.e. camera) lens used to construct a fixed focal-length image formation and detection module of the present invention might typically consist of three to fifteen or more individual optical elements contained within a common barrel structure. The inherent complexity of such an optical module prevents its performance from being described very accurately using a "thin lens analysis", described above by equation (1). However, the results of a thin lens analysis can be used as a useful guide when choosing an imaging lens for a particular PLIIM system application.

A typical imaging lens can focus light (illumination) originating anywhere from an infinite distance away, to a few feet away. However, regardless of the origin of such illumination, its rays must be brought to a sharp focus at exactly the same location (e.g. the film plane or image detector), which (in an ordinary camera) does not move. At first glance, this requirement may appear unusual because the thin lens equation (1) above states that the image distance at which light is focused through a thin lens is a function of the object distance at which the light originates, as shown in FIG. 1J3. Thus, it would appear that the position of the image detector would depend on the distance at which the object being imaged is located. An imaging subsystem having a variable focal distance lens assembly avoids this difficulty because several of its lens elements are capable of movement relative to the others. For a fixed focal length imaging lens, the leading lens element(s) can move back and forth a short distance, usually accomplished by the rotation of a helical barrel element which converts rotational motion into purely linear motion of the lens elements. This motion has the effect of changing the image distance to compensate for a change in object distance, allowing the image detector to remain in place, as shown in the schematic optical diagram of FIG. 1J4.

Figure 3A:
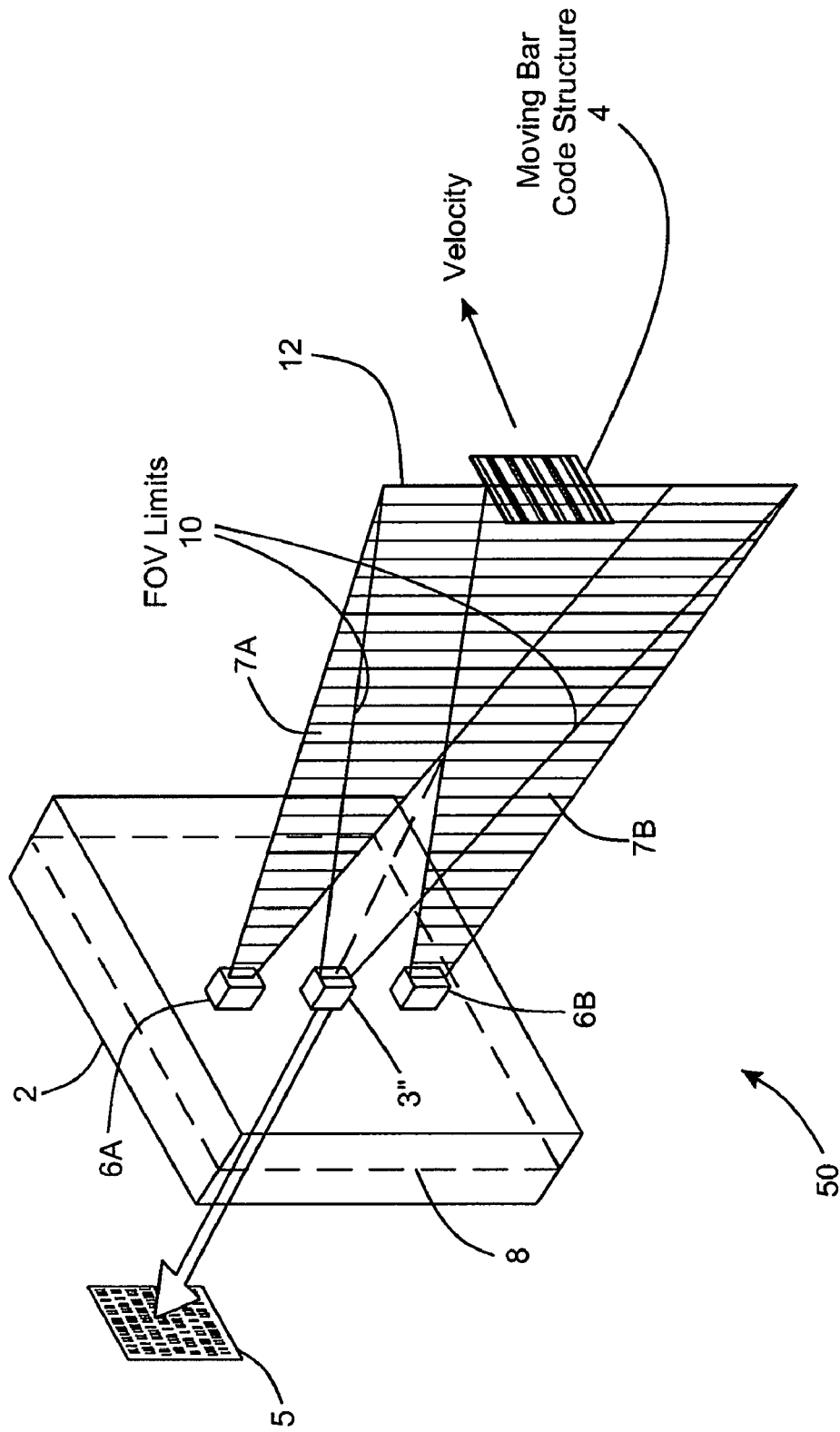
FIG. 3A is a schematic representation of a fifth generalized embodiment of the PLIIM system of the present invention, wherein a pair of planar laser illumination arrays (PLIAs) are mounted on opposite sides of a linear image formation and detection module (IFDM) having a variable focal length imaging lens, a variable focal distance and a variable field of view, so that the planar laser illumination arrays produce a stationary plane of laser beam illumination (i.e. light) which is disposed substantially coplanar with the field view of the image formation and detection module during object illumination and image detection operations carried out on bar code symbol and other graphical indicia by the PLIIM system of the present invention.

Modeling a Variable Focal Length (Zoom) Imaging Lens Used in the Image Formation and Detection Module of the Present Invention As shown in FIG. 1J5, a variable focal length (zoom) imaging subsystem has an additional level of internal complexity. A zoom-type imaging subsystem is capable of changing its focal length over a given range; a longer focal length produces a smaller field of view at a given object distance. Consider the case where the PLIIM system needs to illuminate and image a certain object over a range of object distances, but requires the illuminated object to appear the same size in all acquired images. When the object is far away, the PLIIM system will generate control signals that select a long focal length, causing the field of view to shrink (to compensate for the decrease in apparent size of the object due to distance). When the object is close, the PLIIM system will generate control signals that select a shorter focal length, which widens the field of view and preserves the relative size of the object. In many bar code scanning applications, a zoom-type imaging subsystem in the PLIIM system (as shown in FIGS. 3A through 3J5) ensures that all acquired images of bar code symbols have the same dpi image resolution regardless of the position of the bar code symbol within the object distance of the PLIIM system.

As shown in FIG. 1J5, a zoom-type imaging subsystem has two groups of lens elements which are able to undergo relative motion. The leading lens elements are moved to achieve focus in the same way as for a fixed focal length lens. Also, there is a group of lenses in the middle of the barrel which move back and forth to achieve the zoom, that is, to change the effective focal length of all the lens elements acting together.

Several Techniques for Accommodating the Field of View (FOV) of a PLIIM System to Particular End-User Environments In many applications, a PLIIM system of the present invention may include an imaging subsystem with a very long focal length imaging lens (assembly), and this PLIIM system must be installed in end-user environments having a substantially shorter object distance range, and/or field of view (FOV) requirements or the like. Such problems can exist for PLIIM systems employing either fixed or variable focal length imaging subsystems. To accommodate a particular PLIIM system for installation in such environments, three different techniques illustrated in FIGS. 1K1-1K2, 1L1 and 1L2 can be used.

In FIGS. 1K1 and 1K2, the focal length of the imaging lens 3B can be fixed and set at the factory to produce a field of view having specified geometrical characteristics for particular applications. In FIG. K1, the focal length of the image formation and detection module 3 is fixed during the optical design stage so that the fixed field of view (FOV) thereof substantially matches the scan field width measured at the top of the scan field, and thereafter overshoots the scan field and extends on down to the plane of the conveyor belt 34. In this FOV arrangement, the dpi image resolution will be greater for packages having a higher height profile above the conveyor belt, and less for envelope-type packages with low height profiles. In FIG. 1K2, the focal length of the image formation and detection module 3 is fixed during the optical design stage so that the fixed field of view thereof substantially matches the plane slightly above the conveyor belt 34 where envelope-type packages are transported. In this FOV arrangement, the dpi image resolution will be maximized for envelope-type packages which are expected to be transported along the conveyor belt structure, and this system will be unable to read bar codes on packages having a height-profile exceeding the low-profile scanning field of the system.

In FIG. 1L, a FOV beam folding mirror arrangement is used to fold the optical path of the imaging subsystem within the interior of the system housing so that the FOV emerging from the system housing has geometrical characteristics that match the scanning application at hand. As shown, this technique involves mounting a plurality of FOV folding mirrors 9A through 9E on the optical bench of the PLIIM system to bounce the FOV of the imaging subsystem 3B back and forth before the FOV emerges from the system housing. Using this technique, when the FOV emerges from the system housing, it will have expanded to a size appropriate for covering the entire scan field of the system. This technique is easier to practice with image formation and detection modules having linear image detectors, for which the FOV folding mirrors only have to expand in one direction as the distance from the imaging subsystem increases. In FIG. 1L, this direction of FOV expansion occurs in the direction perpendicular to the page. In the case of area-type PLIIM systems, as shown in FIGS. 4A through 6F4, the FOV folding mirrors have to accommodate a 3-D FOV which expands in two directions. Thus an internal folding path is easier to arrange for linear-type PLIIM systems.

In FIG. 1L2, the fixed field of view of an imaging subsystem is expanded across a working space (e.g. conveyor belt structure) by using a motor 35 to controllably rotate the FOV 10 during object illumination and imaging operations. When designing a linear-type PLIIM system for industrial scanning applications, wherein the focal length of the imaging subsystem is fixed, a higher dpi image resolution will occasionally be required. This implies using a longer focal length imaging lens, which produces a narrower FOV and thus higher dpi image resolution. However, in many applications, the image formation and detection module in the PLIIM system cannot be physically located far enough away from the conveyor belt (and within the system housing) to enable the narrow FOV to cover the entire scanning field of the system. In this case, a FOV folding mirror 9F can be made to rotate, relative to stationary for folding mirror 9G, in order to sweep the linear FOV from side to side over the entire width of the conveyor belt, depending on where the bar coded package is located. Ideally, this rotating FOV folding mirror 9F would have only two mirror positions, but this will depend on how small the FOV is at the top of the scan field. The rotating FOV folding mirror can be driven by motor 35 operated under the control of the system controller 22, as described herein.

Method of Adjusting the Focal Characteristics of the Planar Laser Illumination Beams Generated by Planar Laser Illumination Arrays Used in Conjunction with Image Formation and Detection Modules Employing Fixed Focal Length Imaging Lenses In the case of a fixed focal length camera lens, the planar laser illumination beam 7A, 7B is focused at the farthest possible object distance in the PLIIM system. In the case of fixed focal length imaging lens, this focus control technique of the present invention is not employed to compensate for decrease in the power density of the reflected laser beam as a function of $1/r^2$ distance from the imaging subsystem, but rather to compensate for a decrease in power density of the planar laser illumination beam on the target object due to an increase in object distance away from the imaging subsystem.

It can be shown that laser return light that is reflected by the target object (and measured/detected at any arbitrary point in space) decreases in intensity as the inverse square of the object distance. In the PLIIM system of the present invention, the relevant decrease in intensity is not related to such "inverse square" law decreases, but rather to the fact that the width of the planar laser illumination beam increases as the object distance increases. This "beam-width/object-distance" law decrease in light intensity will be described in greater detail below.

Using a thin lens analysis of the imaging subsystem, it can be shown that when any form of illumination having a uniform power density $E_0$ (i.e. power per unit area) is directed incident on a target object surface and the reflected laser illumination from the illuminated object is imaged through an imaging lens having a fixed focal length f and f-stop F, the power density $E_{pix}$ (measured at the pixel of the image detection array and expressed as a function of the object distance r) is provided by the expression (8) set forth below:

$$E_{pix} = \frac{E_0}{8F}\left(1 - \frac{f}{r}\right)^2 \qquad (8)$$

FIG. 1M1 shows a plot of pixel power density $E_{pix}$ vs. object distance r calculated using the arbitrary but reasonable values $E_0=1$ W/m$^2$, f=80 mm and F=4.5. This plot demonstrates that, in a counter-intuitive manner, the power density at the pixel (and therefore the power incident on the pixel, as its area remains constant) actually increases as the object distance increases. Careful analysis explains this particular optical phenomenon by the fact that the field of view of each pixel on the image detection array increases slightly faster with increases in object distances than would be necessary to compensate for the $1/r^2$ return light losses. A more analytical explanation is provided below.

The width of the planar laser illumination beam increases as object distance r increases. At increasing object distances, the constant output power from the VLD in each planar laser illumination module (PLIM) is spread out over a longer beam width, and therefore the power density at any point along the laser beam width decreases. To compensate for this phenomenon, the planar laser illumination beam of the present invention is focused at the farthest object distance so that the height of the planar laser illumination beam becomes smaller as the object distance increases; as the height of the planar laser illumination beam becomes narrower towards the farthest object distance, the laser beam power density increases at any point along the width of the planar laser illumination beam. The decrease in laser beam power density due to an increase in planar laser beam width and the increase in power density due to a decrease in planar laser beam height, roughly cancel each other out, resulting in a power density which either remains approximately constant or increases as a function of increasing object distance, as the application at hand may require.

When the laser beam is fanned (i.e. spread) out into a substantially planar laser illumination beam by the cylindrical lens element employed within each PLIM in the PLIIM system, the total output power in the planar laser illumination beam is distributed along the width of the beam in a roughly Gaussian distribution, as shown in the power vs. position plot of FIG. 1M2. Notably, this plot was constructed using actual data gathered with a planar laser illumination beam focused at the farthest object distance in the PLIIM system. For comparison purposes, the data points and a Gaussian curve fit are shown for the planar laser beam widths taken at the nearest and farthest object distances. To avoid having to consider two dimensions simultaneously (i.e. left-to-right along the planar laser beam width dimension and near-to-far through the object distance dimension), the discussion below will assume that only a single pixel is under consideration, and that this pixel views the target object at the center of the planar laser beam width.

For a fixed focal length imaging lens, the width L of the planar laser beam is a function of the fan/spread angle θ induced by (i) the cylindrical lens element in the PLIM and (ii) the object distance r, as defined by the following expression (9):

$$L = 2r\tan\frac{\theta}{2} \qquad (9)$$

FIG. 1M3 shows a plot of beam width length L versus object distance r calculated using θ=50°, demonstrating the planar laser beam width increases as a function of increasing object distance.

The height parameter of the planar laser illumination beam "h" is controlled by adjusting the focusing lens 15 between the visible laser diode (VLD) 13 and the cylindrical lens 16, shown in FIGS. 1I1 and 1I2. FIG. 1M4 shows a typical plot of planar laser beam height h vs. image distance r for a planar laser illumination beam focused at the farthest object distance in accordance with the principles of the present invention. As shown in FIG. 1M4, the height dimension of the planar laser beam decreases as a function of increasing object distance.

Assuming a reasonable total laser power output of 20 mW from the VLD 13 in each PLIM 11, the values shown in the plots of FIGS. 1M3 and 1M4 can be used to determine the power density $E_0$ of the planar laser beam at the center of its beam width, expressed as a function of object distance. This measure, plotted in FIG. 1N, demonstrates that the use of the laser beam focusing technique of the present invention, wherein the height of the planar laser illumination beam is decreased as the object distance increases, compensates for the increase in beam width in the planar laser illumination beam, which occurs for an increase in object distance. This yields a laser beam power density on the target object which increases as a function of increasing object distance over a substantial portion of the object distance range of the PLIIM system.

Figure 1N:
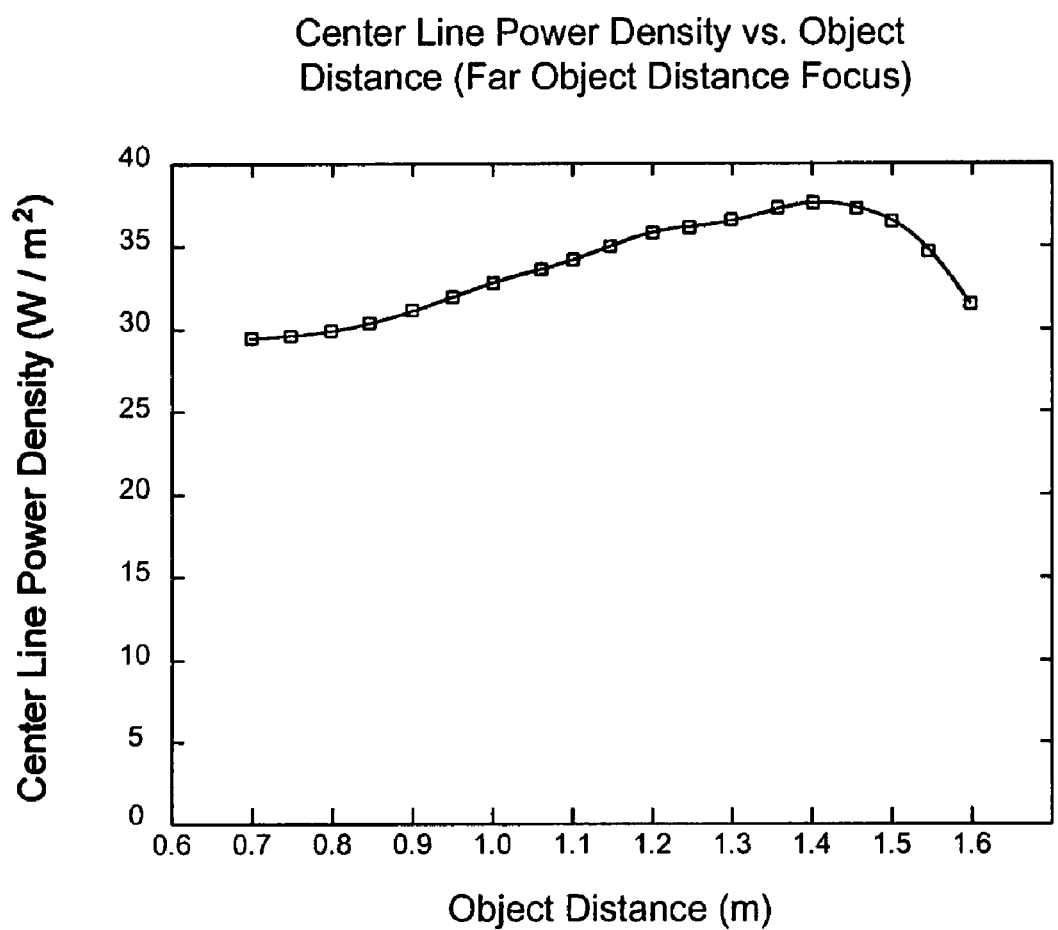
FIG. 1N is a data plot of planar laser beam power density $E_0$ at the center of its beam width, plotted as a function of object distance, demonstrating that use of the laser beam focusing technique of the present invention, wherein the height of the planar laser illumination beam is decreased as the object distance increases, compensates for the increase in beam width in the planar laser illumination beam, which occurs for an increase in object distance, thereby yielding a laser beam power density on the target object which increases as a function of increasing object distance over a substantial portion of the object distance range of the PLIIM system.

Finally, the power density $E_0$ plot shown in FIG. 1N can be used with expression (1) above to determine the power density on the pixel, $E_{pix}$. This $E_{pix}$ plot is shown in FIG. 1O. For comparison purposes, the plot obtained when using the beam focusing method of the present invention is plotted in FIG. 1O against a "reference" power density plot $E_{pix}$ which is obtained when focusing the laser beam at infinity, using a collimating lens (rather than a focusing lens 15) disposed after the VLD 13, to produce a collimated-type planar laser illumination beam having a constant beam height of 1 mm over the entire portion of the object distance range of the system. Notably, however, this non-preferred beam collimating technique, selected as the reference plot in FIG. 1O, does not compensate for the above-described effects associated with an increase in planar laser beam width as a function of object distance. Consequently, when using this non-preferred beam focusing technique, the power density of the planar laser illumination beam produced by each PLIM decreases as a function of increasing object distance.

Therefore, in summary, where a fixed or variable focal length imaging subsystem is employed in the PLIIM system hereof, the planar laser beam focusing technique of the present invention described above helps compensate for decreases in the power density of the incident planar illumination beam due to the fact that the width of the planar laser illumination beam increases for increasing object distances away from the imaging subsystem.

Producing a Composite Planar Laser Illumination Beam Having Substantially Uniform Power Density Characteristics in Near and Far Fields by Additively Combining the Individual Gaussian Power Density Distributions of Planar Laser Illumination Beams Produced by Planar Laser Illumination Beam Modules (PLIMS) in Planar Laser Illumination Arrays (PLIAS)

Having described the best known method of focusing the planar laser illumination beam produced by each VLD in each PLIM in the PLIIM system hereof, it is appropriate at this juncture to describe how the individual Gaussian power density distributions of the planar laser illumination beams produced a PLIA 6A, 6B are additively combined to produce a composite planar laser illumination beam having substantially uniform power density characteristics in near and far fields, as illustrated in FIGS. 1P1 and 1P2.

When the laser beam produced from the VLD is transmitted through the cylindrical lens, the output beam will be spread out into a laser illumination beam extending in a plane along the direction in which the lens has curvature. The beam size along the axis which corresponds to the height of the cylindrical lens will be transmitted unchanged. When the planar laser illumination beam is projected onto a target surface, its profile of power versus displacement will have an approximately Gaussian distribution. In accordance with the principles of the present invention, the plurality of VLDs on each side of the IFD module are spaced out and tilted in such a way that their individual power density distributions add up to produce a (composite) planar laser illumination beam having a magnitude of illumination which is distributed substantially uniformly over the entire working depth of the PLIIM system (i.e. along the height and width of the composite planar laser illumination beam).

The actual positions of the PLIMs along each planar laser illumination array are indicated in FIG. 1G3 for the exemplary PLIIM system shown in FIGS. 1G1 through 1I2. The mathematical analysis used to analyze the results of summing up the individual power density functions of the PLIMs at both near and far working distances was carried out using the Matlab™ mathematical modeling program by Mathworks, Inc. (http://www.mathworks.com). These results are set forth in the data plots of FIGS. 1P1 and 1P2. Notably, in these data plots, the total power density is greater at the far field of the working range of the PLIIM system. This is because the VLDs in the PLIMs are focused to achieve minimum beam width thickness at the farthest object distance of the system, whereas the beam height is somewhat greater at the near field region. Thus, although the far field receives less illumination power at any given location, this power is concentrated into a smaller area, which results in a greater power density within the substantially planar extent of the planar laser illumination beam of the present invention.

When aligning the individual planar laser illumination beams (i.e. planar beam components) produced from each PLIM, it will be important to ensure that each such planar laser illumination beam spatially coincides with a section of the FOV of the imaging subsystem, so that the composite planar laser illumination beam produced by the individual beam components spatially coincides with the FOV of the imaging subsystem throughout the entire working depth of the PLIIM system.

Second Alternative Embodiment of the PLIIM System of the Present Invention Shown in FIG. 1A In FIG. 1Q1, the second illustrative embodiment of the PLIIM system of FIG. 1A is shown comprising: a 1-D type image formation and detection (IFD) module 3', as shown in FIG. 1B1; and a pair of planar laser illumination arrays 6A and 6B. As shown, these arrays 6A and 6B are arranged in relation to the image formation and detection module 3 so that the field of view thereof is oriented in a direction that is coplanar with the planes of laser illumination produced by the planar illumination arrays, without using any laser beam or field of view folding mirrors. One primary advantage of this system architecture is that it does not require any laser beam or FOV folding mirrors, employs the few optical surfaces, and maximizes the return of laser light, and is easy to align. However, it is expected that this system design will most likely require a system housing having a height dimension which is greater than the height dimension required by the system design shown in FIG. 1B1.

As shown in FIG. 1Q2, PLIIM system 1B shown in FIG. 1Q1 comprises: planar laser illumination arrays 6A and 6B, each having a plurality of planar laser illumination modules 11A through 11F, and each planar laser illumination module being driven by a VLD driver circuit 18; linear-type image formation and detection module 3 having an imaging subsystem with a fixed focal length imaging lens, a fixed focal distance, and a fixed field of view, and 1-D image detection array (e.g. Piranha Model Nos. CT-P4, or CL-P4 High-Speed CCD Line Scan Camera, from Dalsa, Inc. USA—http:/www/dalsa.com) for detecting 1-D line images formed thereon by the imaging subsystem; an image frame grabber 19 operably connected to the linear-type image formation and detection module 3, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner. Preferably, the PLIIM system of FIGS. 1O1 and 1O2 is realized using the same or similar construction techniques shown in FIGS. 1G1 through 1I2, and described above.

Third Alternative Embodiment of the PLIIM System of the Present Invention Shown in FIG. 1A In FIG. 1R1, the third illustrative embodiment of the PLIIM system of FIGS. 1A, 1C are shown comprising: a 1-D type image formation and detection (IFD) module 3 having a field of view (FOV), as shown in FIG. 1B1; a pair of planar laser illumination arrays 6A and 6B for producing first and second planar laser illumination beams; and a pair of planar laser beam folding mirrors 37A and 37B arranged. The function of the planar laser illumination beam folding mirrors 37A and 37B is to fold the optical paths of the first and second planar laser illumination beams produced by the pair of planar illumination arrays 37A and 37B such that the field of view (FOV) of the image formation and detection module 3 is aligned in a direction that is coplanar with the planes of first and second planar laser illumination beams during object illumination and imaging operations. One notable disadvantage of this system architecture is that it requires additional optical surfaces which can reduce the intensity of outgoing laser illumination and therefore reduce slightly the intensity of returned laser illumination reflected off target objects. Also this system design requires a more complicated beam/FOV adjustment scheme, than not using any planar laser illumination beam folding mirrors. This system design can be best used when the planar laser illumination beams do not have large apex angles to provide sufficiently uniform illumination. In this system embodiment, the PLIMs are mounted on the optical bench as far back as possible from the beam folding mirrors, and cylindrical lenses with larger radiuses will be employed in the design of each PLIM.

As shown in FIG. 1R2, PLIIM system 1C shown in FIG. 1R1 comprises: planar laser illumination arrays 6A and 6B, each having a plurality of planar laser illumination modules 6A through 6B, and each planar laser illumination module being driven by a VLD driver circuit 18; linear-type image formation and detection module having an imaging subsystem with a fixed focal length imaging lens, a fixed focal distance, and a fixed field of view, and 1-D image detection array (e.g. Piranha Model Nos. CT-P4, or CL-P4 High-Speed CCD Line Scan Camera, from Dalsa, Inc. USA—http:/www/dalsa.com) for detecting 1-D line images formed thereon by the imaging subsystem; pair of planar laser beam folding mirrors 37A and 37B arranged so as to fold the optical paths of the first and second planar laser illumination beams produced by the pair of planar illumination arrays 6A and 6B; an image frame grabber 19 operably connected to the linear-type image formation and detection module 3, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner. Preferably, the PLIIM system of FIGS. 1Q1 and 1Q2 is realized using the same or similar construction techniques shown in FIGS. 1G1 through 1I2, and described above.

Fourth Illustrative Embodiment of the PLIIM System of the Present Invention Shown in FIG. 1A In FIG. 1S1, the fourth illustrative embodiment of the PLIIM system of FIGS. 1A, indicated by reference No. 1D is shown comprising: a 1-D type image formation and detection (IFD) module 3 having a field of view (FOV), as shown in FIG. 1B1; a pair of planar laser illumination arrays 6A and 6B for producing first and second planar laser illumination beams; a field of view folding mirror 9 for folding the field of view (FOV) of the image formation and detection module 3 about 90 degrees downwardly; and a pair of planar laser beam folding mirrors 37A and 37B arranged so as to fold the optical paths of the first and second planar laser illumination beams produced by the pair of planar illumination arrays 6A and 6B such that the planes of first and second planar laser illumination beams 7A and 7B are in a direction that is coplanar with the field of view of the image formation and detection module 3. Despite inheriting most of the disadvantages associated with the system designs shown in FIGS. 1B1 and 1R1, this system architecture allows the length of the system housing to be easily minimized, at the expense of an increase in the height and width dimensions of the system housing.

As shown in FIG. 1S2, PLIIM system 1D shown in FIG. 1S1 comprises: planar laser illumination arrays 6A and 6B, each having a plurality of planar laser illumination modules 11A through 11F, and each planar laser illumination module being driven by a VLD driver circuit 18; linear-type image formation and detection module 3 having an imaging subsystem with a fixed focal length imaging lens, a fixed focal distance, and a fixed field of view, and 1-D image detection array (e.g. Piranha Model Nos. CT-P4, or CL-P4 High-Speed CCD Line Scan Camera, from Dalsa, Inc. USA—http:/www/dalsa.com) for detecting 1-D line images formed thereon by the imaging subsystem; a field of view folding mirror 9 for folding the field of view (FOV) of the image formation and detection module 3; a pair of planar laser beam folding mirrors 9 and 3 arranged so as to fold the optical paths of the first and second planar laser illumination beams produced by the pair of planar illumination arrays 37A and 37B; an image frame grabber 19 operably connected to the linear-type image formation and detection module 3, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner. Preferably, the PLIIM system of FIGS. 1S1 and 1S2 is realized using the same or similar construction techniques shown in FIGS. 1G1 through 1I2, and described above.

Figure 1T:
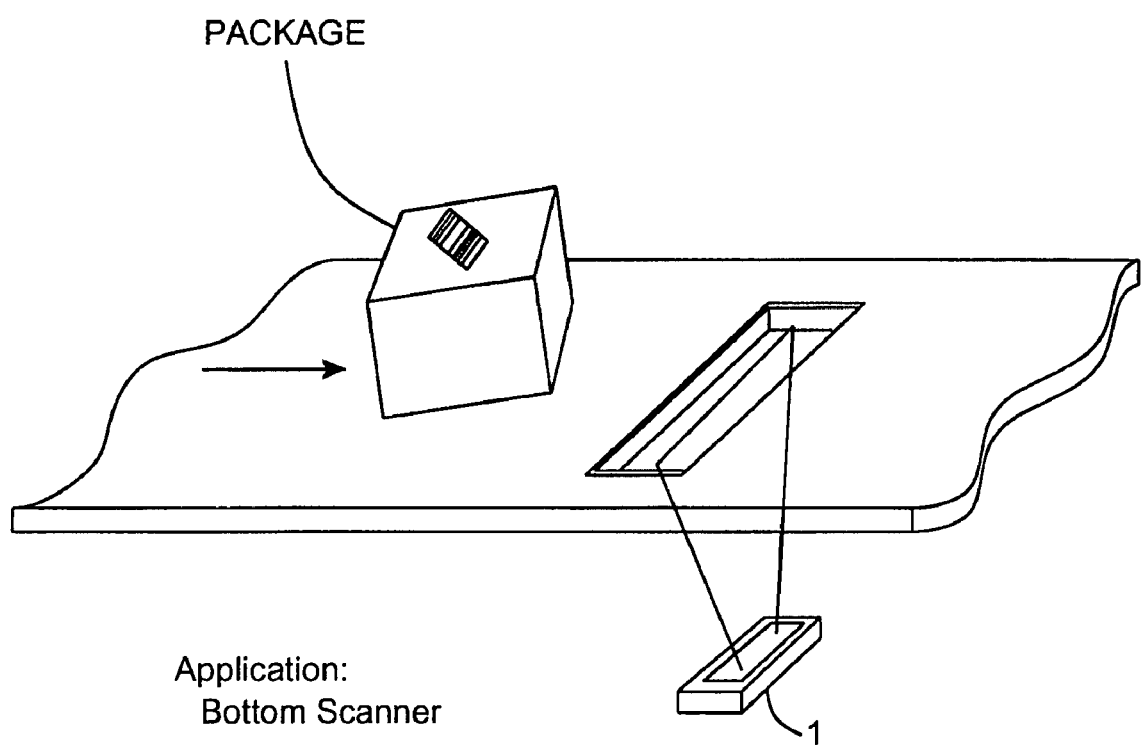
FIG. 1T is a schematic representation of an under (or over) the-conveyor belt package identification system embodying the PLIIM system of FIG. 1A.
Figure 1U:
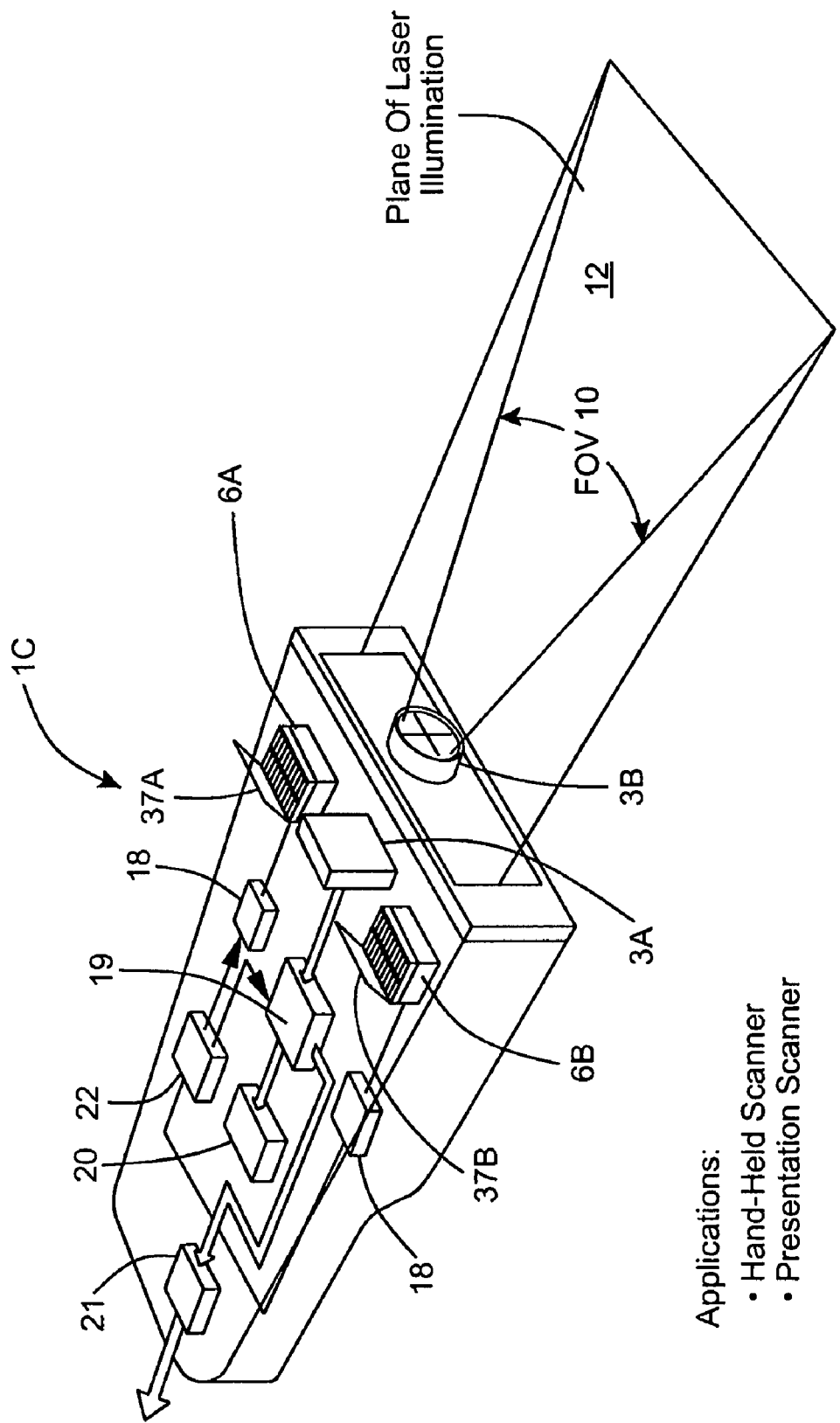
FIG. 1U is a schematic representation of a hand-supportable bar code symbol reading system embodying the PLIIM system of FIG. 1A.

Applications for the First Generalized Embodiment of the PLIIM System of the Present Invention, and the Illustrative Embodiments Thereof Fixed focal distance PLIIM systems shown in FIGS. 1B1 through 1U are ideal for applications in which there is little variation in the object distance, such as in a conveyor-type bottom scanner application. As such scanning systems employ a fixed focal length imaging lens, the image resolution requirements of such applications must be examined carefully to determine that the image resolution obtained is suitable for the intended application. Because the object distance is approximately constant for a bottom scanner application (i.e. the bar code almost always is illuminated and imaged within the same object plane), the dpi resolution of acquired images will be approximately constant. As image resolution is not a concern in this type of scanning applications, variable focal length (zoom) control is unnecessary, and a fixed focal length imaging lens should suffice and enable good results.

A fixed focal distance PLIIM system generally takes up less space than a variable or dynamic focus model because more advanced focusing methods require more complicated optics and electronics, and additional components such as motors. For this reason, fixed focus PLIIM systems are good choices for handheld and presentation scanners as indicated in FIG. 1U, wherein space and weight are always critical characteristics. In these applications, however, the object distance can vary over a range from several to a twelve or more inches, and so the designer must exercise care to ensure that the scanner's depth of field (DOF) alone will be sufficient to accommodate all possible variations in target object distance and orientation. Also, because a fixed focus imaging subsystem implies a fixed focal length camera lens, the variation in object distance implies that the dots per inch resolution of the image will vary as well. The focal length of the imaging lens must be chosen so that the angular width of the field of view (FOV) is narrow enough that the dpi image resolution will not fall below the minimum acceptable value anywhere within the range of object distances supported by the PLIIM system.

Second Generalized Embodiment of the Planar Laser Illumination and Electronic Imaging System of the Present Invention The second generalized embodiment of the PLIIM system of the present invention 11 is illustrated in FIGS. 1V1 and 1V2. As shown in FIG. 1V1, the PLIIM system 1' comprises: a housing 2 of compact construction; a linear (i.e. 1-dimensional) type image formation and detection (IFD) module 3'; and a pair of planar laser illumination arrays (PLIAs) 6A and 6B mounted on opposite sides of the IFD module 3'. During system operation, laser illumination arrays 6A and 6B each produce a moving plane of laser illumination beam 12' which synchronously moves and is disposed substantially coplanar with the field of view (FOV) of the image formation and detection module 3', so as to scan a bar code symbol or other graphical structure 4 disposed stationary within a 3-D scanning region.

As shown in FIGS. 2V2 and 2V3, the PLIIM system of FIG. 2V1 comprises: an image formation and detection module 3' having an imaging subsystem 3B' with a fixed focal length imaging lens, a fixed focal distance, and a fixed field of view, and a 1-D image detection array 3 (e.g. Piranha Model Nos. CT-P4, or CL-P4 High-Speed CCD Line Scan Camera, from Dalsa, Inc. USA—http:/www/dalsa.com) for detecting 1-D line images formed thereon by the imaging subsystem; a field of view sweeping mirror 9 operably connected to a motor mechanism 38 under control of system controller 22, for folding and sweeping the field of view of the image formation and detection module 3; a pair of planar laser illumination arrays 6A and 6B for producing planar laser illumination beams 7A and 7B; a pair of planar laser illumination beam folding/sweeping mirrors 37A and 37B operably connected to motor mechanisms 39A and 39B, respectively, under control of system controller 22, for folding and sweeping the planar laser illumination beams 7A and 7B, respectively, in synchronism with the FOV being swept by the FOV folding and sweeping mirror 9; an image frame grabber 19 operably connected to the linear-type image formation and detection module 3, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner.

An image formation and detection (IFD) module 3 having an imaging lens with a fixed focal length has a constant angular field of view (FOV); that is, the farther the target object is located from the IFD module, the larger the projection dimensions of the imaging subsystem's FOV become on the surface of the target object. A disadvantage to this type of imaging lens is that the resolution of the image that is acquired, in terms of pixels or dots per inch, varies as a function of the distance from the target object to the imaging lens. However, a fixed focal length imaging lens is easier and less expensive to design and produce than the alternative, a zoom-type imaging lens which will be discussed in detail hereinbelow with reference to FIGS. 3A through 3J4.

Each planar laser illumination module 6A through 6B in PLIIM system 1' is driven by a VLD driver circuit 18 under the system controller 22. Notably, laser illumination beam folding/sweeping mirror 37A' and 38B', and FOV folding/sweeping mirror 9' are each rotatably driven by a motor-driven mechanism 38, 39A, and 39B, respectively, operated under the control of the system controller 22. These three mirror elements can be synchronously moved in a number of different ways. For example, the mirrors 37A', 37B' and 9' can be jointly rotated together under the control of one or more motor-driven mechanisms, or each mirror element can be driven by a separate driven motor which is synchronously controlled to enable the planar laser illumination beams 7A, 7B and FOV 10 to move together in a spatially-coplanar manner during illumination and detection operations within the PLIIM system.

In accordance with the present invention, the planar laser illumination arrays 6A and 6B, the linear image formation and detection module 3, the folding/sweeping FOV mirror 9', and the planar laser illumination beam folding/sweeping mirrors 37A' and 37B' employed in this generalized system embodiment, are fixedly mounted on an optical bench or chassis 8 so as to prevent any relative motion (which might be caused by vibration or temperature changes) between: (i) the image forming optics (e.g. imaging lens) within the image formation and detection module 3 and the FOV folding/sweeping mirror 9' employed therewith; and (ii) each planar laser illumination module (i.e. VLD/cylindrical lens assembly) and the planar laser illumination beam folding/sweeping mirrors 37A' and 37B' employed in this PLIIM system configuration. Preferably, the chassis assembly should provide for easy and secure alignment of all optical components employed in the planar laser illumination arrays 6A' and 6B', beam folding/sweeping mirrors 37A' and 37B', the image formation and detection module 3 and FOV folding/sweeping mirror 9', as well as be easy to manufacture, service and repair. Also, this generalized PLIIM system embodiment 1' employs the general "planar laser illumination" and "focus beam at farthest object distance (FBAFOD)" principles described above.

Applications for the Second Generalized Embodiment of the PLIIM System of the Present Invention The fixed focal length PLIIM system shown in FIGS. 1V1-1V3 has a 3-D fixed field of view which, while spatially-aligned with a composite planar laser illumination beam 12 in a coplanar manner, is automatically swept over a 3-D scanning region within which bar code symbols and other graphical indicia 4 may be illuminated and imaged in accordance with the principles of the present invention. As such, this generalized embodiment of the present invention is ideally suited for use in hand-supportable and hands-free presentation type bar code symbol readers shown in FIGS. 1V4 and 1V5, respectively, in which rasterlike-scanning (i.e. up and down) patterns can be used for reading 1-D as well as 2-D bar code symbologies such as the PDF 147 symbology. In general, the PLIM system of this generalized embodiment may have any of the housing form factors disclosed and described in Applicant's copending U.S. application Ser. Nos. 09/204,176 entitled filed Dec. 3, 1998 and 09/452,976 filed Dec. 2, 1999, and WIPO Publication No. WO 00/33239 published Jun. 8, 2000, incorporated herein by reference. The beam sweeping technology disclosed in copending application Ser. No. 08/931,691 filed Sep. 16, 1997, incorporated herein by reference, can be used to uniformly sweep both the planar laser illumination beam and linear FOV in a coplanar manner during illumination and imaging operations.

Third Generalized Embodiment of the PLIIM System of the Present Invention

The third generalized embodiment of the PLIIM system of the present invention 40 is illustrated in FIG. 2A. As shown therein, the PLIIM system 40 comprises: a housing 2 of compact construction; a linear (i.e. 1-dimensional) type image formation and detection (IFD) module 3' including a 1-D electronic image detection array 3A, a linear (1-D) imaging subsystem (LIS) 3B' having a fixed focal length, a variable focal distance, and a fixed field of view (FOV), for forming a 1-D image of an illuminated object located within the fixed focal distance and FOV thereof and projected onto the 1-D image detection array 3A, so that the 1-D image detection array 3A can electronically detect the image formed thereon and automatically produce a digital image data set 5 representative of the detected image for subsequent image processing; and a pair of planar laser illumination arrays (PLIAs) 6A and 6B, each mounted on opposite sides of the IFD module 3', such that each planar laser illumination array 6A and 6B produces a composite plane of laser beam illumination 12 which is disposed substantially coplanar with the field view of the image formation and detection module 3' during object illumination and image detection operations carried out by the PLIIM system.

In accordance with the present invention, the planar laser illumination arrays 6A and 6B, the linear image formation and detection module 3', and any non-moving FOV and/or planar laser illumination beam folding mirrors employed in any configuration of this generalized system embodiment, are fixedly mounted on an optical bench or chassis so as to prevent any relative motion (which might be caused by vibration or temperature changes) between: (i) the image forming optics (e.g. imaging lens) within the image formation and detection module 3' and any stationary FOV folding mirrors employed therewith; and (ii) each planar laser illumination module (i.e. VLD/cylindrical lens assembly) and any planar laser illumination beam folding mirrors employed in the PLIIM system configuration. Preferably, the chassis assembly should provide for easy and secure alignment of all optical components employed in the planar laser illumination arrays 6A and 6B as well as the image formation and detection module 3', as well as be easy to manufacture, service and repair. Also, this generalized PLIIM system embodiment 40 employs the general "planar laser illumination" and "focus beam at farthest object distance (FBAFOD)" principles described above. Various illustrative embodiments of this generalized PLIIM system will be described below.

An image formation and detection (IFD) module 3 having an imaging lens with variable focal distance, as employed in the PLIIM system of FIG. 2A, can adjust its image distance to compensate for a change in the target's object distance; thus, at least some of the component lens elements in the imaging subsystem are movable, and the depth of field of the imaging subsystems does not limit the ability of the imaging subsystem to accommodate possible object distances and orientations. A variable focus imaging subsystem is able to move its components in such a way as to change the image distance of the imaging lens to compensate for a change in the target's object distance, thus preserving good focus no matter where the target object might be located. Variable focus can be accomplished in several ways, namely: by moving lens elements; moving imager detector/sensor; and dynamic focus. Each of these different methods will be summarized below for sake of convenience.

Use of Moving Lens Elements in the Image Formation and Detection Module

The imaging subsystem in this generalized PLIIM system embodiment can employ an imaging lens which is made up of several component lenses contained in a common lens barrel. A variable focus type imaging lens such as this can move one or more of its lens elements in order to change the effective distance between the lens and the image sensor, which remains stationary. This change in the image distance compensates for a change in the object distance of the target object and keeps the return light in focus. The position at which the focusing lens element(s) must be in order to image light returning from a target object at a given object distance is determined by consulting a lookup table, which must be constructed ahead of time, either experimentally or by design software, well known in the optics art.

Use of an Moving Image Detection Array in the Image Formation and Detection Module The imaging subsystem in this generalized PLIIM system embodiment can be constructed so that all the lens elements remain stationary, with the imaging detector/sensor array being movable relative to the imaging lens so as to change the image distance of the imaging subsystem. The position at which the image detector/sensor must be located to image light returning from a target at a given object distance is determined by consulting a lookup table, which must be constructed ahead of time, either experimentally or by design software, well known in the art.

Use of Dynamic Focal Distance Control in the Image Formation and Detection Module The imaging subsystem in this generalized PLIIM system embodiment can be designed to embody a "dynamic" form of variable focal distance (i.e. focus) control, which is an advanced form of variable focus control. In conventional variable focus control schemes, one focus (i.e. focal distance) setting is established in anticipation of a given target object. The object is imaged using that setting, then another setting is selected for the next object image, if necessary. However, depending on the shape and orientation of the target object, a single target object may exhibit enough variation in its distance from the imaging lens to make it impossible for a single focus setting to acquire a sharp image of the entire object. In this case, the imaging subsystem must change its focus setting while the object is being imaged. This adjustment does not have to be made continuously; rather, a few discrete focus settings will generally be sufficient. The exact number will depend on the shape and orientation of the package being imaged and the depth of field of the imaging subsystem used in the IFD module.

It should be noted that dynamic focus control is only used with a linear image detection/sensor array, as used in the system embodiments shown in FIGS. 2A through 3J4. The reason for this limitation is quite clear: an area-type image detection array captures an entire image after a rapid number of exposures to the planar laser illumination beam, and although changing the focus setting of the imaging subsystem might clear up the image in one part of the detector array, it would induce blurring in another region of the image, thus failing to improve the overall quality of the acquired image.

First Illustrative Embodiment of the PLIIM System Shown in FIG. 2A

The first illustrative embodiment of the PLIIM system of FIG. 2A 40A is shown in FIG. 2B1. As illustrated therein, the field of view of the image formation and detection module 3' and the first and second planar laser illumination beams 7A and 7B produced by the planar illumination arrays 6A and 6B, respectively, are arranged in a substantially coplanar relationship during object illumination and image detection operations.

The PLIIM system illustrated in FIG. 2B1 is shown in greater detail in FIG. 2B2. As shown therein, the linear image formation and detection module 3' is shown comprising an imaging subsystem 3B', and a linear array of photo-electronic detectors 3A realized using CCD technology (e.g. Piranha Model Nos. CT-P4, or CL-P4 High-Speed CCD Line Scan Camera, from Dalsa, Inc. USA—http:/www/dalsa.com) for detecting 1-D line images (e.g. 6000 pixels, @60 MHZ scanning rate) formed thereon by the imaging subsystem 3B', providing an image resolution of 200 dpi or 8 pixels/mm, as the image resolution that results from a fixed focal length imaging lens is the function of the object distance (i.e. the longer the object distance, the lower the resolution). The imaging subsystem 3B' has a fixed focal length imaging lens (e.g. 80 mm Pentax lens, F4.5), a fixed field of view (FOV), and a variable focal distance imaging capability (e.g. 36" total scanning range), and an auto-focusing image plane with a response time of about 20-30 milliseconds over about 5 mm working range.

As shown, each planar laser illumination array (PLIA) 6A, 6B comprises a plurality of planar laser illumination modules (PLIMs) 11A through 11F, closely arranged relative to each other, in a rectilinear fashion. As taught hereinabove, the relative spacing and orientation of each PLIM 11 is such that the spatial intensity distribution of the individual planar laser beams 7A, 7B superimpose and additively produce composite planar laser illumination beam 12 having a substantially uniform power density distribution along the widthwise dimensions of the laser illumination beam, throughout the entire working range of the PLIIM system.

As shown in FIG. 2C1, the PLIIM system of FIG. 2B1 comprises: planar laser illumination arrays 6A and 6B, each having a plurality of planar laser illumination modules 11A through 11F, and each planar laser illumination module being driven by a VLD driver circuit 18; linear-type image formation and detection module 3A; an image frame grabber 19 operably connected to the linear-type image formation and detection module 3A, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner.

FIG. 2C2 illustrates in greater detail the structure of the IFD module 3' used in the PLIIM system of FIG. 2B1. As shown, the IFD module 3' comprises a variable focus fixed focal length imaging subsystem 3B' and a 1-D image detecting array 3A mounted along an optical bench 30 contained within a common lens barrel (not shown). The imaging subsystem 3B' comprises a group of stationary lens elements 3B' mounted along the optical bench before the image detecting array 3A, and a group of focusing lens elements 3B' (having a fixed effective focal length) mounted along the optical bench in front of the stationary lens elements 3A1. In a non-customized application, focal distance control can be provided by moving the 1-D image detecting array 3A back and forth along the optical axis with an optical element translator 3C in response to a first set of control signals 3E generated by the system controller 22, while the entire group of focal lens elements remain stationary. Alternatively, focal distance control can also be provided by moving the entire group of focal lens elements back and forth with translator 3C in response to a first set of control signals 3E generated by the system controller, while the 1-D image detecting array 3A remains stationary. In customized applications, it is possible for the individual lens elements in the group of focusing lens elements 3B' to be moved in response to control signals generated by the system controller 22. Regardless of the approach taken, an IFD module 3' with variable focus fixed focal length imaging can be realized in a variety of ways, each being embraced by the spirit of the present invention.

Second Illustrative Embodiment of the PLIIM System of the Present Invention Shown in FIG. 2A The second illustrative embodiment of the PLIIM system of FIG. 2A 40B is shown in FIG. 2D1 comprising: an image formation and detection module 3' having an imaging subsystem 3B' with a fixed focal length imaging lens, a variable focal distance and a fixed field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http:/www/dalsa.com) for detecting 1-D line images formed thereon by the imaging subsystem 3B'; a field of view folding mirror 9 for folding the field of view of the image formation and detection module 3'; and a pair of planar laser illumination arrays 6A and 6B arranged in relation to the image formation and detection module 3' such that the field of view thereof folded by the field of view folding mirror 9 is oriented in a direction that is coplanar with the composite plane of laser illumination 12 produced by the planar illumination arrays, during object illumination and image detection operations, without using any laser beam folding mirrors.

One primary advantage of this system design is that it enables a construction having an ultra-low height profile suitable, for example, in unitary package identification and dimensioning systems of the type disclosed in FIGS. 17-22, wherein the image-based bar code symbol reader needs to be installed within a compartment (or cavity) of a housing having relatively low height dimensions. Also, in this system design, there is a relatively high degree of freedom provided in where the image formation and detection module 3' can be mounted on the optical bench of the system, thus enabling the field of view (FOV) folding technique disclosed in FIG. 1L1 to be practiced in a relatively easy manner.

As shown in FIG. 2D2, the PLIIM system of FIG. 2D1 comprises: planar laser illumination arrays 6A and 6B, each having a plurality of planar laser illumination modules 11A through 11F, and each planar laser illumination module being driven by a VLD driver circuit 18; linear-type image formation and detection module 3'; a field of view folding mirror 9 for folding the field of view of the image formation and detection module 3'; an image frame grabber 19 operably connected to the linear-type image formation and detection module 3', for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner.

FIG. 2D2 illustrates in greater detail the structure of the IFD module 3' used in the PLIIM system of FIG. 2D1. As shown, the IFD module 3' comprises a variable focus fixed focal length imaging subsystem 3B' and a 1-D image detecting array 3A mounted along an optical bench 3D contained within a common lens barrel (not shown). The imaging subsystem 3B' comprises a group of stationary lens elements 3A' mounted along the optical bench before the image detecting array 3A', and a group of focusing lens elements 3B' (having a fixed effective focal length) mounted along the optical bench in front of the stationary lens elements 3A1. In a non-customized application, focal distance control can be provided by moving the 1-D image detecting array 3A back and forth along the optical axis with a translator 3E in response to a first set of control signals 3E generated by the system controller 22, while the entire group of focal lens elements remain stationary. Alternatively, focal distance control can also be provided by moving the entire group of focal lens elements 3B' back and forth with translator 3C in response to a first set of control signals 3E generated by the system controller 22, while the 1-D image detecting array 3A remains stationary. In customized applications, it is possible for the individual lens elements in the group of focusing lens elements 3B' to be moved in response to control signals generated by the system controller. Regardless of the approach taken, an IFD module 3' with variable focus fixed focal length imaging can be realized in a variety of ways, each being embraced by the spirit of the present invention.

Third Illustrative Embodiment of the PLIIM System of the Present Invention Shown in FIG. 2A The second illustrative embodiment of the PLIIM system of FIG. 2A 40C is shown in FIG. 2D1 comprising: an image formation and detection module 3' having an imaging subsystem 3B' with a fixed focal length imaging lens, a variable focal distance and a fixed field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http:/www/dalsa.com) for detecting 1-D line images formed thereon by the imaging subsystem 3B'; a pair of planar laser illumination arrays 6A and 6B for producing first and second planar laser illumination beams 7A, 7B, and a pair of planar laser beam folding mirrors 37A and 37B for folding the planes of the planar laser illumination beams produced by the pair of planar illumination arrays 6A and 6B, in a direction that is coplanar with the plane of the field of view of the image formation and detection during object illumination and image detection operations.

The primary disadvantage of this system architecture is that it requires additional optical surfaces (i.e. the planar laser beam folding mirrors) which reduce outgoing laser light and therefore the return laser light slightly. Also this embodiment requires a complicated beam/FOV adjustment scheme. Thus, this system design can be best used when the planar laser illumination beams do not have large apex angles to provide sufficiently uniform illumination. Notably, in this system embodiment, the PLIMs are mounted on the optical bench 8 as far back as possible from the beam folding mirrors 37A, 37B, and cylindrical lenses 16 with larger radiuses will be employed in the design of each PLIM 11.

As shown in FIG. 2E2, the PLIIM system of FIG. 2E1 comprises: planar laser illumination arrays 6A and 6B, each having a plurality of planar laser illumination modules 11A through 11F, and each planar laser illumination module being driven by a VLD driver circuit 18; linear-type image formation and detection module 3'; a field of view folding mirror 9 for folding the field of view of the image formation and detection module 3'; an image frame grabber 19 operably connected to the linear-type image formation and detection module 3A, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner.

FIG. 2E3 illustrates in greater detail the structure of the IFD module 3' used in the PLIIM system of FIG. 2E1. As shown, the IFD module 3' comprises a variable focus fixed focal length imaging subsystem 3B' and a 1-D image detecting array 3A mounted along an optical bench 3D contained within a common lens barrel (not shown). The imaging subsystem 3B' comprises a group of stationary lens elements 3A1 mounted along the optical bench before the image detecting array 3A, and a group of focusing lens elements 3B' (having a fixed effective focal length) mounted along the optical bench in front of the stationary lens elements 3A1. In a non-customized application, focal distance control can be provided by moving the 1-D image detecting array 3A back and forth along the optical axis in response to a first set of control signals 3E generated by the system controller 22, while the entire group of focal lens elements 3B' remain stationary. Alternatively, focal distance control can also be provided by moving the entire group of focal lens elements 3B' back and forth with translator 3C in response to a first set of control signals 3E generated by the system controller 22, while the 1-D image detecting array 3A remains stationary. In customized applications, it is possible for the individual lens elements in the group of focusing lens elements 3B' to be moved in response to control signals generated by the system controller 22. Regardless of the approach taken, an IFD module 3' with variable focus fixed focal length imaging can be realized in a variety of ways, each being embraced by the spirit of the present invention.

Fourth Illustrative Embodiment of the PLIIM System of the Present Invention Shown in FIG. 2A The fourth illustrative embodiment of the PLIIM system of FIG. 2A 40D is shown in FIG. 2F1 comprising: an image formation and detection module 3' having an imaging subsystem 3B' with a fixed focal length imaging lens, a variable focal distance and a fixed field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http:/www/dalsa.com) for detecting 1-D line images formed thereon by the imaging subsystem 3B'; a field of view folding mirror 9 for folding the FOV of the imaging subsystem 3B'; a pair of planar laser illumination arrays 6A and 6B for producing first and second planar laser illumination beams; and a pair of planar laser beam folding mirrors 37A and 37B arranged in relation to the planar laser illumination arrays 6A and 6B so as to fold the optical paths of the first and second planar laser illumination beams 7A, 7B in a direction that is coplanar with the folded FOV of the image formation and detection module 3', during object illumination and image detection operations.

As shown in FIG. 2F2, the PLIIM system 40D of FIG. 2F1 comprises: planar laser illumination arrays 6A and 6B, each having a plurality of planar laser illumination modules 11A through 11B, and each planar laser illumination module being driven by a VLD driver circuit 18; linear-type image formation and detection module 3'; a field of view folding mirror 9 for folding the field of view of the image formation and detection module 3'; an image frame grabber 19 operably connected to the linear-type image formation and detection module 3A, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner.

FIG. 2F3 illustrates in greater detail the structure of the IFD module 3' used in the PLIIM system of FIG. 2F1. As shown, the IFD module 3' comprises a variable focus fixed focal length imaging subsystem 3B' and a 1-D image detecting array 3A mounted along an optical bench 3D contained within a common lens barrel (not shown). The imaging subsystem 3B' comprises a group of stationary lens elements 3A1 mounted along the optical bench 3D before the image detecting array 3A, and a group of focusing lens elements 3B' (having a fixed effective focal length) mounted along the optical bench in front of the stationary lens elements 3A1. In a non-customized application, focal distance control can be provided by moving the 1-D image detecting array 3A back and forth along the optical axis with translator 3C in response to a first set of control signals 3E generated by the system controller 22, while the entire group of focal lens elements 3B' remain stationary. Alternatively, focal distance control can also be provided by moving the entire group of focal lens elements 3B' back and forth with translator 3C in response to a first set of control signals 3E generated by the system controller 22, while the 1-D image detecting array 3A remains stationary. In customized applications, it is possible for the individual lens elements in the group of focusing lens elements 3B' to be moved in response to control signals generated by the system controller 22. Regardless of the approach taken, an IFD module with variable focus fixed focal length imaging can be realized in a variety of ways, each being embraced by the spirit of the present invention.

Applications for the Third Generalized Embodiment of the PLIIM System of the Present Invention, and the Illustrative Embodiments Thereof As the PLIIM systems shown in FIGS. 2A through 2F3 employ an IFD module 3' having a linear image detecting array and an imaging subsystem having variable focus (i.e. focal distance) control, such PLIIM systems are good candidates for use in a conveyor top scanner application, as shown in FIG. 2G, as the variation in target object distance can be up to a meter or more (from the imaging subsystem). In general, such object distances are too great a range for the depth of field (DOF) characteristics of the imaging subsystem alone to accommodate such object distance parameter variations during object illumination and imaging operations. Provision for variable focal distance control is generally sufficient for the conveyor top scanner application shown in FIG. 2G, as the demands on the depth of field and variable focus or dynamic focus control characteristics of such PLIIM system are not as severe in the conveyor top scanner application, as they might be in the conveyor side scanner application, also illustrated in FIG. 2G.

Notably, by adding dynamic focusing functionality to the imaging subsystem of any of the embodiments shown in FIGS. 2A through 2F3, the resulting PLIIM system becomes appropriate for the conveyor side-scanning application discussed above, where the demands on the depth of field and variable focus or dynamic focus requirements are greater compared to a conveyor top scanner application.

Fourth Generalized Embodiment of the PLIIM System of the Present Invention

The fourth generalized embodiment of the PLIIM system 40' of the present invention is illustrated in FIGS. 2I1 and 2I2. As shown in FIG. 2I1, the PLIIM system 40' comprises: a housing 2 of compact construction; a linear (i.e. 1-dimensional) type image formation and detection (IFD) module 3'; and a pair of planar laser illumination arrays (PLIAs) 6A and 6B mounted on opposite sides of the IFD module 3'. During system operation, laser illumination arrays 6A and 6B each produce a moving planar laser illumination beam 12' which synchronously moves and is disposed substantially coplanar with the field of view (FOV) of the image formation and detection module 3', so as to scan a bar code symbol or other graphical structure 4 disposed stationary within a 3-D scanning region.

As shown in FIGS. 2I2 and 2I3, the PLIIM system of FIG. 2I1 comprises: an image formation and detection module 3' having an imaging subsystem 3B' with a fixed focal length imaging lens, a variable focal distance and a fixed field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http:/www/dalsa.com) for detecting 1-D line images formed thereon by the imaging subsystem 3B'; a field of view folding and sweeping mirror 9' for folding and sweeping the field of view 10 of the image formation and detection module 3'; a pair of planar laser illumination arrays 6A and 6B for producing planar laser illumination beams 7A and 7B; a pair of planar laser illumination beam sweeping mirrors 37A' and 37B' for folding and sweeping the planar laser illumination beams 7A and 7B, respectively, in synchronism with the FOV being swept by the FOV folding and sweeping mirror 9'; an image frame grabber 19 operably connected to the linear-type image formation and detection module 3A, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner. As shown in FIG. 2F2, each planar laser illumination module 11A through 11F, is driven by a VLD driver circuit 18 under the system controller 22. Notably, laser illumination beam folding/sweeping mirrors 37A' and 37B', and FOV folding/sweeping mirror 9' are each rotatably driven by a motor-driven mechanism 39A, 39B, 38, respectively, operated under the control of the system controller 22. These three mirror elements can be synchronously moved in a number of different ways. For example, the mirrors 37A', 37B' and 9' can be jointly rotated together under the control of one or more motor-driven mechanisms, or each mirror element can be driven by a separate driven motor which are synchronously controlled to enable the composite planar laser illumination beam and FOV to move together in a spatially-coplanar manner during illumination and detection operations within the PLIIM system.

FIG. 2I4 illustrates in greater detail the structure of the IFD module 3' used in the PLIIM system of FIG. 2I1. As shown, the IFD module 3' comprises a variable focus fixed focal length imaging subsystem 3B' and a 1-D image detecting array 3A mounted along an optical bench 3D contained within a common lens barrel (not shown). The imaging subsystem 3B' comprises a group of stationary lens elements 3A1 mounted along the optical bench before the image detecting array 3A, and a group of focusing lens elements 3B' (having a fixed effective focal length) mounted along the optical bench in front of the stationary lens elements 3A1. In a non-customized application, focal distance control can be provided by moving the 1-D image detecting array 3A back and forth along the optical axis in response to a first set of control signals 3E generated by the system controller 22, while the entire group of focal lens elements 3B' remain stationary. Alternatively, focal distance control can also be provided by moving the entire group of focal lens elements 3B' back and forth with a translator 3C in response to a first set of control signals 3E generated by the system controller 22, while the 1-D image detecting array 3A remains stationary. In customized applications, it is possible for the individual lens elements in the group of focusing lens elements 3B' to be moved in response to control signals generated by the system controller 22. Regardless of the approach taken, an IFD module 3' with variable focus fixed focal length imaging can be realized in a variety of ways, each being embraced by the spirit of the present invention.

In accordance with the present invention, the planar laser illumination arrays 6A and 6B, the linear image formation and detection module 3', the folding/sweeping FOV mirror 9', and the planar laser illumination beam folding/sweeping mirrors 37A' and 37B' employed in this generalized system embodiment, are fixedly mounted on an optical bench or chassis 8 so as to prevent any relative motion (which might be caused by vibration or temperature changes) between: (i) the image forming optics (e.g. imaging lens) within the image formation and detection module 3' and the FOV folding/ sweeping mirror 9' employed therewith; and (ii) each planar laser illumination module (i.e. VLD/cylindrical lens assembly) and the planar laser illumination beam folding/sweeping mirrors 37A' and 37B' employed in this PLIIM system configuration. Preferably, the chassis assembly should provide for easy and secure alignment of all optical components employed in the planar laser illumination arrays 6A and 6B, beam folding/sweeping mirrors 37A' and 37B', the image formation and detection module 3' and FOV folding/sweeping mirror 9', as well as be easy to manufacture, service and repair. Also, this generalized PLIIM system embodiment 40' employs the general "planar laser illumination" and "focus beam at farthest object distance (FBAFOD)" principles described above.

Applications for the Fourth Generalized Embodiment of the PLIIM System of the Present Invention As the PLIIM systems shown in FIGS. 2I1 through 2I4 employ (i) an IFD module having a linear image detecting array and an imaging subsystem having variable focus (i.e. focal distance) control, and (ii) a mechanism for automatically sweeping both the planar (2-D) FOV and planar laser illumination beam through a 3-D scanning field in an "up and down" pattern while maintaining the inventive principle of "laser-beam/FOV coplanarity" herein disclosed, such PLIIM systems are good candidates for use in a hand-held scanner application, shown in FIG. 2I5, and the hands-free presentation scanner application illustrated in FIG. 2I6. The provision of variable focal distance control in these illustrative PLIIM systems is most sufficient for the hand-held scanner application shown in FIG. 2I5, and presentation scanner application shown in FIG. 2I6, as the demands placed on the depth of field and variable focus control characteristics of such systems will not be severe.

Fifth Generalized Embodiment of the PLIIM System of the Present Invention

The fifth generalized embodiment of the PLIIM system of the present invention 50 is illustrated in FIG. 3A. As shown therein, the PLIIM system 50 comprises: a housing 2 of compact construction; a linear (i.e. 1-dimensional) type image formation and detection (IFD) module 3" including a 1-D electronic image detection array 3A, a linear (1-D) imaging subsystem (LIS) 3B" having a variable focal length, a variable focal distance, and a variable field of view (FOV), for forming a 1-D image of an illuminated object located within the fixed focal distance and FOV thereof and projected onto the 1-D image detection array 3A, so that the 1-D image detection array 3A can electronically detect the image formed thereon and automatically produce a digital image data set 5 representative of the detected image for subsequent image processing; and a pair of planar laser illumination arrays (PLIAs) 6A and 6B, each mounted on opposite sides of the IFD module 3", such that each planar laser illumination array 6A and 6B produces a plane of laser beam illumination 7A, 7B which is disposed substantially coplanar with the field view of the image formation and detection module 3" during object illumination and image detection operations carried out by the PLIIM system.

In the PLIIM system of FIG. 3A, the linear image formation and detection (IFD) module 3" has an imaging lens with a variable focal length (i.e. a zoom-type imaging lens) 3B1, that has a variable angular field of view (FOV); that is, the farther the target object is located from the IFD module, the larger the projection dimensions of the imaging subsystem's FOV become on the surface of the target object. A zoom imaging lens is capable of changing its focal length, and therefore its angular field of view (FOV) by moving one or more of its component lens elements. The position at which the zooming lens element(s) must be in order to achieve a given focal length is determined by consulting a lookup table, which must be constructed ahead of time either experimentally or by design software, in a manner well known in the art. An advantage to using a zoom lens is that the resolution of the image that is acquired, in terms of pixels or dots per inch, remains constant no matter what the distance from the target object to the lens. However, a zoom camera lens is more difficult and more expensive to design and produce than the alternative, a fixed focal length camera lens.

The image formation and detection (IFD) module 3" in the PLIIM system of FIG. 3A also has an imaging lens 3B2 with variable focal distance, which can adjust its image distance to compensate for a change in the target's object distance. Thus, at least some of the component lens elements in the imaging subsystem 3B2 are movable, and the depth of field (DOF) of the imaging subsystem does not limit the ability of the imaging subsystem to accommodate possible object distances and orientations. This variable focus imaging subsystem 3B2 is able to move its components in such a way as to change the image distance of the imaging lens to compensate for a change in the target's object distance, thus preserving good image focus no matter where the target object might be located. This variable focus technique can be practiced in several different ways, namely: by moving lens elements in the imaging subsystem; by moving the image detection/sensing array relative to the imaging lens; and by dynamic focus control. Each of these different methods has been described in detail above.

In accordance with the present invention, the planar laser illumination arrays 6A and 6B the image formation and detection module 3" are fixedly mounted on an optical bench or chassis assembly 8 so as to prevent any relative motion between (i) the image forming optics (e.g. camera lens) within the image formation and detection module 3" and (ii) each planar laser illumination module (i.e. VLD/cylindrical lens assembly) employed in the PLIIM system which might be caused by vibration or temperature changes. Preferably, the chassis assembly should provide for easy and secure alignment of all optical components employed in the planar laser illumination arrays 6A and 6B as well as the image formation and detection module 3", as well as be easy to manufacture, service and repair. Also, this PLIIM system employs the general "planar laser illumination" and "FBAFOD" principles described above.

First Illustrative Embodiment of the PLIIM System of the Present Invention Shown in FIG. 3B1

The first illustrative embodiment of the PLIIM system of FIG. 3A 50A is shown in FIG. 3B1. As illustrated therein, the field of view of the image formation and detection module 3" and the first and second planar laser illumination beams 7A and 7B produced by the planar illumination arrays 6A and 6B, respectively, are arranged in a substantially coplanar relationship during object illumination and image detection operations.

The PLIIM system 50A illustrated in FIG. 3B1 is shown in greater detail in FIG. 3B2. As shown therein, the linear image formation and detection module 3" is shown comprising an imaging subsystem 3B", and a linear array of photo-electronic detectors 3A realized using CCD technology (e.g. Piranha Model Nos. CT-P4, or CL-P4 High-Speed CCD Line Scan Camera, from Dalsa, Inc. USA—http:/www/dalsa.com) for detecting 1-D line images formed thereon by the imaging subsystem 3B". The imaging subsystem 3B" has a variable focal length imaging lens, a variable focal distance and a variable field of view. As shown, each planar laser illumination array 6A, 6B comprises a plurality of planar laser illumination modules (PLIMs) 11A through 11F, closely arranged relative to each other, in a rectilinear fashion. As taught hereinabove, the relative spacing of each PLIM 11 is such that the spatial intensity distribution of the individual planar laser beams superimpose and additively provide a composite planar case illumination beam having substantially uniform composite spatial intensity distribution for the entire planar laser illumination array 6A and 6B.

As shown in FIG. 3C1, the PLIIM system 50A of FIG. 3B1 comprises: planar laser illumination arrays 6A and 6B, each having a plurality of planar laser illumination modules 11A through 11F, and each planar laser illumination module being driven by a VLD driver circuit 18; linear-type image formation and detection module 3"; an image frame grabber 19 operably connected to the linear-type image formation and detection module 3A, for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner.

FIG. 3C2 illustrates in greater detail the structure of the IFD module 3" used in the PLIIM system of FIG. 3B1. As shown, the IFD module 3" comprises a variable focus variable focal length imaging subsystem 3B" and a 1-D image detecting array 3A mounted along an optical bench 3D contained within a common lens barrel (not shown). In general, the imaging subsystem 3B' comprises: a first group of focal lens elements 3A1 mounted stationary relative to the image detecting array 3A; a second group of lens elements 3B2, functioning as a focal lens assembly, movably mounted along the optical bench in front of the first group of stationary lens elements 3A1; and a third group of lens elements 3B1, functioning as a zoom lens assembly, movably mounted between the second group of focal lens elements and the first group of stationary focal lens elements 3A1. In a non-customized application, focal distance control can also be provided by moving the second group of focal lens elements 3B2 back and forth with translator 3C1 in response to a first set of control signals generated by the system controller 22, while the 1-D image detecting array 3A remains stationary. Alternatively, focal distance control can be provided by moving the 1-D image detecting array 3A back and forth along the optical axis with translator 3C1 in response to a first set of control signals 3E2 generated by the system controller 22, while the second group of focal lens elements 3B2 remain stationary. For zoom control (i.e. variable focal length control), the focal lens elements in the third group 3B2 are typically moved relative to each other with translator 3C1 in response to a second set of control signals 3E2 generated by the system controller 22. Regardless of the approach taken in any particular illustrative embodiment, an IFD module with variable focus variable focal length imaging can be realized in a variety of ways, each being embraced by the spirit of the present invention.

Figure 3D:
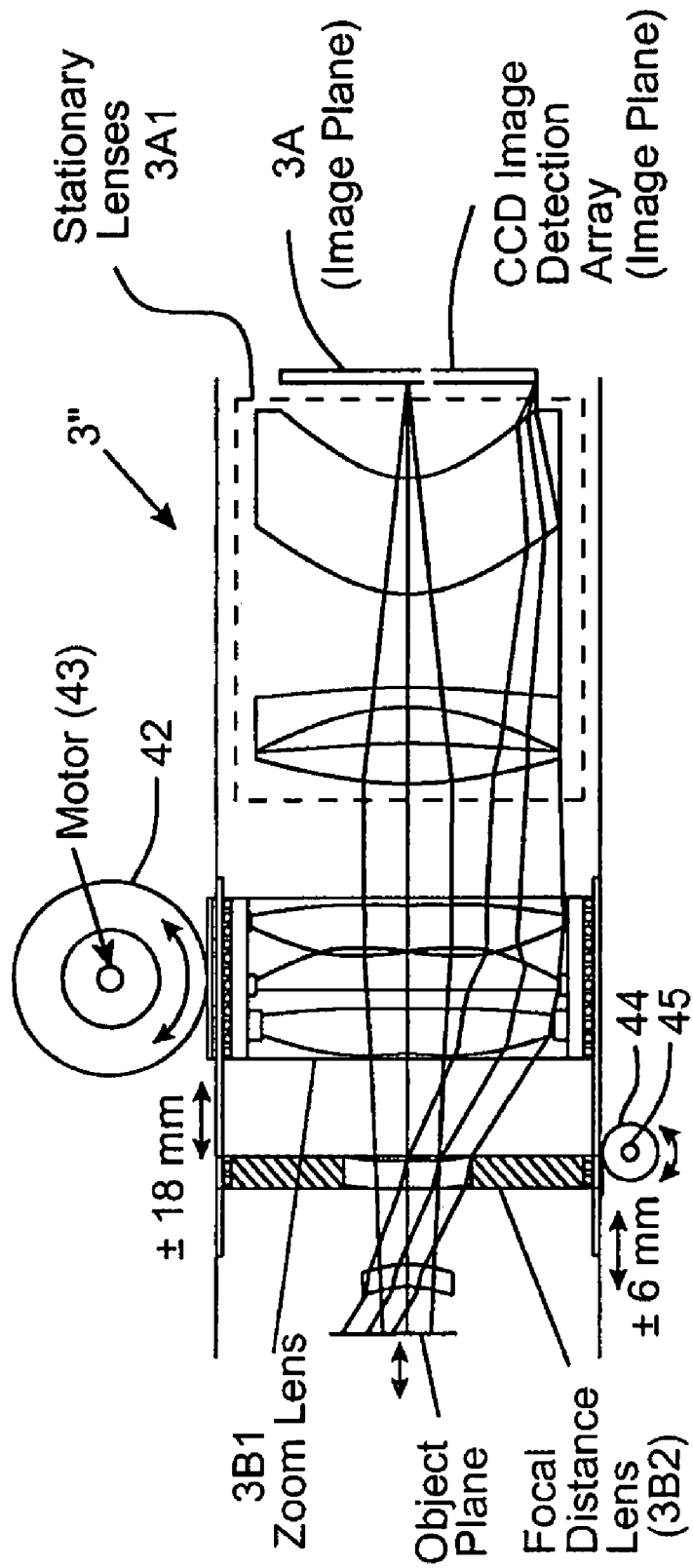
FIG. 3D is a schematic representation of a preferred implementation of the imaging subsystem contained in the image formation and detection module employed in the PLIIM system of FIG. 3B1, shown comprising a stationary lens system mounted before the stationary linear image detection array, a first movable lens system for large stepped movement relative to the stationary lens system during image zooming operations, and a second movable lens system for small stepped movements relative to the first movable lens system and the stationary lens system during image focusing operations.

A preferred implementation of the image subsystem of FIG. 3C2 is shown in FIG. 3D. As shown in FIG. 3D, imaging subsystem 3B" comprises: an optical bench 3D having a pair of rails, along which mounted optical elements are translated; a linear CCD-type image detection array 3A (e.g. Piranha Model Nos. CT-P4, or CL-P4 High-Speed CCD Line Scan Camera, from Dalsa, Inc. USA—http:/www/dalsa.com) fixedly mounted to one end of the optical bench; a system of stationary lenses 3A1 fixedly mounted before the CCD-type linear image detection array 3A; a first system of movable lenses 3B1 slidably mounted to the rails of the optical bench 3D by a set of ball bearings, and designed for stepped movement relative to the stationary lens subsystem 3A1 with translator 3C1 in automatic response to a first set of control signals 3E1 generated by the system controller 22; and a second system of movable lenses 3B2 slidably mounted to the rails of the optical bench by way of a second set of ball bearings, and designed for stepped movements relative to the first system of movable lenses 3B with translator 3C2 in automatic response to a second set of control signals 3D2 generated by the system controller 22. As shown in FIG. 3D, a large stepper wheel 42 driven by a zoom stepper motor 43 engages a portion of the zoom lens system 3B1 to move the same along the optical axis of the stationary lens system 3A1 in response to control signals 3C1 generated from the system controller 22. Similarly, a small stepper wheel 44 driven by a focus stepper motor 45 engages a portion of the focus lens system 3B2 to move the same along the optical axis of the stationary lens system 3A1 in response to control signals 3E2 generated from the system controller 22.

Method of Adjusting the Focal Characteristics of the Planar Laser Illumination Beams Generated by Planar Laser Illumination Arrays Used in Conjunction with Image Formation and Detection Modules Employing Variable Focal Length (Zoom) Imaging Lenses Unlike the fixed focal length imaging lens case, there occurs a significant a $1/r^2$ drop-off in laser return light intensity at the image detection array when using a zoom (variable focal length) imaging lens in the PLIIM system hereof. In PLIIM system employing an imaging subsystem having a variable focal length imaging lens, the area of the imaging subsystem's field of view (FOV) remains constant as the working distance increases. Such variable focal length control is used to ensure that each image formed and detected by the image formation and detection (IFD) module 3" has the same number of "dots per inch" (DPI) resolution, regardless of the distance of the target object from the IFD module 3". However, since module's field of view does not increase in size with the object distance, equation (8) must be rewritten as the equation (10) set forth below $$E_{ccd}^{zoom} = \frac{E_0 f^2 s^2}{8d^2 F^2 r^2} \qquad (10)$$

where $s^2$ is the area of the field of view and $d^2$ is the area of a pixel on the image detecting array. This expression is a strong function of the object distance, and demonstrates $1/r^2$ drop off of the return light. If a zoom lens is to be used, then it is desirable to have a greater power density at the farthest object distance than at the nearest, to compensate for this loss. Again, focusing the beam at the farthest object distance is the technique that will produce this result.

Therefore, in summary, where a variable focal length (i.e. zoom) imaging subsystem is employed in the PLIIM system, the planar laser beam focusing technique of the present invention described above helps compensate for (i) decreases in the power density of the incident illumination beam due to the fact that the width of the planar laser illumination beam increases for increasing distances away from the imaging subsystem, and (ii) any $1/r^2$ type losses that would typically occur when using the planar laser planar illumination beam of the present invention.

Second Illustrative Embodiment of the PLIIM System of the Present Invention Shown in FIG. 3A The second illustrative embodiment of the PLIIM system of FIG. 3A 50B is shown in FIG. 3E1 comprising: an image formation and detection module 3" having an imaging subsystem 3B with a variable focal length imaging lens, a variable focal distance and a variable field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http://www/dalsa.com) for detecting 1-D line images formed thereon by the imaging subsystem 3B"; a field of view folding mirror 9 for folding the field of view of the image formation and detection module 3"; and a pair of planar laser illumination arrays 6A and 6B arranged in relation to the image formation and detection module 3" such that the field of view thereof folded by the field of view folding mirror 9 is oriented in a direction that is coplanar with the composite plane of laser illumination 12 produced by the planar illumination arrays, during object illumination and image detection operations, without using any laser beam folding mirrors.

As shown in FIG. 3E2, the PLIIM system of FIG. 3E1 comprises: planar laser illumination arrays 6A and 6B, each having a plurality of planar laser illumination modules 11A through 11F, and each planar laser illumination module being driven by a VLD driver circuit 18; linear-type image formation and detection module 3A; a field of view folding mirror 9' for folding the field of view of the image formation and detection module 3"; an image frame grabber 19 operably connected to the linear-type image formation and detection module 3", for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner.

FIG. 3E3 illustrates in greater detail the structure of the IFD module 3" used in the PLIIM system of FIG. 3E1. As shown, the IFD module 3" comprises a variable focus variable focal length imaging subsystem 3B" and a 1-D image detecting array 3A mounted along an optical bench 3D contained within a common lens barrel (not shown). In general, the imaging subsystem 3B" comprises: a first group of focal lens elements 3A1 mounted stationary relative to the image detecting array 3A; a second group of lens elements 3B2, functioning as a focal lens assembly, movably mounted along the optical bench in front of the first group of stationary lens elements 3A; and a third group of lens elements 3B1, functioning as a zoom lens assembly, movably mounted between the second group of focal lens elements and the first group of stationary focal lens elements 3B2. In a non-customized application, focal distance control can also be provided by moving the second group of focal lens elements 3B2 back and forth with translator 3C2 in response to a first set of control signals 3E2 generated by the system controller 22, while the 1-D image detecting array 3A remains stationary. Alternatively, focal distance control can be provided by moving the 1-D image detecting array 3A back and forth along the optical axis with translator 3C2 in response to a first set of control signals 3E2 generated by the system controller 22, while the second group of focal lens elements 3B2 remain stationary. For zoom control (i.e. variable focal length control), the focal lens elements in the third group 3B1 are typically moved relative to each other with translator 3C1 in response to a second set of control signals 3E1 generated by the system controller 22. Regardless of the approach taken in any particular illustrative embodiment, an IFD module 3" with variable focus variable focal length imaging can be realized in a variety of ways, each being embraced by the spirit of the present invention.

Detailed Description of an Exemplary Realization of the PLIIM System Shown in FIG. 3E1 Through 3E3

Referring now to FIGS. 3E4 through 3E8, an exemplary realization of the PLIIM system 50B shown in FIGS. 3E1 through 3E3 will now be described in detail below.

As shown in FIGS. 3E41 and 3E5, an exemplary realization of the PLIIM system 50B FIGS. 3E1-3E3 is indicated by reference numeral 25' contained within a compact housing 2 having height, length and width dimensions of about 4.5", 21.7" and 19.7", respectively, to enable easy mounting above a conveyor belt structure or the like. As shown in FIGS. 3E4, 3E5 and 3E6, the PLIIM system comprises a linear image formation and detection module 3", a pair of planar laser illumination arrays 6A, and 6B, and a field of view (FOV) folding structure (e.g. mirror, refractive element, or diffractive element) 9. The function of the FOV folding mirror 9 is to fold the field of view (FOV) 10 of the image formation and detection module 3' in an imaging direction that is coplanar with the plane of laser illumination beams 7A and 7B produced by the planar illumination arrays 6A and 6B. As shown, these components are fixedly mounted to an optical bench 8 supported within the compact housing 2 so that these optical components are forced to oscillate together. The linear CCD imaging array 3A can be realized using a variety of commercially available high-speed line-scan camera systems such as, for example, the Piranha Model Nos. CT-P4, or CL-P4 High-Speed CCD Line Scan Camera, from Dalsa, Inc. USA—http://www/dalsa.com. Notably, image frame grabber 19, image data buffer (e.g. VRAM) 20, decode image processor 21, and system controller 22 are realized on one or more printed circuit (PC) boards contained within a camera and system electronic module 27 also mounted on the optical bench, or elsewhere in the system housing 2.

While this system design requires additional optical surfaces (i.e. planar laser beam folding mirrors) which complicates laser-beam/FOV alignment, and attenuates slightly the intensity of collected laser return light, this system design will be beneficial when the FOV of the imaging subsystem cannot have a large apex angle, as defined as the angular aperture of the imaging lens (in the zoom lens assembly), due to the fact that the IFD module 3" must be mounted on the optical bench in a backed-off manner to the conveyor belt (or maximum object distance plane), and a longer focal length lens (or zoom lens with a range of longer focal lengths) is chosen.

One notable advantage of this system design is that it enables a construction having an ultra-low height profile suitable, for example, in unitary package identification and dimensioning systems of the type disclosed in FIGS. 17-22, wherein the image-based bar code symbol reader needs to be installed within a compartment (or cavity) of a housing having relatively low height dimensions. Also, in this system design, there is a relatively high degree of freedom provided in where the image formation and detection module 3" can be mounted on the optical bench of the system, thus enabling the field of view (FOV) folding technique disclosed in FIG. 1L1 to be practiced in a relatively easy manner.

As shown in FIG. 3E4, the compact housing 2 has a relatively long light transmission window 28 of elongated dimensions for the projecting the FOV 10 of the image formation and detection module 3" through the housing towards a predefined region of space outside thereof, within which objects can be illuminated and imaged by the system components on the optical bench. Also, the compact housing 2 has a pair of relatively short light transmission apertures 30A and 30B, closely disposed on opposite ends of light transmission window 28, with minimal spacing therebetween, as shown in FIG. 3E4. Such spacing is to ensure that the FOV emerging from the housing 2 can spatially overlap in a coplanar manner with the substantially planar laser illumination beams projected through transmission windows 29A and 29B, as close to transmission window 28 as desired by the system designer, as shown in FIGS. 3E6 and 3E7. Notably, in some applications, it is desired for such coplanar overlap between the FOV and planar laser illumination beams to occur very close to the light transmission windows 28, 29A and 29B (i.e. at short optical throw distances), but in other applications, for such coplanar overlap to occur at large optical throw distances.

In either event, each planar laser illumination array 6A and 6B is optically isolated from the FOV of the image formation and detection module 3" to increase the signal-to-noise ratio (SNR) of the system. In the preferred embodiment, such optical isolation is achieved by providing a set of opaque wall structures 30A, 30B about each planar laser illumination array, extending from the optical bench 8 to its light transmission window 29A or 29B, respectively. Such optical isolation structures prevent the image formation and detection module 3" from detecting any laser light transmitted directly from the planar laser illumination arrays 6A and 6B within the interior of the housing. Instead, the image formation and detection module 3" can only receive planar laser illumination that has been reflected off an illuminated object, and focused through the imaging subsystem 3B" of the IFD module 3".

Notably, the linear image formation and detection module of the PLIIM system of FIG. 3E4 has an imaging subsystem 3B" with a variable focal length imaging lens, a variable focal distance, and a variable field of view. In FIG. 3E8, the spatial limits for the FOV of the image formation and detection module are shown for two different scanning conditions, namely: when imaging the tallest package moving on a conveyor belt structure; and when imaging objects having height values close to the surface of the conveyor belt structure. In a PLIIM system having a variable focal length imaging lens and a variable focusing mechanism, the PLIIM system would be capable of imaging at either of the two conditions indicated above.

Third Illustrative Embodiment of the PLIIM System of the Present Invention Shown in FIG. 3A The third illustrative embodiment of the PLIIM system of FIG. 3A 50C is shown in FIG. 3F1 comprising: an image formation and detection module 3" having an imaging subsystem 3B" with a variable focal length imaging lens, a variable focal distance and a variable field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http://www/dalsa.com) for detecting 1-D line images formed thereon by the imaging subsystem 3B"; a pair of planar laser illumination arrays 6A and 6B for producing first and second planar laser illumination beams 7A and 7B, respectively; and a pair of planar laser beam folding mirrors 37A and 37B for folding the planes of the planar laser illumination beams produced by the pair of planar illumination arrays 6A and 6B, in a direction that is coplanar with the plane of the FOV of the image formation and detection module 3" during object illumination and imaging operations.

One notable disadvantage of this system architecture is that it requires additional optical surfaces (i.e. the planar laser beam folding mirrors) which reduce outgoing laser light and therefore the return laser light slightly. Also this system design requires a more complicated beam/FOV adjustment scheme than the direct-viewing design shown in FIG. 3B1. Thus, this system design can be best used when the planar laser illumination beams do not have large apex angles to provide sufficiently uniform illumination. Notably, in this system embodiment, the PLIMs are mounted on the optical bench as far back as possible from the beam folding mirrors 37A and 37B, and cylindrical lenses 16 with larger radiuses will be employed in the design of each PLIM 11A through 11P.

As shown in FIG. 3F2, the PLIIM system of FIG. 3F1 comprises: planar laser illumination arrays 6A and 6B, each having a plurality of planar laser illumination modules 11A through 11F, and each planar laser illumination module being driven by a VLD driver circuit 18; linear-type image formation and detection module 3A; a pair of planar laser illumination beam folding mirrors 37A and 37B, for folding the planar laser illumination beams 7A and 7B in the imaging direction; an image frame grabber 19 operably connected to the linear-type image formation and detection module 3", for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer; and a system controller 22 operably connected to the various components within the system for controlling the operation thereof in an orchestrated manner.

FIG. 3F3 illustrates in greater detail the structure of the IFD module 3" used in the PLIIM system of FIG. 3F1. As shown, the IFD module 3" comprises a variable focus variable focal length imaging subsystem 3B" and a 1-D image detecting array 3A mounted along an optical bench 3D contained within a common lens barrel (not shown). In general, the imaging subsystem 3B' comprises: a first group of focal lens elements 3A' mounted stationary relative to the image detecting array 3A; a second group of lens elements 3B2, functioning as a focal lens assembly, movably mounted along the optical bench 3D in front of the first group of stationary lens elements 3A1; and a third group of lens elements 3B1, functioning as a zoom lens assembly, movably mounted between the second group of focal lens elements and the first group of stationary focal lens elements 3A1. In a non-customized application, focal distance control can also be provided by moving the second group of focal lens elements 3B2 back and forth in response to a first set of control signals generated by the system controller, while the 1-D image detecting array 3A remains stationary. Alternatively, focal distance control can be provided by moving the 1-D image detecting array 3A back and forth along the optical axis with translator in response to a first set of control signals 3E2 generated by the system controller 22, while the second group of focal lens elements 3B2 remain stationary. For zoom control (i.e. variable focal length control), the focal lens elements in the third group 3B1 are typically moved relative to each other with translator 3C1 in response to a second set of control signals 3E1 generated by the system controller 22. Regardless of the approach taken in any particular illustrative embodiment, an IFD module with variable focus variable focal length imaging can be realized in a variety of ways, each being embraced by the spirit of the present invention.

Fourth Illustrative Embodiment of the PLIIM System of the Present Invention Shown in FIG. 3A The fourth illustrative embodiment of the PLIIM system of FIG. 3A 50D is shown in FIG. 3G1 comprising: an image formation and detection module 3" having an imaging subsystem 3B" with a variable focal length imaging lens, a variable focal distance and a variable field of view, and a linear array of photo-electronic detectors 3A realized using CCD technology (e.g. Piranha Model Nos. CT-P4, or CL-P4 High-Speed CCD Line Scan Camera, from Dalsa, Inc. USA—http:/www/dalsa.com) for detecting 1-D line images formed thereon by the imaging subsystem 3B"; a FOV folding mirror 9 for folding the FOV of the imaging subsystem in the direction of imaging; a pair of planar laser illumination arrays 6A and 6B for producing first and second planar laser illumination beams 7A, 7B; and a pair of planar laser beam folding mirrors 37A and 37B for folding the planes of the planar laser illumination beams produced by the pair of planar illumination arrays 6A and 6B, in a direction that is coplanar with the plane of the FOV of the image formation and detection module during object illumination and image detection operations.

As shown in FIG. 3G2, the PLIIM system of FIG. 3G1 comprises: planar laser illumination arrays 6A and 6B, each having a plurality of planar laser illumination modules 11A through 11F, and each planar laser illumination module being driven by a VLD driver circuit 18; linear-type image formation and detection module 3"; a FOV folding mirror 9 for folding the FOV of the imaging subsystem in the direction of imaging; a pair of planar laser illumination beam folding mirrors 37A and 37B, for folding the planar laser illumination beams 7A and 7B in the imaging direction; an image frame grabber 19 operably connected to the linear-type image formation and detection module 3", for accessing 1-D images (i.e. 1-D digital image data sets) therefrom and building a 2-D digital image of the object being illuminated by the planar laser illumination arrays 6A and 6B; an image data buffer (e.g. VRAM) 20 for buffering 2-D images received from the image frame grabber 19; a decode image processor 21, operably connected to the image data buffer 20, for carrying out image processing algorithms (including bar code symbol decoding algorithms) and operators on digital images stored within the image data buffer 20; and a system controller 22 operably connected to the various components within the system for controlling the operation thereof in an orchestrated manner.

FIG. 3G3 illustrates in greater detail the structure of the IFD module 3" used in the PLIIM system of FIG. 3G1. As shown, the IFD module 3" comprises a variable focus variable focal length imaging subsystem 3B" and a 1-D image detecting array 3A mounted along an optical bench 3D contained within a common lens barrel (not shown). In general, the imaging subsystem 3B' comprises: a first group of focal lens elements 3A1 mounted stationary relative to the image detecting array 3A; a second group of lens elements 3B2, functioning as a focal lens assembly, movably mounted along the optical bench in front of the first group of stationary lens elements 3A1; and a third group of lens elements 3B1, functioning as a zoom lens assembly, movably mounted between the second group of focal lens elements and the first group of stationary focal lens elements 3A1. In a non-customized application, focal distance control can also be provided by moving the second group of focal lens elements 3B2 back and forth with translator 3C2 in response to a first set of control signals 3E2 generated by the system controller 22, while the 1-D image detecting array 3A remains stationary. Alternatively, focal distance control can be provided by moving the 1-D image detecting array 3A back and forth along the optical axis in response to a first set of control signals 3E2 generated by the system controller 22, while the second group of focal lens elements 3B2 remain stationary. For zoom control (i.e. variable focal length control), the focal lens elements in the third group 3B1 are typically moved relative to each other with translator 3C1 in response to a second set of control signals 3C1 generated by the system controller 22. Regardless of the approach taken in any particular illustrative embodiment, an IFD module with variable focus variable focal length imaging can be realized in a variety of ways, each being embraced by the spirit of the present invention.

Figure 3H:
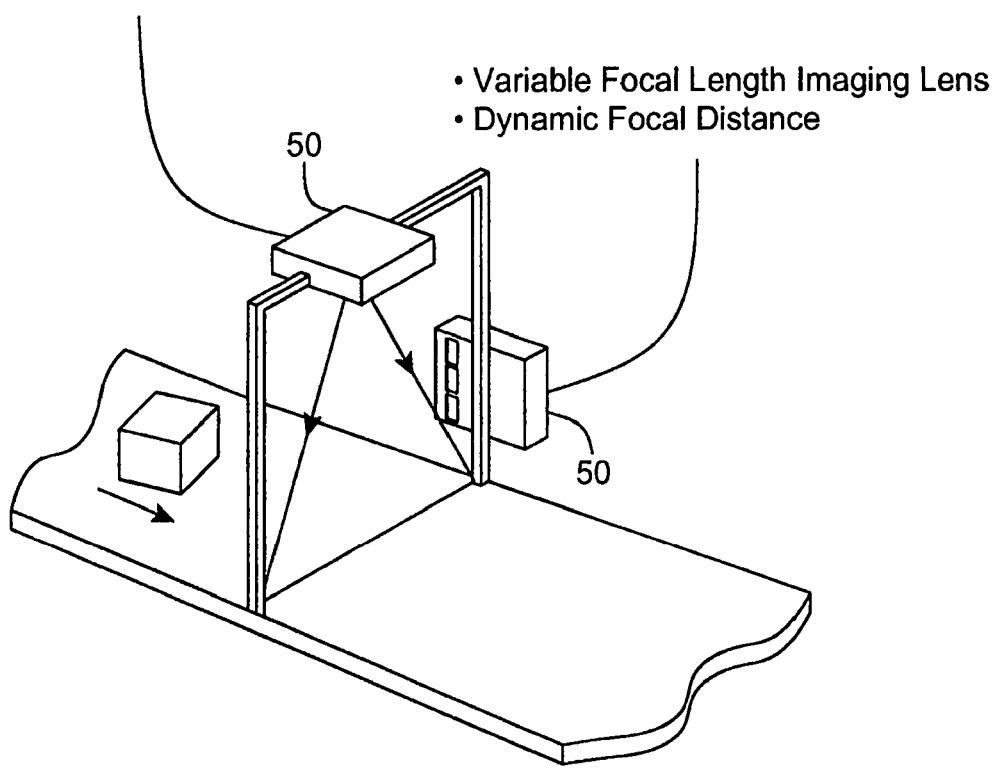
FIG. 3H is a schematic representation of an over-the-conveyor and side-of conveyor belt package identification systems embodying the PLIIM system of FIG. 3A.
Figure 3I:
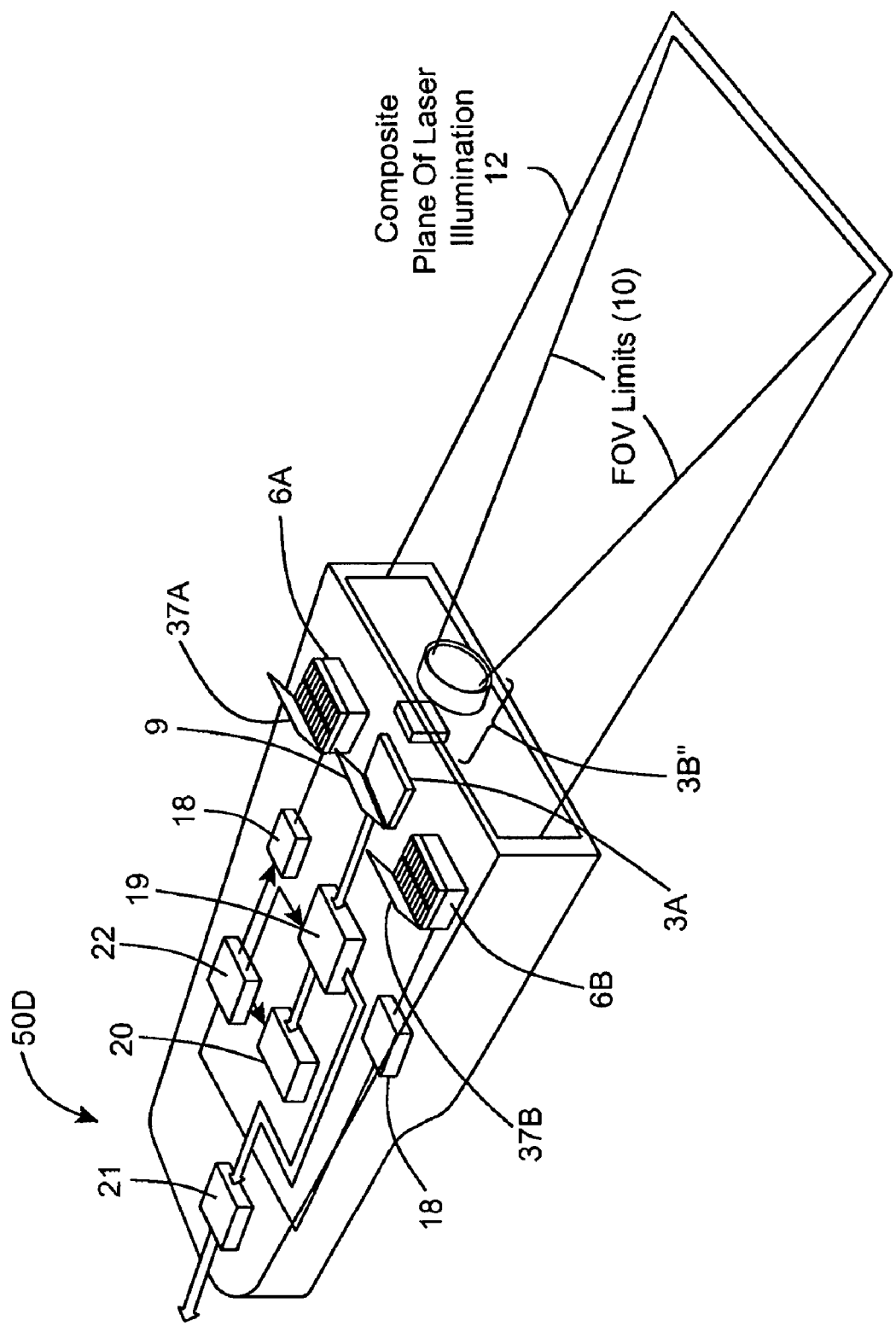

Applications for the Fifth Generalized Embodiment of the PLIIM System of the Present Invention, and the Illustrative Embodiments Thereof As the PLIIM systems shown in FIGS. 3A through 3G3 employ an IFD module having a linear image detecting array and an imaging subsystem having variable focal length (zoom) and variable focus (i.e. focal distance) control mechanisms, such PLIIM systems are good candidates for use in the conveyor top scanner application shown in FIG. 3H, as variations in target object distance can be up to a meter or more (from the imaging subsystem) and the imaging subsystem provided therein can easily accommodate such object distance parameter variations during object illumination and imaging operations. Also, by adding dynamic focusing functionality to the imaging subsystem of any of the embodiments shown in FIGS. 3A through 3F3, the resulting PLIIM system will become appropriate for the conveyor side scanning application also shown in FIG. 3G, where the demands on the depth of field and variable focus or dynamic focus requirements are greater compared to a conveyor top scanner application.

Modifications of the Illustrative Embodiments

While each embodiment of the PLIIM system of the present invention disclosed herein has employed a pair of planar laser illumination arrays, it is understood that in other embodiments of the present invention, only a single PLIA may be used, whereas in other embodiments three or more PLIAs may be used depending on the application at hand.

While the illustrative embodiments disclosed herein have employed electronic-type imaging detectors (e.g. 1-D and 2-D CCD-type image sensing/detecting arrays) for the clear advantages that such devices provide in bar code and other photo-electronic scanning applications, it is understood, however, that photo-optical and/or photo-chemical image detectors/sensors (e.g. optical film) can be used to practice the principles of the present invention disclosed herein.

While the package conveyor subsystems employed in the illustrative embodiments have utilized belt or roller structures to transport packages, it is understood that this subsystem can be realized in many ways, for example: using trains running on tracks passing through the laser scanning tunnel; mobile transport units running through the scanning tunnel installed in a factory environment; robotically-controlled platforms or carriages supporting packages, parcels or other bar coded objects, moving through a laser scanning tunnel subsystem.

While the various embodiments of the package identification and measuring system hereof have been described in connection with linear (1-D) and 2-D code symbol scanning applications, it should be clear, that the system and methods of the present invention are equally suited for scanning alphanumeric characters (e.g. textual information) in optical character recognition (OCR) applications, as taught in U.S. Pat. No. 5,727,081 to Burges, et al, incorporated herein by reference, and scanning graphical images as practiced in the graphical scanning arts.

It is understood that the laser scanning systems, modules, engines and subsystems of the illustrative embodiments may be modified in a variety of ways which will become readily apparent to those skilled in the art, and having the benefit of the novel teachings disclosed herein. All such modifications and variations of the illustrative embodiments thereof shall be deemed to be within the scope and spirit of the present invention as defined by the claims to Invention appended hereto.

The invention claimed is:

1. A hand-supportable planar laser illumination and imaging (PLIIM) based code symbol reader comprising:
a hand-supportable housing having light transmission aperture;
a linear image formation and detection module, disposed in said hand-supportable housing, and having a linear image detection array and image formation optics with a field of view (FOV) extending from said linear image detection array, through said light transmission aperture and onto an object moving relative to said hand-supportable housing during object illumination and imaging operations;
a planar laser illumination beam (PLIB) producing device, disposed in said hand-supportable housing, and having at least one visible laser diode (VLD) arranged in relation to said linear image formation and detection module, for producing a planar light illumination beam (PLIB), and projecting said PLIB through said light transmission aperture and oriented such that the plane of said planar light illumination beam is coplanar with said FOV of said linear image formation and detection module so that the object can be simultaneously illuminated by said PLIB and imaged within said FOV and onto said linear image detection array for detection as a digital linear image of the object;
an image grabber, disposed on said hand-supportable housing, for grabbing digital linear images formed and detected by said linear image formation and detection module;
an image data buffer, disposed on said hand-supportable housing, for buffering said digital linear images grabbed by said image grabber;
a digital image processor, disposed on said hand-supportable housing, and operably associated with said image data buffer, for processing said buffered digital linear images so as to read code symbols graphically represented in said digital linear images; and
a controller for automatically controlling one or more of said linear image formation and detection module, said PLIB producing device, said image frame grabber, said image data buffer and said digital image processor.

2. The hand-supportable PLIIM-based system of claim 1, wherein said PLIB producing device comprises beam forming optics disposed before each said VLD so as to produce at least one PLIB component of said PLIB produced from said PLIB producing device.

3. The hand-supportable PLIIM-based system of claim 1, wherein said image forming optics have a fixed focal distance and a fixed focal length providing a fixed field of view.

4. The hand-supportable PLIIM-based system of claim 1, wherein said image forming optics have a variable focal distance and a fixed focal length providing a fixed field of view.

5. The hand-supportable PLIIM-based system of claim 1, wherein said image forming optics have a variable focal distance and a variable focal length providing a variable field of view.

6. The hand-supportable PLIIM-based system of claim 1, wherein code symbols are selected from the group consisting of bar code symbols.

7. The hand-supportable PLIIM-based system of claim 1, wherein said linear image formation and detection module, said PLIB producing device, said image frame grabber, said image data buffer, said digital image processor and said controller are supported on a single platform within said hand-supportable housing.

8. The hand-supportable PLIIM-based system of claim 1, wherein said image data buffer comprises VRAM.

9. The hand-supportable PLIIM-based system of claim 1, wherein said digital image processor comprises a programmed microprocessor.

10. The hand-supportable PLIIM-based system of claim 1, wherein said controller comprises a programmed microprocessor.

* * * * *